United States Patent [19]

Hamilton et al.

[11] 4,443,845

[45] Apr. 17, 1984

[54] MEMORY SYSTEM HAVING A COMMON INTERFACE

[75] Inventors: Stephen P. Hamilton, Midland; Arthur C. Hunter, Lubbock, both of Tex.

[73] Assignee: Texas Instruments Incorporated, Dallas, Tex.

[21] Appl. No.: 163,023

[22] Filed: Jun. 26, 1980

[51] Int. Cl.³ .................................................. G06F 13/06
[52] U.S. Cl. .................................................. 364/200
[58] Field of Search ... 364/200 MS File, 900 MS File, 364/700, 706, 710, 712; 365/228, 229

[56] References Cited

U.S. PATENT DOCUMENTS

| Re. 30,671 | 7/1981 | Poland | 364/200 X |
|---|---|---|---|
| 3,859,638 | 1/1975 | Hume, Jr. | 365/228 X |
| 3,972,028 | 7/1976 | Weber et al. | 364/200 |
| 4,000,565 | 1/1977 | Overby et al. | 364/710 X |
| 4,021,656 | 5/1977 | Caudel et al. | 364/900 X |
| 4,063,221 | 12/1977 | Watson et al. | 364/900 |
| 4,086,626 | 4/1978 | Chung | 364/200 |
| 4,164,786 | 8/1979 | Gollomp | 364/200 |
| 4,296,476 | 10/1981 | Mayer et al. | 364/900 |

*Primary Examiner*—Thomas M. Heckler
*Attorney, Agent, or Firm*—Rene' E. Grossman; Leo N. Heiting; Mel Sharp

[57] ABSTRACT

A data processing system having separate read-only memory and read-write memory integrated circuits coupled to a central processing unit via the same interface system. The data processing system is comprised of bus means having either command, address, or data signals present and conducted thereon. In the preferred embodiment, the bus means is comprised of a four binary digit bidirectional conductor bus coupling between the central processing circuit and the memory circuits. In the preferred embodiment, the data processing system is further comprised of processor means within said central processing unit coupled to the bus means for selectively transmitting selected ones of said command, data and address signals onto the bus means, said processor means further including means for receiving certain other ones of said data and address signals from the bus means; and memory means including, in the preferred embodiment, read-only memory circuits and read write memory circuits, coupled to the bus means (and to the processor means via the bus means), including means for selectively transferring data with the processor means in response to said received command and address signals being within a unique subset of commands and addresses. In the preferred embodiment, each separate individual circuit comprising the memory means includes the means for responding to the command signal received via the bus means and for storing or outputting address signals or data signals responsive to decoding said received command signal.

6 Claims, 87 Drawing Figures

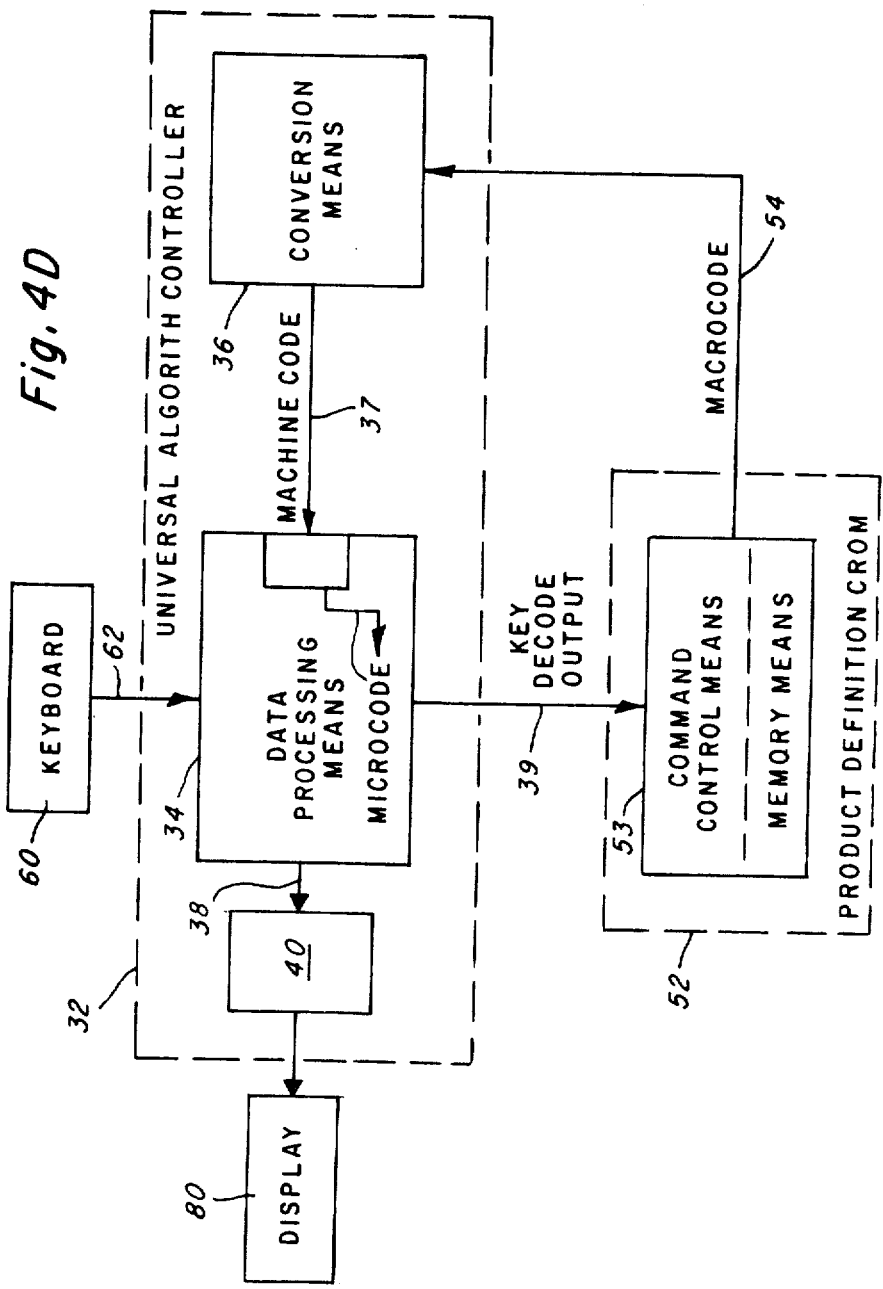

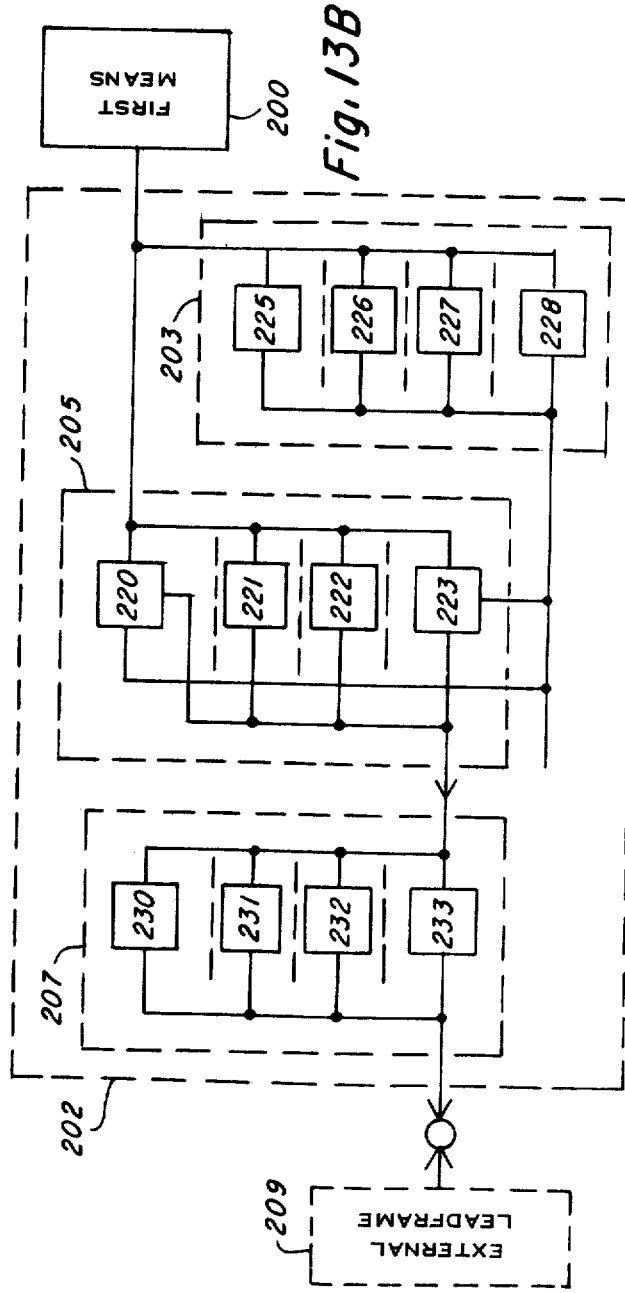

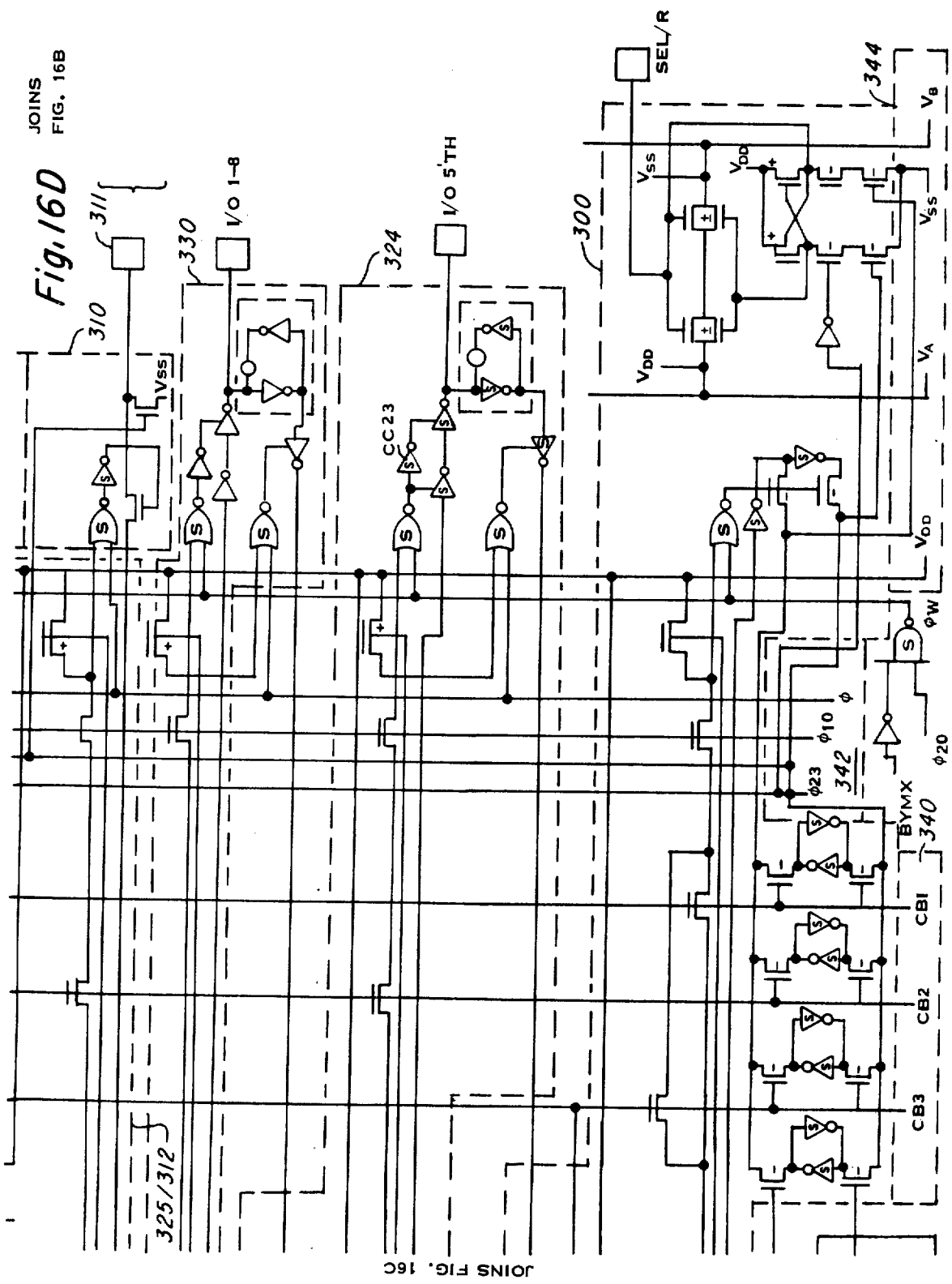

| SEQUENCE STATE (HEX) | CS | I/O1 | I/O2 | I/O4 | I/O8 | FUNCTIONAL DESCRIPTION |
|---|---|---|---|---|---|---|
| 00–0F | 0 | X | X | X | X | DESELECTED |
| 10 | 1 | 0 | 0 | 0 | 0 | NOP STATE |
| 11XXX | 1 | X | X | X | X | COMMAND COMMENCEMENT TRANSITION WHEN TRANSITION FROM 10000 TO 11XXX SEE BELOW FOR COMMAND CODES: |
| COMMANDS: | | | | | | |
| 19 | 1 | ⌐ | 0 | 0 | 1 | LOAD ADDRESS |
| 1A | 1 | ⌐ | 1 | 0 | 1 | READ ADDRESS |
| 1B | 1 | ⌐ | 1 | 0 | 1 | READ TWO DIGITS |
| 1C | 1 | ⌐ | 0 | 0 | 1 | READ SIXTEEN DIGITS |
| 1D | 1 | ⌐ | 1 | 1 | 1 | WRITE TWO DIGITS (RAM ONLY) |
| 1E | 1 | ⌐ | 1 | 1 | 1 | WRITE SIXTEEN DIGITS (RAM ONLY) |
| 1F | 1 | ⌐ | 1 | 1 | 1 | (RAM ONLY) |
| 18 | 1 | ⌐ | 0 | 0 | 0 | (RAM ONLY) |

0 = LOGIC φ LEVEL SIGNAL
1 = LOGIC + LEVEL SIGNAL
X = DON'T CARE WHETHER LOGIC φ OR 1
⌐ = TRANSITION FROM LOGIC φ TO LOGIC 1 LEVEL

Fig. 27

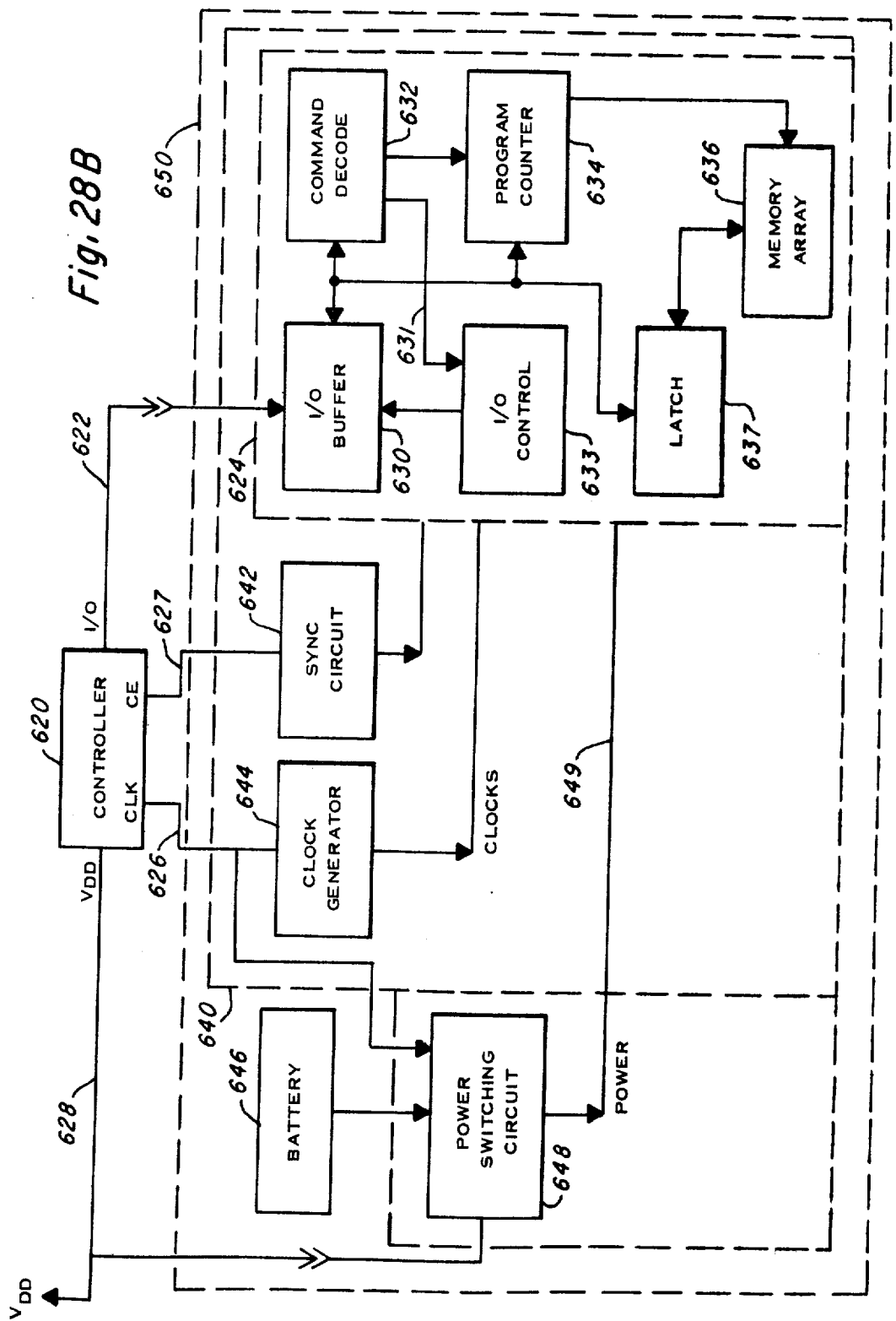

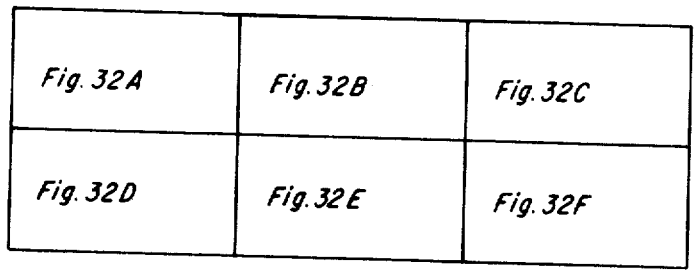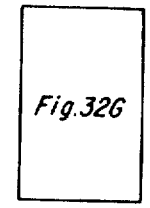
Fig. 31
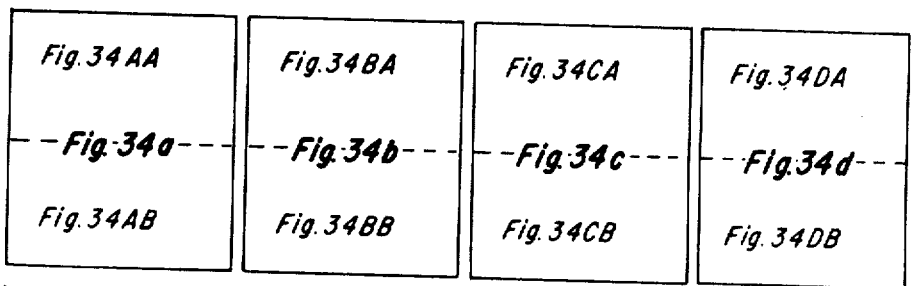
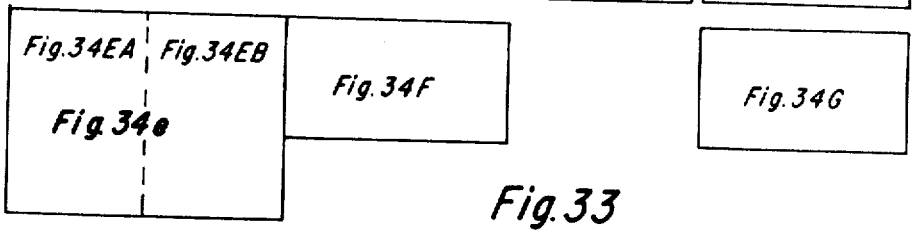
Fig. 33
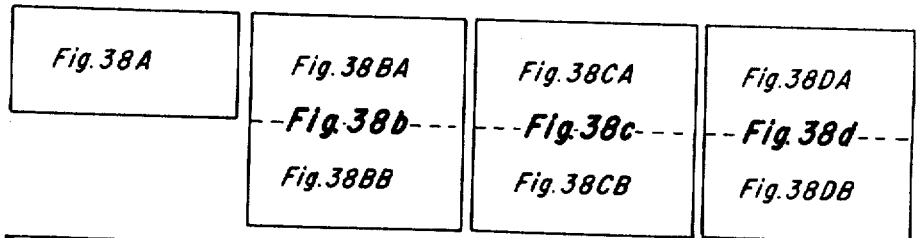
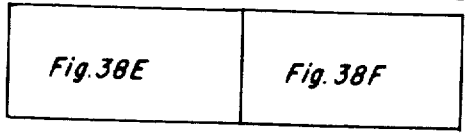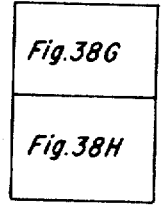
Fig. 37
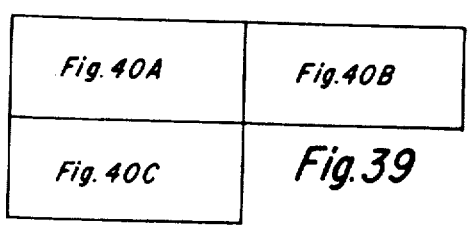
Fig. 39

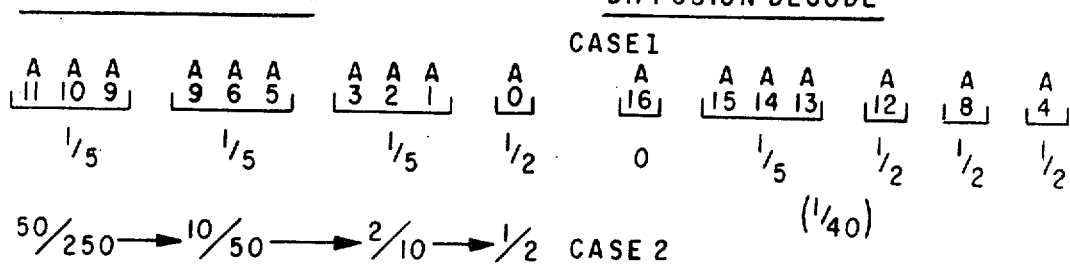
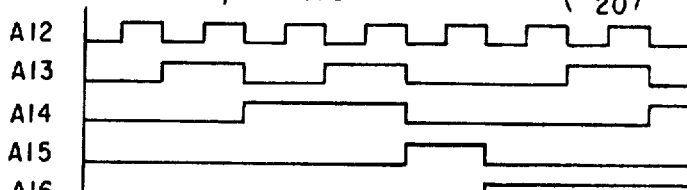
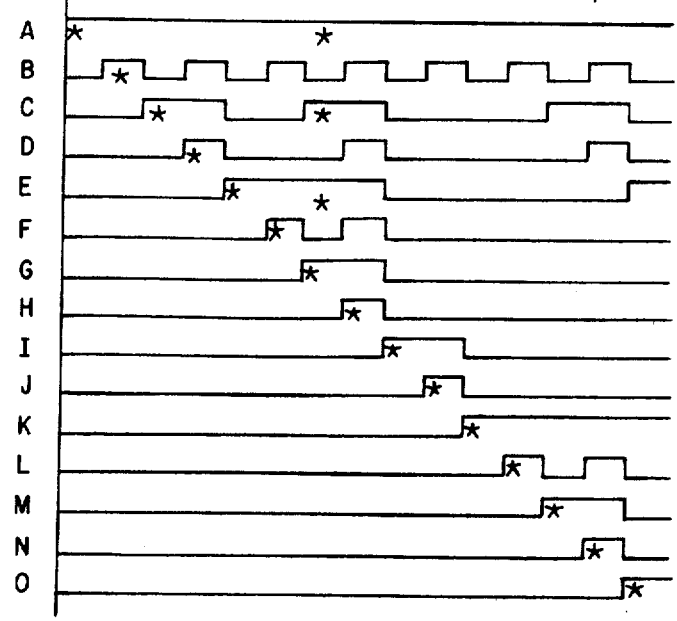
Fig. 32G

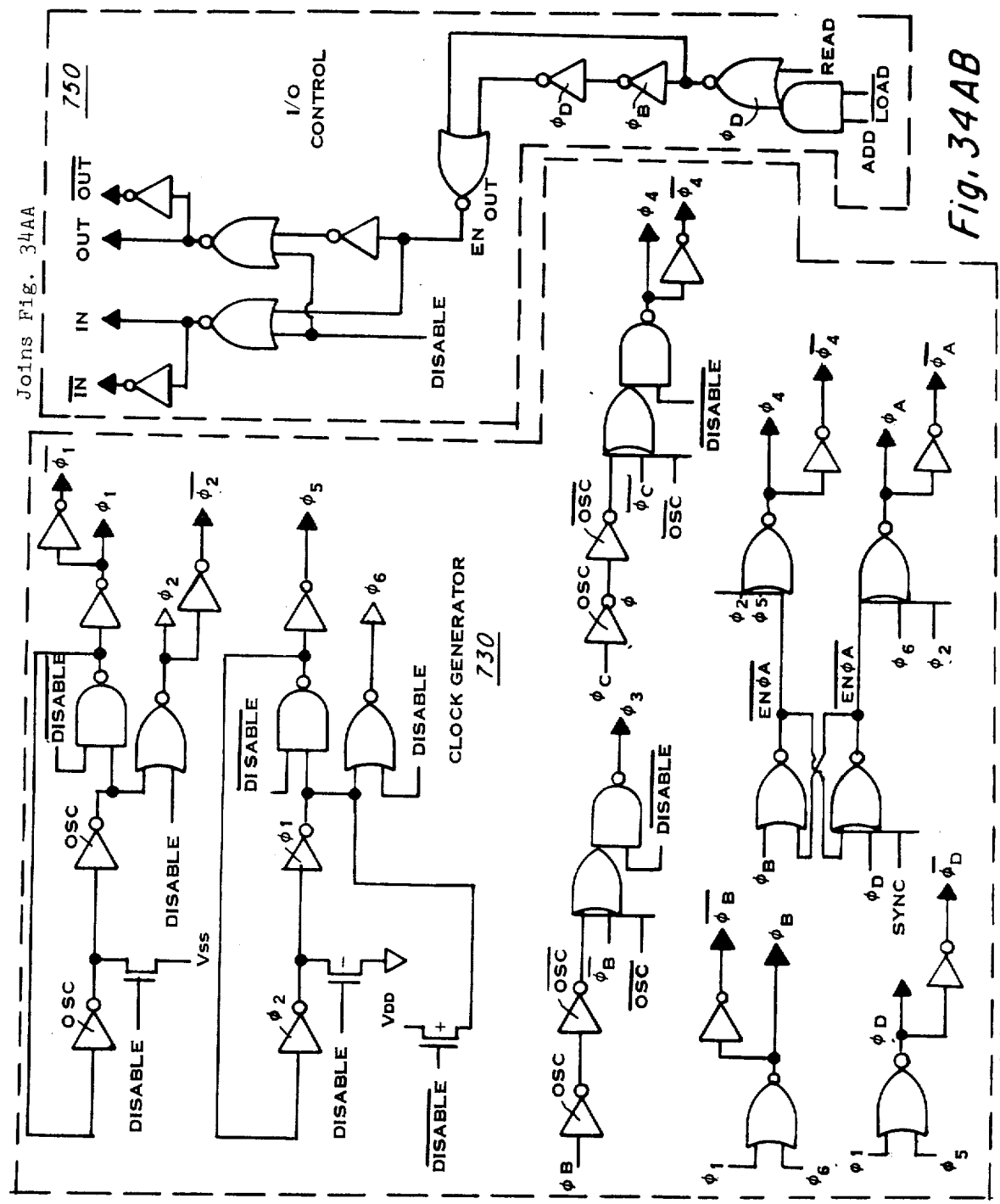

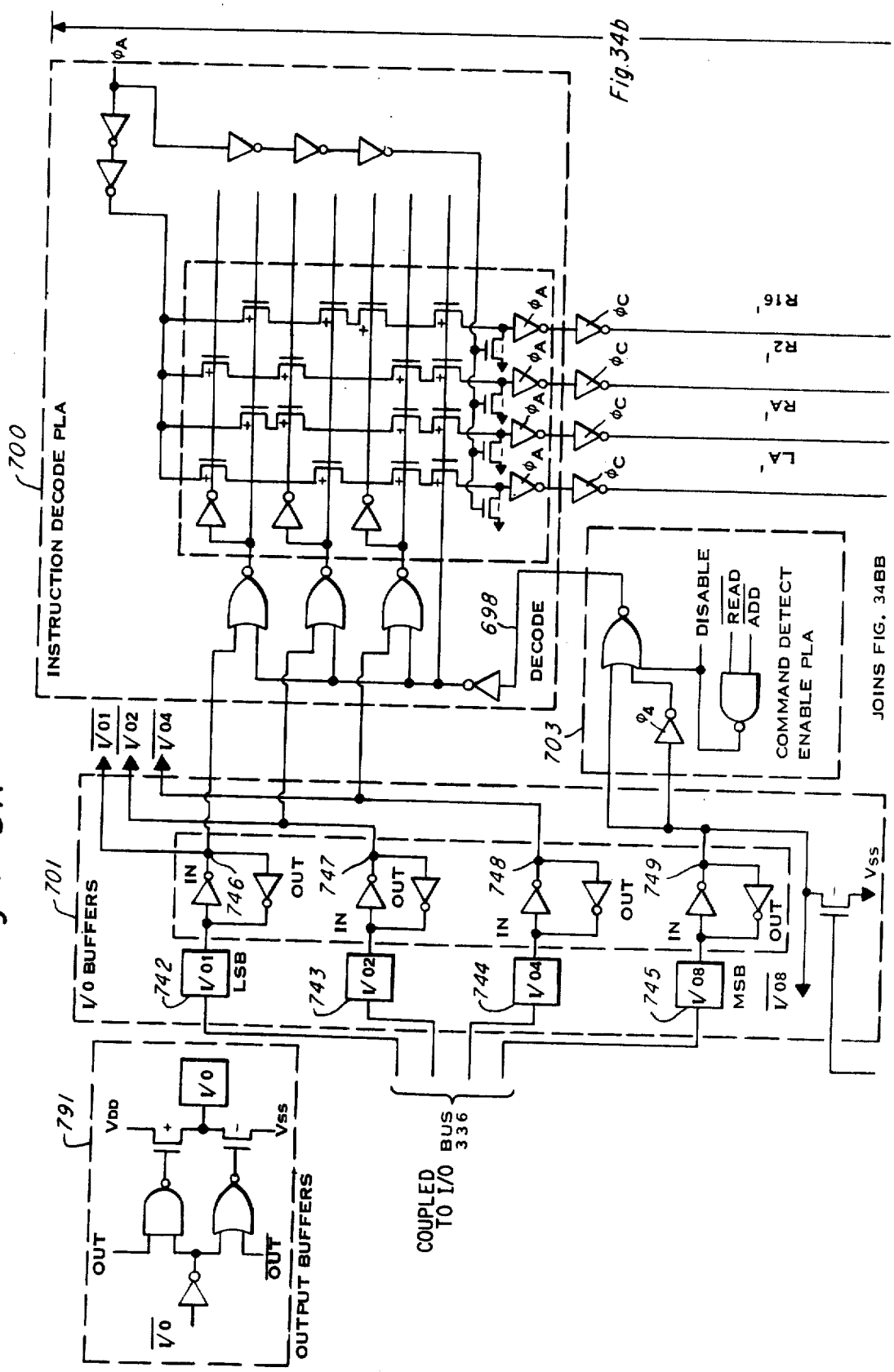

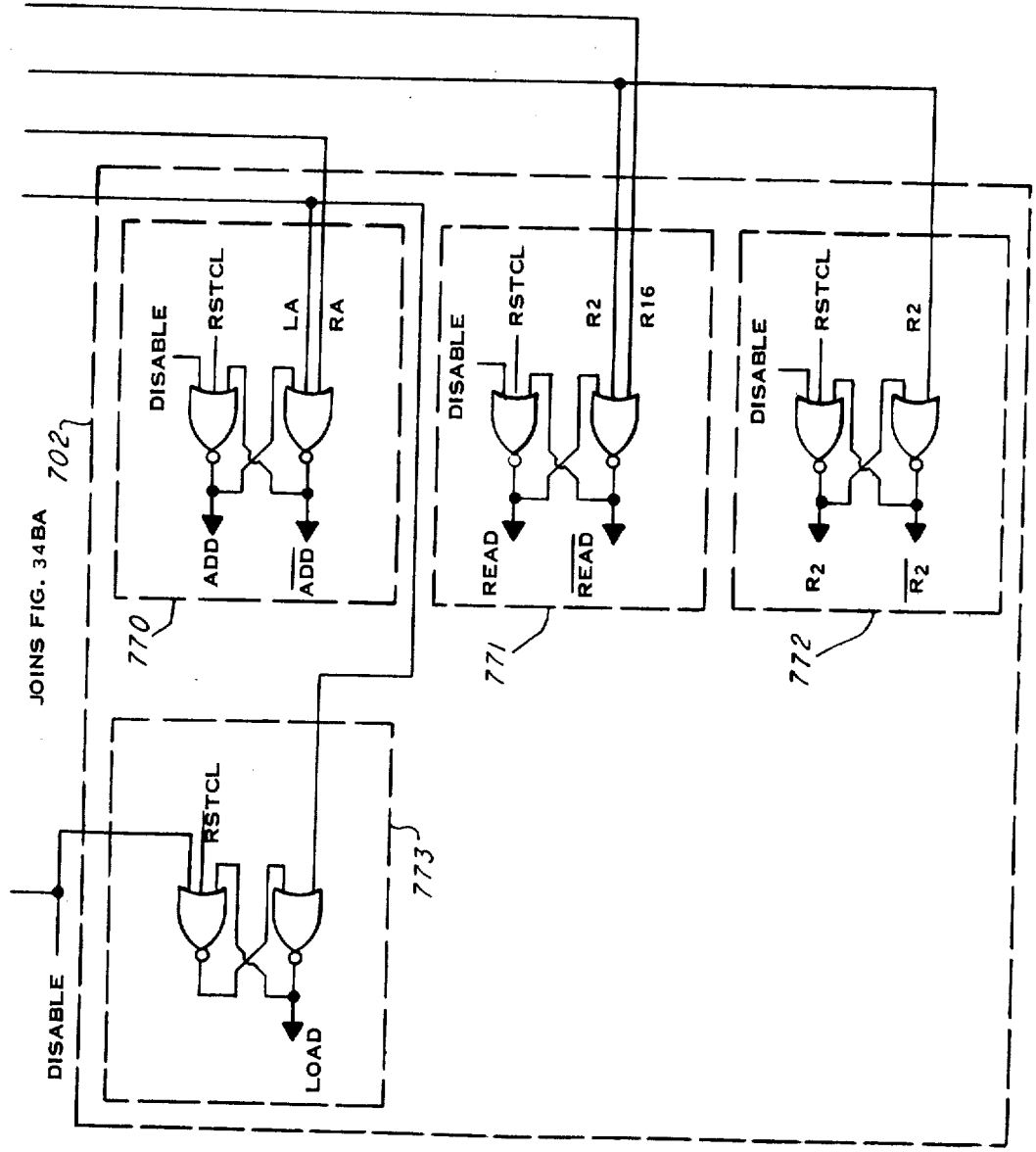

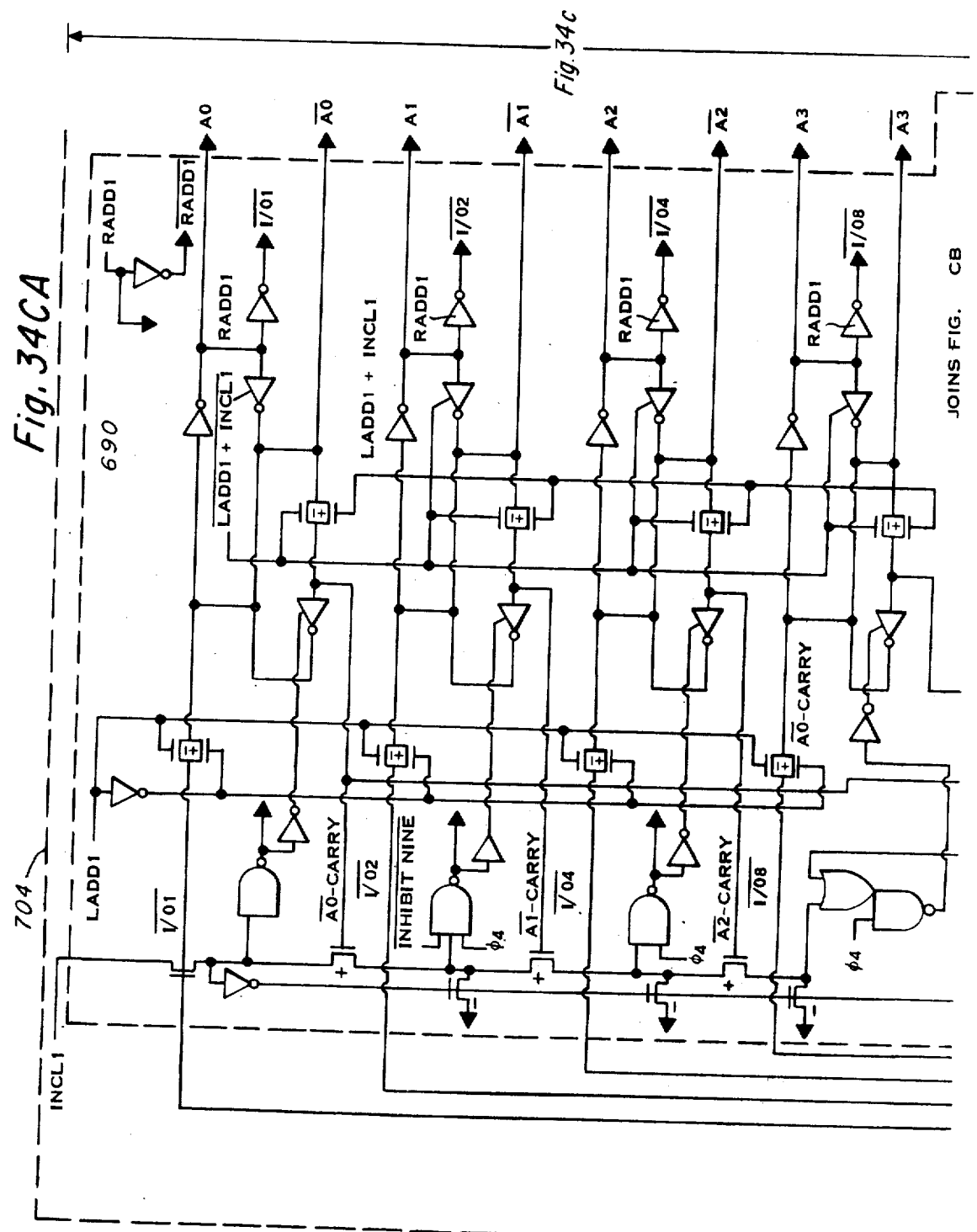

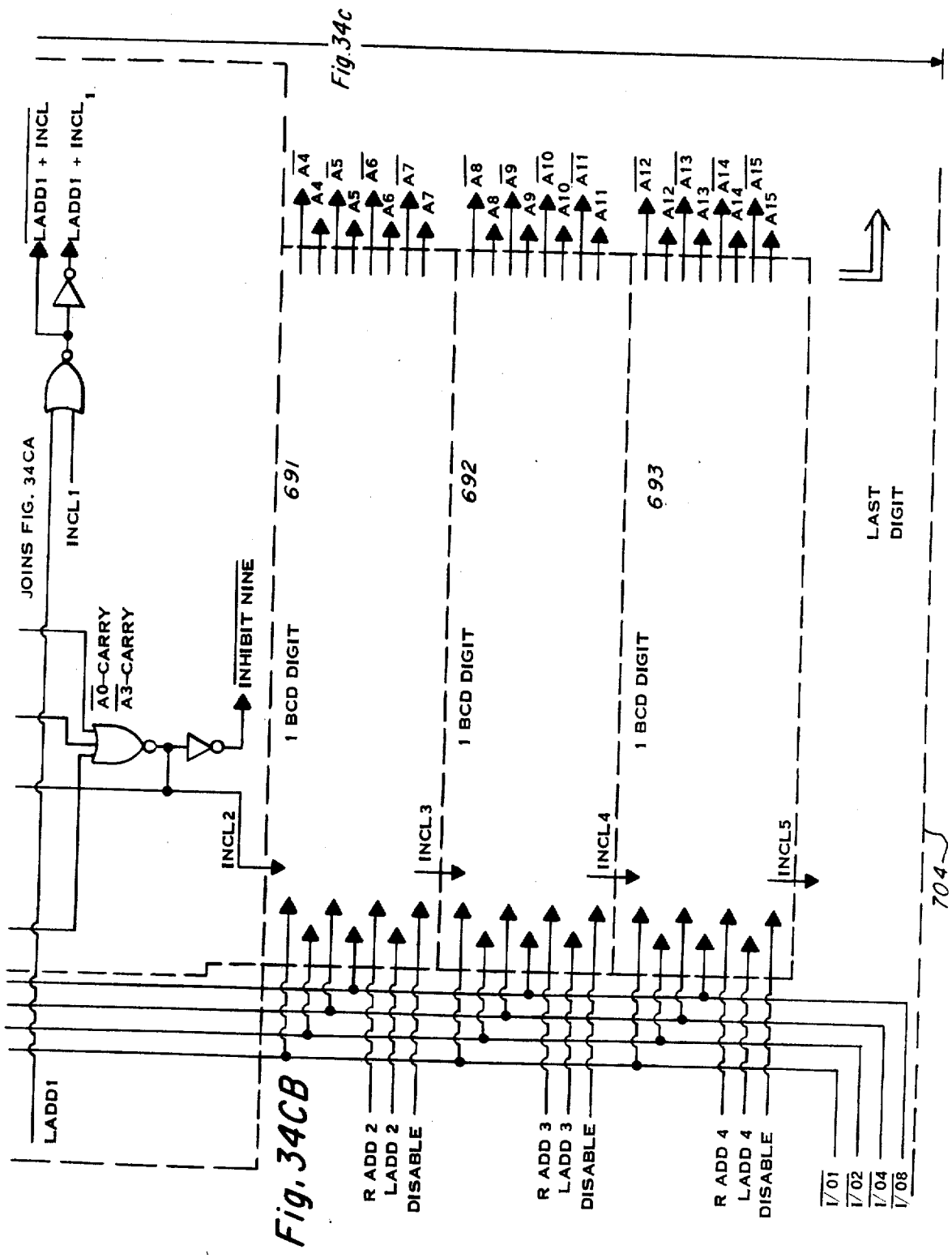

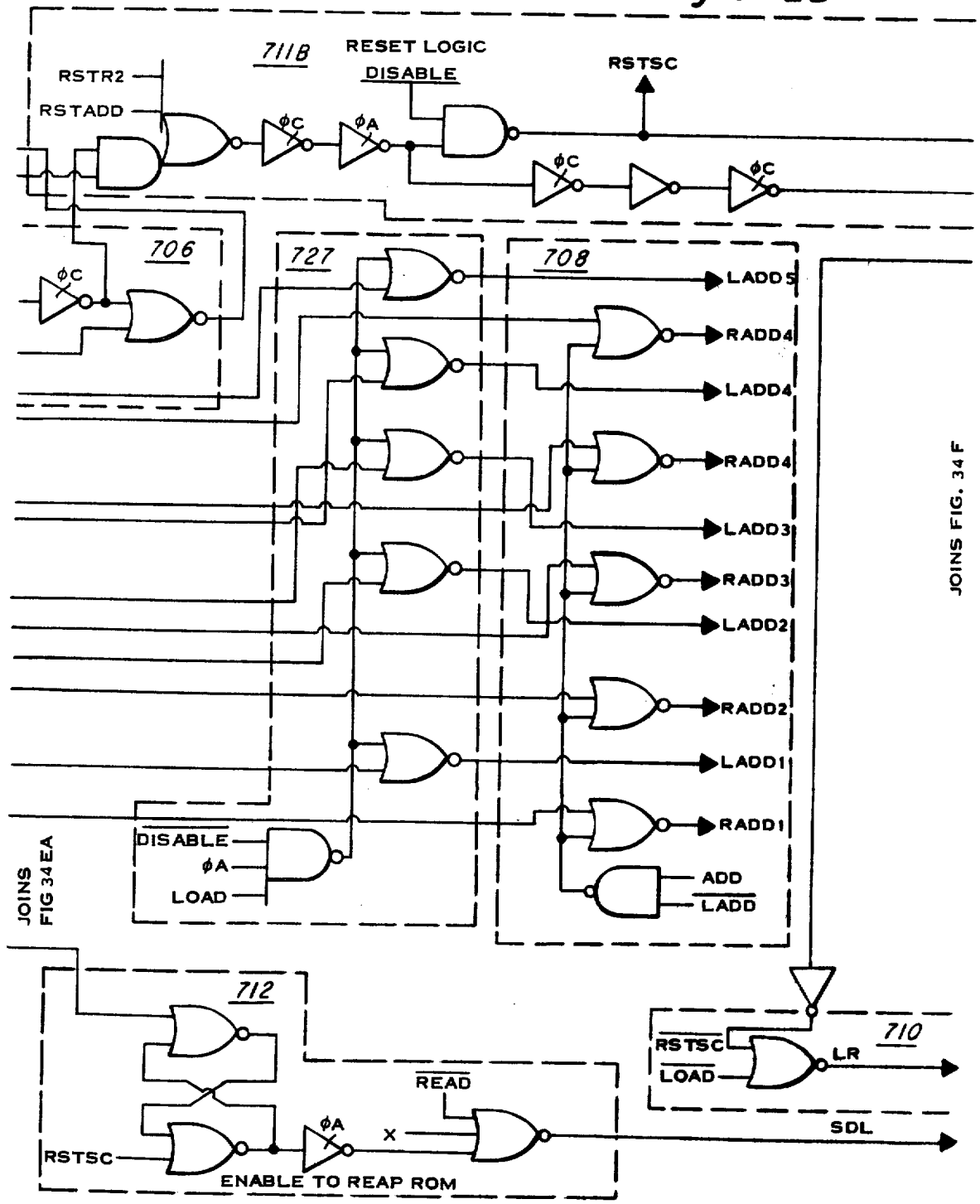

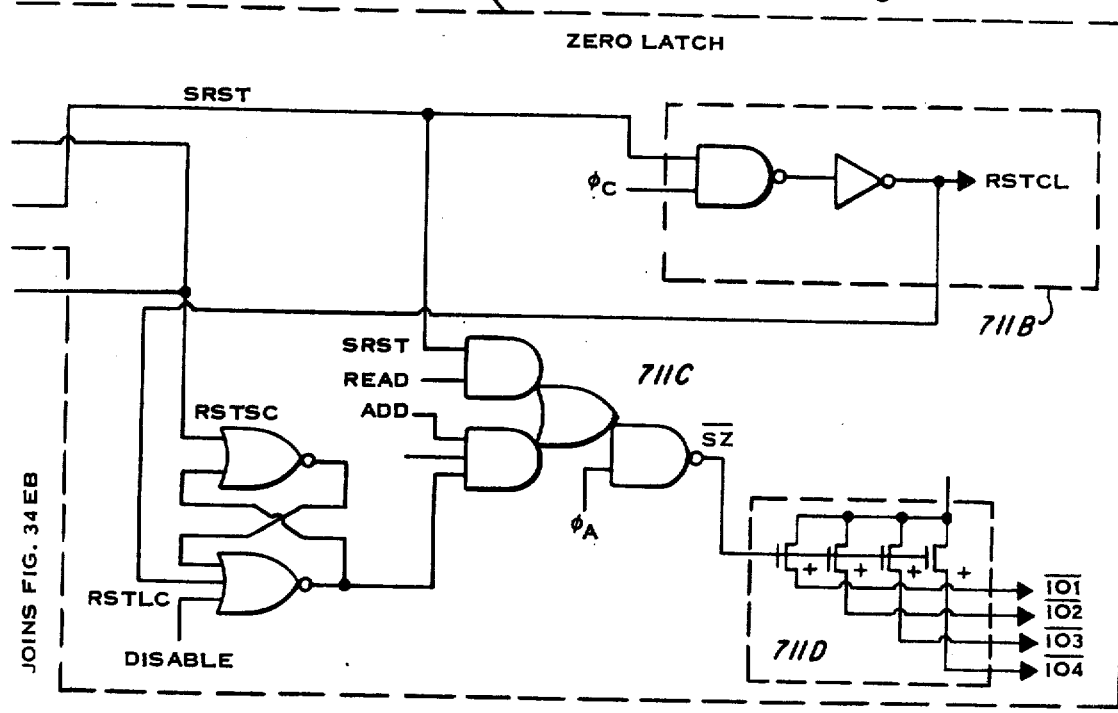
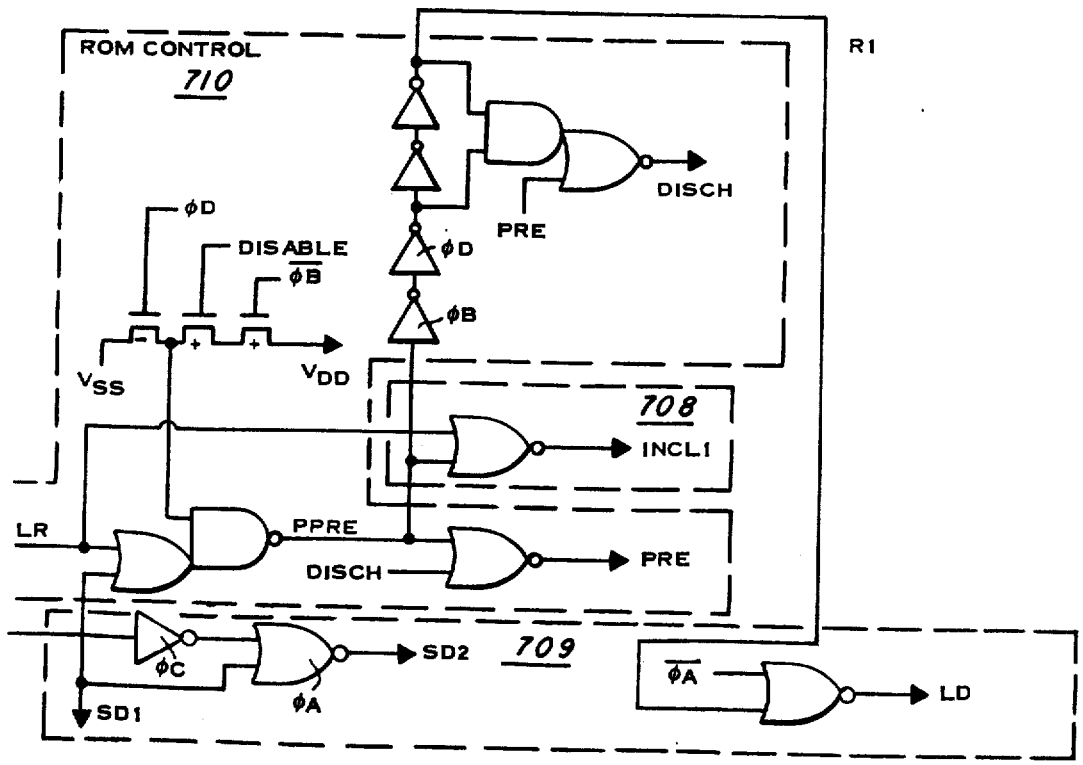
Fig. 34F

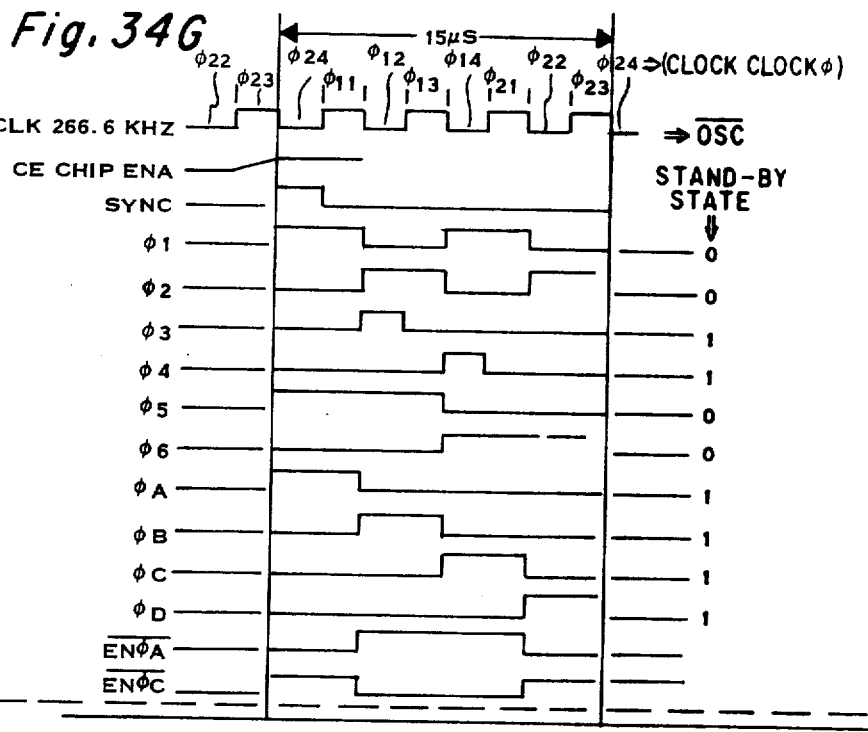
Fig. 34G
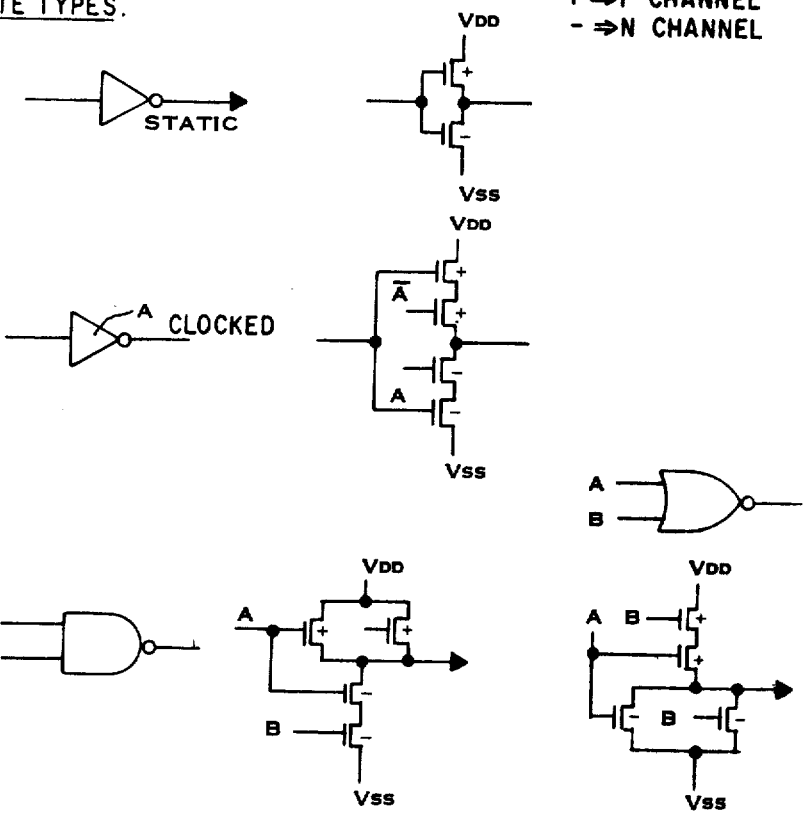
NOTE GATE TYPES:
+ ⇒ P CHANNEL
− ⇒ N CHANNEL

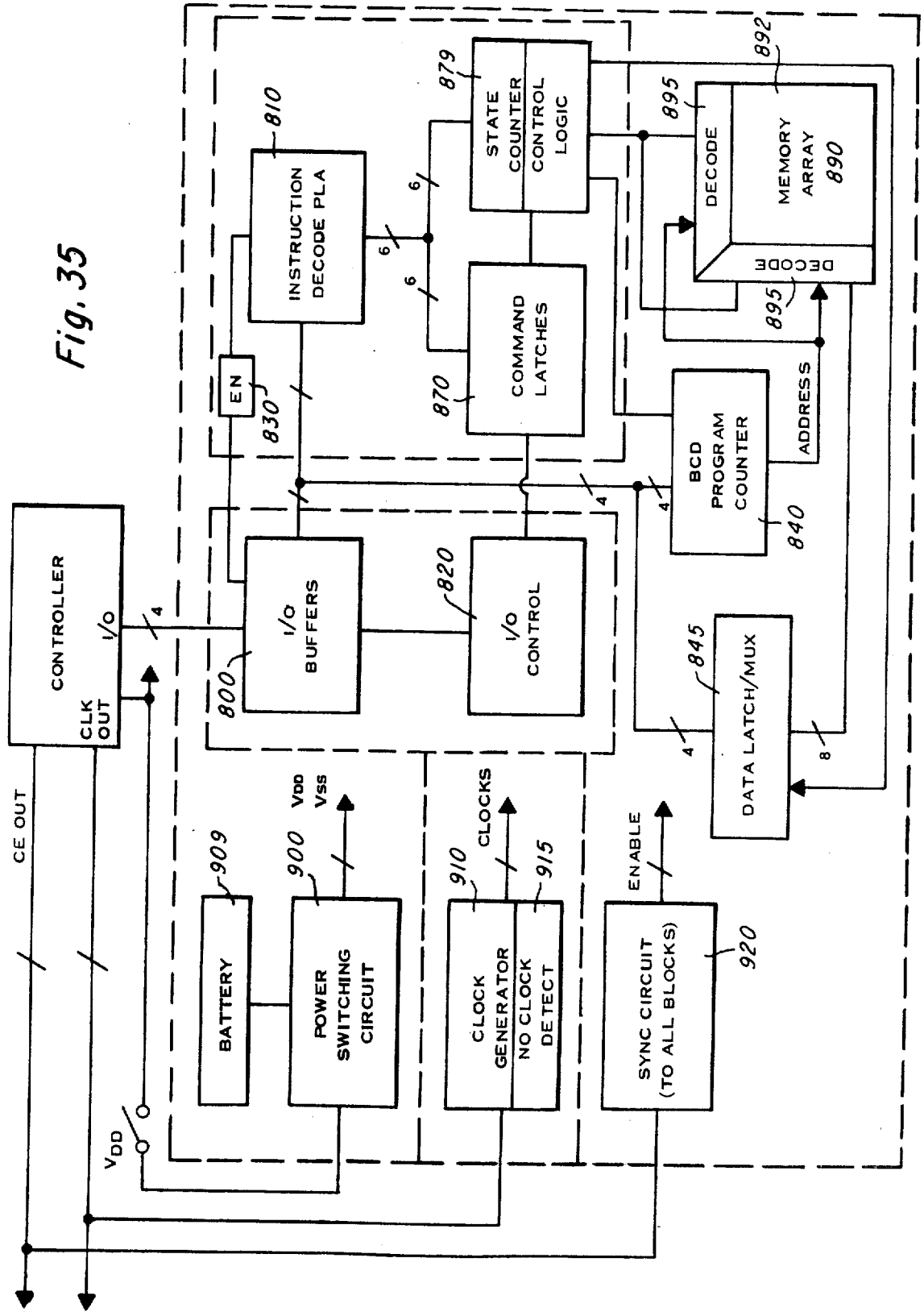

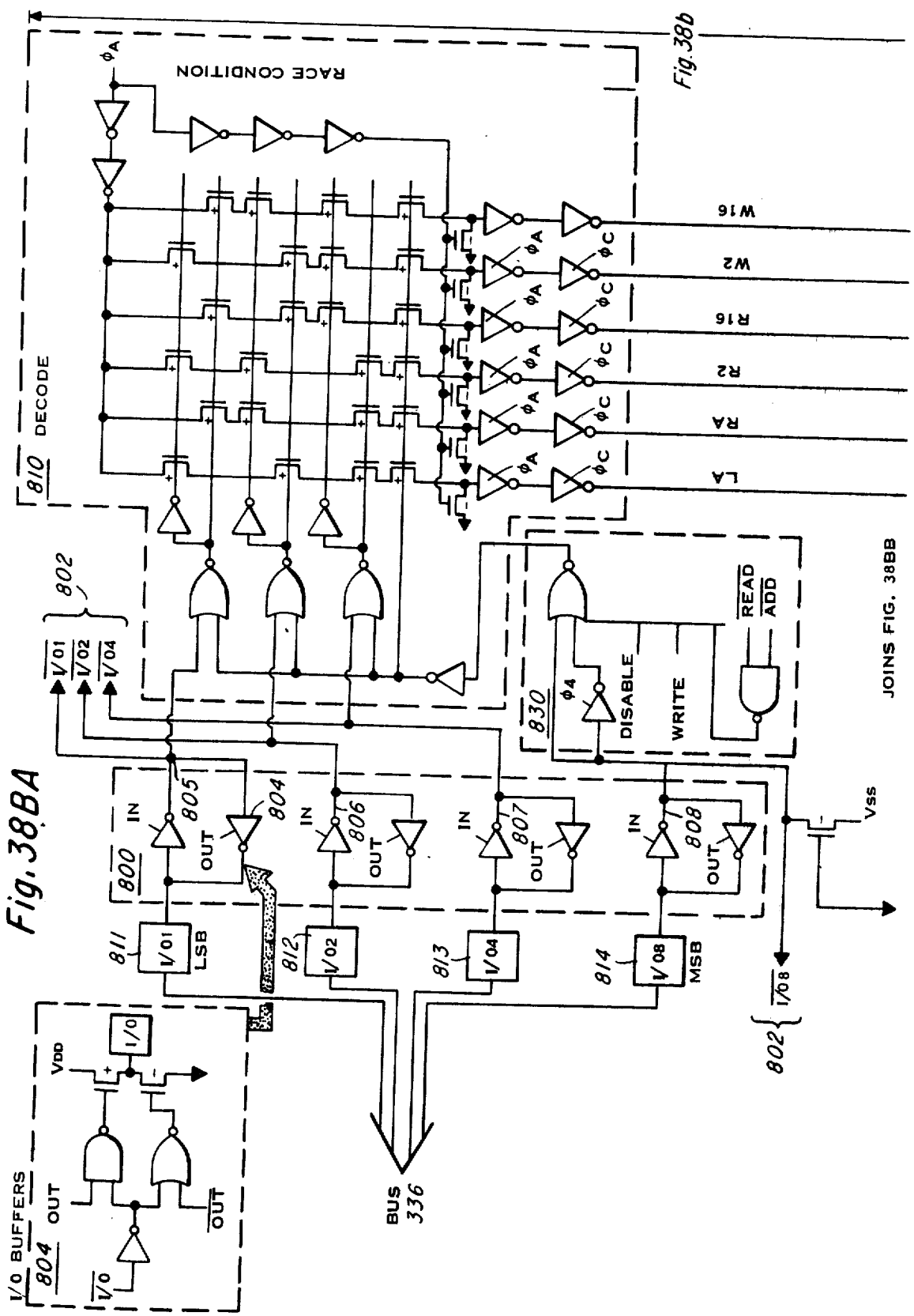

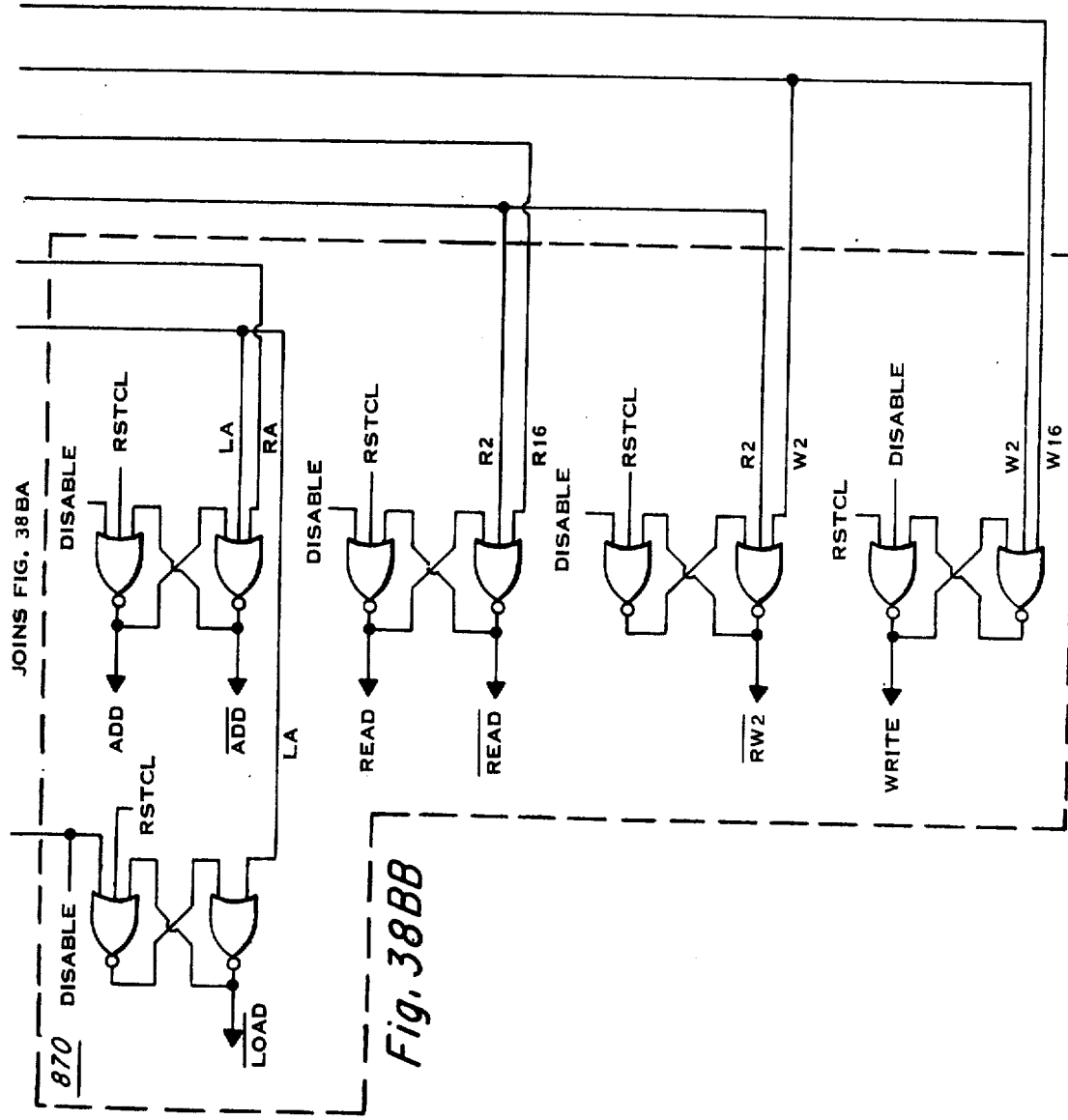

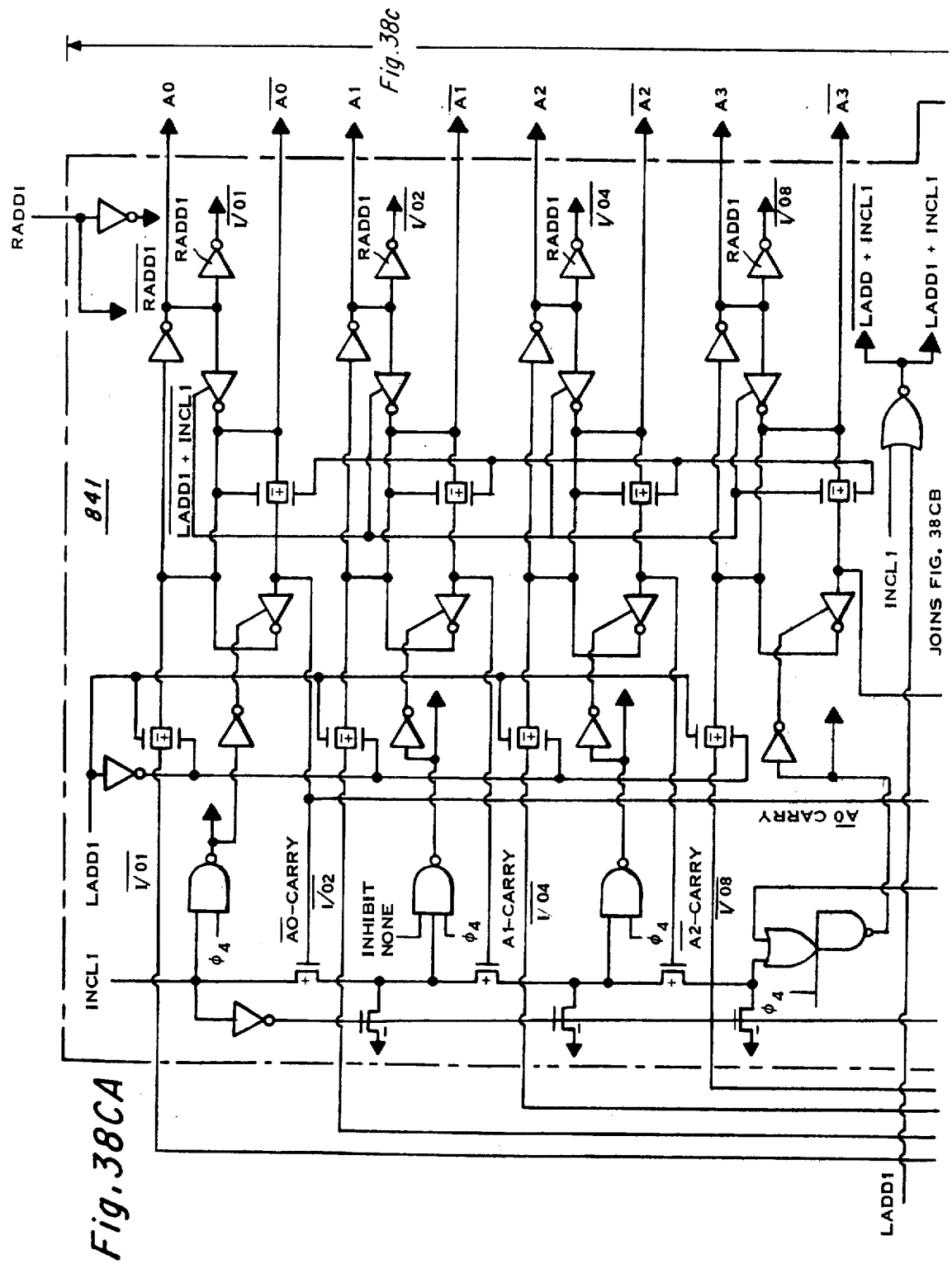

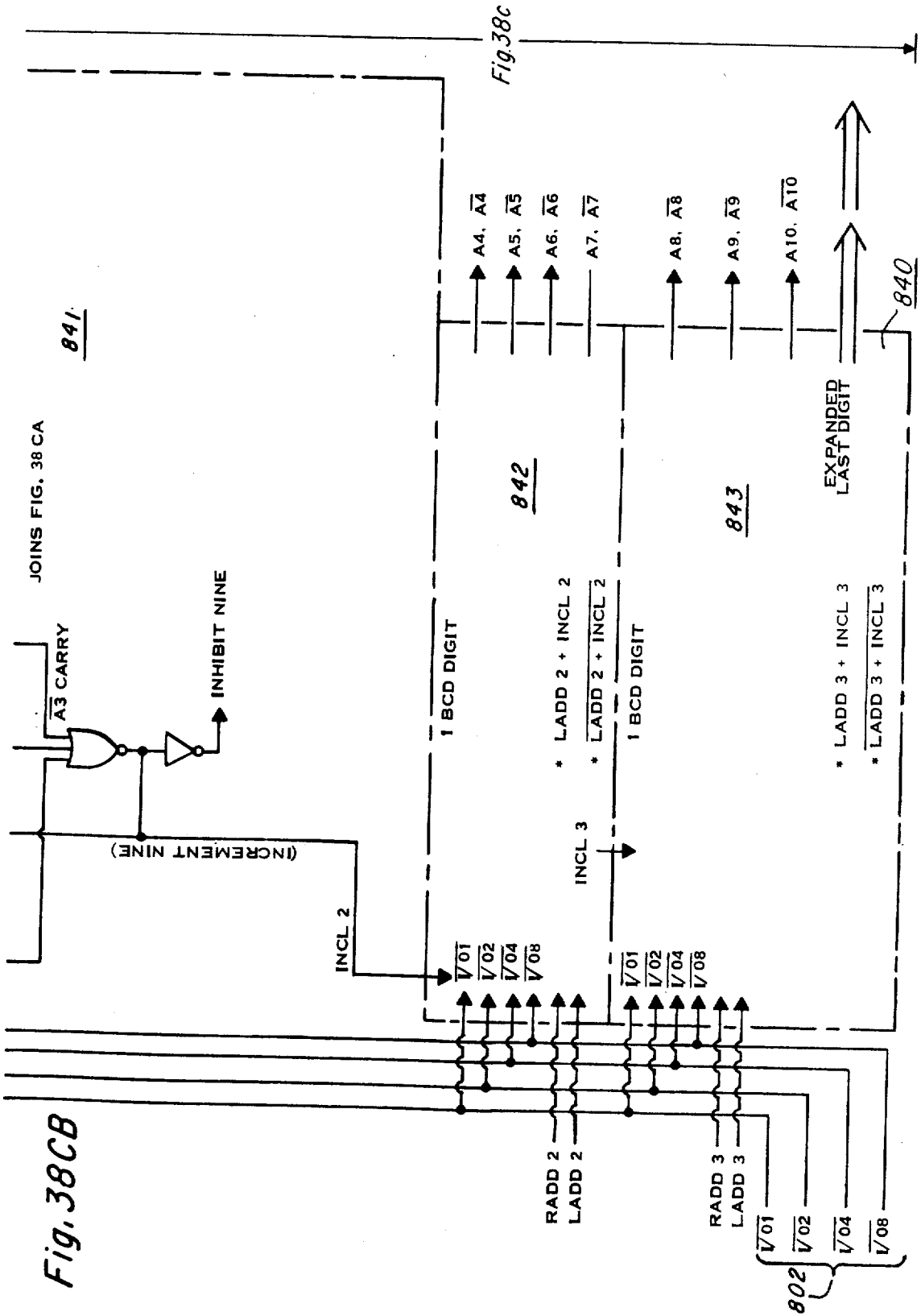

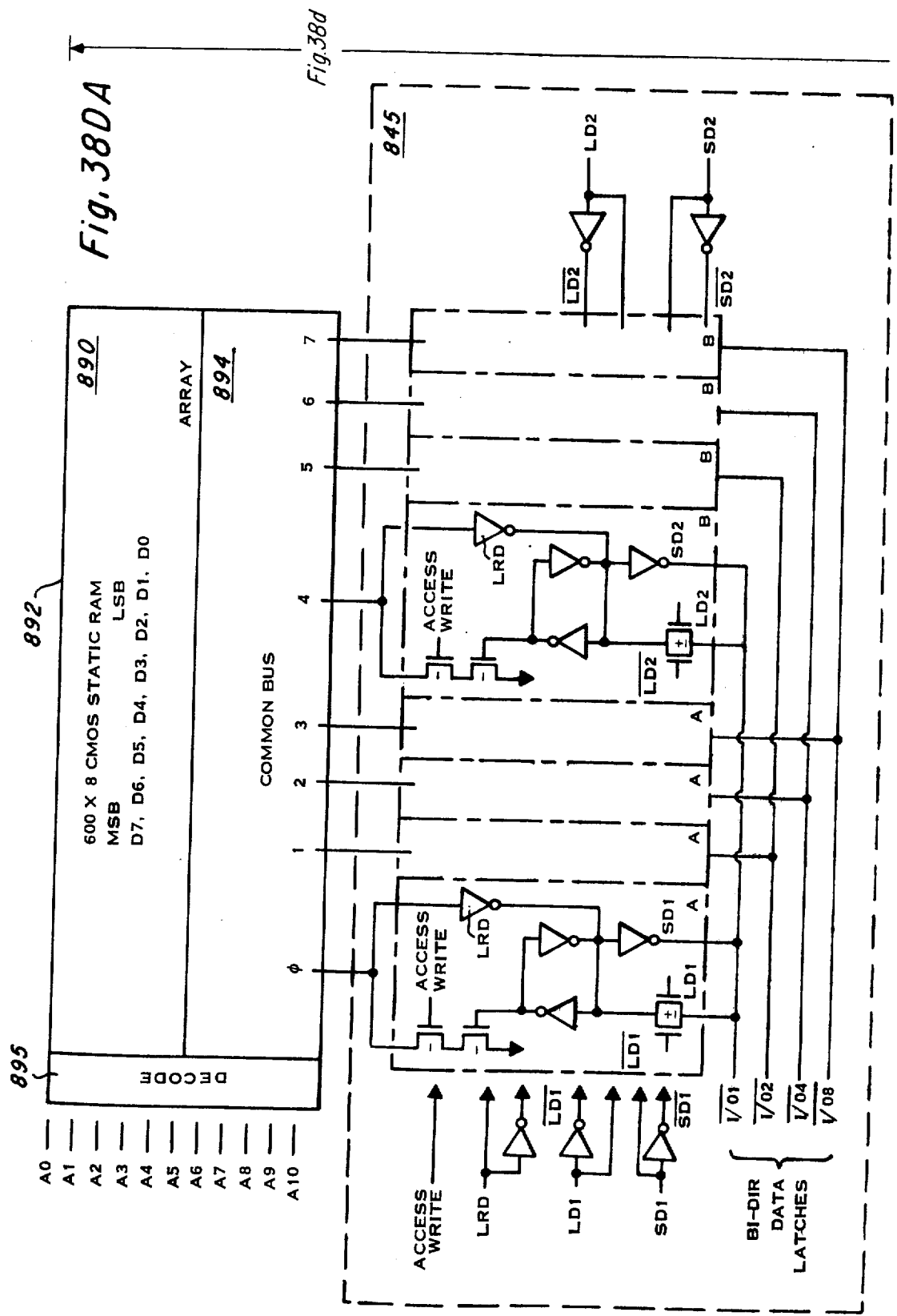

NOTE GATE TYPE:

+ ⇒ P CHANNEL
− ⇒ N CHANNEL

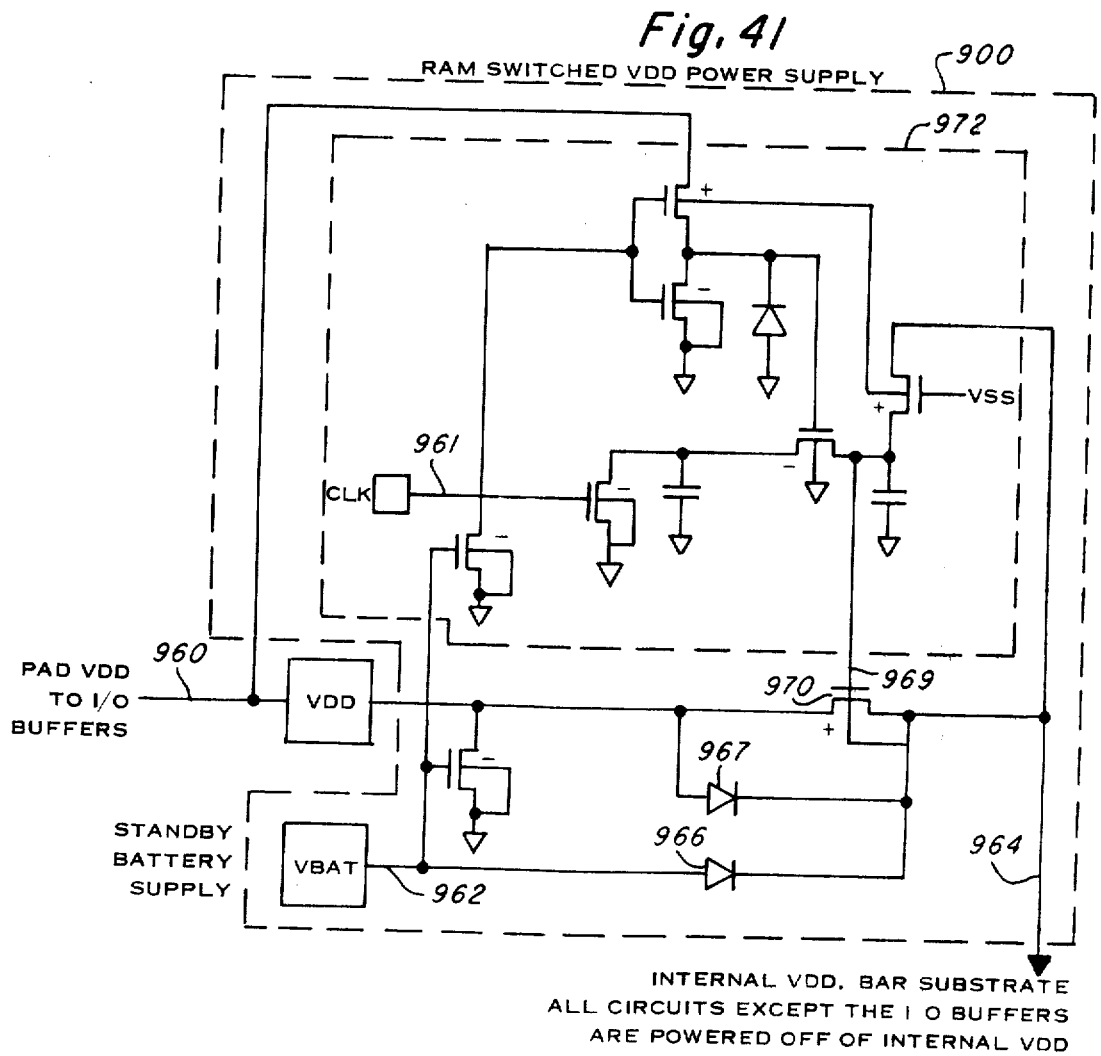

MEMORY SYSTEM HAVING A COMMON INTERFACE

BACKGROUND OF THE INVENTION

This invention relates to a bus interface system for coupling memory to processing circuits in a data processing system such as a calculator. More particularly, this invention relates to a common bus for address, data, and command (control) signals without requiring a separate bus for identifying whether address, data, or control signals are presently being transferred on the common bus as heretofore required. Alternatively, separate buses have been utilized for conducting data, control, and address signals between said memory circuits and said data processing circuits. However, the use of separate buses, either for identifying the type of signal on common bus, or for each carrying a separate type of signal requires additional circuitry and increases the physical size of the data processing system utilizing such buses.

SUMMARY OF THE INVENTION

A data processing system having separate read-only memory and read-write memory integrated circuits coupled to a central processing unit via the same interface system. The data processing system is comprised of bus means having either command, address, or data signals present and conducted thereon. In the preferred embodiment, the bus means is comprised of a four binary digit bidirectional conductor bus coupling between the central processing circuit and the memory circuits. The data processing system is further comprised of processor means coupled to the bus means for selectively transmitting selected ones of said command, data and address signals, onto the bus means, said processor means further including means for receiving certain other ones of said command, data, and address signals from the bus means; and memory means including in the preferred embodiment read-only memory circuits and read write memory circuits, coupled to the bus means and to the processor means via the bus means, including means for selectively transferring data with the processor means in response to said received command and address signals being within a unique subset of commands and addresses. In the preferred embodiment, each separate individual circuit comprising the memory means includes the means for responding to the command signal received via the bus means and for storing or outputting address signals or data signals responsive to decoding said received command signal. The present invention allows the same instruction set and commands to be used to address both read-out memory and read-write memory via a command bus, said bus means, and reduces the number of bus lines which are necessary for coupling between said memory means and said processor means.

BRIEF DESCRIPTION OF THE DRAWINGS

The novel features believed characteristic of the invention are set forth in the appended claims. The invention itself, however, as well as a preferred mode of use, further objects, and advantages thereof, will be best understood by reference to the following detailed description of illustrative embodiments when read in conjunction with the accompanying drawings, wherein:

FIGS. 4A-D are functional block diagrams of alternate embodiments of a modular system design utilizing the present invention;

FIGS. 13A-B are functional block diagrams of a programmable pinout interconnect means which may be employed in the controller 30 of FIGS. 4A-D. and in the modular integrated circuit designs of FIGS. 6-8;

FIGS. 16A-D show detailed schematic representations of functional blocks from FIGS. 14A-B;

FIG. 27 is a state command table for the communications protocol of the present invention as described with reference to FIGS. 26A-E and may better be understood in conjunction with FIGS. 26A-E;

FIGS. 28A-C are block diagrams of systems embodying the command protocol as discussed with reference to FIGS. 26A-F and 27, the I/O latch as described with reference to FIG. 25, and the modular system as discussed with reference to FIGS. 4 and 5, with FIG. 28A embodying a block diagram of a system having a memory means (either read-write, or read-only, or both types of memories);

FIG. 28B is a detailed block diagram of the system shown in FIG. 28A showing also the non-volatile memory embodiments of the memory means 624 of FIG. 28A, and FIG. 28C is a block diagram of a non-volatile memory module embodying the memory means 650 of FIG. 28B;

FIG. 31 is a drawing interrelationship layout for FIGS. 32A-G;

FIGS. 32A-G are a detailed schematic circuit representation of the read-only memory array cells 735 and associated decode circuit 714 corresponding to the memory array 636 of FIG. 28B and memory array 735 of FIG. 29;

FIG. 33 is a drawing interrelationship layout of FIGS. 34A-G;

FIGS. 34A-G are a detailed schematic circuit representation of the clock generator 730, the No-Clock detector 740, the sync circuit 720, the I/O buffers 701, the I/O control logic 750, the enable circuit 703, the instruction decode, the PLA 700, the command latch 702, the state counter 706, the control logic 707, the data latches 705, and the BCD program counter 704, as described with reference to FIGS. 29 and 30;

FIG. 35 is a block diagram of the read-write embodiment of the memory module 650 and the memory means 640 as shown in FIGS. 28B and C;

FIG. 37 is the layout interrelationship diagram of FIGS. 38A-H;

FIGS. 38A-H are detailed schematic circuit diagrams of the block diagrams of FIGS. 35 and 36;

FIG. 39 is a drawing interrelationship diagram of FIGS. 40A-B;

FIGS. 41-42 are detailed schematic diagrams of the power switching circuit 900 of the memory means 640 of FIG. 28B and FIG. 35.

DETAILED DESCRIPTION OF THE INVENTION

Figure 1:
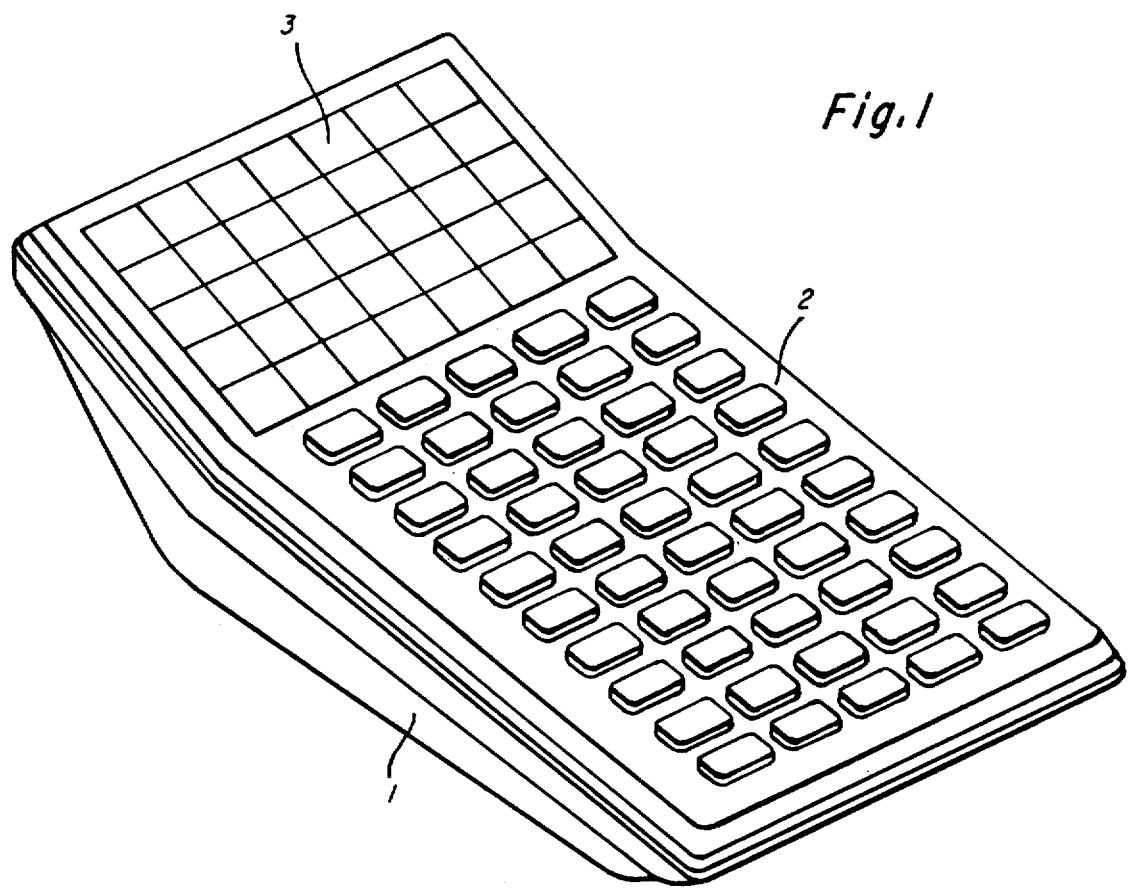
FIG. 1 is a pictoral view of a portable, electronic, handheld calculator of the type which embodies the present invention.

Referring to FIG. 1, an electronic portable calculator of the type which may employ features of this invention is shown in pictoral form. The calculator 1 includes the keyboard 2, and the display 3. Display 3, in the preferred embodiment, consists of 16 alpha-numeric characters, each provided by liquid crystal display devices, or an array of light emitting diodes, a vacuum florescent tube display, or other display device. The display is preferably implemented having complete alpha-numeric display capability so as to be capable of displaying English language messages as well a permitting the display of data in scientific notation, or other output formats. Of course, the type of display and the number of digits displayed in a design choice. The display may be of the 7 segment, 8 segment, 9 segment, 13 segment, or 5×7 dot matrix display character, depending on the character display flexibility desired. In a preferred embodiment, a 5×7 dot matrix per character position is utilized to allow for complete alpha-numeric and special character display. A keyboard, 2, or other input means, preferably includes a set of number keys (0-9), a decimal point key, a plurality of function command keys including, for example, exponential, logarithmic, trigonometric and hierarcy functions. The expotential and logarithmic function command keys include, for example, $X^2$, $\sqrt{X}$, $1/X$, $\log X$, $\ln X$, $y^x$, and $Y\sqrt{X}$. The trigonometric functions include, for instance, the sine, cosine, tangent, and their inverses, the hyperbolic sine, hyperbolic cosine, and hyperbolic tangent, and inverse hyperbolic functions. Other function command keys include store (STO), and recall (RCL) keys for respectively storing and recalling a number stored in one of the memory registers. The enter exponent key (EE) allows exponent entry of the number displayed in scientific notation. A +/− key is provided for changing the sign of the display number. An exchange key (X:Y) is provided for exchanging the operator and the operand of an arithmetic function. More conventional function command keys are supplied, including the clear key (C), the clear entry key (CE) and the plus (+), minus (−), multiply (×), divide (÷), and equal (=) keys. Other function keys, in a preferred embodiment, may include alpha-numeric variable keys (A-Z), parenthesis keys, hierarchy control keys, label key (LBL), and programmable feature function keys. The calculator is further provided with OP code keys for performing special functions such as slope, intercept, plotting operations, alpha-numeric operations, operating system hierarchy interface and control and the like.

Figure 2:
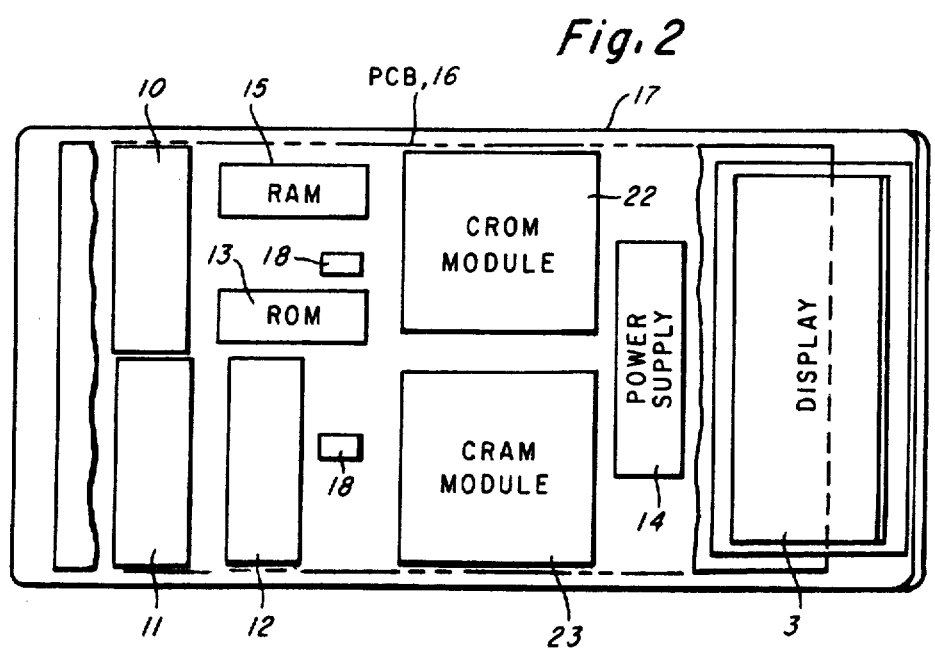
FIG. 2 is a bottom view of the calculator of FIG. 1 showing the placement of major components in the preferred embodiment of the invention of FIG. 1.

Referring to FIG. 2, a bottom view of the calculator 1 of FIG. 1 is shown. The placement of major components in a preferred embodiment of the calculator of FIG. 1 is shown. Controller integrated circuit chips 10, 11, and 12 provide the intelligence and control capabilities of the calculator system. Read/write memory 15, and read only memory 13, provide additional base system data storage beyond that provided on the controller chips 10, 11 and 12. A power supply 14 provides all necessary working voltages to the remainder of the calculator system's electronic components. The controller devices 10, 11 and 12, the read/write memory 15, the read only memory 13, and the power supply 14 are mounted to a main printed circuit board 16 within a calculator case 17. Additionally, compartments within the calculator case 17 are coupled to the main printed circuit board 16 to allow for interconnection of plug-in memory modules 22 and 23 for interconnection to the controller chips 10, 11 and 12.

Figure 3:
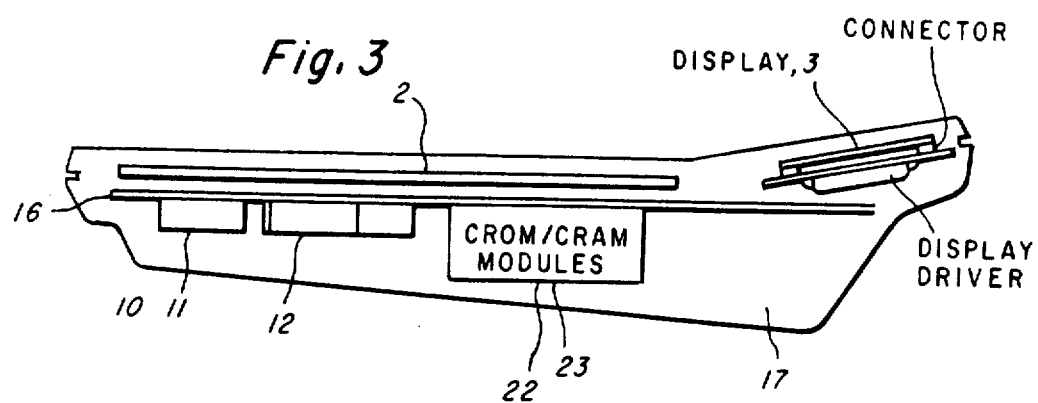
FIG. 3 is a side view of the calculator system of FIG. 1 and 2 detailing the relative placement of components within the calculator housing.

Referring to FIG. 3, a side view of the calculator system of FIGS. 1 and 2 is shown, detailing the relative placement of the controller chips 10, 11, and 12, the display 3, the keyboard 2, printed circuit board 16, and the memory modules 22 and 23, within the calculator case housing 17.

Figure 4A:
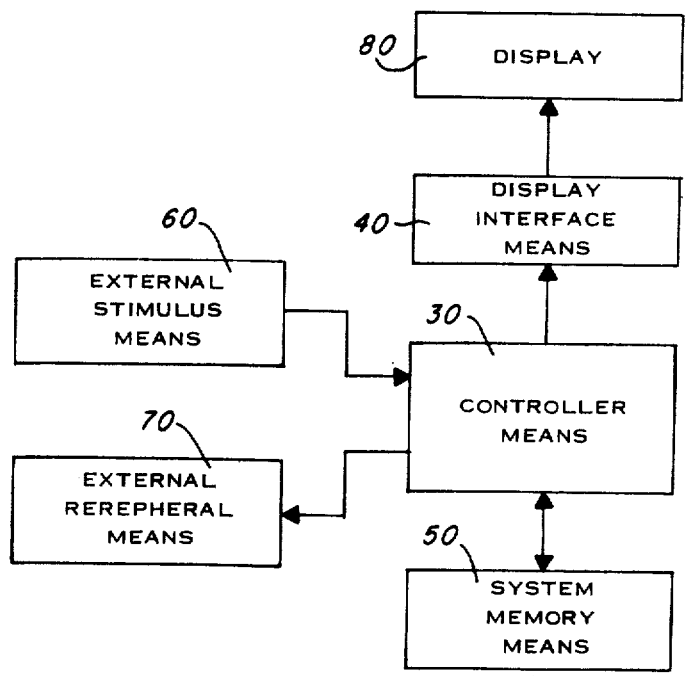
Figure 4B:
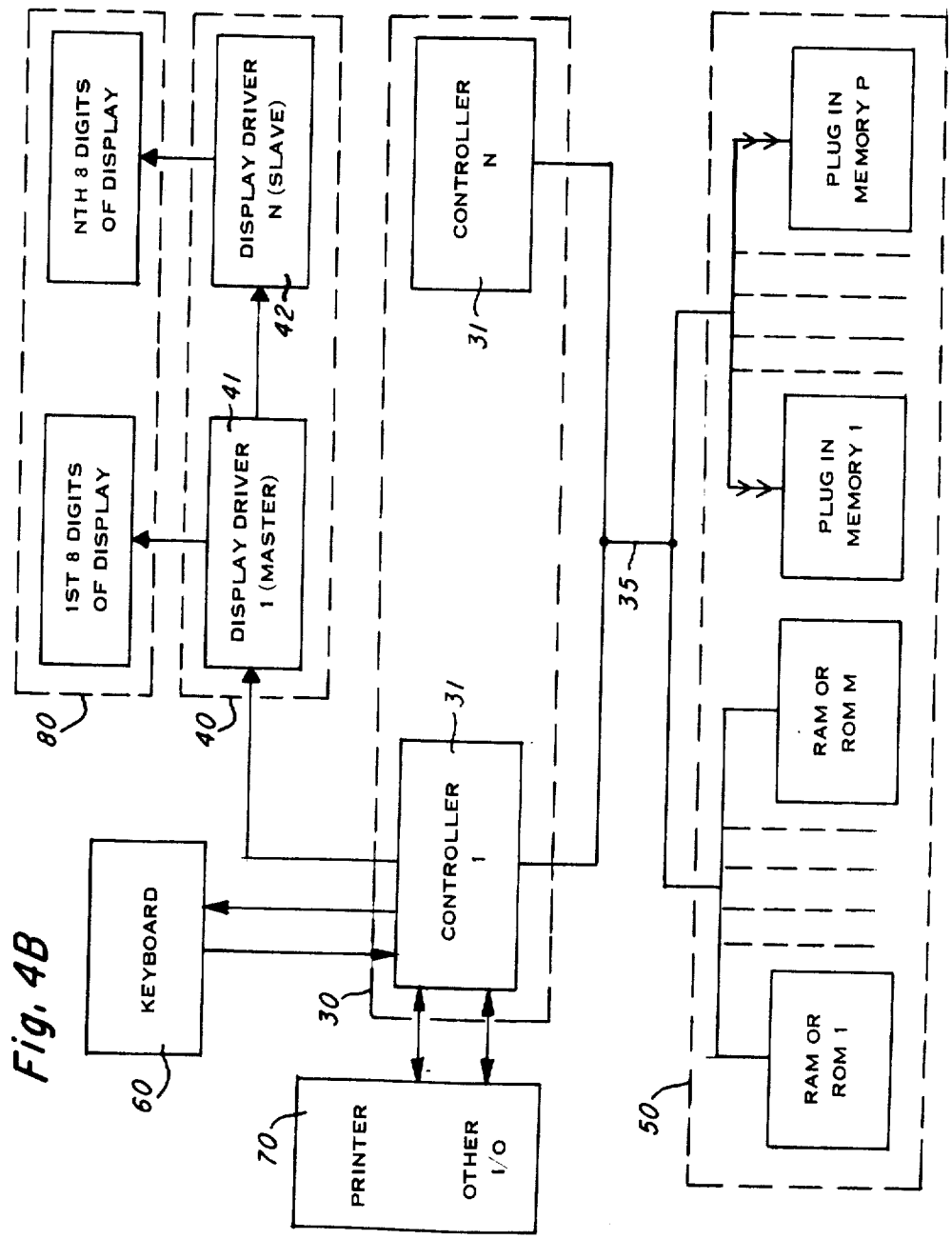

Referring to FIGS. 4A–D, block diagrams of alternate embodiments of modular system design of the present invention are shown. Referring to FIGS. 4A–B, modular controller means 30 is comprised of at least one controller integrated circuit 31 having modular bar size, modular bar I/O, and on bar functional modularity interchangeability within the integrated circuit 31. The controller means 30 provides the central processing capability of the modular system. The controller means 30 may comprise a single modular integrated circuit controller 31, or a plurality of modular integrated circuit controllers 31 interactively forming the controller means 30. In a preferred embodiment, each modular integrated circuit controller 31 is comprised of fixed logic including data processing logic, instruction decode, and other processing and decoding logic functions; modular input and modular output interface means; and partitionable blocks of modular memory including read/write memory means and read only memory means. The controller means 30 is coupled to display interface means 40, to system memory means 50, to external input stimulus means 60, and to external peripheral means 70. The display interface means 40 may be comprised of cascadeable display drivers including a master driver and at least one slave driver, as described in greater detail in co-pending application Ser. No. 168,853, A Data Processing System Having Dual Output Modes, filed July 14, 1980. Each display driver, master and slave, individually controls sectional blocks of characters of the display 80. Alternatively, the display interface means 40 may be included within the controller means 30. The display interface means 40 is coupled to the display 80 for providing communications to and power for the display 80. The controller means 30, in a preferred embodiment, communicates only with the master display driver 41, with the master display driver 41 cascading an output to provide communication to the save display drivers 42, thereby providing for uniform and simplified controller means 30 to display 80 interface, irrespective of the number of characters in the display 80. The system memory means 50 provides additional data storage capability for the controller means 30. In a preferred embodiment, the system memory means 50 is comprised of individual modules of read/write and read only memory means, such as the read/write memory 15, read only memory 13, and the plug-in memory means 22 and 23 as described with reference to FIG. 2. A common communication bus 35 couples the controller means 30 to the read/write and read only memory means of the system memory means 50, as described in greater detail with reference to FIGS. 14–16, and FIG. 26, infra. The external stimulus means 60 may be comprised of keyboard input means, external digital data storage means such as magnetic tape, card, or disk, or digital communication means such as a modem. The external peripheral means 70 provides for communication from the controller means 30 to the ultimate user. The external peripheral means 70 may be comprised of hard copy printer, video display, or may alternatively provide for non-volatile data storage.

Figure 4C:
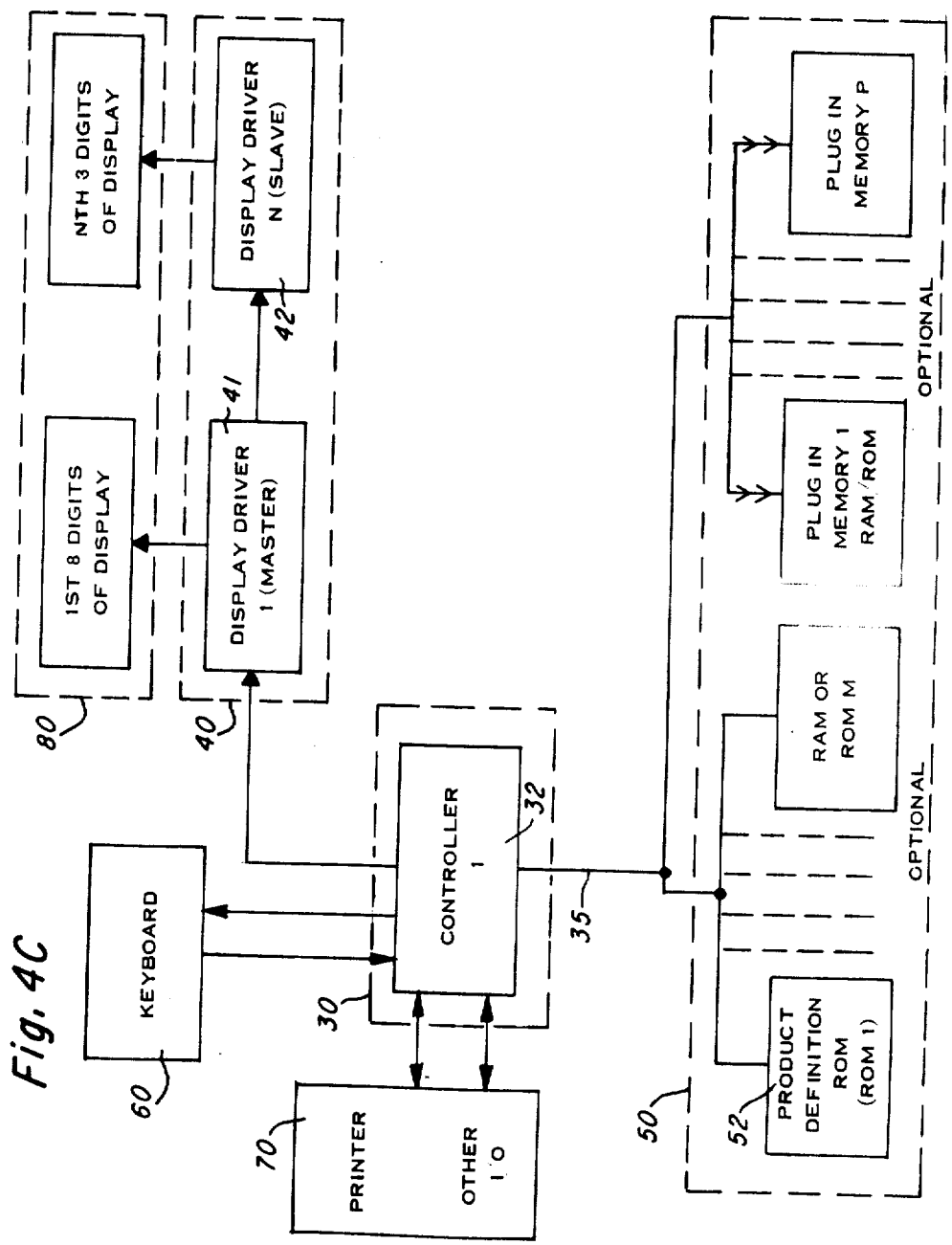

Referring to FIG. 4C, a block diagram of an alternative embodiment of the modular system of the present invention is shown. The block diagram of FIG. 4C is similar to that of FIG. 4B except that in the alternative embodiment the controller means 30 and memory means 50 are different than those shown in FIG. 4B. The controller means 30 is comprised of a universal algorithm controller 32 coupled to the keyboard input means 60, the printer means 70, and the display driver means 40. The display driver means 40 couples to the display 80. Alternatively, the display driver means 40 may be included within the universal algorithm controller integrated circuit 32. Furthermore, the universal algorithm controller 32 is coupled to a product definition ROM 52 in the memory means 50. Additionally, the universal algorithm controller 32 may be coupled to additional RAM or ROM memories within the memory means 50, either as a fixed part of the calculator system, or as plug in memories, as described with reference to FIGS. 2–3.

Referring to FIG. 4D, a detailed block diagram of the universal algorithm controller embodiment of the present invention is shown. The keyboard 60 selectively provides input signals 62 responsive to user provided key activations. The universal algorithm controller integrated circuit 32 is coupled to the keyboard input means 60, and to a command control means 52 comprising the product definition ROM. Additionally, the universal algorithm controller 32 provides an output 38 to drive the display 80. The universal algorithm controller 32 is comprised of a data processing means 34, coupled to the keyboard input means 60, for providing an operation signal, such as a key decode output 39, indicative of the received input signal 62 from the keyboard means, and for providing a display signal, 38 in response to receiving an instruction signal 37. A code conversion means 36 is coupled to the data processing means 34 for providing a selected machine code instruction signal 37 in response to receiving a macrocode command signal 54 from the product definition ROM 52. The command control means 53 of the product definition ROM 52 is coupled to the data processing means 34 and to the code conversion means 36 for providing the command signal output 54 in response to receiving the key decode operation signal 39. The unique calculator functions to be performed are stored in macrocode in the memory means 50, including the product definition ROM 52, and may be supplemented by the plug in memories for a new calculator design.

Figure 5A:
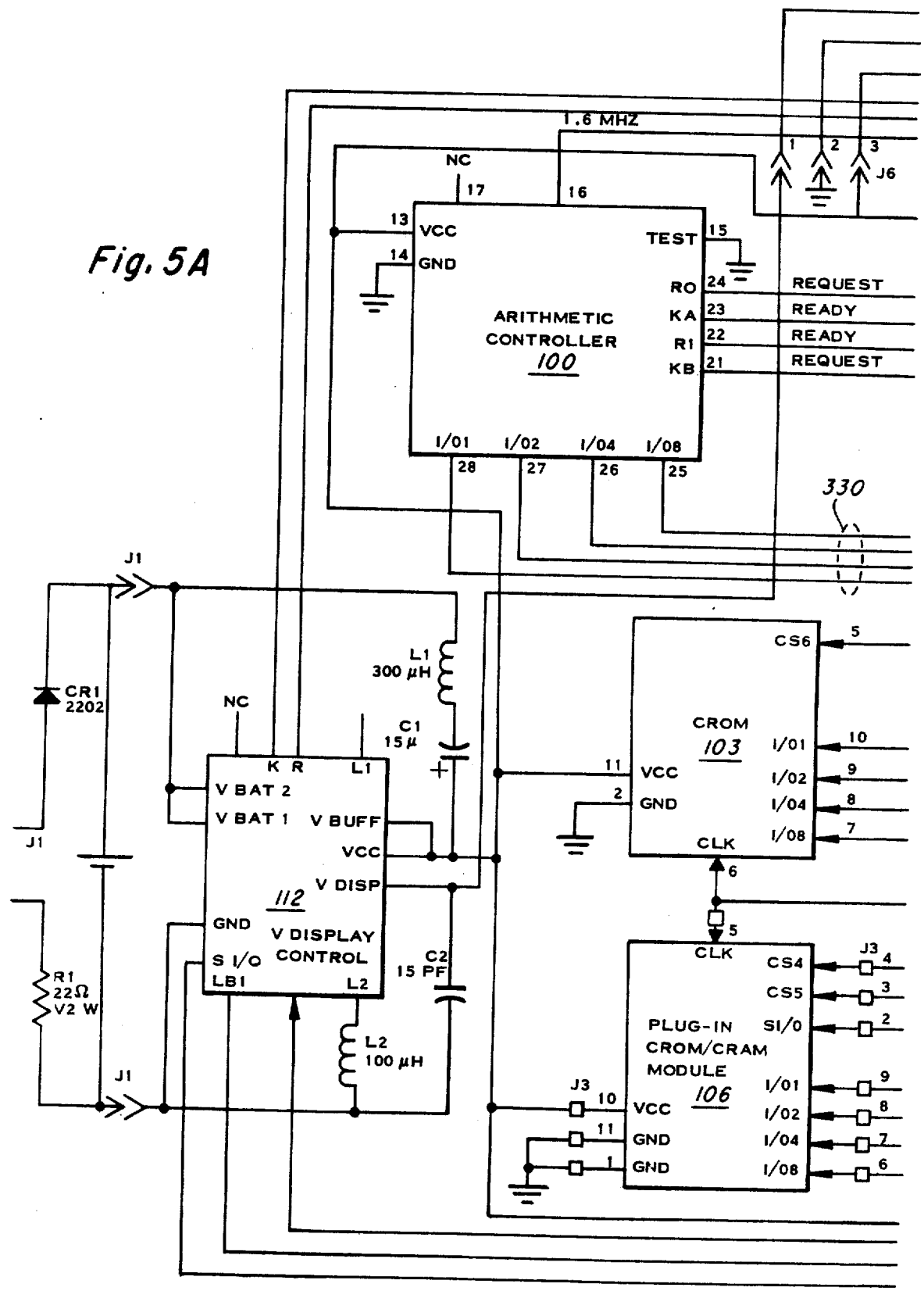
FIGS. 5A-5C form a detailed schematic logic diagram of a preferred embodiment of the modular calculator system of FIGS. 4A-B implemented in the calculator of FIG. 2.
Figure 5B:
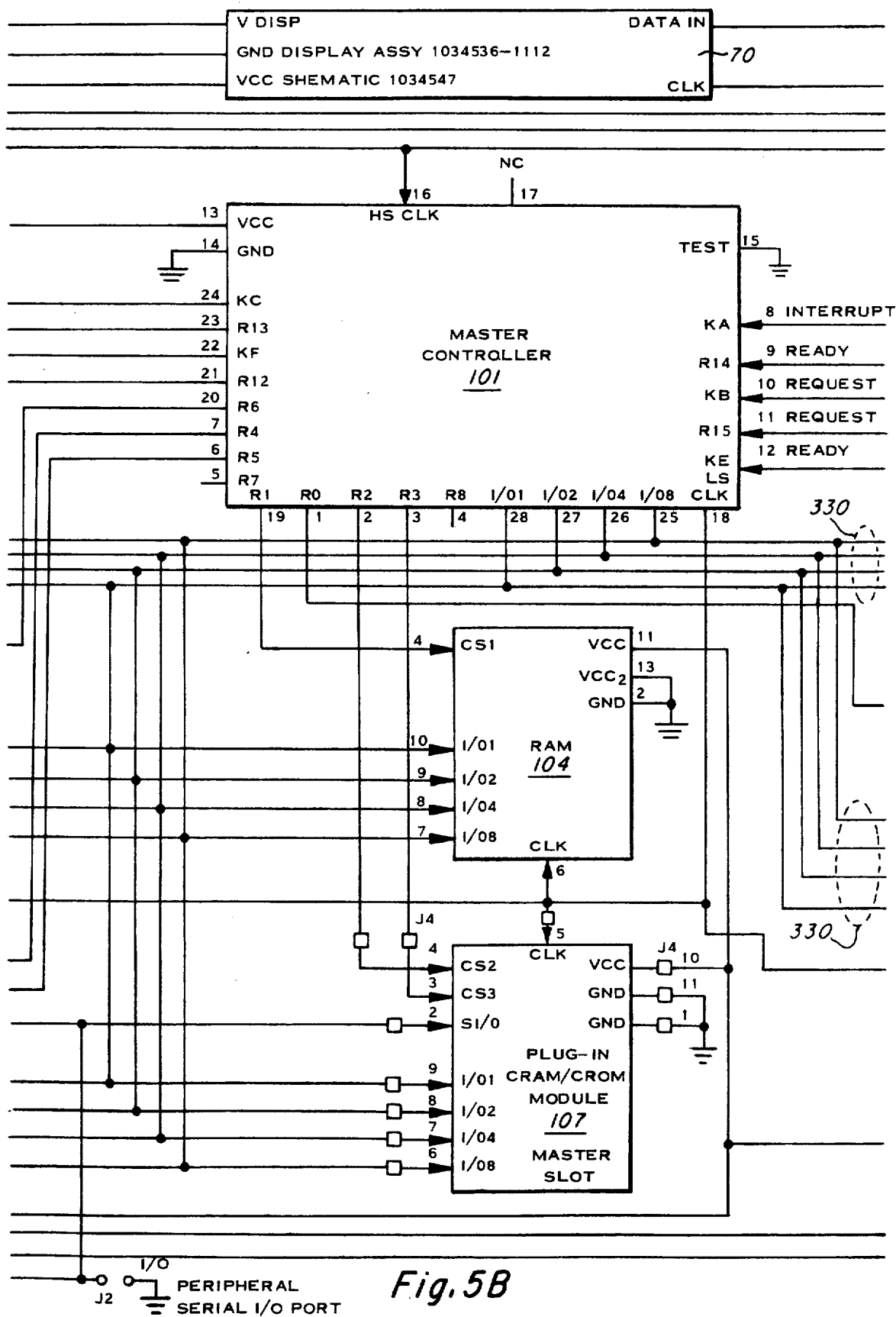
Figure 5C:
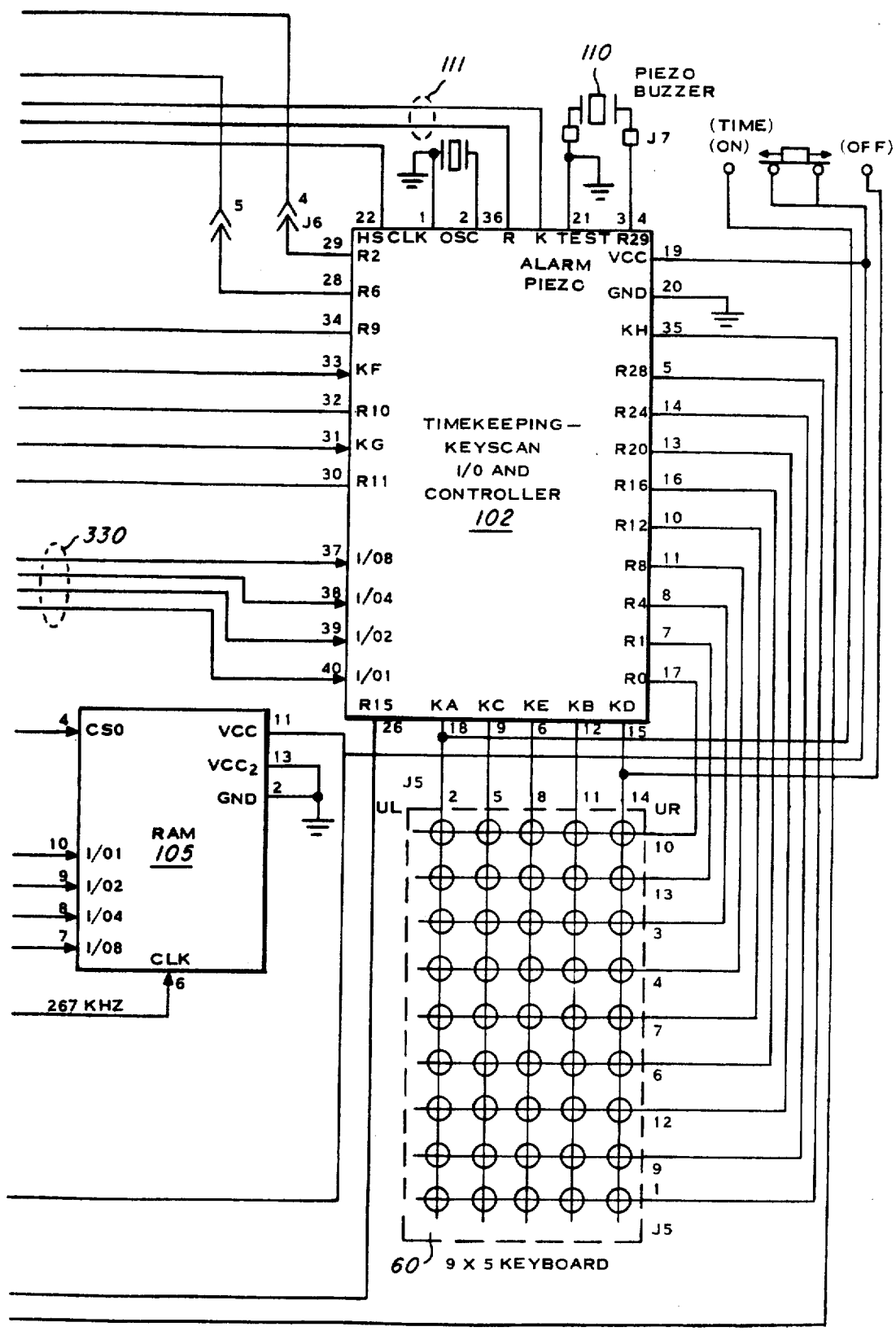

Referring to FIGS. 5A–C, a detailed schematic of an embodiment of the calculator system of FIGS. 4A–B as implemented in the calculator 1 of FIG. 2 is shown.

The calculator system of FIGS. 5A–C may be comprised of the controller means 30, as shown in FIGS. 4A–B, expandable in functional blocks, for providing arithmetic processing and data manipulation and processing such as the arithmetic controller 100, master controller 101 and timekeeping, key scan and I/O controller 102; an input means, such as the keyboard 60, coupled to the controller means 30, for providing outputs to the controller means in response to an externally supplied stimulus; a memory means 50 such as the memory 103, 104, 105, 106, and 107, expandable in partioned blocks, coupled to the controller means 30, for storing data and providing data outputs to the controller means 30 in response to receiving select inputs; a display interface means, such as the cascadable display drivers 70 and display interface chip 112, expandable in partioned blocks, coupled to the controller means 30, for receiving outputs from the controller means 30 representative of a desired character display, and providing display drive outputs corresponding to the desired character display compatable in voltage and timing with a selected display technology such as liquid crystal display; and a display device such as a liquid crystal display, expandable in partioned blocks corresponding to the partioned blocks of the display interface means and connected thereto, the display device being of the particular display technology compatable with the display interface means and timing such as that output from that controller 112, for receiving the outputs from the display interface means and for providing a visable representation of the desired character display in response thereto. As is described in greater detail in copending application Ser. No. 168,853, A Data Processing System Having Dual Output Modes, filed July 14, 1980, the cascadable display driver 70 is comprised of a master display driver and at least one slave display driver, each display driver forming a partitioned block of the display interface. The master display driver being coupled to the controller means and coupled to one of the slave display drivers, the master display driver converting a received output from the controller means into a slave communication output for connection to the first slave display driver, all other slave display drivers being connected in daisy chain with the first slave display driver. Each slave display driver couples the slave communication output from the proceeding slave display driver to the next slave display driver.

In the preferred embodiment, the calculator system of FIGS. 5A–C includes a controller means 30 expandable in functional blocks, for providing arithmetic processing and data manipulation and processing in the master controller 101, and timekeeping I/O functions in controller 102. In the preferred embodiment, the controller 100 of FIG. 5A is combined to be contained with the controller 101. The master controller 101 is coupled to the I/O controller 102 to allow for communication between the individual controllers. The memory means 50 of FIGS. 4A–B is shown in FIGS. 5A–C as comprised of on board read only memory 103 and on-board read write memories 104 and 105, as well as plug-in memories 106 and 107 which may be either read only, read/write or a combination thereof. The external stimulus means 60 is shown in part as a 9×5 keyboard coupled to the I/O controller 102 of the controller means 30. Additionally, the I/O controller 102 is coupled to an external peripheral piezoelectric buzzer 110, and has provisions for connection to an additional external peripheral, such as printer connection 111. The display interface 40 is comprised of the cascadable display drivers 70 and the display interface voltage controller chip 112. The display voltage controller chip provides regulated multi-voltage power source supplies for the liquid crystal display, as well as for providing regulated power supply voltages to the integrated circuit chips of the calculator system of FIGS. 5A–C.

Figure 6:
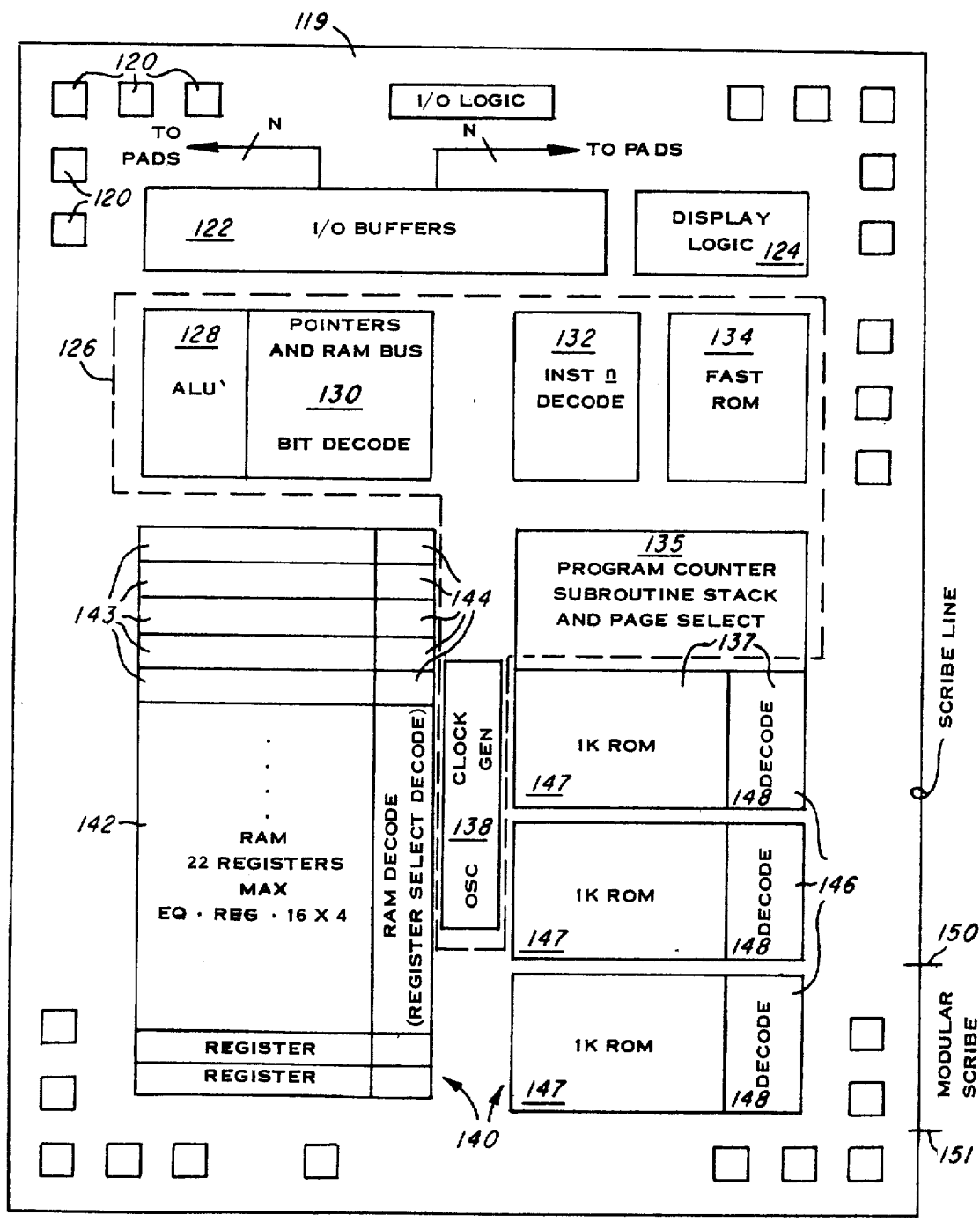
FIG. 6 is bar layout block diagrams of a preferred embodiment of a modular controller integrated circuit of the controller means 30 of FIGS. 4A-D, showing three levels of modular layout reduction.

Referring to FIG. 6, a layout block diagram of a preferred embodiment of a modular controller chip of the controller means 30 of FIGS. 4A–D is shown. Bonding pads 120 are distributed along the external periphery of integrated circuit chip 119. A modular input/output buffer and interconnect (I/O) means 122 is laid adjacent a first edge of the integrated circuit chip 119, and is selectively coupled to the bonding pads 120. Display logic 124 provides an additional level of functional modularity to the integrated circuit chip 119 and may be deleted from the layout or left in the design as required by the end application. The display logic 124 provides a voltage buffering and timing interface for interconnection of the integrated circuit chip 119 to an external liquid crystal display or other type of alphanumeric or graphic display. A common block of logic forming non-modular circuit group 126 is comprised of fixed circuit function groups for providing data processing and manipulation in accordance with a stored instruction set. The circuit group 126 is comprised of an arithmetic logic unit 128, address pointers, and RAM bus and bit decode circuit means 130, instruction decode circuit means 132, high speed (fast) read only memory (ROM) 134, and program counter, subroutine stack, and page select circuit means 136. A clock generator means 138, although forming a function block of the circuit group 126, may be physically relocated on the integrated circuit chip 119 closer towards the first edge as necessary to accommodate a smaller bar size. In the preferred embodiment, the circuit group 126 is located physically adjacent to the I/O means 122. A partitionable modular memory circuit 140 is physically located adjacent to the circuit group 126 and coupled thereto. Additionally, the memory circuit 140 is physically located adjacent to a second edge of the integrated circuit chip 119 parallel to and opposite from the first edge. In the preferred embodiment, the memory circuit 140 is comprised of a partitionable modular read/write memory circuit (RAM) 142 and a partitionable modular read only memory circuit (ROM) 146. The read/write memory circuit 142 is comprised of read/write memory cells grouped into partitionable registers 143 and register select decode grouped into partitionable decode circuits 144, with each partitionable decode circuit 144 being associated with and adjacent to a partitionable register 143, so as to provide for modular partitionable registers 143 each with its own associated decode 144. The read only memory circuit 146 is comprised of a plurality of memory cells grouped into pages 147 (in the preferred embodiment each page comprising 1024 words), each page being partitionable and independent of each other page, and address decode means partitioned into modular decode circuits 148, each decode circuit 148 being adjacent to and associated with a partitionable page 147 so as to allow addressing of particular locations within the associated page. The invention may be more easily understood by comparing FIGS. 6, 7 and 8.

Figure 7:
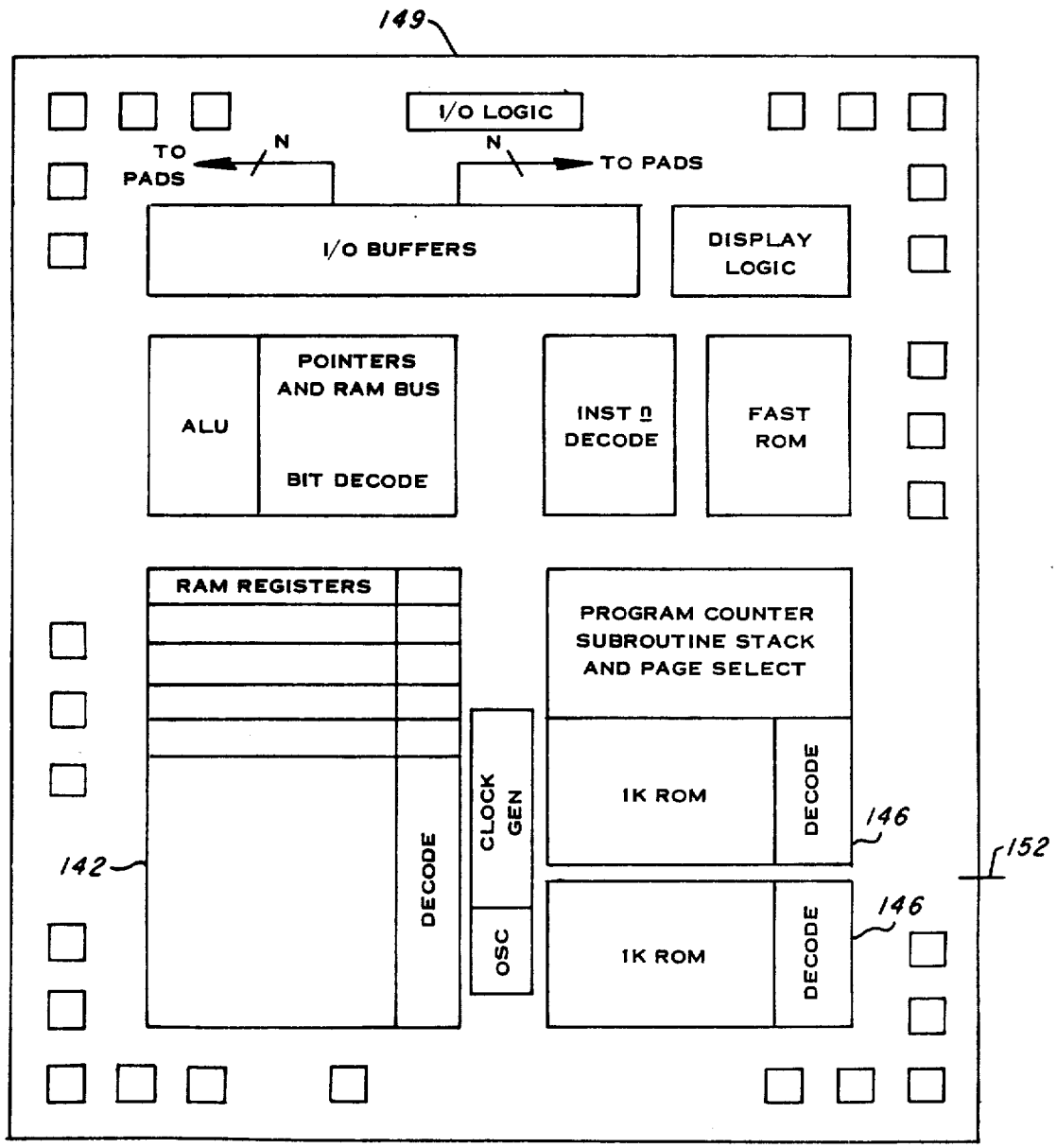
FIG. 7 is an alternative bar layout diagram similar to FIG. 6.

Due to the modular layout and circuit design of the integrated circuit 119 of FIG. 6, partitioned segments of the modular memory means 142 and 146 may be removed from the integrated circuit design bar, substantially without relayout and without circuit redesign of the integrated circuit 119, along the modular scribe lines 150 and 151, and the bar layout compressed so as to result in integrated circuit chip 149 bar layout and design as shown in FIG. 7. As shown in FIG. 7, one page of ROM 147 and associated decode 148, of the read only memory means 146 is removed, and a plurality of registers 143 and associated decode 144, of the read/write memory means 142 are removed in partitioned groups along the modular scribe lines 150 and 151 as shown in FIG. 6, so as to provide an integrated circuit chip 149, as shown in FIG. 7, identical to the integrated circuit chip 119 of FIG. 6, except for the reduced memory capacity and reduced bar size of the chip 149. Thus, a functionally identical circuit of reduced bar size and reduced memory capacity is provided without necessitating redesign or relayout of the integrated circuit. Thus, the read only memory means 146 may be partitioned to include a minimum number of blocks of read only memory cells required to store the desired instruction set codes with the associated address decode circuit including only a sufficient modular portion to address the minimum number of blocks of read only memory. Furthermore, the read/write memory means 142 may be partitioned to include a minimum number of blocks of memory cells required to store data and the associated address decode circuitry partitioned to include only a sufficient modular portion of address circuitry required to address the minimum number of blocks of read/write memory cells.

Figure 8:
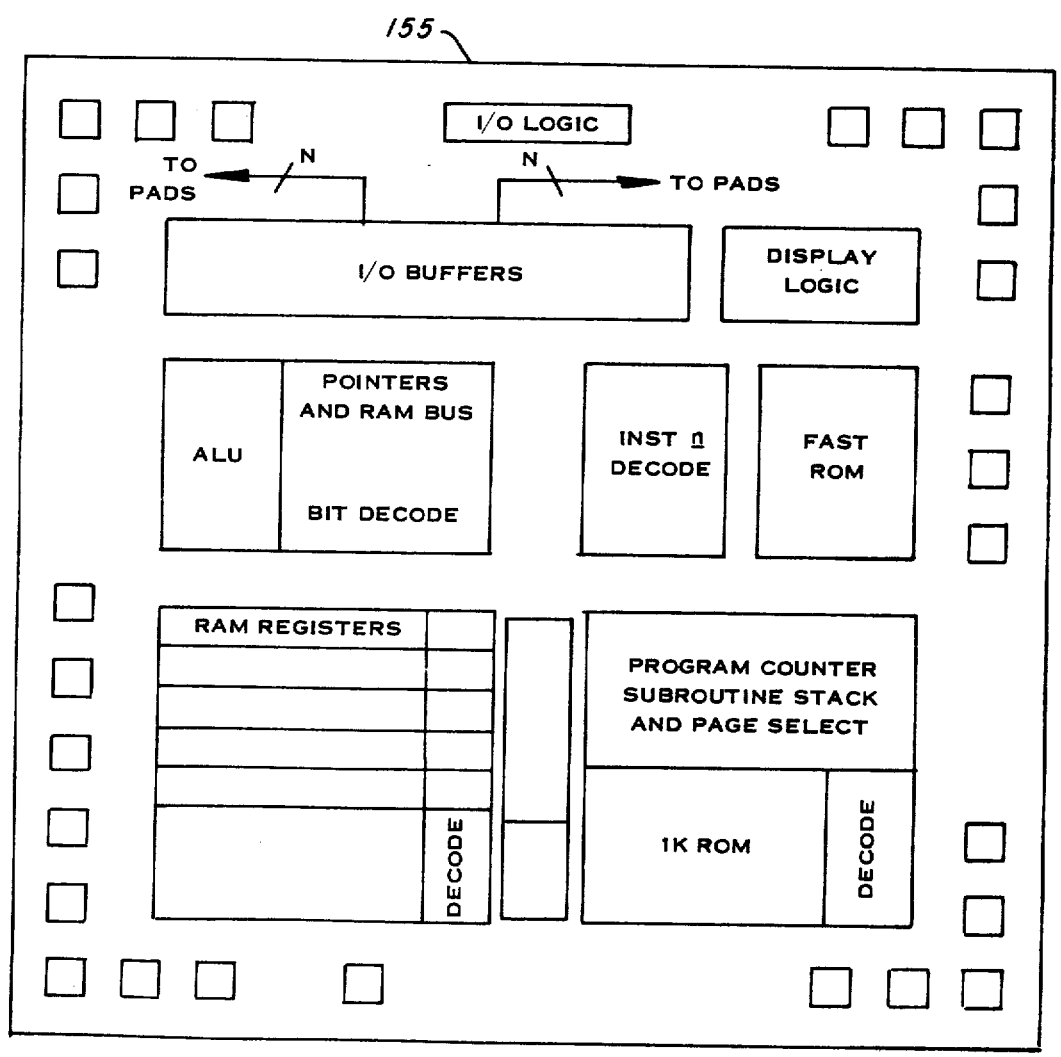
FIG. 8 is an alternative bar layout diagram similar to FIGS. 6 and 7.

Referring to FIG. 8, a further reduction in bar size and memory capacity of the integrated circuit chip 149 of FIG. 7 is shown in the resultant integrated circuit chip 155. By removing selected modules of the partitioned memory circuit groups of the read only memory means 146 and the read/write memory means 142, in the manner as described above with reference to FIG. 7, but with removal being made along the modular scribe line 152 of the integrated circuit chip 149, the resultant integrated circuit chip 155 is created without circuitry redesign and esssentially without chip relayout (possibly moving bonding pads if so desired) from the integrated circuit chip 149, of FIG. 7. It is also possible to derive the integrated circuit chip 155 of FIG. 8 directly from the integrated circuit chip 119 of FIG. 6. The modular features of the I/O means 122 and display logic means 124 are available and unchanged in the integrated circuit chips 119, 149 and 155, and will be described in greater detail, infra.

Figure 9:
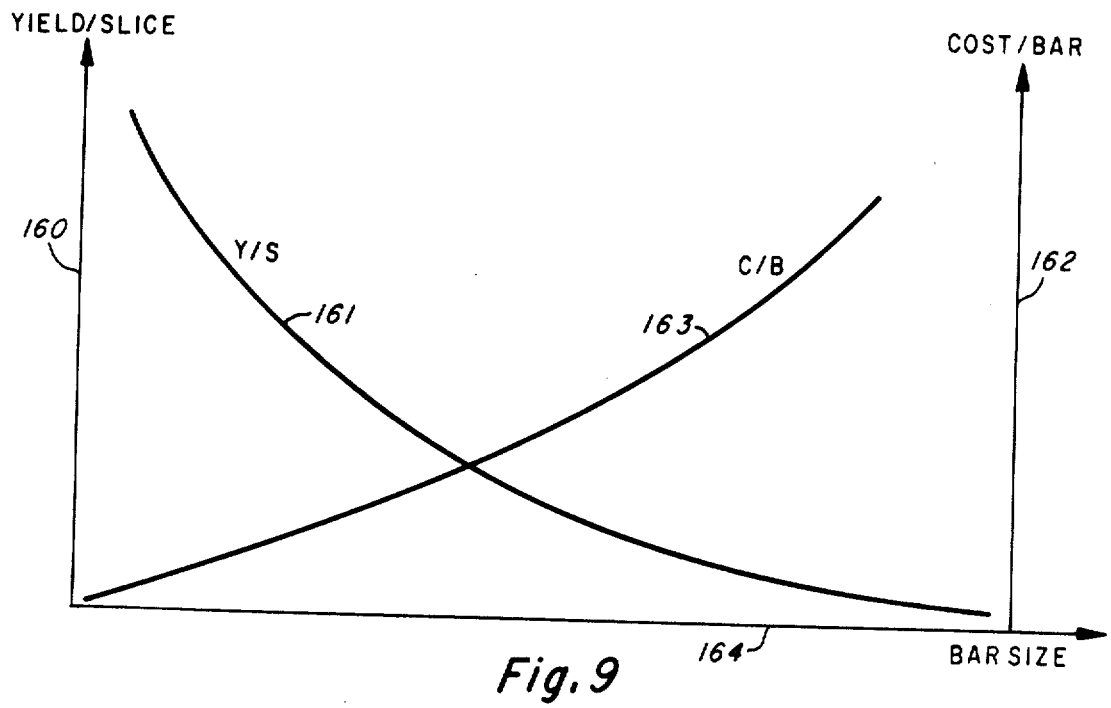
FIG. 9 is a combined axis graph showing yield per slice and cost per bar as plotted against integrated circuit bar size.

Referring to FIG. 9, two of the many benefits derived from the bar modularity as explained with reference to FIGS. 6, 7 and 8 are shown. In FIG. 9, the advantages of optimizing the integrated circuit chip bar size to the application's memory requirements is shown in terms of benefits accruing in yield per slice along axis 160 as shown on curve 161, and as cost per bar along axis 162 as shown on curve 163, both yield per slice and cost per bar being plotted against a common axis 164 of bar size. As shown by curve 161, the yield per slice is inversely proportional to the bar size of the integrated circuits on the semiconductor wafer. As bar size per integrated circuit is decreased, more integrated circuit bars may be placed on a given semiconductor wafer slice, and even assuming a constant yield of bars, the yield per slice in increased. Additionally, as the bar size is reduced, and the complexity of the circuitry and fabrication associated therewith is reduced, the yield of the bars is increased. Referring to curve 163, the cost per integrated circuit chip (bar) is directly proportional to the bar size of the integrated circuit, and therefore optimizing bar size minimizes cost. The bar modularity invention of the present application allows simplified, interchangeable and quick design turnaround of different memory capacity and specialized function integrated circuit chips with a common circuit group nucleus to be derived from a common circuit design and a common bar layout, utilizing a common instruction set, and thereby removes most of the impediments heretofor present in attaining the benefits of optimum bar size for a given application. A further benefit of the bar modularity is reduced cost per bar from a separate phenomenon in the semiconductor industry known as the learning curve as applied to semiconductor manufacture.

Figure 10:
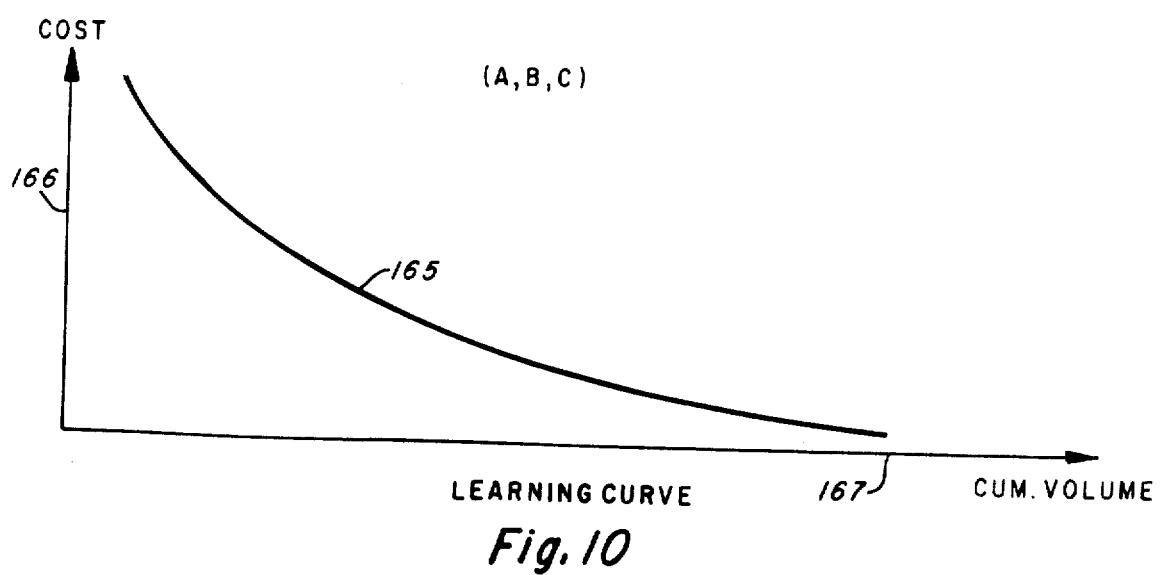
FIG. 10 is a plot of cost v. cumulative volume, showing the semiconductor learning curve as applied to the integrated circuit designs of FIGS. 6-8.

Referring to FIG. 10, a semiconductor learning curve 165 is shown as plotted against cost on the vertical axis 166 and cumulative volume on the horizontal axis 167, the horizontal axis being logirithimically scaled. The integrated circuit chips 119, 149 and 155 are derivable from the bar modularity invention, and all share a common bar layout, a common circuit design, and common processing. The manufacturing volume of each of the integrated circuit chips within the bar modularity chip set are additive in forming a combined cumulative volume to drive the cost down the learning curve at a faster rate than attainable as to any of the integrated circuit chip bars standing alone.

A method of manufacturing a modular integrated curcuit as described with reference to FIGS. 6,7 and 8 may be better understood with reference to the flow chart of FIG. 11. First, a first circuit means for providing permanent electronic circuitry is patterned on a replica of a integrated circuit to be manufactured. The first circuit means may include the program counter, subroutine stack, instruction decode array, arithmetic logic unit, memory pointers, accumulator, oscilators and clock generators, and a permanent section of read/write and read only memory. This first circuit means forms the central module for all versions of the modular integrated circuit. Next, a second circuit means is patterned on the replica of the integrated circuit in the form of at least two electronic circuit modules. The second circuit means may include control word storage in a read only memory, and data storage in a read/write memory, each forming separate partitioned memories, but both being integral sections of the integrated circuit. Next, the electronic circuitry of the first circuit means and the modules of the second circuit means are electrically interconnected on the replica of the integrated circuit so that any or all of the modules may be removed without destroying the functioning of electronic circuitry or of the remaining modules. In the preferred embodiment, the modules of the second circuit means are physically positioned on the replica with respect to other modules of the second circuit means and the electronic circuitry of the first circuit means, so that any or all of the modules may be removed without necessitating relayout and such that the resulting layout produces a minimally size integrated circuit bar. Next, the nondesired modules are removed from the replica in accordance with the minimal memory requirements of the application and the special function requirements of the application to achieve an optimal amount of circuitry. Next, one of several options for alternative embodiments may be chosen. In one embodiment, the next step after the step of removing the desired modules is to replace the removed modules with other desired functional modules. In an alternative embodiment, the next step after the step of removing the desired modules is to pattern on the replica a pinout definition means, connected to the first circuit means, for changing the integrated circuit pinouts according to a pinout definition matrix so that the pinout of the integrated circuit may be redefined without destroying the functioning, patterning, or positioning of the first circuit means and the second circuit means, followed by the step of patterning the pinout definition matrix according to the desired pinout. Alternatively, both of these steps may be taken. The next step, in any event, is the step of reducing the replica in size proportionally with the size of the removed modules so as to provide a minimal bar size and an optimal design. Next, the replica in its desired form is transformed into the desired integrated circuit. This may be done by a number of method, such as generating a mask set from the replica in its desired form, processing a semiconductor slice using this mask set, and packaging and testing the resultant integrated circuits.

The first circuit means may include block decode means for selectively providing an output to a selected one of the memory modules in the second circuit means in response to receiving a memory address, wherein the selected memory module outputs a stored data word which is coupled to the first circuit means in response to receiving the output from the block decode means. Furthermore, the second circuit means may be partioned such that removal of individual ones of the blocks of the partitioned memory modules reduces the memory storage capacity of the integrated circuit in predefined modular blocks. One page or 1024 words of read only memory, and seven registers of read/write memory form a partitionable block of the memory in a preferred embodiment.

Figure 11:
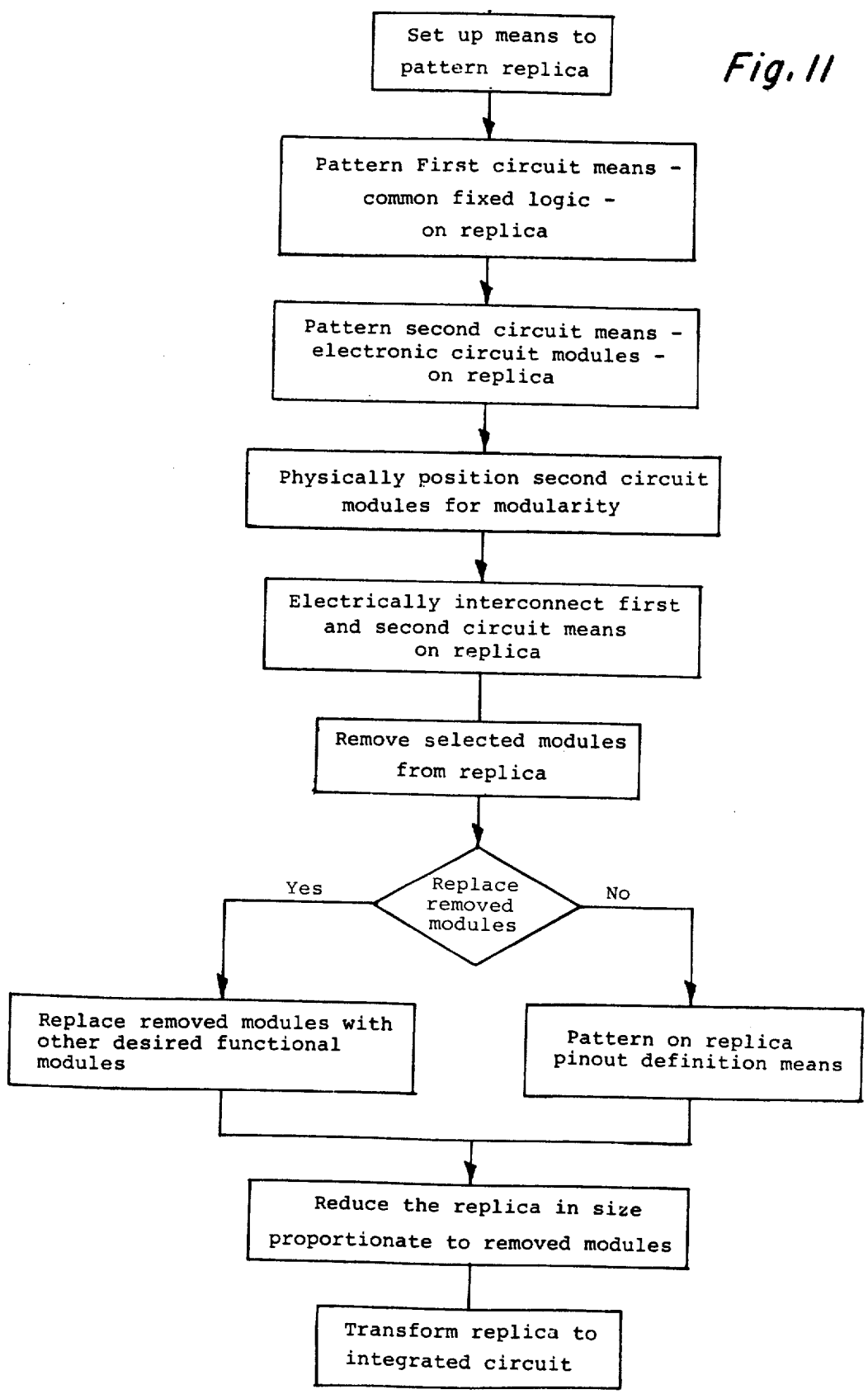
FIG. 11 is a flow chart showing a method of manufacturing a modular integrated circuit as described with reference to FIGS. 6-8.

The manufacture of the modular integrated circuit may be accomplished, in a preferred embodiment, by an automated data processing machine having input thereto representing circuit topology and initial values of all design variables wherein data for each of the steps as described with reference to the flowchart of FIG. 11 are generated and stored in the data processing machine. This would include the steps of generating and storing first circuit means for providing permanent electronic circuitry; generating and storing second circuit means in the form of at least two electronic modules; generating and storing electrical interconnect of the modules in the electronic circuitry so that any or all of the modules may be removed without destroying the functioning of the electronic circuitry and of the remaining modules; positioning the modules with respect to the electronic circuitry of the first circuit means so that any or all of the modules may be removed independent of the first circuit means and independent of the remaining modules; removing the desired modules from storage, reducing the stored circuit representation in size proportionally with the size of the removed modules; and transforming the stored representation in its desired form into an integrated circuit. Additionally, the alternate embodiments as described with reference to FIG. 11 may also be utilized in conjunction with the automated data processing machine. Furthermore, modular functional blocks may be stored in the automated data processing machine for recall and positioning in accordance with the desired application.

Utilizing the modular integrated circuit as described above, a modular system result as described with reference to FIGS. 4A-D is achieved.

Figure 12A:
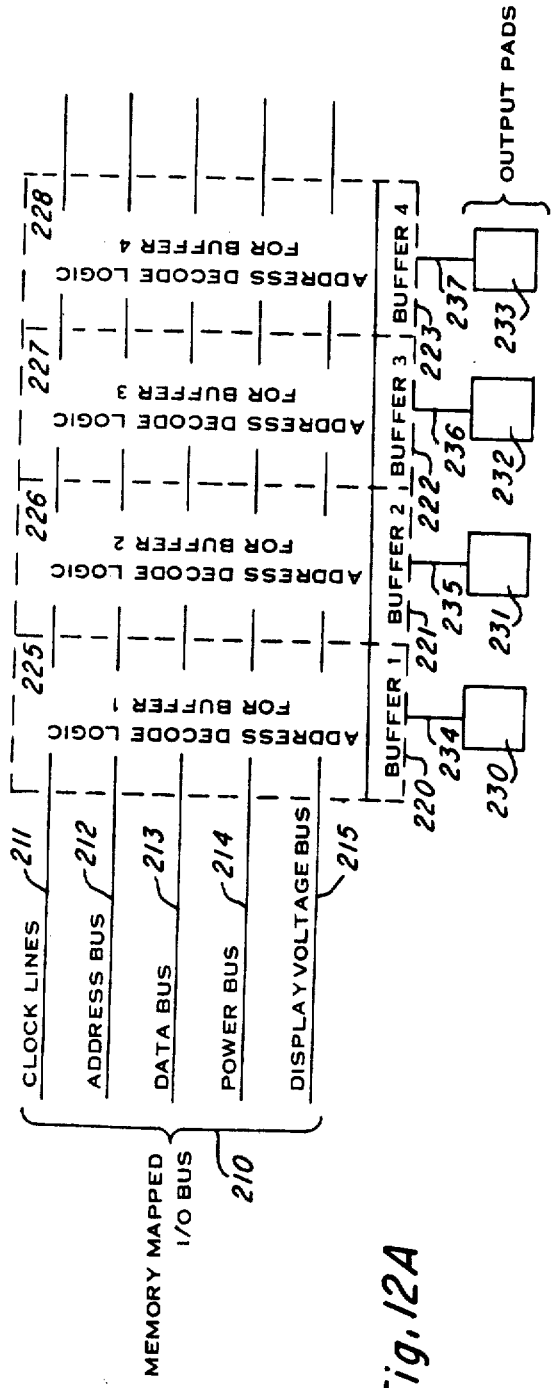
FIGS. 12A-B are detailed functional block diagrams of a modular memory mapped I/O interconnection scheme, wherein each buffer has associated with it an individual address decode logic circuit, for use in the controller integrated circuit 30 of FIGS. 4A-D.
Figure 12B:
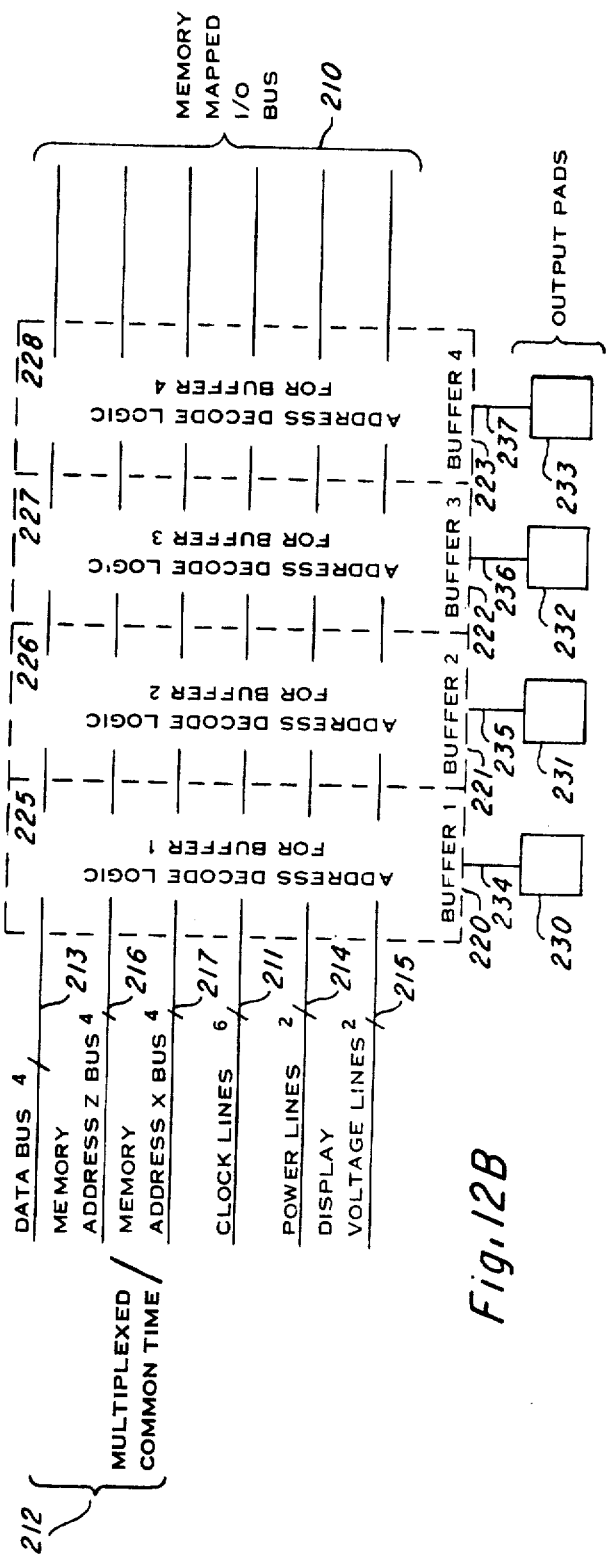

Referring to FIGS. 12A-B, a block diagram of a modular I/O design for the controller integrated circuit 30 of FIGS. 4A-D is shown.

A solution to the problem of rigid I/O design fixed to optimize each product is to provide a modular I/O design. First, each I/O buffer 220-223 is treated by the logic of the controller integrated circuit as an addressable element of memory (memory bit). The I/O buffer can then be addressed and either written into or read from using memory compatible instructions and hardware. Next, each bufer is provided with its own associated memory address decode 225-228. This allows a common address bus 212, data bus 213, control and clock lines 211 and power buses, 214 and 215, to be coupled in parallel to each of the I/O buffer locations. Each buffer has its own associated address decode which individually decodes its own predefined select address, and is selectively either written into or read from. This eliminates the need for special select and control lines for each of the buffers. In one embodiment of the invention, no change of the interconnect between the buffers and associated decode or between the buffers and bonding pads, or between the memory mapped I/O bus and the address decode is required to reconfigure the buffer functions and therefore the pinout. When a first buffer is the same as a second buffer, then simply reprogramming the decode address of the address decode associated with a particular buffer redefines the function of the buffer and the pinout associated therewith. Alternatively, the separate address decode associated with each of the firt and second buffers may be swapped, that is be physically interchanged, so as to be associated with the second and first buffer, respectively, retaining the same program decode address.

In a preferred embodiment, the I/O data bus is run along one edge of the semiconductor bar and all buffers and associated decode are placed along a straight line beneath and coupled to the I/O data bus as shown in FIGS. 6-8. A metal interconnect is made from each of the buffers to the corresponding bonding pad. This provides the option of not having to physically remove a buffer and associated decode to a new bonding pad location in order to couple that buffer and associated address decode to that bonding pad. The address decode interconnect modularity permits the change of bonding pad functions between any two like species of buffers, for example between two select line buffers, and may be done by changing only the hardware programmable address at the buffer address decode. However, to exchange the coupling arrangement between two different species of buffers and associated bonding pads, for example, swapping a K line with a select line, would require physically removing and relocating the buffers. In a further embodiment as described with reference to FIGS. 13A-B, would only reprogramming an interconnect contact matrix so as to couple the metal interconnect from the desired buffer to the desired metal line coupling to the desired bonding pad is required. Although the I/O buffers may be designed so that each one may be programmed for a different function, in the preferred embodiment, each buffer has a specific function, so as to achieve optimal system circuit design. In the preferred embodiment, there are discrete function buffers for I/O functions, input functions, and K lines or select ilnes. In an alternate embodiment, one general purpose buffer may be provided which fulfills all the functions that are required by the system. However, this general purpose buffer would be phyically larger than the largest function buffer used. This would allow the hardware programmable address feature of the buffers to accomodate complete changes of bonding pad functions irrespective of the particular species of function to be output, without any hardware metal interconnect changes and in fact without any interconnect contact matrix in the preferred embodiment, and without any buffer relocation in the one embodiment. However, by optimizing buffer size for each function, more buffers may be fitted in a given area of semiconductor bar. However, if all the buffers are made general purpose and the same size, then there is no limit as to total pin-out change simply by reprogramming the programmable address decode associated with the buffers. The choice of approach, the one embodiment, the preferred embodiment, or the alternate general purpose buffer embodiment, is dependent upon the designers objectives and the systems requirements.

Referring to FIGS. 12A-B, each I/O buffer, 220-223, is treated by the logic of the integrated circuit as an addressable element of memory (memory bit). The I/O buffer is addressed and either written into or read from as a memory location. Next, each buffer 220-223 has its own associated memory address decode 225-228. This allows common address, data, and control and clock line busses 210 to be coupled in parallel to each of the I/O buffers 220-223 locations, where each buffer's associated address decode circuit individually decodes its own predefined selected address, and is selectively either written into or read from responsive to the command and data codes. This eliminates the need for special select and control lines for each of the buffers. With the present invention, only an address bus 212 and data bus 213 are required to be coupled to the buffers and associated decode logic, and a common address/common data bus may be utilized. To address 16 I/O buffers with the present invention, only four address lines are required for selection of one of the 16 buffers. A key additional advantage to the present invention is that it makes any I/O change easy to implement. That is, it does not matter where the buffer is located along the general purpose data bus. Thus, any individual buffer with its associated address decode can be physically located at any location along this address/data bus, and there is no necessity to relayout the select/control lines specific to each individual buffer when changing pin-out. Thus, the present invention makes any I/O reconfiguration a minimum design change which can be eaily accomplished either manually or with the assistance of digital layout programming techniques. The buffers with associated address decode along a common address/data bus provides for a memory mapped I/O system with self address decode capability associated with each buffer. Thus, in one embodiment, no change of the interconnect between the buffers and associated decode or between the buffers and the bonding pads, nor between the associated decode and the memory mapped I/O bus is required to reconfigure the buffer functions and therefore the pin-out. To reduce bar layout complexity and bar size area, the address and data lines may be multiplexed together on a common bus coupled to the buffers and the address decode associated therewith. This results in fewer required lines in the I/O bus 210. When a first buffer is the same as a second buffer, then simply reprogramming the decode address of the address decode associated with a particular buffer redefines the output of the buffer and the pin-out associated therewith. Alternatively, the address decodes associated with each of the first and second buffers may be swapped, that is be physically interchanged, so as to be associated with the second and first buffer, respectively, with the address decodes retaining the original program decode address. Alternatively, if it is desired to retain the same address decode location with a different type of buffer, the buffer may be replaced or swapped with a buffer of the desired type, and coupled to the original address decode and to the bonding pad to which the replaced buffer was associated with. By this method, optimal buffer size is achieved, while retaining I/O modularity and pin-out definition modularity. In a preferred embodiment, as described with reference to FIGS. 13A-B, a programmable interconnect contact matrix 245 is interposed between the outputs of the buffers 220-223 and the metal lines 234-237 coupling to the bonding pads 230-233. Thus, by providing a particular matrix program for the interconnect matrix 245, the coupling of the output from the buffers to the bonding pad locations which couple to the external coupling means to form the external pin-out may be modified independently of the buffer locations or the selected address decode for any given buffer.

Referring again to FIGS. 12A-B, in one embodiment of the invention, the I/O bus 210 is distributed around the whole perimeter of the integrated circuit bar, and each individual buffer 220-223 and associated address decode 225-228, is located adjacent to and coupled to a respective bonding pad 230-233. The address to which each buffer 220-223 will respond is controlled by programming a selected address into the associated address decode 225-228 by hardwire programming, such as via gate, moat, or metal level masks during processing, via ion implants, or via electrical programming after completion of processing. In order to change the association or a particular buffer and associated decode with a particular bonding pad to be associated with a different bonding pad, the particular buffer and associated address decode must be physically relocated adjacent to the different bonding pad to which it will be coupled, and the address decode logic must be selectively programmed to respond to the newly selected desired address.

In a preferred embodiment of the present invention, the I/O data bus 210 is run along one edge of the semiconductor bar as shown in FIG. 6-8, and all buffers 220-223 and associated decode 225-228 are placed along a straight line beneath and coupled to the I/O data bus 210.

Figure 13A:
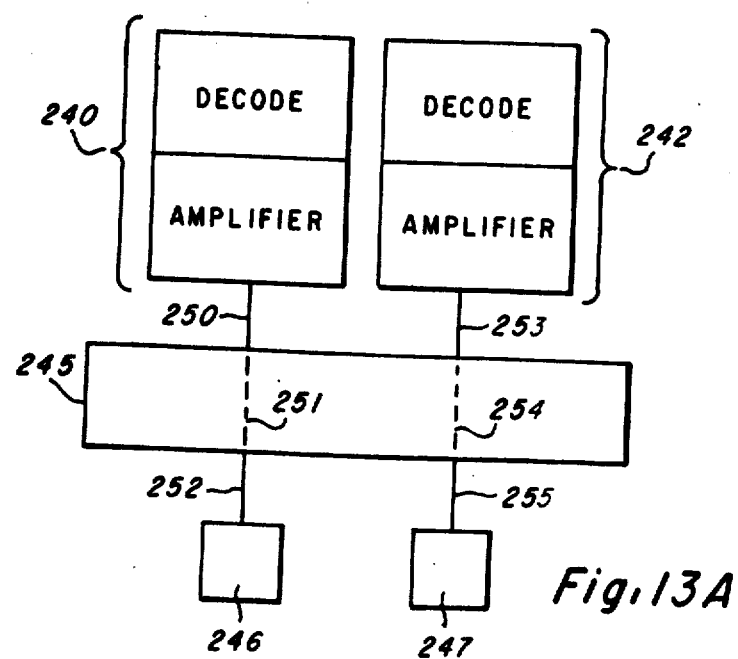

Referring to FIGS. 13A-B, the metal interconnect 234-237 from the buffers 220-223 to the desired bonding pad 230-233, respectively, of FIGS. 12A-B, are functionally replaced by an equal number of programmable interconnects, such as 251 and 253, of a programmable interconnect contact matrix 253 as shown in FIG. 13A. This provides the option of not having to physically remove a buffer and associated address decode and physically relocate the buffer and associated decode to a new bonding pad location in order to couple that buffer and associated address decode to new bonding pad. Rather, by varying the selected pattern of the interconnect contact matrix 245, for example, by means of hardwire programming (such as gate or metal level mask programming during processing, ion implant, by post assembly electrically programming, or by other programming means), the selective coupling between the outputs of the buffers 220-223 and the bonding pads 230-233 of FIGS. 12A-B is accomplished without physical relocation or relayout of the semiconductor bar, and without reprogramming the associated address decode circuits 225-228. Metal lines 234-237, each output from a respective buffer 220-223, are coupled to a respective location in the matrix 245, and an equal number of metal lines are output from the matrix 245 each coupling to a bonding pad 230-233. The chip designer may select an individual buffer and program the metal connection via the interconnect contact matrix 245 out to a particular metal line coupling to a particular bonding pad. For example, referring to FIG. 13A, assume it is desired to change the functions served by a bonding pad 246, which was an input buffer 240 function (KC), to an output buffer 242 function (R4) select which was coupled to bonding pad 247, pads 246 and 247 being adjacent one another. Two metal lines, 252 and 254, physically located adjacent one another, are run along the one edge of the bar adjacent to the I/O buffer arrays 240 and 242. The metal connects, or coupling means, 251 and 253, from the outputs of the KC buffer 240 and the R4 select buffer 242 must be changed to couple with the desired bonding pad metal lines to achieve the functional swap. The address decode I/O modularity permits the change of bonding pad functions between any two like species of buffers, for example, between two select line buffers, and may be done by changing only the hardware programmable address at the buffer address decode. However, to exchange the coupling arrangement between two different species of buffers and associated bonding pads, swapping the KC line with the R4 select line, would require physically removing and relocating the buffers with the address decode I/O modularity scheme. In the preferred embodiment, only reprogramming the contact matrix 245 so as to couple the metal interconnect from the desired buffer to the desired metal line coupling to the desired bonding pad is required. Although the I/O buffers may be designed so that each one may be programmed for a different function, in the preferred embodiment each buffer has a specific function so as to achieve optimal system circuit design. In the preferred embodiment, there are discrete function buffers for I/O functions, input functions, and K lines or select lines. In an alternate embodiment, one general purpose buffer may be chosen which would fill all the functions that are required by the system, although the buffer would have to be physically larger than the largest function buffer used. This would allow the hardware programmable address decode feature of the buffers to accomodate complete changes of bonding pad functions irrespective of the particular species of function to be output, without any hardware metal interconnect changes (thus obviating the need for the interconnect contact contact matrix 245 in this embodiment), and without any buffer relocation required as in the special purpose buffers embodiment. However, by optimizing buffer size for each function, more buffers may be fitted in a given area of semiconductor bar. For example, a select buffer is much wider (approximately 5 to 10 times wider) than a K buffer. If all of the buffers were general purpose multi-function buffers, then each buffer for the K-function would be 5–10 times larger than that required for the specific application, and consequently, the design would be limited as to how many output buffers could be placed within the allowable area of the semiconductor. However, if all the buffers are made general purpose and the same size, then there is no limit as to total pin-out change simply by reprogramming the programmable address decode associated with the buffers. The choice of approach is dependent upon the design objectives and the systems requirements, and the advantages and disadvantages of each approach must be analyzed for each project.

Referring to FIG. 13B, the programmable interconnect matrix is comprised of a pin-out definition means 202. An interconnect coupling means includes bonding pad means 207 having individual bonding pads 230–233, for providing interconnection to conductors 209 external to the integrated circuit so as to define a pin-out for the integrated circuit. An interconnect contact means includes amplifier means 205 and logic means 203 for coupling the first circuit means 200 to the bonding pad means 207. A programmable interconnect (such as a programmable mask level during processing or electrical programming after manufacture) couples outputs from the first circuit means 200 to individual bonding pads 230–233 of the bonding pad means 207 according to the programmed state of pin-out definition matrix means within the pin-out definitions means 202.

Referring to FIG. 14, a block diagram of a preferred embodiment of the memory mapped I/O in a modular controller integrated circuit of the present invention is shown. A plurality of R/select line outputs 300 may be used either to drive a one fourth duty cycle liquid crystal display, for keyboard scan, or for communication. A plurality of K line inputs 310 may be utilized for keyboard scan, or for communications input from a source external to the integrated circuit. In the preferred embodiment, four of the bit lines may be used as multiplexed test outputs. A plurality of common lines 320 may function as inputs or outputs. In the preferred embodiment, four common/test input lines may be used either to drive an externally coupled liquid crystal display, or may be used to receive input addresses for coupling to the main program counter or instruction decoder of the controller chip. A plurality of dedicated test inputs 315 may be provided, the preferred embodiment utilizing four dedicated test inputs.

At least one print I/O communications line 324 is provided in the preferred embodiment. A plurality of bidirectional input/output lines 330, I/O 1, 2, 4, 8 in the preferred embodiment, provide for bidirectional communication to a source external to the integrated circuit such as separate RAM, ROM or peripheral integrated circuits as shown in FIGS. 5A–C. In the preferred embodiment, the address decode logic, as shown in FIGS. 12A–C, are designed so as to be responsive to RAM register locations greater than 23. Of course depending on the number of RAM registers used in the controller, and upon the bus architecture utilized in the controller, other addressing schemes of the address decode logic is possible. In the preferred embodiment, the associated address decode forms a part of the select/R lines 300, the common lines 320, the K lines 310, the print I/O lines 324, the I/O lines 330, and timekeeping means 350. Each associated address decode is coupled to an internal I/O bus 335 corresponding to the control bus 210 of FIGS. 12A–C. The I/O bus 335 is comprised of a Memory Address X/Multiplexed Common Line bus 340, corresponding to bus 217 of FIGS. 12A–12B; a Data bus 341 corresponding to the Data bus 213 of FIGS. 12A–12B; a Timing and Control bus 342 corresponding to the bus 211 of FIGS. 12A–B; a Memory Address Z bus 343 corresponding to the bus 211 of FIGS. 12A–B; and a display voltage bus 344, corresponding to busses 214 and 215 of FIGS. 12A–B. Additionally, in the preferred embodiment, fixed logic blocks and modular logic blocks coupled to the I/O bus 335 include the timekeeping logic 350 and associated decode 360, as shown in greater detail in FIG. 17 and FIGS. 18A–G. The I/O bus 335 is coupled to a plurality of modular circuit blocks and fixed logic circuit blocks comprising interface means for bidirectional communication between the processor portion of the controller integrated circuit and the I/O bus 335.

An I/O oscillator 370 provides an output coupled to an I/O clock generator 372 which provides a first output to a display voltage generator 374 and provides a second output to the clocking and control logic 376. The clocking and control logic 376 provides a plurality of timing and control outputs, coupled to the timing and control bus 342, responsive to receiving the second output from the I/O clock oscillator 372 and to receiving a processor clock input 377. The I/O oscillator 370 is, in the preferred embodiment, an RC controlled oscillator output operating at a nominal 32 KHZ. The oscillator 370 is coupled to and drives the I/O clock oscillator 372 independent of and a synchronous to a main processor oscillator within the processor portion of the controller integrated circuit. Independence from the main oscillator yields considerable power savings in a display only mode wherein only the I/O oscillator and display circuit is active, as described in greater detail in U.S. Pat. No. 4,317,181, Four Mode Microcomputer Power Save Operation. The machine state control latches 371 are also described in greater detail therein. An oscillator which is compatible with the present invention is described in greater detail in copending application Ser. No. 130,299, filed Mar. 3, 1980, CMOS Frequency Divider Circuit.

The I/O clock generator 372 divides the received output from the I/O oscillator 370 to generate multiphase I/O clocks at different frequencies. In the preferred embodiment, the I/O clock generator 372 provides a two phase I/O clock at 8 KHZ and at 500 HZ, providing pulses suitable for shifting the common time generator 373 of the common time generator and multiplexor logic 400, every two miliseconds. The I/O clock generator 372 also provides an output which, in the preferred embodiment, generates a 125 ms pulse every third common time which may be used to provide for rapid hardware keyboard interupts via the select/R lines 300. This output may be coupled to the display voltage generator 374 so as to allow the hardware keyboard interupts to affect all display segments of the external display identically.

Figure 16A:
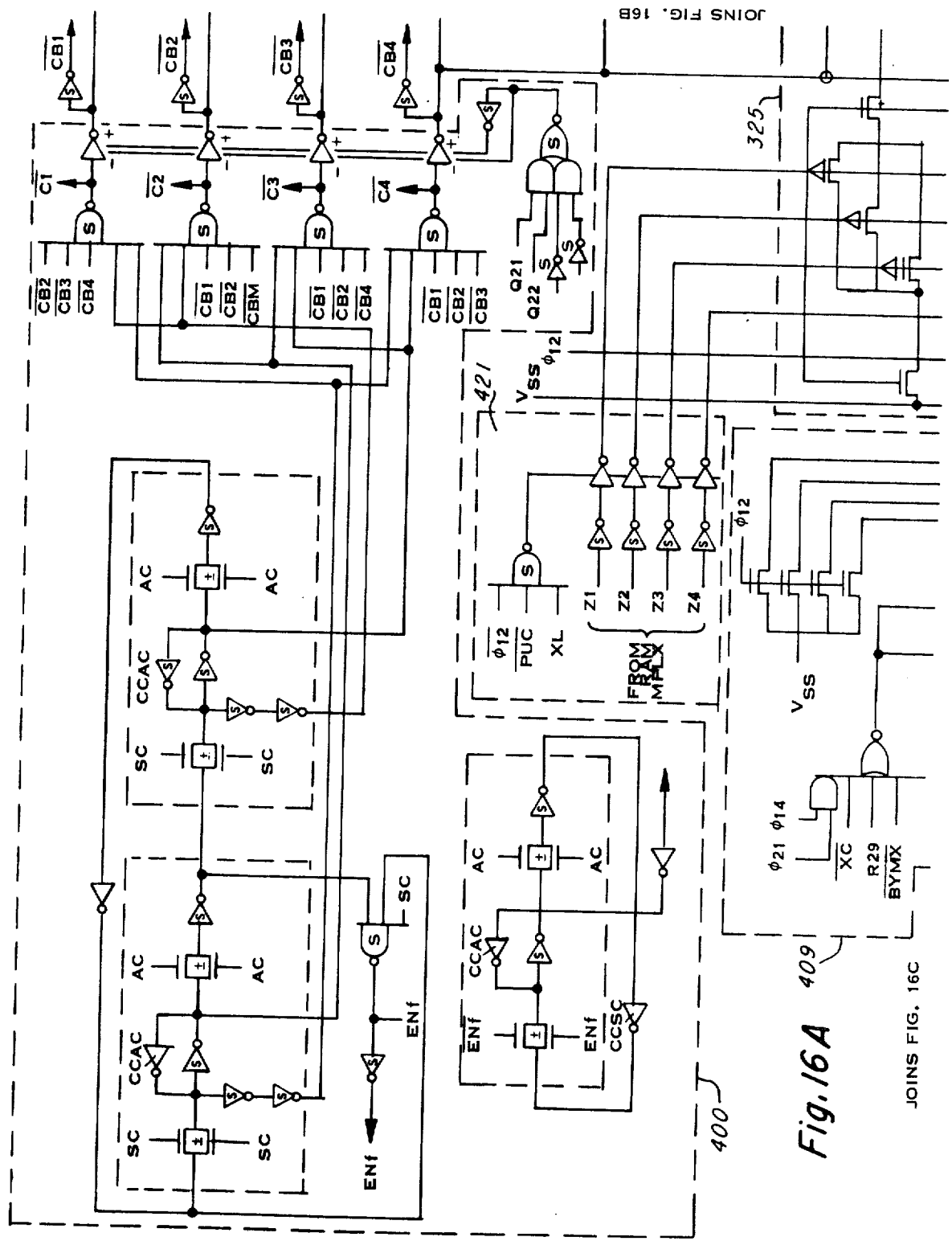

The common time generator and multiplexor logic 400 is shown in greater detail in FIG. 16A. The common time generator 373 and multiplexor 375 form a two bit shift counter in the preferred embodiment, having four states which correspond to the four common times of the system. The counter shifting rate is selected via the multiplexor 375 responsive to the outputs from the machine state control mode latches 371, so as to shift at a display rate of two milliseconds, or at the processors internal instruction cycle rate, 15 microseconds in the preferred embodiment. The common time generator 373 provides a plurality of outputs coupled to the select data latches 405 and a buffer 407. The outputs from the buffer 407 are coupled to the memory address X bus/common bus 340. The X Decode Programmable Logic Array (PLA) 410 in the preferred embodiment encodes a five bit RAM X register address received from the processor portion of the controller integrated circuit into a memory address x bus 340 compatible output so as to select a particular addressed buffer along the I/O bus 335. In the preferred embodiment, the PLA 410 provides active decode only for X addresses greater than 11000, (base 2). The output of the PLA 410 is coupled to an isolation buffer 411 which provides an output coupled to the memory address X bus 340.

Select data latches 405 are comprised of a plurality of single bit latches which store character data to be clocked into the select buffers 300. This data is received from the processor portion of the controller integrated circuit via the processor's internal data busses x and y when the latches are selected by the common time generator 373. The concept of multiple internal processor data busses is described in greater detail in copending application Ser. No. 196,829, Data Processing System Having Multiple Buses, and in copending application Ser. No. 196,808, Multiple Memory Pointer System, both filed Oct. 14, 1980. The select data latches 405 replace the conventional output programmable logic array. Character data may be stored in a look up table coded into a series of instructions in the instruction's immediate fields within the main read only memory of the integrated circuit. Only the data required for a particular individual display requirement is stored, and may be changed with a change in ROM code. The data outputs from the select data latches 405 are selectively strobed from the latches 405 responsive to the output received from the common time generator 373, in proper sequence to the select/R buffers 300 and stored in the four bit latch 301 of the select/R buffers 300 coupled via the data bus 341. Additionally, the data bus 341 is coupled to a bidirectional buffer interface 409 to one of the internal data busses from the processor portion of the controller integrated circuit. An anykeys latch 420 is coupled to the outputs from the X decode PLA 410 and to an output from a buffer 421 which couples a signal from the processor's multiplexed PZ address bus. The anykeys latch 420 may be a hardware or software controlled latch which causes all select/R line 300 outputs to be coupled to a first supply voltage, VDD in the preferred embodiment, when the anykeys latch 420 is set. The anykeys latch 420 may also enable the K-line 310 pull down transistors to activate. In the preferred embodiment, the anykeys latch may only be set during a process and display mode. In general, the anykeys latch 420 may be set and reset in response to predefined set and reset instruction execution. An output from the anykeys latch 420 is coupled to the display voltage generator 374.

The display voltage generator 374 is coupled so as to receive inputs from the machine state mode control latches 371, the common time generator 373, the anykeys latch 420, and the I/O clock generator 372. The display voltage generator 374 provides outputs coupled to the display voltage bus 344. In essence, the display voltage generator 374 serves two purposes:

(1) to generate the multiple voltage reference outputs (VDD, 2-3VDD, 1-3VDD, and VSS, in the preferred embodiment) as required for one fourth duty cycle operations; and (2) to switch the liquid crystal display drive voltage busses 344 between the voltage references and to supply a nominal 62.5 HERTZ AC waveform with a zero volt DC offset voltage for coupling to the liquid crystal display. Intermediate voltages may be generated via passive resistor divider chains, as shown in greater detail in FIG. 21. A low impeadence divider chain may be used for the first five percent of each common time when the display voltages are changing, after which time a high impedance chain may be used to hold steady the voltage level, in the preferred embodiment.

The clocking and control logic 376 is coupled so as to receive inputs from the I/O clock generator 372 and from the processor clock bus 377 from the processor portion of the controller integrated circuit.

The clocking and control logic 376 generates various timing and control signals so as to enable to the processor portion of the controller integrated circuit to synchronously interface with the I/O portion for communication. The clocking and control logic 376 may also selectively activate desired sections of the I/O portion of the integrated circuit so as to force those sections to become static combinational logic when the processor is inactive, responsive to the outputs from the control latches 371, thereby allowing the I/O to display information when driven only by the common time generator 373 (as described in greater detail in U.S. Pat. No. 4,317,180, Clocked Logic Low Power Standby Mode.

In a preferred embodiment, the I/O bus 335 is comprised of four Data Lines comprising the data bus 341; four Memory Address X/Common Lines comprising the X/common bus 340; four PZ lines comprising the PZ bus 343; six clock/control lines comprising the Timing and Control bus 343; four Display Voltage lines comprising the Display Voltage bus 344; and two power lines forming a main power bus. Each buffer, set of buffers, or special circuit coupled to the I/O bus 335 includes individual address decode circuitry so that each individual buffer or special circuit decodes its own address directly off the I/O bus 335, which may use a noncomplementary signal decoder as described in co-pending application Ser. No. 154,339, filed May 29, 1980, Address Decode System, or through any other type of address decode means. This feature of individual address decode being associated with each buffer or special circuit facilitates changing buffer address or buffer location by simply changing the hardware address decode circuitry. In the preferred emobodiment, the hardware address decode is programmable, either during processing via ion implant, via metal mask, gate mask, moat mask, or a combination thereof, or after processing via electrical programming.

Figure 16B:
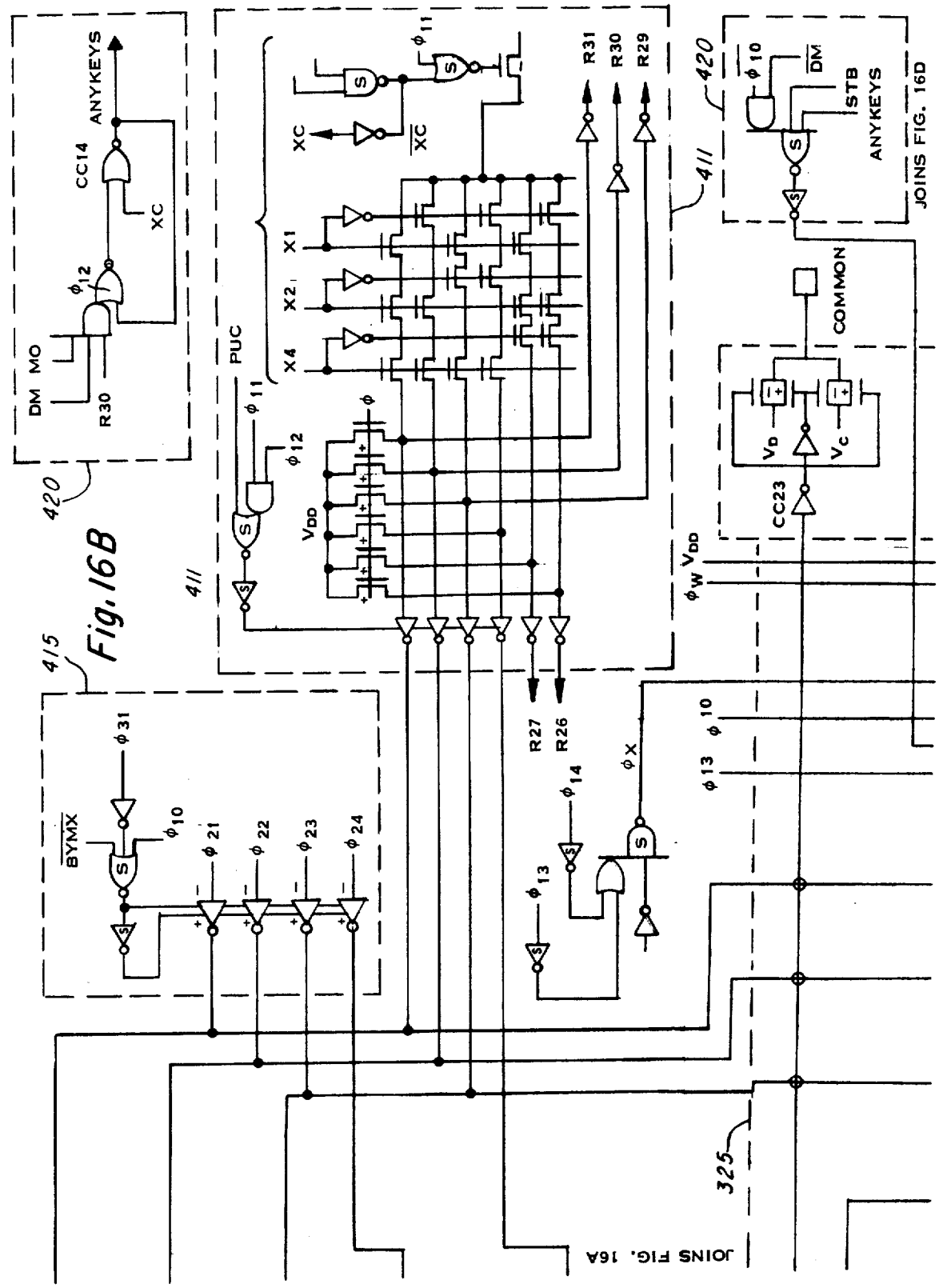
Figure 16C:
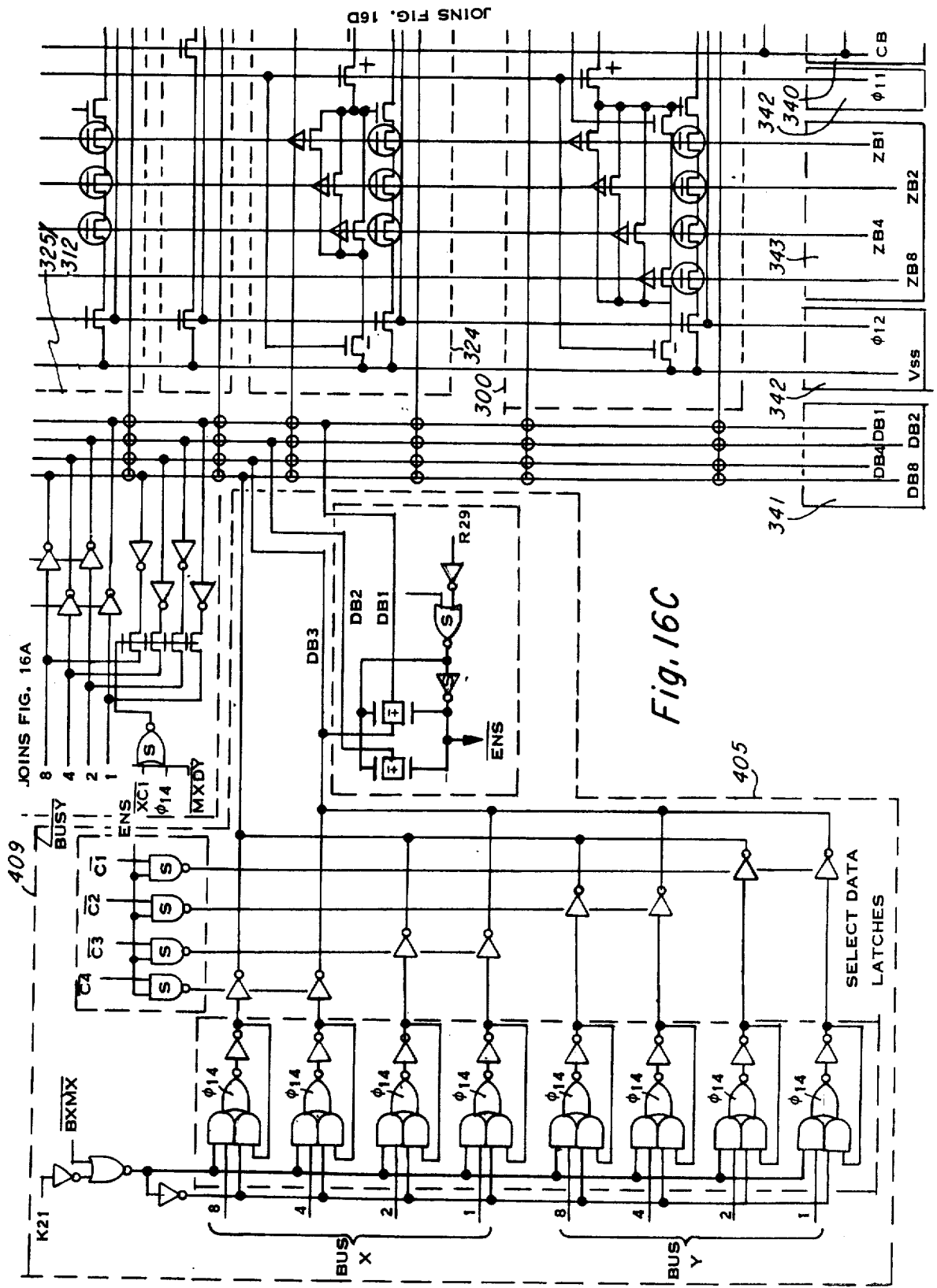

The data bus 341 as shown in greater detail in FIG. 16C, is a bidirectional multibit bus. In the preferred embodiment the data bus 381 is a four bit bus. Data transfer to and from the buffers coupled to the bus 335 and to the processor's internal bus occurs via the data bus 341. In the preferred embodiment, the processor internal bus may be a particular one of a plurality of internal processor busses as described in copending application Ser. No. 196,829, Data Processing System with Multiple Buses and application Ser. No. 196,808, Multiple Memory Pointer System, both filed Oct. 10, 1980.

The PZ address bus 343, as shown in greater detail in FIG. 16C, couples a memory address received from the processor to an individual buffer coupled to bus 335, where it is decoded. In the preferred embodiment, the PZ address bus 343 is coupled to the processor's four bit RAM word address as output from the multiplexed PZ address buffer 421, as shown in detail in FIG. 16A.

The Memory Address X/Common line bus 340 as shown in greater detail in FIGS. 16C and 16D, is a uni-directional bus which serves multiple purposes. In the preferred embodiment, the memory address x/common bus 340 is a four bit unidirectional bus which serves four purposes. First, when the processor is communicating with the I/O section, encoded register data is output from the X decode PLA 410, as shown in greater detail in FIG. 16D and, is coupled to the memory address X/common bus 340 for coupling to the selected individual buffers for decoding during the first half of the processor's instruction cycle. Second, when the processor is communicating with a Select/R buffer 300, so as to load R line data, timing signals are carried to the Select/R buffers 300 so as to strobe data into the 4-bit latch 301 during the second half of the processor's cycle. Third, while the calculator system is displaying information, the common time generator 373 utilizes the Memory Address X/Common bus 340 to couple strobe outputs to the common buffers 320 to couple data to the display while simultaneously strobing the proper data from the four bit select latches 301 to the select/R buffers 300 and therefrom to the external system. Fourth, and finally, when the processor is loading select data from an internal bus of the processor via the select data latches 405 or via the bus transciever 409, the common time generator 373 utilizes the Memory Address X/Common bus 340 to strobe data from the data bus 341 into the proper bit of the four bit latch 301 via one output of the select/R buffers 300.

The timing and control bus 342, as shown in greater detail in FIG. 16C, is comprised of various clock and control signals needed to execute addressing, data transfer, and read/write operation of the buffers coupled to the I/O bus 335. The display voltage bus 344, as shown in greater detail in FIGS. 16B and 16D, in the preferred embodiment, couples four time varying waveforms as output from the display voltage generator 374 to the common buffers 320 and to the Select/R buffers 300 so as to properly multiplex a one fourth duty cycle liquid crystal display. The unique features of the display interface and utilization of the display voltage bus 344 are described in greater detail in copending application Ser. No. 168,853, filed July 14, 1980, A Data Processing System Having Dual Output Modes.

The common buffers 320 are coupled to bus 335. The common buffers 320 couple switched time varying waveforms to the back-plane of a liquid crystal display at a frequency determined by the common time generator 373.

The select/R buffers 300, as shown in greater detail in FIGS. 16C and 16D, are coupled to the I/O bus 335. The select/R buffers 300 couple switched time varying waveforms to a front-plane of a liquid crystal display synchronous with the common time rate so as to effectuate a visible display of desired data on the liquid crystal display. Individual segments of the liquid crystal display may be turned on or off depending upon the data stored in the four bit latch 301 of the select/R buffers 300. The outputs from the select/R buffers 300 may also be utilized for logic level output lines subject to the software and electrical restrictions imposed by the system design.

The K lines buffer 310, as shown in greater detail in FIGS. 16A and 16D, are coupled to the Memory Address X/Common bus 340, the data bus 341, the timing and control bus 342, and the PZ bus 343, in the preferred embodiment. The K lines buffer 310 couple to externally supplied inputs and provide logic level inputs for coupling to the I/O bus 335. In the preferred embodiment, the K line buffers 310 include active pull down devices. In the preferred embodiment, the K lines 310 are utilized to sample the keyboard at periodic intervals. Additionally, the pads 311 to which the K line buffers 310 are coupled also serve as output couplings for four bit test data output when the calculator system is in the test mode, as described in greater detail in copending application Ser. No. 221,434, filed Jan. 19, 1981, Executing an Externally Jammed Instruction in a Calculator in a Test Mode.

The print I/O buffer 325 is coupled to the I/O bus 335. The print I/O buffer 325 is designed so as to provide for communication with an external printer-controller integrated circuit. In a preferred embodiment, the print I/O buffer 325 is used with a pulse/width modulation serial data transmission technique. Included in the print I/O buffer 325 are the address decode, an amplifier, and a latch 331 attached thereto which stores the last fixed logic level transmitted on the serial I/O line in accordance with a desired communication protocol, as described in greater detail with reference to FIG. 25.

The external I/O buffers 330, as shown in greater detail in FIGS. 16C and 16D, provide for bidirectional communication with circuits external to the controller integrated circuit. Included with the I/O buffers 330 are the associated address decode, buffer amplifiers, and I/O pulldown latches 331 as described in greater detail with reference to FIG. 25.

The anykeys latch 420, as shown in greater detail in FIG. 16B, is a software controlled latch which pulls all select/R pads to VDD, the positive supply voltage in the preferred embodiment, when the latch 420 is set. Additionally, the anykeys latch 420 may enable the K-line pull down devices. The anykeys latch 420 is set by any of a plurality of instructions executed after a first predefined X register address is decoded when the controller integrated circuit is in a particular power mode as determined by the output from the mode latches 371. In the preferred embodiment, the anykeys latch 420 is set by any instruction executed after addressing the X register 30 when the calculator system is in a process and display mode. The anykeys latch is reset in response to receiving an X register address less than a second predefined value. In the preferred embodiment, the second predefined value is 24.

Figure 14A:
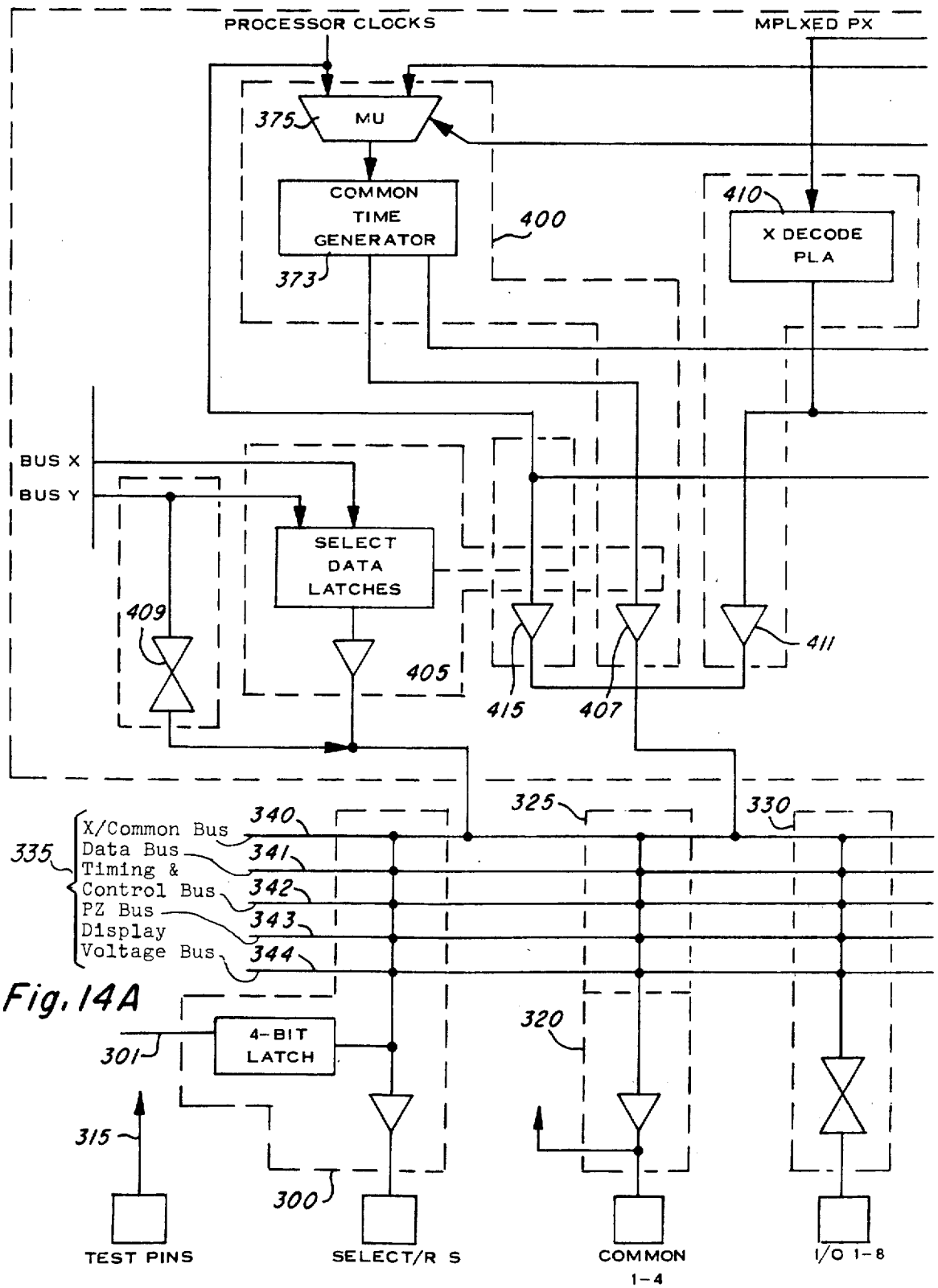
FIGS. 14A-B together form a block diagram of a preferred embodiment of the memory mapped I/O in a modular controller integrated circuit as described with reference with FIGS. 12A-B and 13A-B.
Figure 14B:
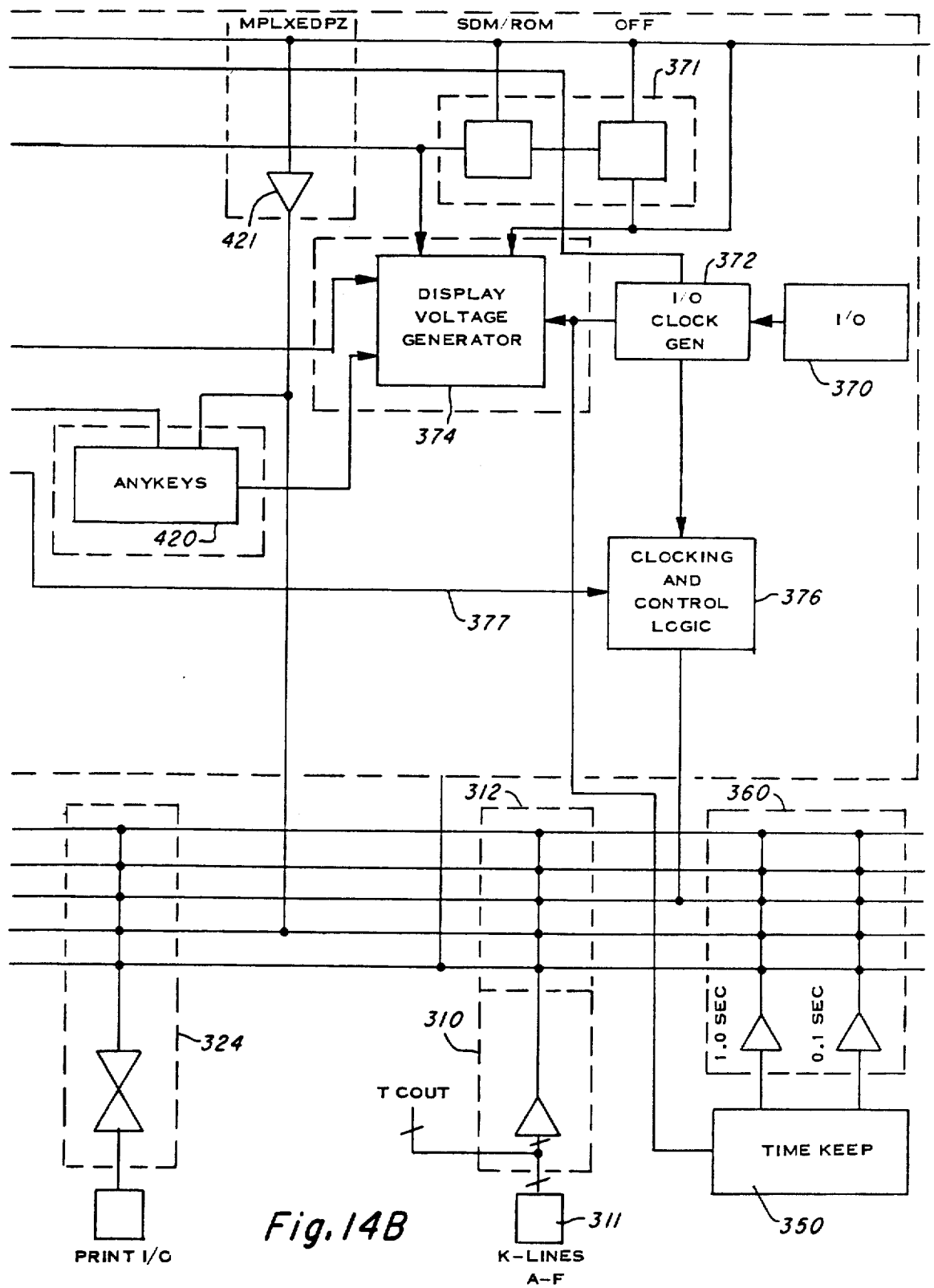

In the preferred embodiment, the I/O section as shown in FIGS. 14A and 14B appears as an extension of RAM memory to the processor and to the instructions as determined by the software. The I/O section is addressed by the same memory pointers that address the processor read/write memory RAM. In a preferred embodiment, a multiple memory pointer system may be utilized such as disclosed copending application Ser. No. 196,892, Data Processing System Having Multiple Buses and application Ser. No. 196,808, Multiple Memory Pointer System, both filed Oct. 14, 1980. The data transfer polarity may be determined by the same read and write microcodes which control the processor RAM. The anykeys latch 420 is reset when the main ocilator latch (MO) of the mode control latches 371 provides an active level output and when the X register address received on the X/common bus 340, contains the address 24. The anykeys latch 420 is set when the display mode (DM) and the MO latches of the mode control latches 371 both provide active outputs, and the address output on the X/common bus 340 is 30. The select data latches 405 may be written into when the received address from the X/common bus 340 is 27, when a microcode bit BXMX is at an active logical level (1), and when the MO latch of the control mode latches 371 provides an active output. The print/I/O buffer 325 may be written into when the X/common bus 340 contains the address 28, when a microcode bit BXMY is at an inactive (o) or low logic level, when a microcode bit BYMX is at an active or high logic level, and when the output of the MO latch of the control mode latches 371 is at an active output level. The print buffer may be read from when the X/common bus 340 contains the address 28 (base 10), when the microcode bit MXBY is at an active logic level, when the microcode bit BYMX is at an inactive logic level, and when the output from the MO latch of the mode control latches 371 is at an active level. The outputs from the select data latches 405 may be written into the select/R buffers 300 when the X/common bus 340 contains the X register address 29, when the PZ bus 343 contains the word address 000-1101 (binary), when the microcode bit MXBY is at an inactive level, when the microcode bit BYMX is at an active output level and the output from the MO latch of the mode control latches 371 is at an active logic level. The four most significant bits, KA-KD, of the K line buffers 310, may be read when the X/common bus 340 contains the X register address 30 (base 10), when the PZ bus 343 contains the word address 00011 or 1011 (base 2), when the microcode data bit MXBY is at an active logic level, when the microcode bit BYMX is at an inactive logic level, and when the output of the MO latch of the mode control latches 371 is at an active logic level. Additionally, when the X/common bus 340 contains the address 30, and when the PZ bus 343 contains the word address 0100 or 1100, when the microcode data bit MXBY is at an active logic level, when the microcode data bit BYMX is at an inactive logic level, and when the MO latch of the mode control latch 371 is an active output level, then the least significant bit, KE, input from the K line buffers 310 is read to the data bus 341. Finally, when the X/common bus 340 contains the register address 31 (base 10), the PZ bus 343 contains the word address 0000-0101 or 1000-1101 (base 2), when the microcode data bit MXBY is inactive, when microcode bit BYMX is active, and when the mode control latch 371 provides an active MO output and an inactive DM output, then the select/R buffers 300 may be written into with the R data.

When the PZ bus 343 contains a 0 address, either select addresses SOA and SOB or outputs R0-R3 are selected depending on whether the select buffers or the R buffers are being addressed. The R-line addresses are repeated starting at PZ bus 343 output equal to 8, because the most significant bit of the PZ bus 343 is disabled, in the preferred embodiment, during decode of the control information, so as to allow selection of four R lines at any given time. The R-line addresses are written underneath the bit of the data bus 341 to which the particular R line is coupled to.

Figure 15:
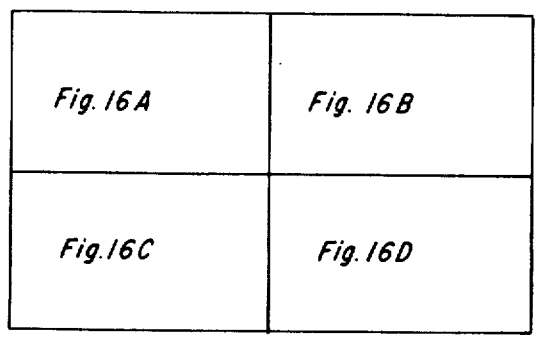
FIG. 15 shows the layout interrelationship of FIGS. 16A-D.

Referring to FIG. 15, the layout interrelationship of the FIGS. 16A to 16D is shown. Referring to FIGS. 16A to 16D, common time generator logic 400 is shown including the common time generator 373, the multiplexor 375, and the buffer 407. Additionally, the PZ bus buffer 421 is shown (FIG. 16A). The processor internal bus to I/O data bus 341 interface transciever 409 is shown in FIGS. 16A and 16C. The address decode means 325 and associated common buffer 320 is shown in FIGS. 16A to 16D. The processor clock to common bus interface 415 is shown in FIG. 16B. The anykeys latch 420 is shown in FIG. 16B. The X-decode PLA 410 is shown in FIG. 16B also. The select data latches 405 is shown in FIG. 16C. The data bus 341, timing and control bus 342, the PZ bus 343, and Memory Address X/Common bus 340, are shown in FIGS. 16C and 16D, while the display voltage bus is shown in FIG. 16D. The K line buffers and associated decode 310 and 312, the I/O Buffers 330 and associated decode, the print I/O buffer 324 and associated decode, the select/R buffer and associated decode 300, and four bit latch 301, are shown in FIGS. 16C and 16D.

Figure 17:
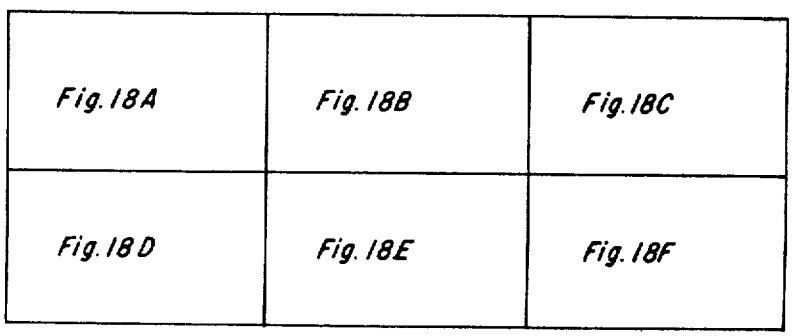
FIG. 17 shows the layout interrelationship of FIGS. 18A-F.
Figure 18A:
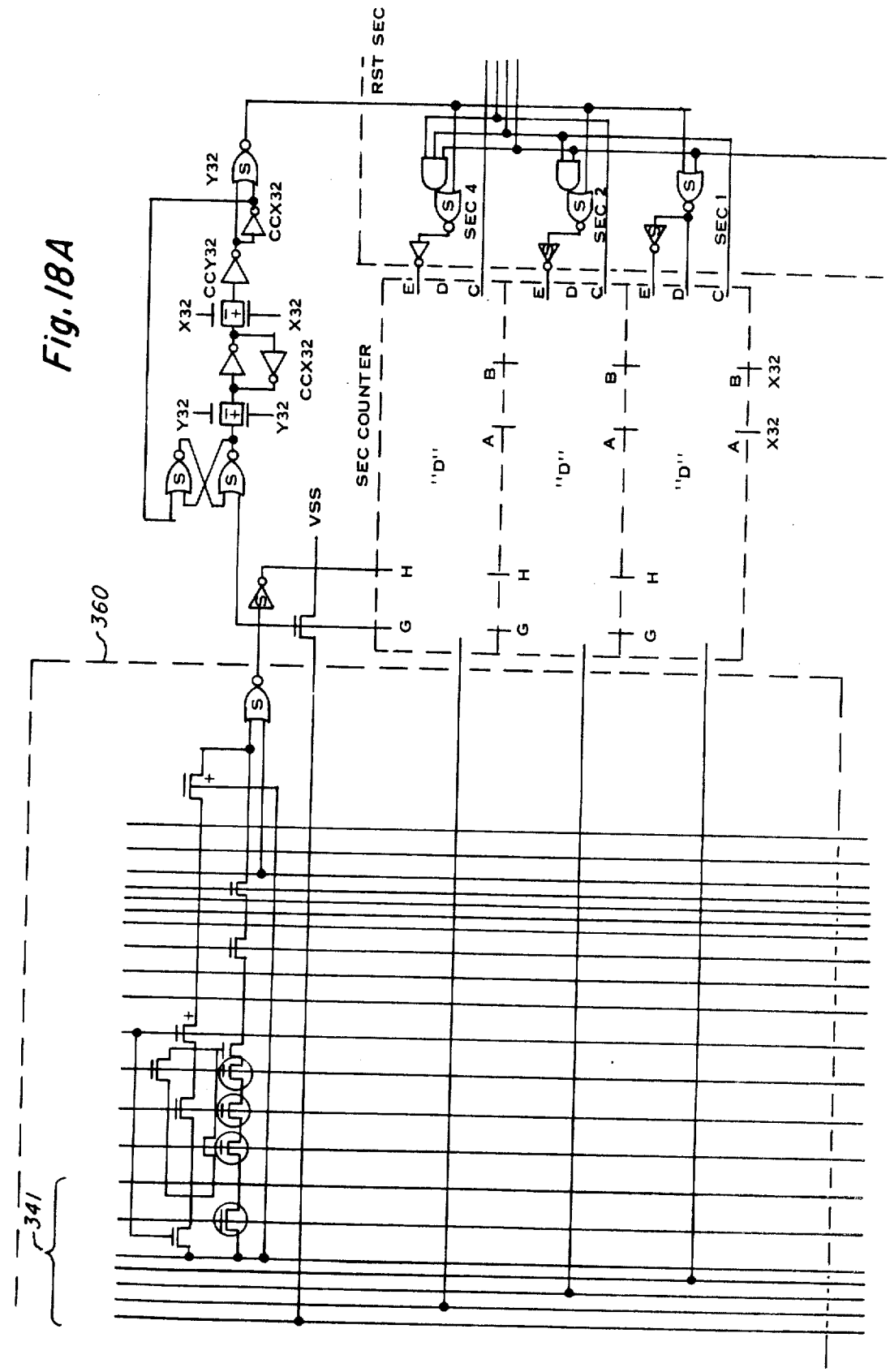
FIGS. 18A-F are detailed schematic representations of the timekeeping logic and associated address decode of FIG. 14B.
Figure 18B:
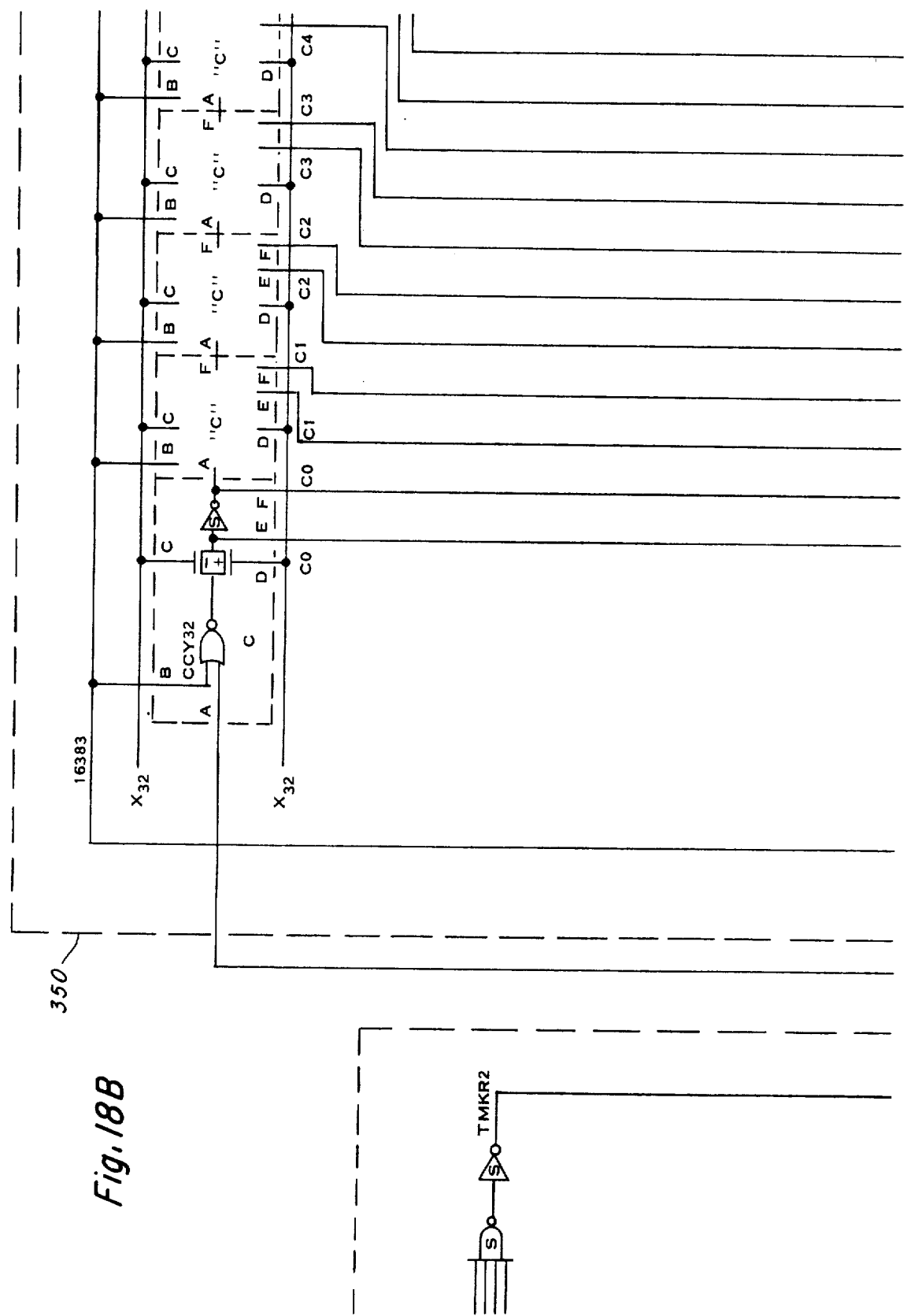
Figure 18C:
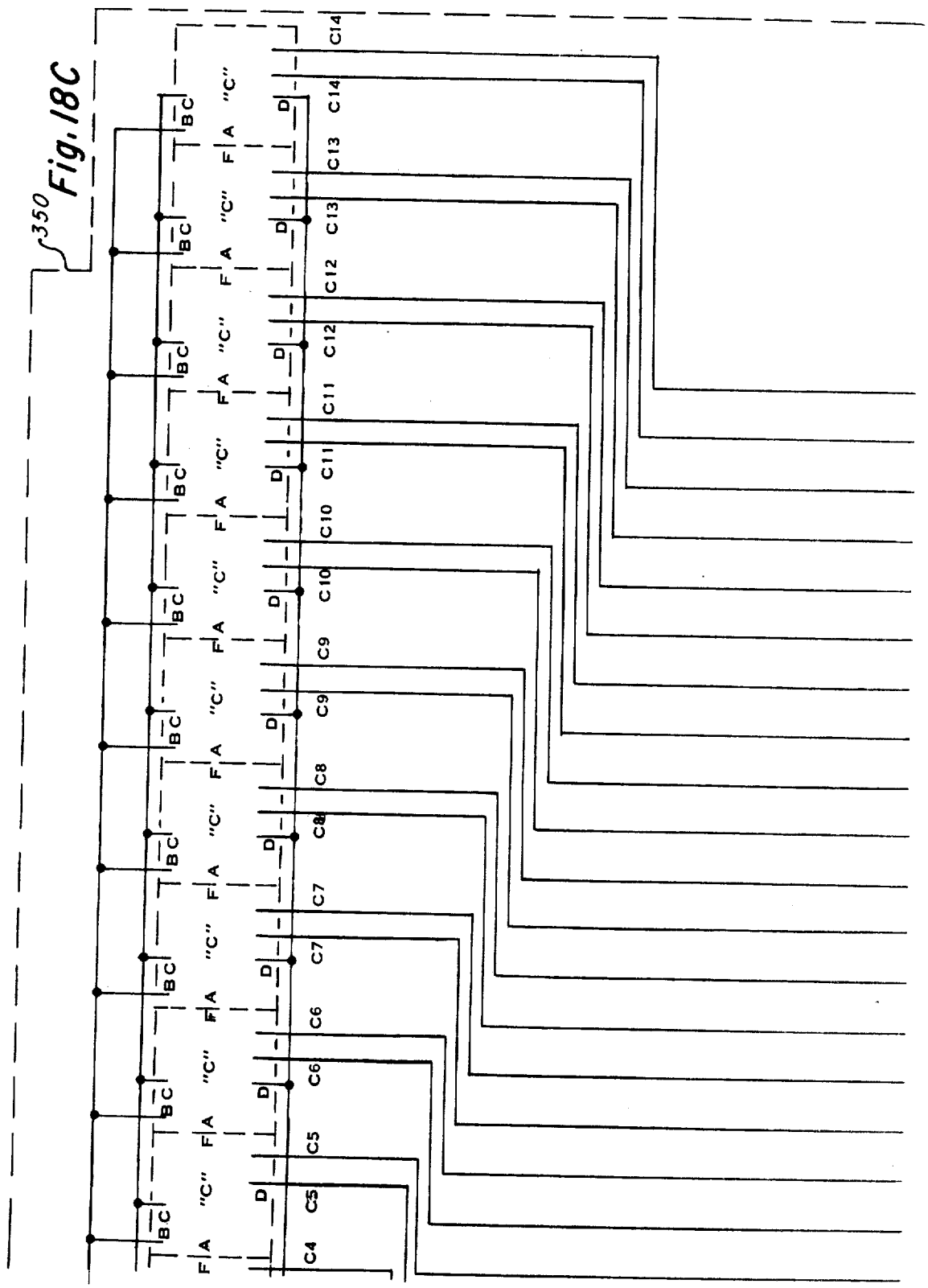
Figure 18D:
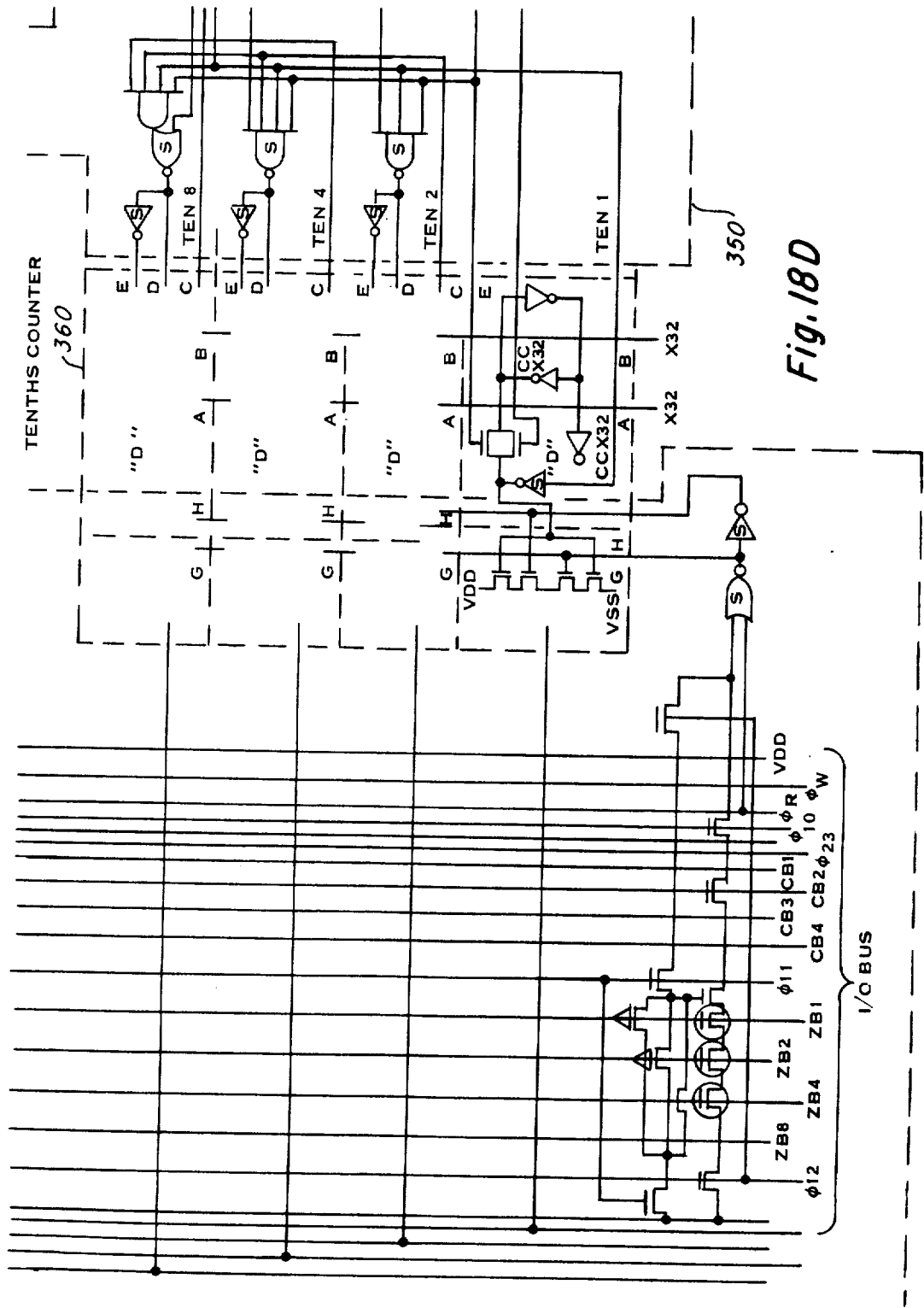
Figure 18E:
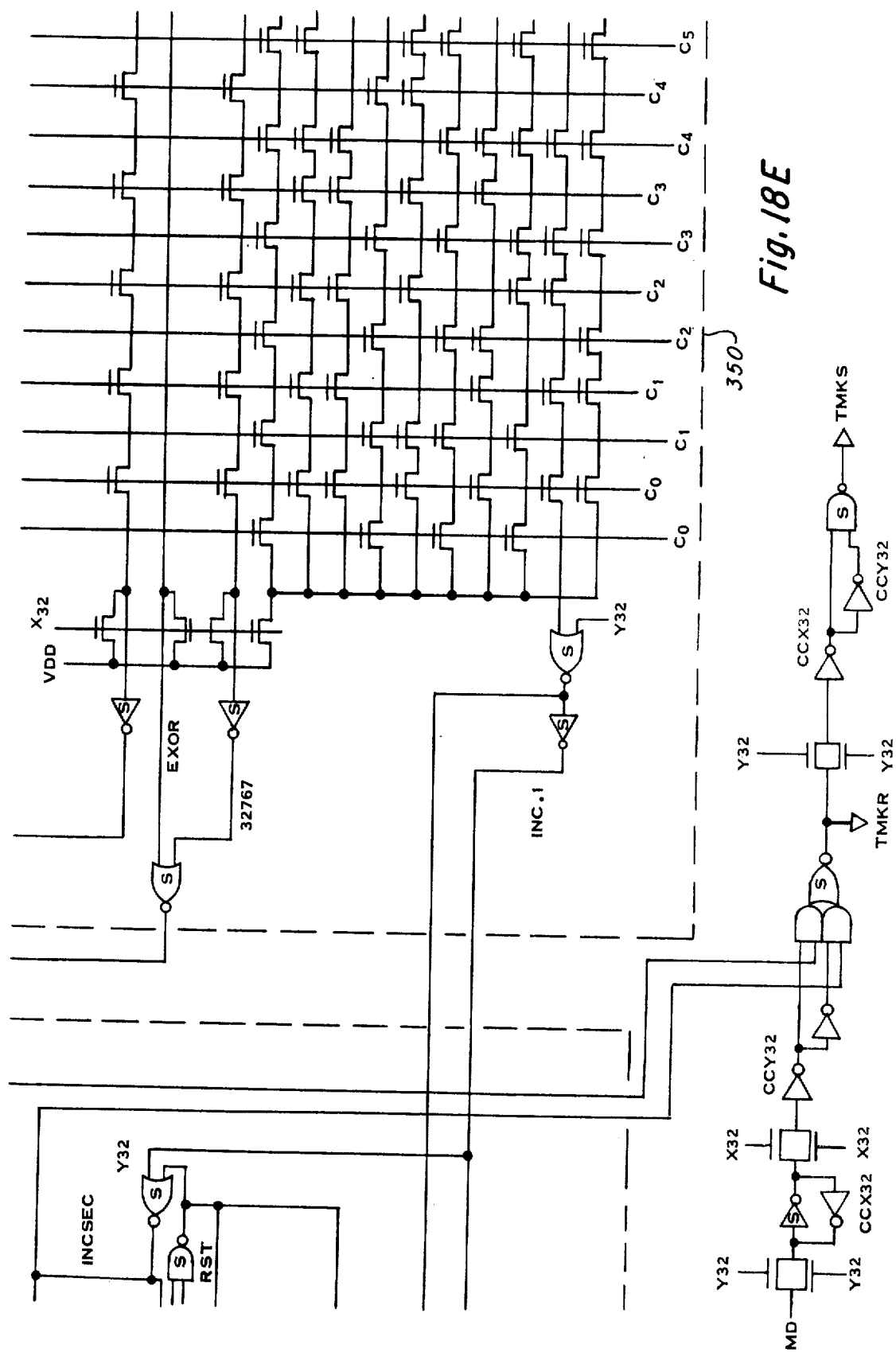
Figure 18F:
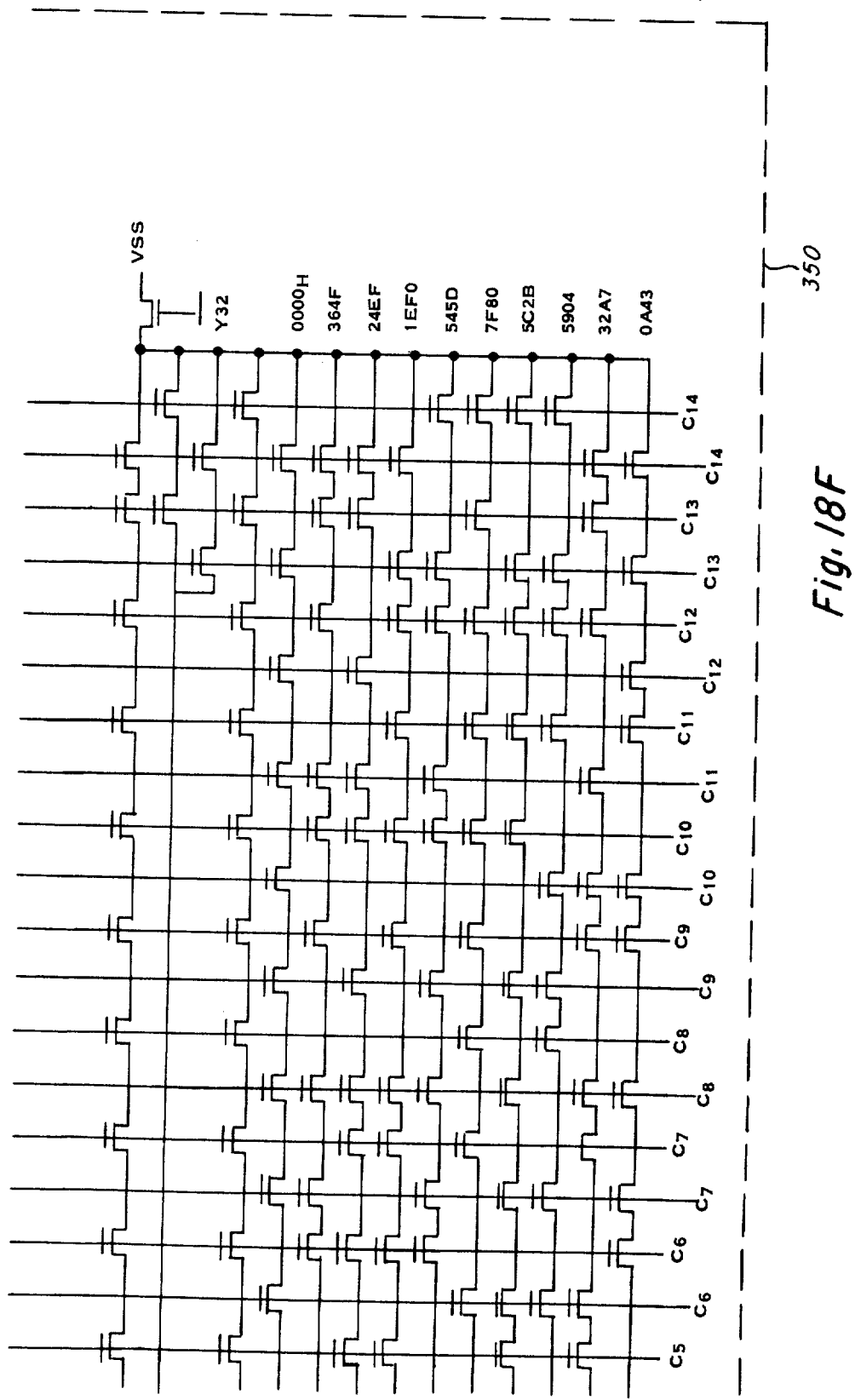

Referring to FIG. 17, the interrelationship of FIGS. 18A 18F is shown. The timekeeping logic 350 and associated address decode 360 of FIG. 14B is shown in greater detail in FIGS. 18A to 18F. More specifically, the timekeeping logic 350 is shown in detail in in FIGS. 18B, 18C, 18E and 18F, and the associated address decode and coupling to the bus 335 is shown in FIGS. 18A and 18D.

Figure 19:
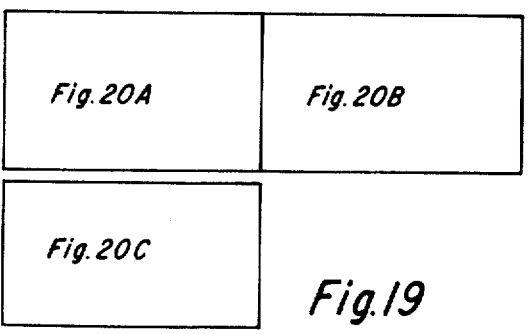
FIG. 19 is a schematic interrelationship diagram of FIGS. 20A and 20B.
Figure 20A:
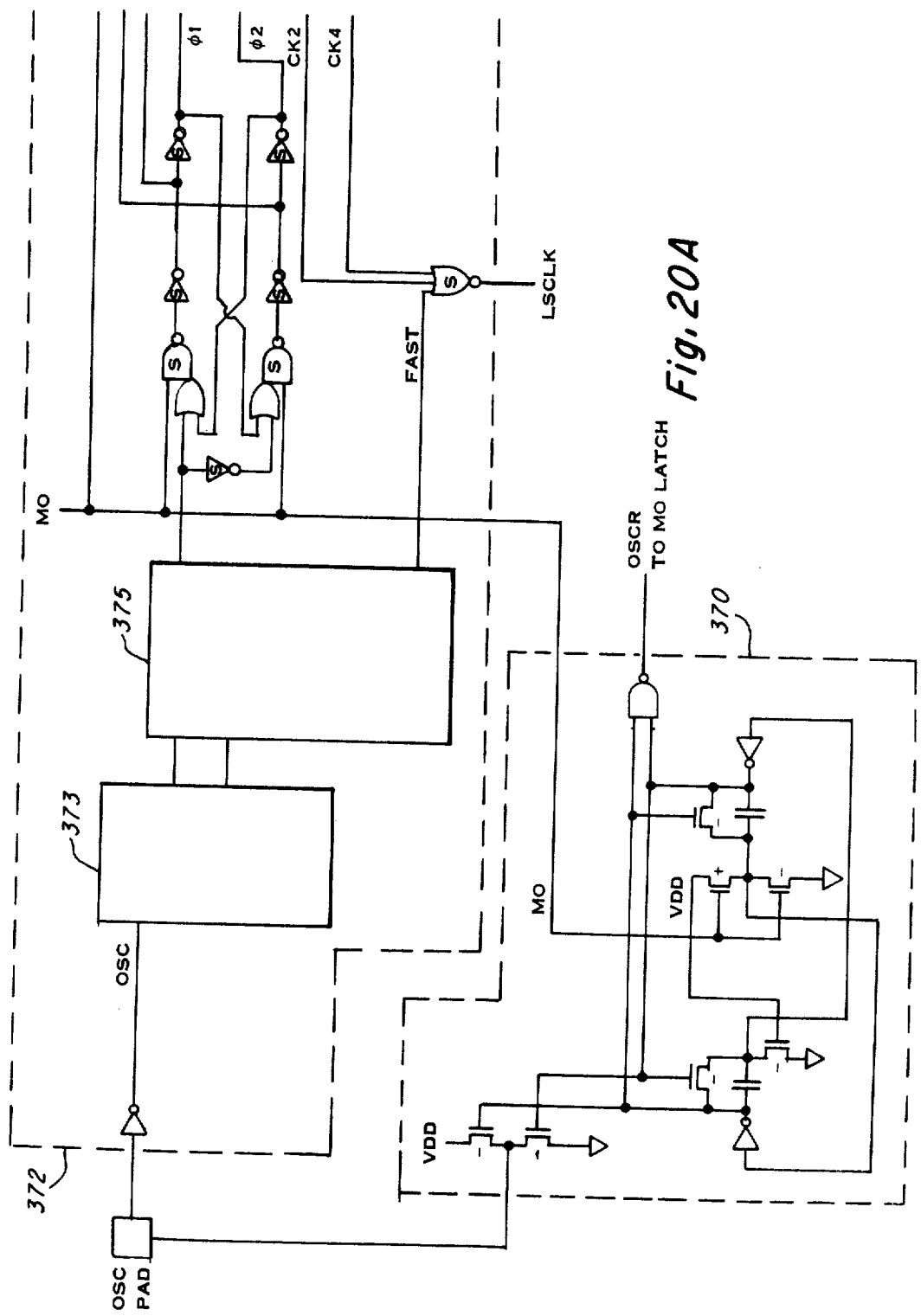
FIGS. 20A-C are a detailed schematic representation of the I/O Oscillator, I/O clock generator, and logic associated therewith as described with reference to FIG. 14B.
Figure 20B:
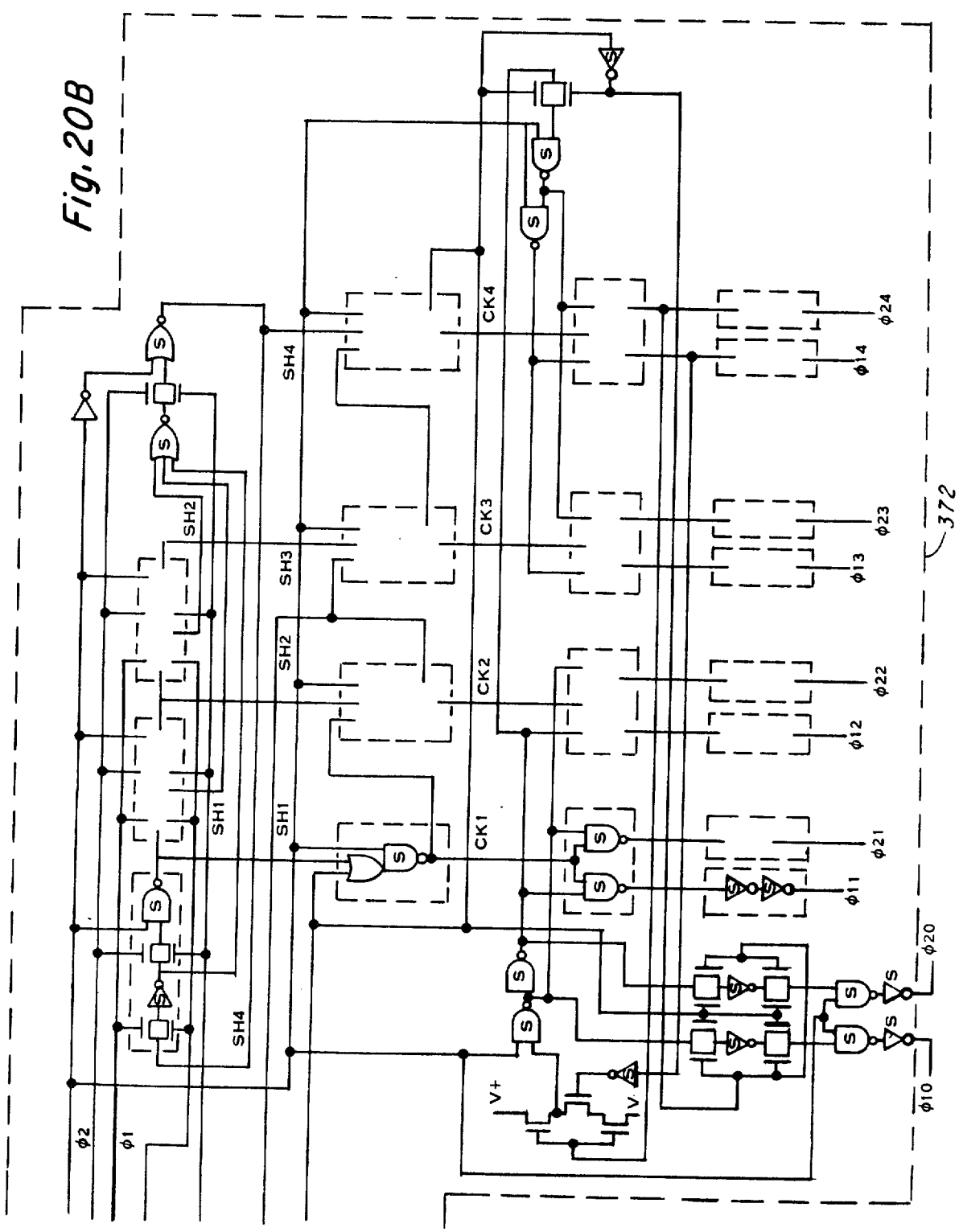
Figure 20C:
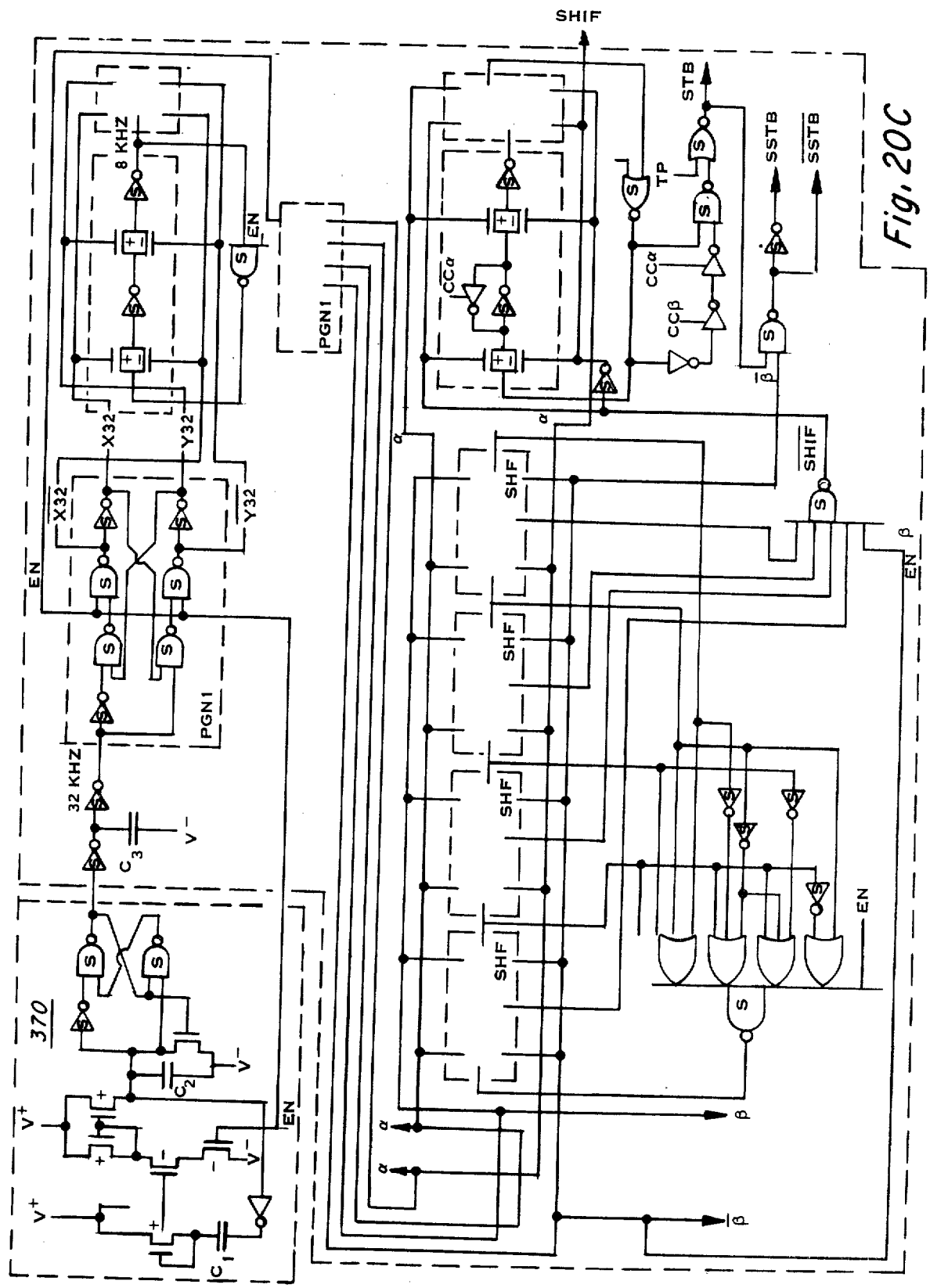
Figure 21:
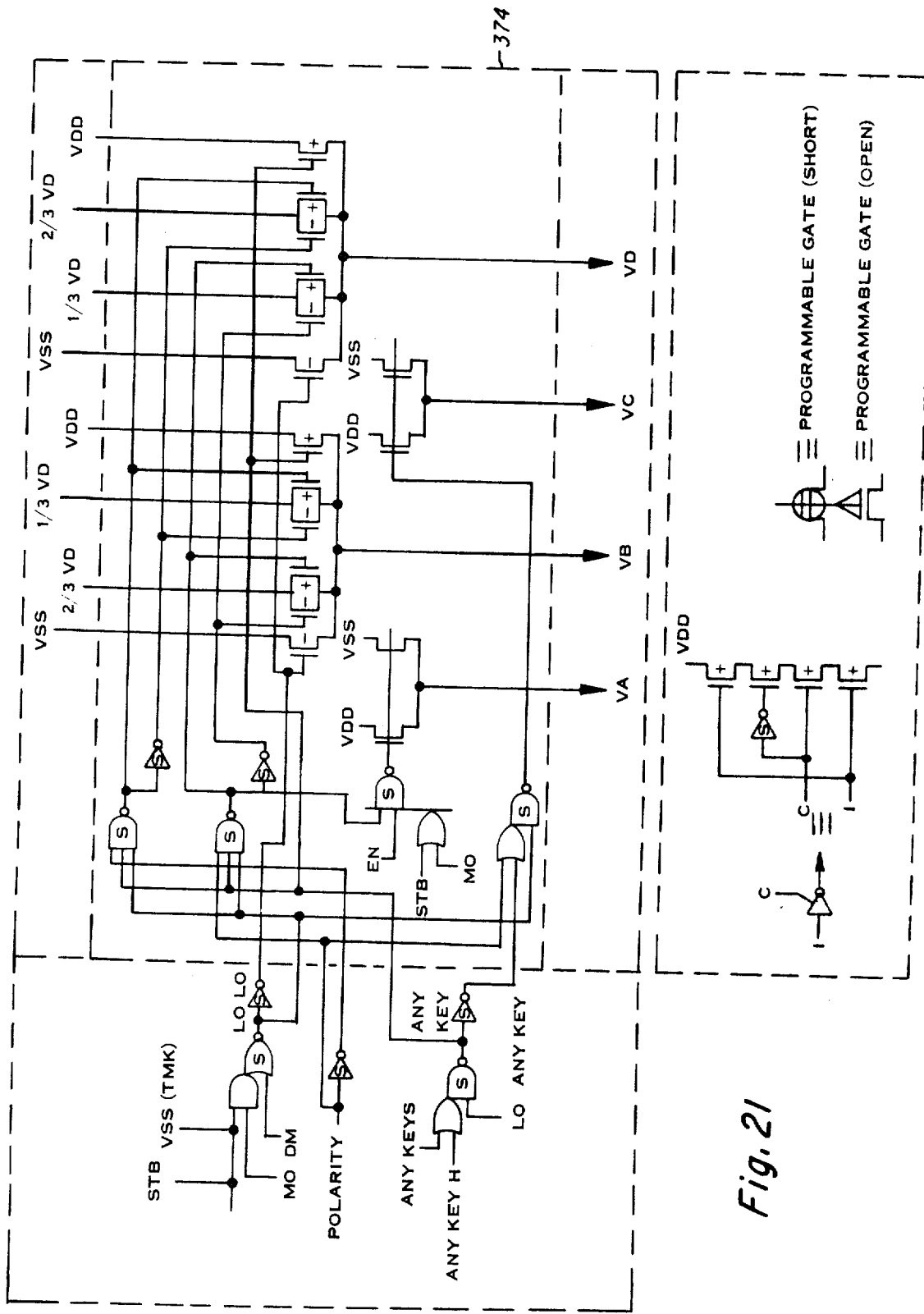
FIG. 21 is a detailed schematic diagram of the display voltage generator of FIG. 14B.

Referring to FIG. 19, the schematic interrelationship of FIGS. 20A to 20B is shown. Referring to FIGS. 20A–20C, a detailed schematic representation of the I/O oscillator 370, I/O clock generator 372, and logic associated therewith is shown, as described with reference to FIG. 14B. The I/O oscillator 370, and associated divide logic 373 and speed select logic 375 is shown in FIG. 20A, with the main oscillator portion of the I/O oscillator 370 shown in FIG. 20C. The I/O Clock generator 372 is shown in FIGS. 20A–C. 370 is described in Referring to FIG. 21, the display voltage generator 374 of FIG. 14B is shown in greater detail. Also shown in FIG. 21 is a key as to schematic conventions used in the figures.

Figure 22:
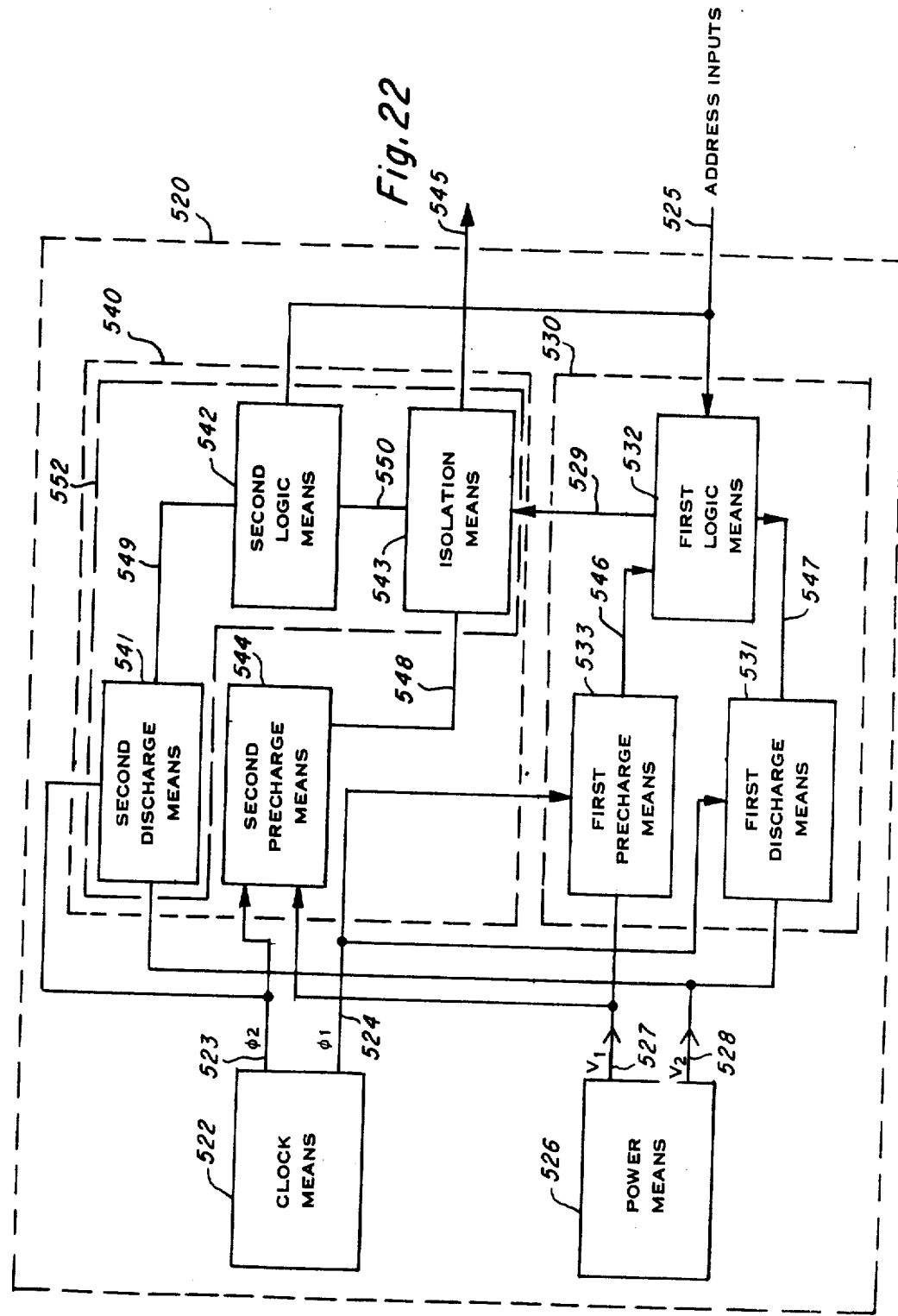
FIG. 22 is a block diagram of the address decode means of FIGS. 14A-B.
Figure 23:
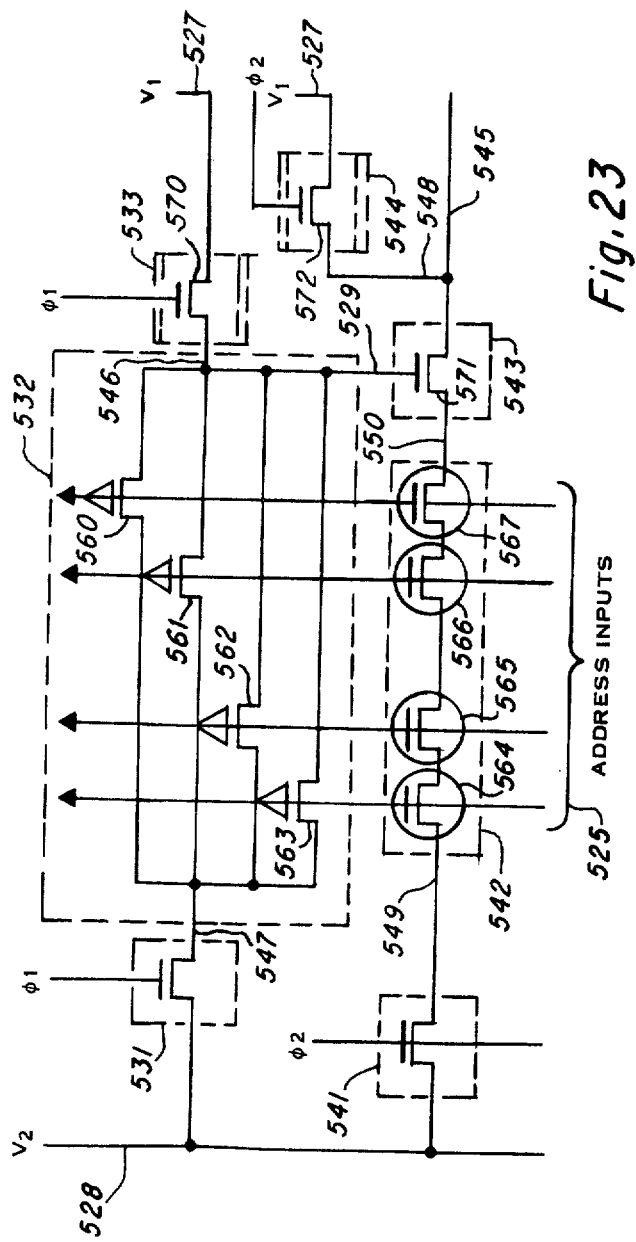
FIG. 23 is a detailed schematic embodiment of the address decode circuit of FIG. 22.
Figure 24:
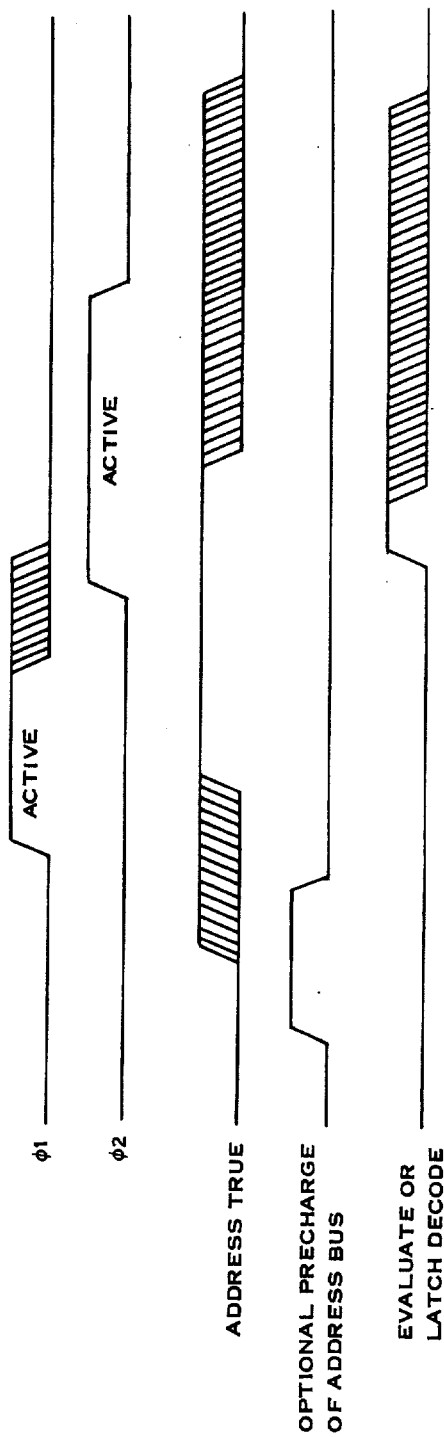
FIG. 24 is a signal timing diagram for the circuitry of FIG. 23.

Referring to FIG. 22, a block diagram of the address decode means coupled to the I/O bus 335 and coupled to individual associated buffers of FIGS. 14A and 14B is shown. FIGS. 22–24 provide detailed schematics of the address decode circuits (i.e. 325, 312, 360 etc.) coupled to the bus 335 of FIGS. 14A and 14B, and of FIGS. 16A to 16D. Referring to FIG. 22, an address decode circuit having noncomplementary address inputs 525 is comprised of a first decode circuit means 530 for receiving the address inputs 525 and for selectively providing an active first decode output 529 in response to decoding a first logic level in a predefined combination from the received address inputs 525. A second decode circuit means 540 is coupled to the address inputs 525 for receiving the address inputs, and is coupled to the first decode means 530. The second decode means selectively provides an active second decode output 545 in response to coincidentally (1) decoding a second logic level in the predefined combination from the received address input and (2) receiving the active first decode output 529 from the first decode means 530. The active second decode output 545 is thereby indicative of the address inputs having the desired predefined combination. In the preferred embodiment, the first decode means 530 and second decode means 540 are programmable so as to allow selection of the desired predefined combination of the first and second logic levels. In other words, the first decode means 530 and second decode means 540 may be selectively programmed, either by hardware programming during the processing of the integrated circuit or electrical programming after completion of processing. The address decode circuit 520 having noncomplementary address inputs may be further comprised of a clock circuit means 522 for providing a first clock output 524 and a second clock output 523. The clock means 522 provides an active first clock output 524 having a first active time interval and an active second clock output 523 having a second active time interval, as shown in the FIG. 24 with reference to $\phi 1$, and $\phi 2$, respectively. Additionally, the address decode circuit 520 may be comprised of power means 526 for providing a first voltage output 527 at a first voltage level $V_1$ and a second voltage output 528 at a second voltage level $V_2$. A first precharge means 533, within the first decode means 530, is coupled to the first voltage output 527 of the power means 526 and to the first clock output 524 of the clock means 522. First precharge means 533 selectively provides a first precharge output 546 during the active (first voltage level) clock output portion of the first active time interval. The first precharge output 546 is provided at the first voltage level in response to receiving the first clock output 524. A first discharge means 531 within the first decode means 530 is coupled to the second voltage output 528 of the power means 526, and to the first clock output 524 of the clock means 522. First discharge means 531 selectively couples a received input 547 from first logic means 532, within the first decode means 530, to the second voltage output 528 in response to receiving the active first clock output 524. The first logic means 532 is coupled to the output 546 of the first precharge means 533 and provides the output 547 coupled to the first discharge means 531. The first logic means selectively isolates the received first precharge means 533 output 546 from the output 547, coupled to the first discharge means 531, in response to receiving a predefined first combination of address inputs 525.

The second decode means 540 is further comprised of a second precharge means 544, coupled to the first voltage output 527 of the power means 526 and coupled to the second clock output 523 of the clock means 522. Second precharge means 544 selectively provides a second precharge output 548 for the duration of the second active time interval, as shown with reference to signal $\phi 2$ of FIG. 24 Second precharge means 544 provides the second precharge output 548 at the first voltage level in response to receiving the active second clock output 523. A second discharge means 541 is coupled to the second voltage output 528 of the power means 526 and is coupled to the second clock output 523 of the clock means 522. Second discharge means 541 selectively couples a received signal 549 to the second voltage output 528 in response to receiving the active second clock output 523. A second logic means 542 is coupled to the second discharge means 541 for selectively coupling a received input 550 from an isolation means 543 via signal 549 to the input of the second discharge means 541 in response to receiving a predefined second combination of address inputs. The isolation means 543 is coupled to the second logic means 542, for selectively coupling the input 550 to the second logic means 542. The isolation means 543 is further coupled to the output 548 from the second precharge means 544, and is also coupled to the first decode output 529 from the first logic means 532. The isolation means 543 provides an output 545 indicating the decode circuit 520 has received a predefined combination on the received address inputs 525. The isolation means 543 provides the decode output 545 in response to receiving the second precharge output 548, and the active first decode output 529 when the second logic means 542 couples the received input 550 to the second discharge means input 549. This couples the isolation means 543 to the second voltage output, and causes the output 545 from the isolation means 543 to be coupled to the second voltage output $V_2$ thereby indicating a true decode of the desired address.

The controller chip integrated circuit of FIGS. 14A and 14B has a plurality of addressable function modules and is comprised of address bus means, such as memory address X/common bus 340, for providing noncomplementary address outputs 525 and power bus means 526 for providing a first voltage output 527 at a first level and a second voltage output 528 at a second level as shown with reference to FIGS. 22-24. The first precharge means 533 is coupled to the first voltage output 527 for providing an output 546 at the first level for a first time interval, as determined by the clock output 524 of the clock means 522. The first logic means 532 is coupled to the address inputs 525 and to the second voltage output 528 via the first means 531, and is coupled to the output 546 of the first precharge means 533. The first logic means 532 includes means for selectively providing a first decode output 529 at the first level, during a second time interval commencing subsequent to the commencement of the first time interval, responsive to the clock means 522, when the received address inputs 525 are at a predefined combination. Additionally, the first logic means 532 includes means for selectively providing the first decode output 529 at the second level during the second time interval when the received address outputs are not at the predefined combination. The second precharge means 544 is coupled to receive the first voltage output 527, for providing an output 548 at the first level for a third time interval commencing subsequent to the commencement of the second time interval, responsive to the clock means 522. A second logic means 542 is coupled to receive the address inputs 525, the second voltage output 528 via signal 549 of second discharge means 541, and the second precharge means 544 output 548. Isolation means 543 includes means for selectively providing an output 545 at the second level during the third time interval when the received address outputs are at the predefined combination, and further includes means for selectively providing the output 545 at the first level during the third time interval when the received address outputs are not at the predefined combination. The first time interval, second time interval, and third time interval as described above may be better understood by reference to the $\phi 1$, $\phi 2$, and latch decode signal waveforms of FIG. 24.

Referring to FIG. 23, a detailed schematic embodiment of the address decode circuit of FIG. 22 is shown. Corresponding functional blocks of FIG. 22 are appropriately numbered in FIG. 23. In this preferred embodiment, the first logic means 532 is comprised of an array of parallel transistors 560-563, the input to each of the transistors 560-563 in the array 532 being coupled to an independent and separate address input 525. In the preferred embodiment each transistor 560-563 is selectively open circuitable in response to a programmed first matrix input. That is, the transistors 560-563 in the array 532 may be selectively programmed, either during processing via mask level layout or after processing via electrical programming, so as to define the predefined combination of address inputs to which the first logic means 532 will respond. The second logic means 542 may be comprised of an array of transistors 564-567 in series connection, an input of each of the transistors 564-567 being coupled to an independent and separate address input 525, with each of the transistors 564-567 in the array being selectively short circuitable in response to recieving a programmed second matrix input. In a manner similar to that described above with reference to the first logic means 532, the programmability of the second logic means 542 may be achieved via processing by mask level design and layout or ion implantation, or after processing of the integrated circuit by electrical programming. The function served by the first logic means 532 and the second logic means 542 is determined in part by the semiconductor process by which the devices are constructed.

For an N-channel process, the function of the first logic means 532 is to decode a predefined combination of zeros, that is second level voltage inputs, from the address inputs 525. In this embodiment, the individual transistors 560-563 are selectively programmed to be open circuited where it is not desired to decode the zero on the corresponding address input 525, and are not programmed to be open circuited, that is are left intact in the array 532, where it is desired to decode a zero. When the address inputs 525 which are coupled to non-open circuited transistors in the array 532 contain a second level voltage input, the decode logic 532 will not couple the output 546 from the first precharge means 533 to the input 547 of the first discharge means 531, thereby preventing discharge of the first decode output 529. First decode output 529 is at the first voltage level after the first time interval because of the precharge action of transistor 570 of the first precharge means 533 coupling the first decode output 529 to the first voltage output 527. When the first decode output 529 is at the first level, the isolation means 543 is enabled, that is transistor 571 is turned on, thereby coupling the second precharge means output 548 to the second decode logic means 542. If a first voltage level output is present on the address inputs 525 which are coupled to the non-open circuited transistors of the array 532, then the output 529 is discharged to the second voltage output level, thereby disabling the isolation means 543. Thus the second precharge output 548 is not coupled to the second decode means 542, and instead the second precharge output 548 is coupled to the decode output 545, providing an output 545 at the first level, indicative of a false decode.

In this N-channel embodiment, the function of the second decode means 542 is to decode a predefined combination of ones, that is first voltage level outputs, received on the address inputs 525. The transistors 564-567 of the second decode means 542 are coupled in series connection, and are selectively programmable to be short circuited. The short circuits may be programmed by the same means as was described above with reference to the programmable open circuits. When the address inputs 525 which are coupled to the nonshortcircuited transistors of the second logic means 542 are at the first voltage level (ones), the transistors of the second logic means 542 are enabled, thereby providing a discharge path from the isolation means 543 to the second voltage output 528 of the discharge means 541. The discharge path via second discharge means 541 is not present until the second clock $\phi 2$ activates the second discharge means 541, thereby allowing time for the first logic means 532 to perform its function and provide an active or inactive first decode output 529 according to the state of the address inputs 525. When the desired combination of the address inputs is provided to the first logic means 532 and to the second logic means 542, the isolation means 543 is enabled so as to couple the precharge voltage output 548 from the second precharge means 544 and the decode output 545 to the second logic means 542, which provides a serial discharge path via discharge means 541 to the second voltage 528, thereby discharging the decode output 545 to the second voltage level, providing an indication of a true address decode. The first discharge means 531 and second discharge means 541 provide power supply isolation during the corresponding precharge intervals of the first precharge means 533 of the first logic means and second precharge means 544 of the second logic means 542, respectively. Alternatively, if the address bus is precharged to a low logic level prior to activation of the first precharge means 533, the first discharge means 531 may be eliminated and replaced by a short circuit to the second voltage level 528.

In a P-channel embodiment of the present invention, the first logic means 532 functions to decode the first logic level, ones, and the second logic means 542 functions to decode the second logic level, zeroes. The transistors 560-563 of the first decode means 532 are left coupled to those address inputs 525 upon which a one is desired to be decoded. All other transistors of the first decode means 532 are programmed to be open circuits independent of the address inputs 525. If all address lines 525 to which non-open circuited transistors of the first logic means 532 are coupled are at the first logic level, then the first decode output 529 will remain precharged to the first voltage level, because the first logic means 532 will provide isolation between the first precharge means 533 and the discharge means 531. If a second logic level, zero, is present on any of the address inputs 525 coupled to a non-open circuited transistor of the first decode means 532, then that transistor will be enabled, thereby coupling the first decode output 529 to the input of the first discharge means 531. This discharges the first decode output 529 to the second voltage output level 528, thereby disabling isolation transistor 571, and causing the decode output 545 to remain at the first voltage output level 527 responsive to the output of the second precharge means 548. However, when the first decode means 532 decodes the desired address, the first decode output 529 is at the active first voltage output level which enables isolation transistor 543 so as to couple the second logic means 542 to the second precharge means 544 and to the output 545. The function of the second decode means 542, is to provide for decode of the second logic level, zeroes, in the P-channel embodiment. The transistors 564-567 of the second decodes means 542 are selectively coupled to the address inputs 525 corresponding to the desired address lines which are desired to be at the first logic level, one. The remaining transistors in the second decode means 542 are programmed to be short circuited, so as to, in essence, be continuously activated. When the address inputs 525 coupled to the non-short-circuited transistors of the second decode means 542 are at second logic level (zero), then the transistors to which those inputs are coupled will be activated, thereby providing a discharge path from the decode output 545 (and first precharge output 548) to the second voltage output level 528, via isolation means 543 and discharge means 541. The first discharge means 531 and second discharge means 541 provide power supply isolation during the precharge times of the first precharge means 533 and second precharge means 544, respectively. If the address inputs 525 are precharged to a high, first voltage level, before $\phi 1$, that is before the first precharge means 533 is activated to thereby couple the first voltage output to the first decode means 532 and first decode outut 529, then the first discharge means 531 will not be required, and may be replaced by a short circuit.

In a CMOS embodiment of the present invention, preferred embodiment, the function of the first decode means 532 and second decode means 542 may be selected to be either the N-channel (second level true) or the P-channel (first level true) decode scheme. Additionally, in CMOS, no bootstraping circuitry is required for the precharge means 533 and 544, and, the precharge transistors 570 and 572 may be made complementary to the remainder of the decode circuitry. Additionally, in a manner similar to that for the P-channel and N-channel techniques, the first discharge means 531 may be eliminated if the address lines 525 are precharged to the off state voltage of the decoder circuitry prior to the enablement of the first precharge means 533 by the first clock active level. Referring to FIG. 24, the signal timing diagram for the circuitry of FIG. 23 is shown. A first clock output $\phi 1$, commences prior to the second clock output $\phi 2$, and the decode true output becomes valid subsequent to the commencement of the second clock output $\phi 2$. The address lines 525 must go to a valid true level prior to the end of the active period of the first clock $\phi 1$, and prior to the commencement of the active period of the second clock output $\phi 2$. Additionally, the timing for the optional precharge of the address bus so as to eliminate the need for the first precharge means 531 is shown, requiring that the address bus be precharged prior to the commencement of the first clock output $\phi 1$ active state.

With the non-complementary address decode invention as described with reference to FIGS. 22-24, a minimum number of address lines are required to be provided on the address bus, thus minimizing the amount of space necessary for address bus runs on the integrated circuit. Furthermore design and layout may be implemented with minimum spacing between the address lines, since the power supply busses are on either side of the decode circuit, and there are no gates between the address lines, only transistors. This provides for a very space efficient layout, and minimizes bar size. A further savings is realized in that this address decode scheme overlays the address lines, thereby utilizing minimal bar area for decode circuitry beyond that required for the address lines themself.

Figure 25:
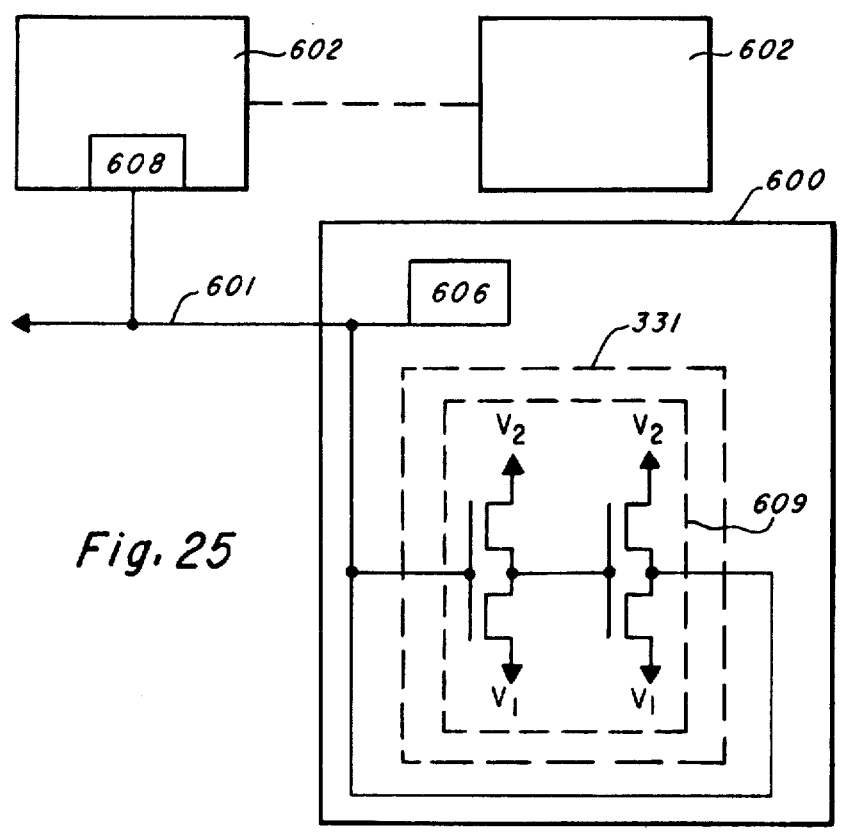
FIG. 25 is a partial schematic partial block diagram of a preferred embodiment of an I/O pull down latch as contained within a controller integrated circuit, as described with reference to FIG. 16D.

Referring again to FIG. 16D, the I/O pull down latch 331 will now be described in greater detail. The I/O buffers 330 and print I/O lines 324 each contain a means 331 for controlling the logic level of the bus lines to which the means 331 is coupled when there is no other active device controlling the bus lines. This is of particular importance when a communications protocol exists between integrated circuits coupled to the I/O bus lines as described in greater detail in copending applications Ser. No. No. 163,025, Memory with Variable Digit Addressing Mode, Ser. No. 163,023, Data Processing System and Ser. No. 163,024, Memory Interface System, all filed June 26, 1980. The I/O pull down latch 331 controls the default state of a bus line to which it is couled without requiring pull up or pull down resistors and without requiring additional control lines. Referring to FIG. 25, a preferred embodiments of the I/O pull down latch 331 is shown as contained within a controller integrated 600. The I/O pulldown latch 331 is coupled to a bus line 601 which couples to a second integrated circuit 602. The pull down latch may alternately be a separate integrated circuit. As described with reference to FIG. 16D, there are a plurality of I/O lines 601 and a plurality of I/O latches 331 each coupled to one of the control lines 601. Additionally there may be a plurality of integrated circuits 602, each integrated circuit coupling to the I/O bus lines 601. In the preferred embodiment, a read/write memory bit 609 (bus control memory bit) is coupled to the bus line 601 which is to be controlled, forming a transparent latch. Other forms of transparent latches may be utilized such as those in bipolar or MOS technology. A communications protocol may be established wherein the last integrated circuit device, 600 or 602, to write onto the bus line 601 must set the bus line to a default (no-up) condition, as described with reference to copending applications Ser. No. 163,023, Data Processing System and Ser. No. 163,024, Memory Interface System, both filed June 26, 1980. However, this invention may also be utilized independent of the communications protocol. In the preferred embodiment, the default condition is a logic zero level. The bus control memory bit 609 is sized so that it may be overdriven by any driver attached to the bus line 601. Thus, the output buffer driver circuits of the integrated circuit 600 or of the integrated circuit 602 may overdrive and set the logic state of the transparent latch 609. This approach has the advantage of dissipating virtually no power once the line has been set to one or the other logic level. In the preferred embodiment, only one bus line control bit 609 is coupled to any given bus line so as to ease the task of overdriving the bus line. The integrated circuit 602 may be RAM, ROM, or other I/O integrated circuits. A first driver 606 provides an output at a fixed voltage level on the bus line 601 for a first time interval during which the controller circuit 600 is communicating information onto the bus 601. Upon completion of communication, the first driver 606 causes its output to go to a high impedance level, thereby allowing the voltage on the bus line 601 to float independent of the driver 606. The memory control bit 609 is coupled to the bus line 601, senses and stores the fixed voltage level output from the first driver 606 during the first time interval as a result of the first driver 606 overdriving the memory bit 609. During the subsequent time interval, when the first driver 606 allows the voltage on the bus 601 to float independent of the first driver 606, the bus control memory bit 609 couples the bus line 601 to the stored fixed voltage level when it detects the floating non-fixed output condition. Thus, the last fixed voltage level present on the bus 601 which is output from any integrated circuit, 600 or 602, coupled to the bus 601 is stored in the memory control bit 609, and the stored fixed voltage level is reoutput onto the bus 601 when none of the integrated circuits, 600 and 602, are providing a fixed voltage level output and all are allowing the bus to float. This I/O memory latch feature is of particular importance in microprocessor, computer oriented, calculator systems, and other bus oriented systems. Thus, the I/O memory latch of the present invention may be implemented in calculator systems as described with reference to FIGS. 1-4, and FIGS. 5A-C, as well as utilized in combination with other inventions disclosed herein. The communication between the controller integrated circuits and the memory integrated circuits would be via the I/O bus 330 as shown in FIGS. 5A-C, and the additional integrated circuits 602 would be the memory integrated circuits 103-107 coupled to the I/O bus.

Referring again to FIGS. 4a-d, and as discussed in greater detail with reference to FIGS. 14a-b and 16c-d and FIG. 25, the controller means 30 of FIG. 4 is coupled to the memory means 50 of FIG. 4 by a four bit bidirectional bus having either command, address, or data signals, present thereon, only one of these signals being present on the bus at any time as shown by bus 330 of FIGS. 5a-c, FIG. 14a, and FIGS. 16c-d. The processor means, 30 of FIGS. 4a-c, and controllers 100-102 of FIGS. 5a-c, is coupled to the common bus 330 for selectively transmitting (outputting) command, data, and address signals onto this common bus. The processor includes means for receiving certain other command, data, and address signals from the common bus. The memory means (50 of FIGS. 4a-c; 13, 15, 22, and 23 of FIG. 2; and 103, 104, 105, 106, and 107 of FIGS. 5a-c) is coupled to the processor via the common bus, the memory for storing and outputting data. The memory includes means for selectively transferring (outputting or storing) data with the processor in response to receiving one of a unique subset of command signals. The memory may be comprised of read-only or read-write memories, or both. In the preferred embodiment, the processor further includes means for selectively providing an active chip select control signal, and the memory is responsive to the unique subset of said command signals only when an active chip select control signal is received. In the preferred embodiment, the chip select signal is coupled to the memory separate from the common bus. Additionally, in the preferred embodiment, a clock signal is coupled from the processor to the memory on yet another separate bus, and the memory stores and transmits data in synchronism with the received clock signal.

Figure 26:
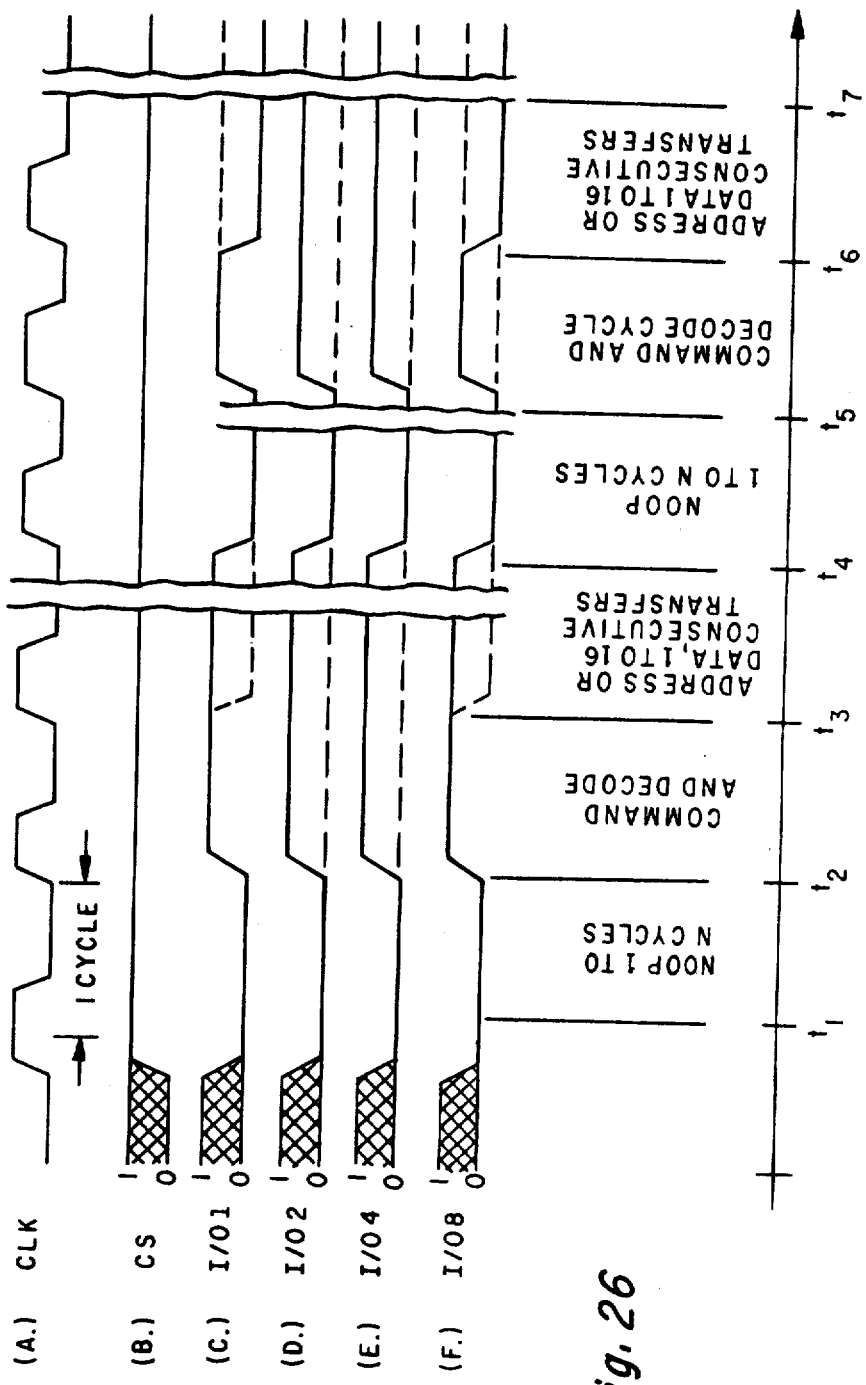
FIGS. 26A-E are a signal waveform timing diagram of the signal transfer protocol for the common bus 330 as shown in FIGS. 5A-C.

Referring to FIG. 26, a signal waveform timing diagram is shown. The signal transfer protocol for the common bus as embodied in the present invention is shown in FIG. 26. Referring to FIG. 27, a state command table for the communications protocol of the present invention is shown. The timing waveforms of FIGS. 26 a-e and the state transistion table of FIG. 27 may each be better understood by being viewed together. Referring to FIG. 27, and specifically referring to sequence as states 00 to 0F, it is shown that so long as the chip select control signal is at a zero (inactive) logic level and is not responsive to the common bus 330 the memory chip to which the chip select is coupled is deselected. Referring to sequence state 10 of FIG. 27, it is shown that when the chip select coupled to a particular memory means is at a logic 1 level, then the common bus is selected as to that particular memory. When the chip select is at a logic one (active) level and the common bus I/O lines I/01, I/02, I/04, and I/08 are all at the logic zero level, the common bus is in the "no-op" state. Refering to FIG. 26, clock cycles T1 and T4, it is seen that the no-op condition may be from one to N cycles long, depending on the time lag between a command sequence ending, and a subsequent command sequence commencing. As discussed with reference to FIG. 25, when a command sequence is completed, the device responding to the command forces a no-op state condition onto the common bus prior to its outputs going high impedance via a zero output circuit as described in greater details with reference to 711D of FIG. 34G and 889D of 38F. The I/O latch invention as described with reference to FIG. 25 maintains the common bus at the no-op state signal levels after the memory output lines go to the high impedance state. A command is decoded as commencing when the chip select is at a logic one level (active) and when a predetermined bit position of the common bus, I/O 1 in a preferred embodiment as shown in FIGS. 26 and 27, switches from a logic zero level to a logic 1 level, and when the previous state of the common bus was a no-op state. These conditions define the command commencement transition. The remaining bit positions of the common bus define the instruction to be performed upon detection of a command commencement transition. As shown in FIG. 27, at sequence state addresses 18-1F, commands to which the memory of the present invention are responsive (the command subset) include the load address command, read address command, read two digits from memory command, read sixteen memory digits from memory command, and where the memory is a read/write memory, the additional two commands of write two digits to memory and write sixteen digits to memory. The memory performs separate memory cycles responsive to each of said commands. Referring to FIG. 26, the common bus communications protocol as utilized in the preferred embodiment of the present invention is shown. FIGS. 26C-F correspond to the common bus lines, FIG. 26 B corresponds to the chip select line coupled to a particular memory means, and FIG. 26a corresponds to the clock signal coupled from the processor means to the memory means. Each time period, T1-T7, is synchronized with the clock signal of FIG. 26a. Referring to time period T1, with the chip select signal at a logic one level, and the I/O bus is at a logic zero level on all bit positions, the common bus contains a no-op state command. Following the no-op state of period T1, period T2 shows a command decode state of signals on the common bus, triggered by the transition (command commencement transition) of I/O 1 at the start of period T2. The I/O lines of FIGS. 26d-f are interpreted by a command decode circuit within the memory according to the communication protocol of FIG. 27 states 19-1F, as described with reference to FIG. 28. Referring to time period T3, data is transferred on the common bus in accordance with the instruction decoded during time period T2. Thus, address data may be selectively transferred to the memory to load into an on chip program counter responsive to the load address command, or the memory program counter contents may be selectively read from the memory program counter onto the common bus responsive to the read address command or multiple digits of data may be selectively read out of storage (retrieved) in the memory responsive to the read two digits and read sixteen digits commands, or multiple digits of data may be selectively written into storage in the memory means responsive to the write two and write sixteen digits commands. The time period T3 is variable, with the number of consecutive transfers, (memory cycles) corresponding to the decoded command. Referring to time period T4, a no-op state is forced onto the common bus by the memory following the completion of the command cycle. This no-op state will be maintained by the I/O latch of FIG. 25 until such time as a device coupled to the common bus outputs a signal other than a no-op state signal. When a subsequent command commencement transition is detected it triggers the start of the command and decode cycle of period T5, corresponding to period T2. Time period T6 corresponds to time period T3 in that address or data is transferred on the common bus during this time period in accordance with the decoded command. As can be seen from FIG. 26 the basic command cycle consists of a no-op state time period such as T1, followed by a command and decode time period such as T2, followed by a data transfer time period such as T3, and finally followed by a no-op state time period such as T4 to end the command cycle.

Figure 28A:
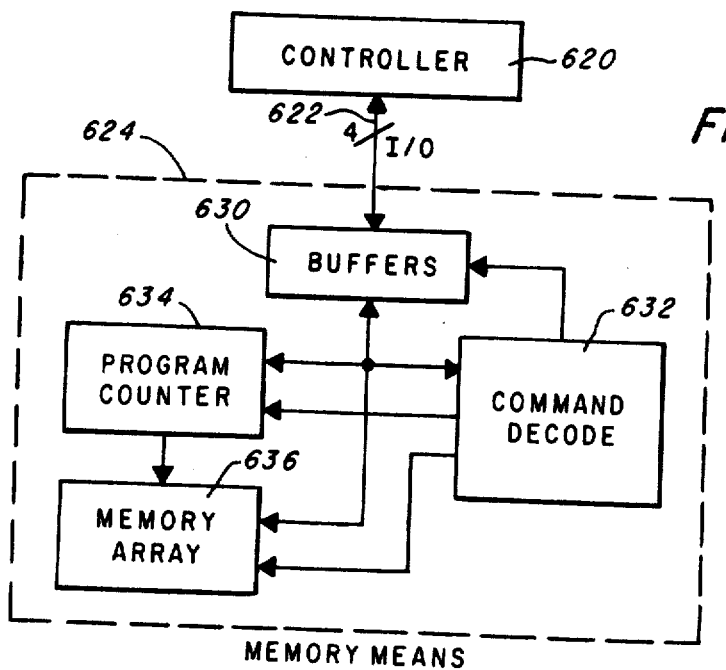

Referring to FIG. 28a, a block diagram of a system embodying the command protocol as discussed with reference to FIGS. 26 and 27, the I/O latch as described with reference to FIG. 25, and the modular system as discussed with reference to FIGS. 4 and 5 is shown. A controller 620 including an I/O pulldown latch as described with reference to FIG. 25 is coupled to a common I/O bus 622. The controller 620 provides command, data, and address signals onto the bus 622. A memory 624 is coupled to the I/O bus 622. The memory 624 is comprised of buffer amplifiers 630, command decode 632, program counter 634, and memory array 636. The signals received from the I/O bus 622 are buffered by the buffer amplifiers 630. The output from the buffer amplifers 630 is coupled to the command decode 632, the program counter 634, and the memory 636. The output from the buffer amplifiers 630 is selectively coupled to the command decode 632, program counter 634 or memory array 636, in response to an output signal from the command decode. The operation of the circuit of FIG. 28a may be better understood by tracing a complete cycle of the command protocol. Assuming first that the signals present on the I/O bus 622 are at the no-op state, the controller 620 outputs a command signal onto the bus 622 which is coupled to the memory 624, and specifically to the buffer amplifiers 630. The output from the buffer amplifiers 630 is coupled to the command decode 632 (instruction decode) which detects the command commencement transition and proceeds to decode the particular received command. Responsive to the received command from the controller 620, the command decode 632 provides an active decode output signal to the buffer amplifiers 630 to direct the output from the amplifiers to the program counter 634 or the memory array 636. Additionally, responsive to the received command signal, the command decode provides an active one of a second group of decode output signals to the program counter 634 and provides an active one of a third group of decode output signals to the memory array 636. The program counter 634 in response to the active decode output signal of the second group either stores received data from the buffer amplifiers 630 within a counter memory, outputs the present program count value from the counter memory to buffer amplifiers 630 to be coupled to the I/O bus 622, or outputs the program count value the to the memory array 636. The memory array 636 stores received data from the buffer amplifiers 630 at the location specified by the program counter output or outputs stored data from the location specified by the program counter output to the buffer amplifiers 630 for coupling to the I/O bus 622, responsive to the received active decode output signal of the third group from the command decode 632 and in response to the received output from the program counter 634. Upon completion of the command initiated (originated) cycle, the memory 624 outputs signals at the no-op state onto the bus 622 to prepare the system for a subsequent command cycle.

Figure 28C:
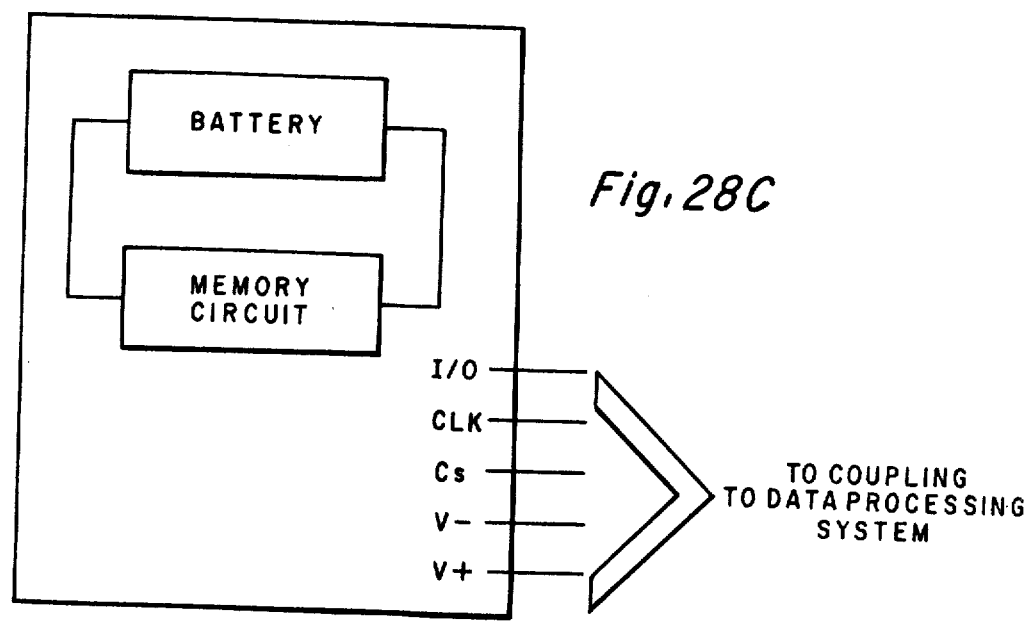

Referring to FIG. 28b, a more detailed block diagram of FIG. 28a is shown. The memory 624 is shown as further comprising an I/O control 633 coupled to the buffer amplifier 630 and command decode 632. The I/O control 633 selectively couples one of a data bus, an address bus, and a control bus within the memory 624 to the common I/O bus 622 via the buffer amplifiers 630 responsive to a fourth command signal 631 received from the command decode 632. The command decode 632 provides the fourth control output 631 in response to receiving selected ones of the command signals. Additionally, the memory 624 is shown as being further comprised of a latch 637 coupled to the buffer amplifiers 630, the command decode 632, and the memory array 636. The latch 637 provides data word size and format conversion to allow an 8 bit wide memory array 636 to couple to a 4 bit wide I/O bus 622 in the preferred embodiment. This concept may be expanded to other word size conversions. Alternatively, the memory array 636 may be comprised of an array organized of the same word width as that of the I/O bus 622 thereby obviating the need for a word size format conversion and for the latch 637. In a preferred embodiment, an integrated circuit 640 includes the memory 624 coupled to a synchronization circuit 642, to a clock generator circuit 644. When the memory array 636 is a read/write memory array, the integrated circuit 640 further includes a power switching circuit 648. In the read/write memory preferred embodiment, the power switching circuit 648 provides a power output 649 coupled to the memory 624. In the preferred embodiment, the integrated circuit 640 is mounted within a housing 650, which is a portable housing provided for coupling and mounting into a module receipt compartment within the housing that contains the controller 620. The module 650 provides for coupling of a synchronizing clock signal 626 to the clock generator 644. The clock generator 644 provides clock outputs to the memory 624 responsive to the received clock signal 626 from the controller 620. Additionally the module 650 has provision for coupling to a chip enable or chip select output 627 from the controller 620 to the sync circuit 642 of the integrated circuit 640 of the module 650. Responsive to the chip enable signal 627, the sync circuit 642 selectively provides an enable output to the memory 624 so as to activate command decode 632 and related circuitry within the memory 624 so as to be responsive to the signals on the I/O bus 622. Furthermore, the module 650 has provision for coupling the main power source of the controller 620 which may be a battery contained within the common housing of controller 620, or may be an externally provided power source. In a read only memory (ROM) embodiment of the memory array 636 (where the module 650 is a read only memory plug in module) the main power source 628 is coupled to the integrated circuit 640 and directly to the memory means 624. However, in a read/write memory (RAM) embodiment of the memory array 636 and therefore, in a read/write memory plug-in module 650, the main power source 628 is coupled to the integrated circuit 640 only via power switching circuit 648. Additionally, in the read/write memory embodiment of the module 650, an independent power source, battery 646, is contained within the module 650 and coupled to the power switching circuit 648 of the integrated circuit 640 as shown in FIG. 28C. The output from the power switching circuit 648 provides a constant power output 649 to the memory 624, either from the main power source 628 of the controller 620 or from the battery 646 of the module 650. The power switching circuit 648 provides uninterrupted power output before, during, and after coupling to the main power source 628.

The power switching circuit 648 is coupled to the clock 626 via the clock output coupling of the module 650. The power switching circuit 648 provides the power output 649 from the main power source 628 when the main power source 628 is coupled to the power switching circuit 648 and a predetermined number of clock signals are received from the clock output 626, detected and counted by the power switching circuit 648 and a predefined count is reached, or alternatively after a fixed time interval has expired during which the clock outputs are properly (continuously) received. Alternatively, when the power switching circuit 648 is not coupled to the first power source 628, or when the power switching circuit 648 is coupled to the first power source 628 but the predefined number of clock signals (for the predetermined time) has not been received via the clock output 626, then the power switching circuit 648 provides the power output 649 from the module battery 646. Thus, the RAM module 650 includes the power switching circuit means 648, within the integrated circuit 640, to provide a non-interrupted power source, 649, to the read/write memory cells in the memory array 636, from either the battery 646, or the external power source 628, independent of the status of coupling to the external power source 628. This results in a non-volatile, removable, read/write memory allowing for both in calculator program development and simultaneously providing a removable transportable non-volatile program storage file.

In the preferred embodiment, the memory 624 is responsive to the command signals from the controller 620, such that the memory 624 selectively performs either storage or retrieval of data to or from multiple locations in the memory array 636 in response to particular command signals, and in response to address signals as output from program counter 634. The memory 624 includes means responsive to other command signals for selectively storing address signals in the program counter 634 in response to receiving a first other command signal and the corresponding address signal in a single command memory cycle as part of the command protocol; and means for selectively automatically incrementing program counter 634 in synchronism with each of the received or transmitted (transferred) data signals, synchronized to the clock output 626 of the controller 620, in response to these particular command signals. Thus, in response to particular single command signals, the memory 624 provides multiple memory cycles of data storage or retrieval, with the program counter automatically incrementing. Thus, responsive to a first command signal and a corresponding address signal output from program counter 634, the memory 624 outputs data from multiple memory locations, comprising but a single command memory cycle. In the preferred embodiment, means are provided for outputting data from two memory locations or from sixteen memory location, within the memory 624, in response to a read two location command signal or a read sixteen location command, respectively. Additionally, the memory 624 is responsive to a second command signal and a corresponding address signal output from program counter 634 so as to store received data signals (sequentially transferred data signals in the preferred embodiment) in multiple memory locations within the memory array 636 in the memory 624. The means for storing multiple data signals responsive to a single command signal in a single command cycle is responsive to a third command signal (store two location command) so as to store sequentially transferred received data in two memory locations within the memory, and is responsive to a received fourth command (store sixteen location command) so as to store sequentially transferred received data in sixteen memory locations within the memory 624. As discussed above, the memory 624 may be comprised of a read-only memory within the memory array 636, in which case the "store in memory location" instructions are not applicable. Alternatively, the memory 624 may be comprised of a read/write memory within the memory array 626, in which case memory 624 is responsive to both store and read commands. The read-only memory embodiment and read/write memory embodiment of the integrated circuit 640 (and of the module 650 incorporating this integrated circuit) are each discussed separately with reference to detailed block diagrams and corresponding detailed circuit schematics corresponding to the integrated circuit 640 of FIG. 28b. The read-only memory embodiment is detailed in FIGS. 29–34, while the read write memory embodiment is detailed in FIGS. 35–40.

Figure 29:
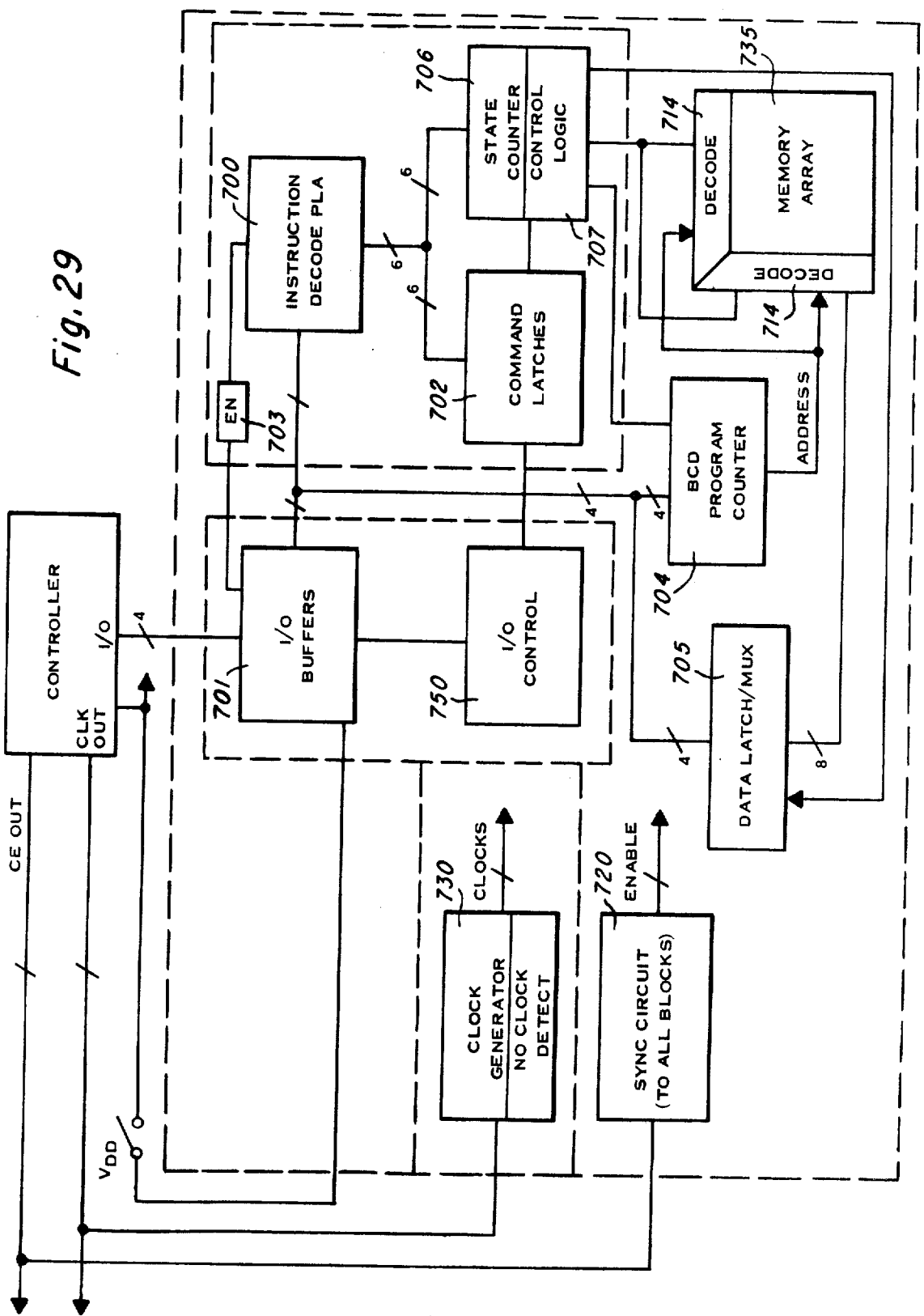
FIG. 29 is a block diagram of the system of FIG. 28A detailing the read-only memory embodiment of the integrated circuit 640 as shown in a removable and transportable module such as module 650 of FIG. 28B.
Figure 34A:
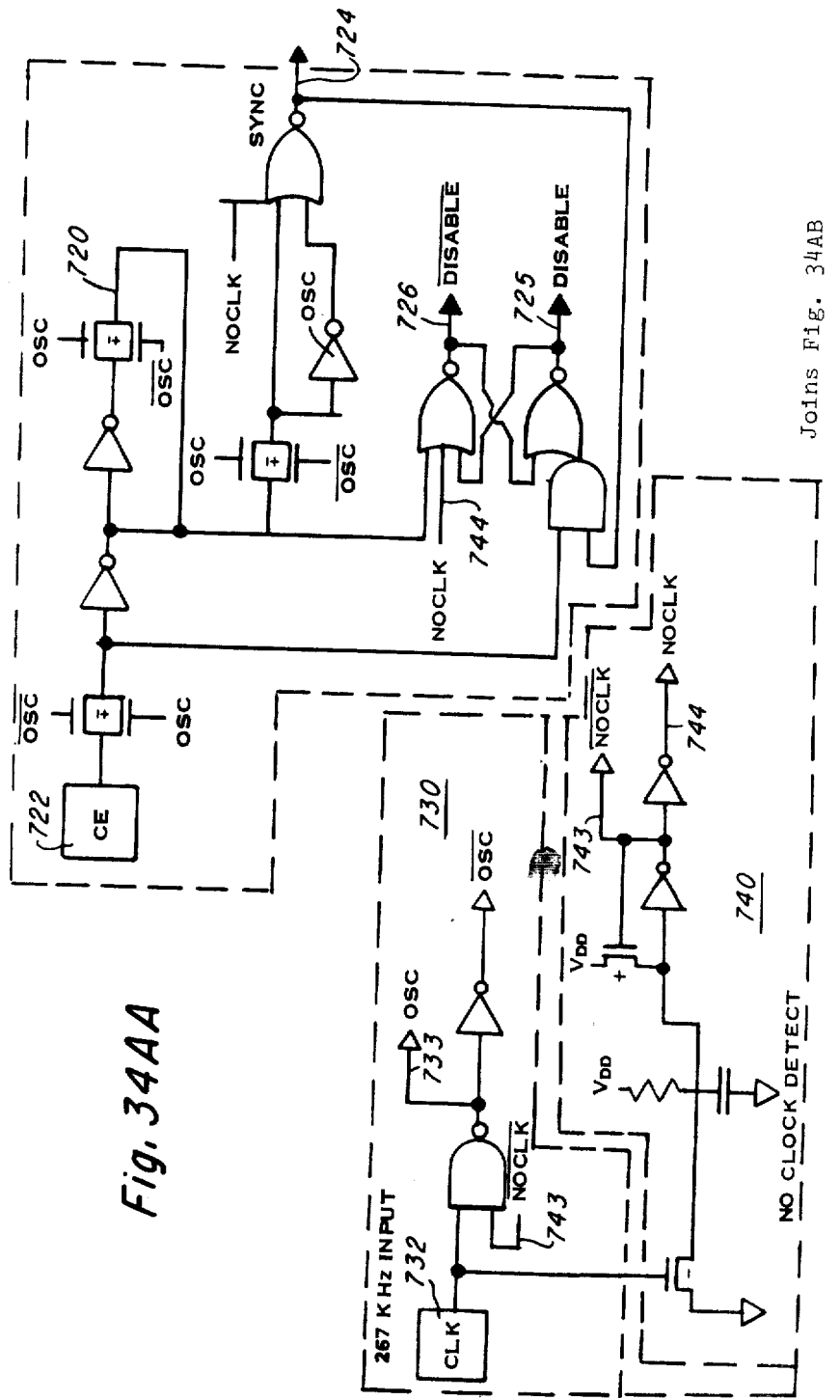

Referring to FIG. 29, the read only memory embodiment of the integrated circuit 640 as shown in the removable and transportable module 650 of FIG. 28b is shown. The block elements of FIG. 29 correspond to block elements of FIG. 28b and to blocked portions of detailed circuit schematics illustrated in FIGS. 31–34. A clock generator circuit 730, as detailed in FIG. 34a, and a no clock detect circuit 740, as detailed in FIG. 34a, correspond to the clock generator circuit 644 of FIG. 28b. The sync circuit 720, as shown in detailed schematic form in FIG. 34a, corresponds to the synchronization circuit 642 of FIG. 28b. An I/O buffer 701, as shown in detailed schematic form in FIG. 34b, corresponds to the I/O buffer 630 of FIG. 28b. The I/O control 750, as shown in FIG. 34a, corresponds to the I/O control 633 of FIG. 28b. An enable circuit 703, as shown in detailed schematic form in FIG. 34b, an instruction decode programmable logic array (PLA) 700, as shown in greater detail in FIG. 34b, the command latches 702, as shown in greater detail in FIG. 34b, and the state ounter 706 and control logic 707, as shown in greater detail in schematic form in FIG. 34f, in combination correspond to the command decode 632 of FIG. 28b. The instruction decode PLA 700 is coupled to the I/O buffers 701 for receipt of signals therefrom, and to the enable circuit 703. Additionally, the instruction decode PLA 700 is coupled to the command latches 702 and to the state counter 706 and control logic 707. The outputs of the control logic 707 are coupled to a memory decode circuit 714 and memory array cells 735, as shown in greater detail in FIGS. 32a–f, corresponding to the memory array 636 of FIG. 28b. Additionally, the outputs of the control logic 707 are coupled to a BCD program counter 704, as shown in greater detail in FIGS. 34c–d, corresponding to the program counter 634 of FIG. 28b. The outputs from the BCD program counter 704 are coupled to the decode circuit 714. Additionally, the BCD program counter 704 is coupled to the I/O buffers 701 so as to provide a means of transferring program counter data. A data latch 705, as shown in greater detail in FIG. 34d, corresponds to the latch 637 of FIG. 28b. The data latches 705 are coupled to the I/O buffers 701 and to the decode circuit 714. The state counter 706 and control logic 707 of FIG. 29 and FIG. 34f is shown in a more detailed block diagram form in FIG. 30.

Figure 30:
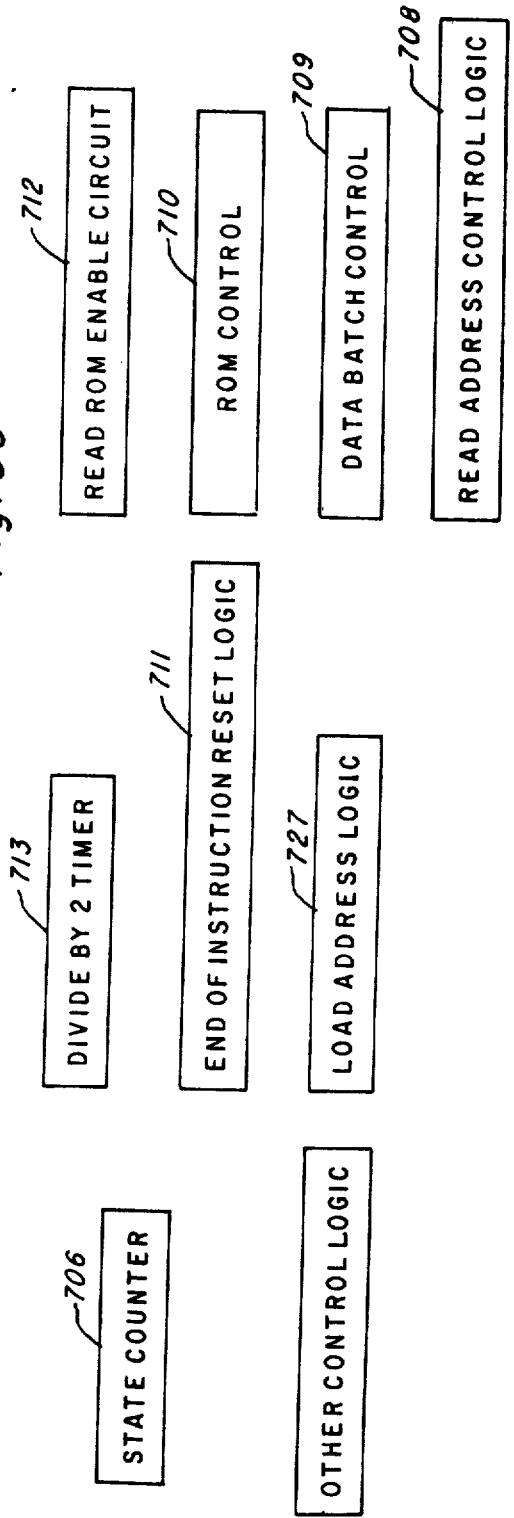
FIG. 30 is a detailed block diagram of the state counter 706 and control logic 707 of FIG. 29.
Figure 32A:
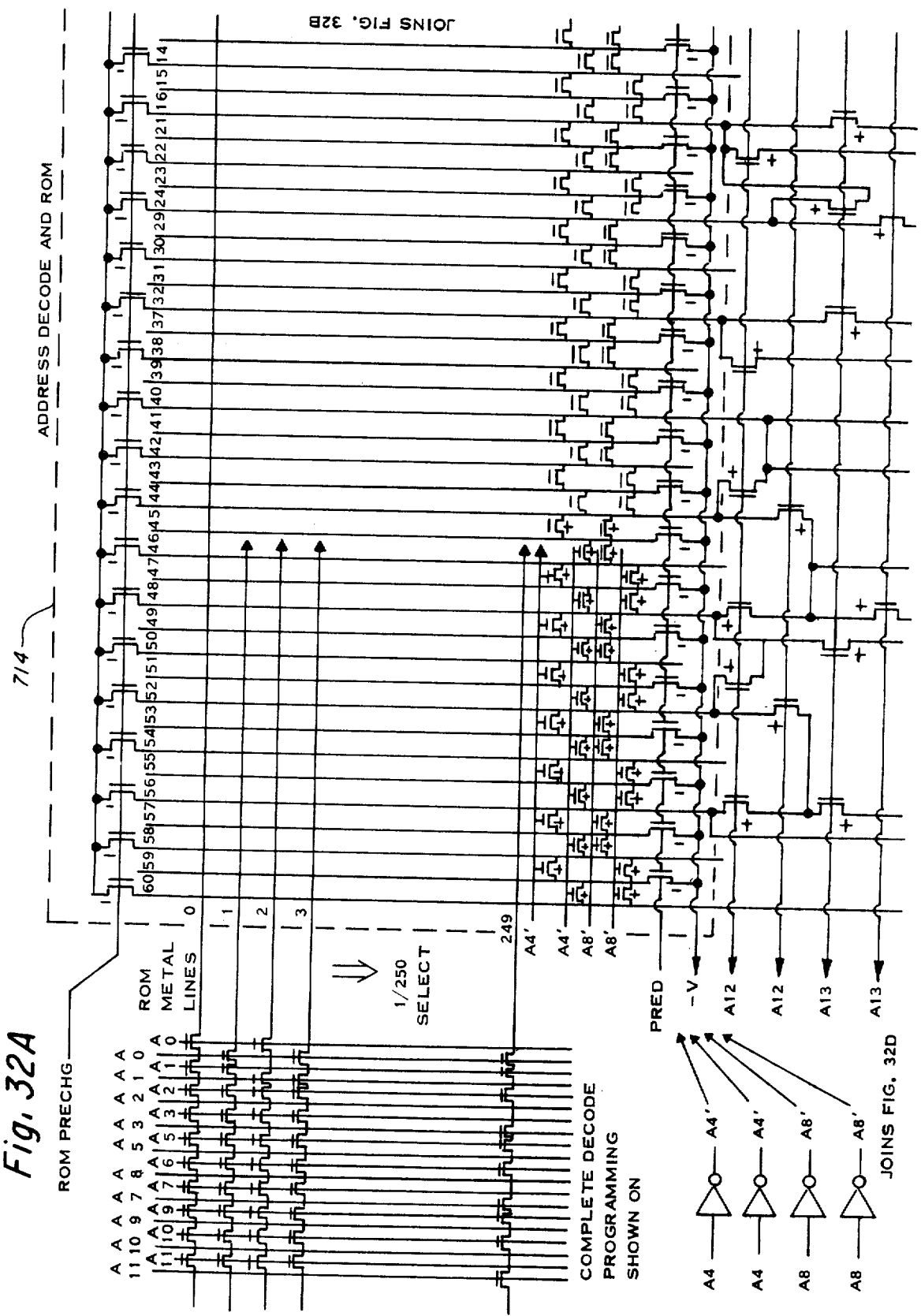
Figure 32B:
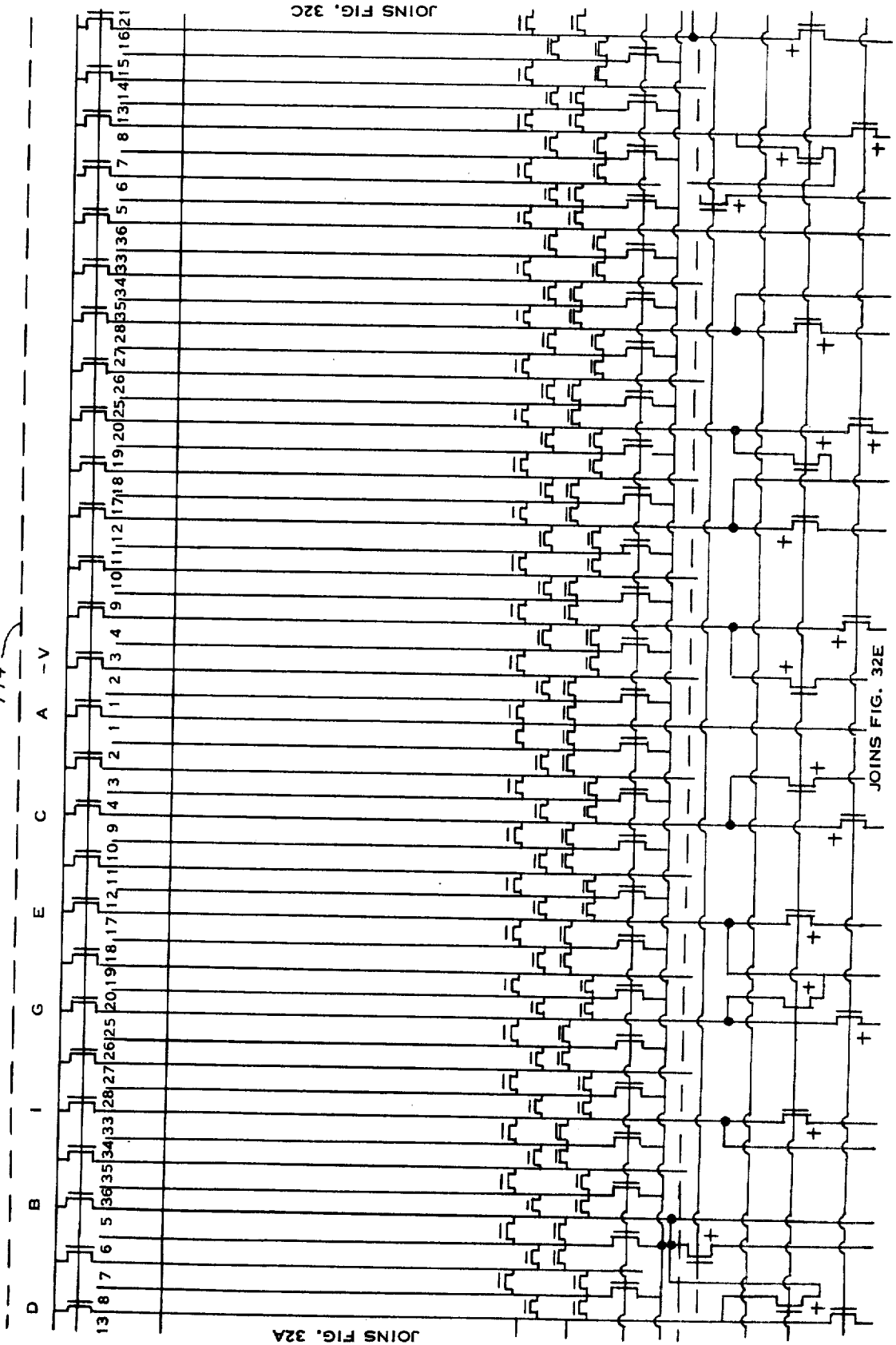
Figure 32C:
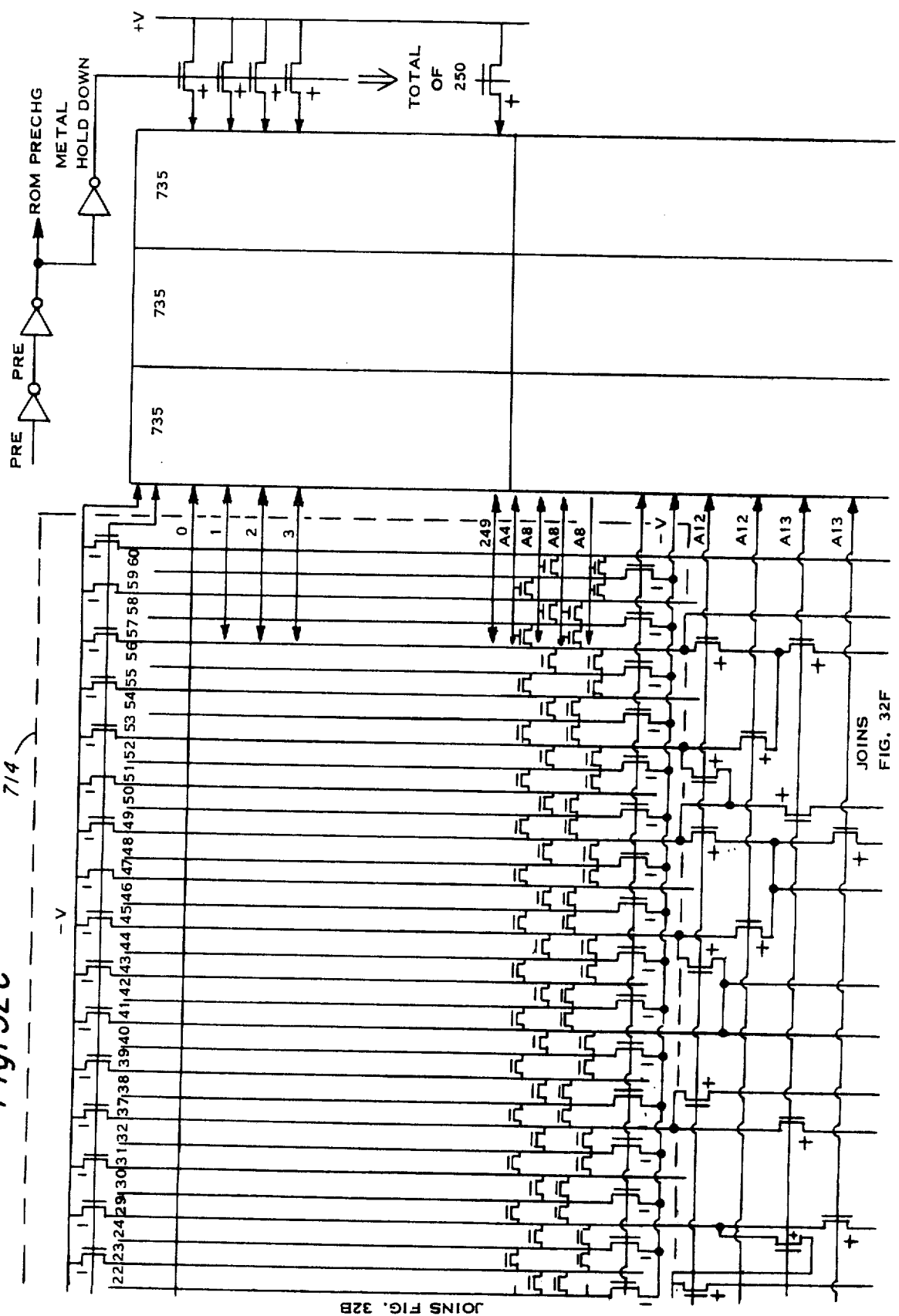
Figure 32D:
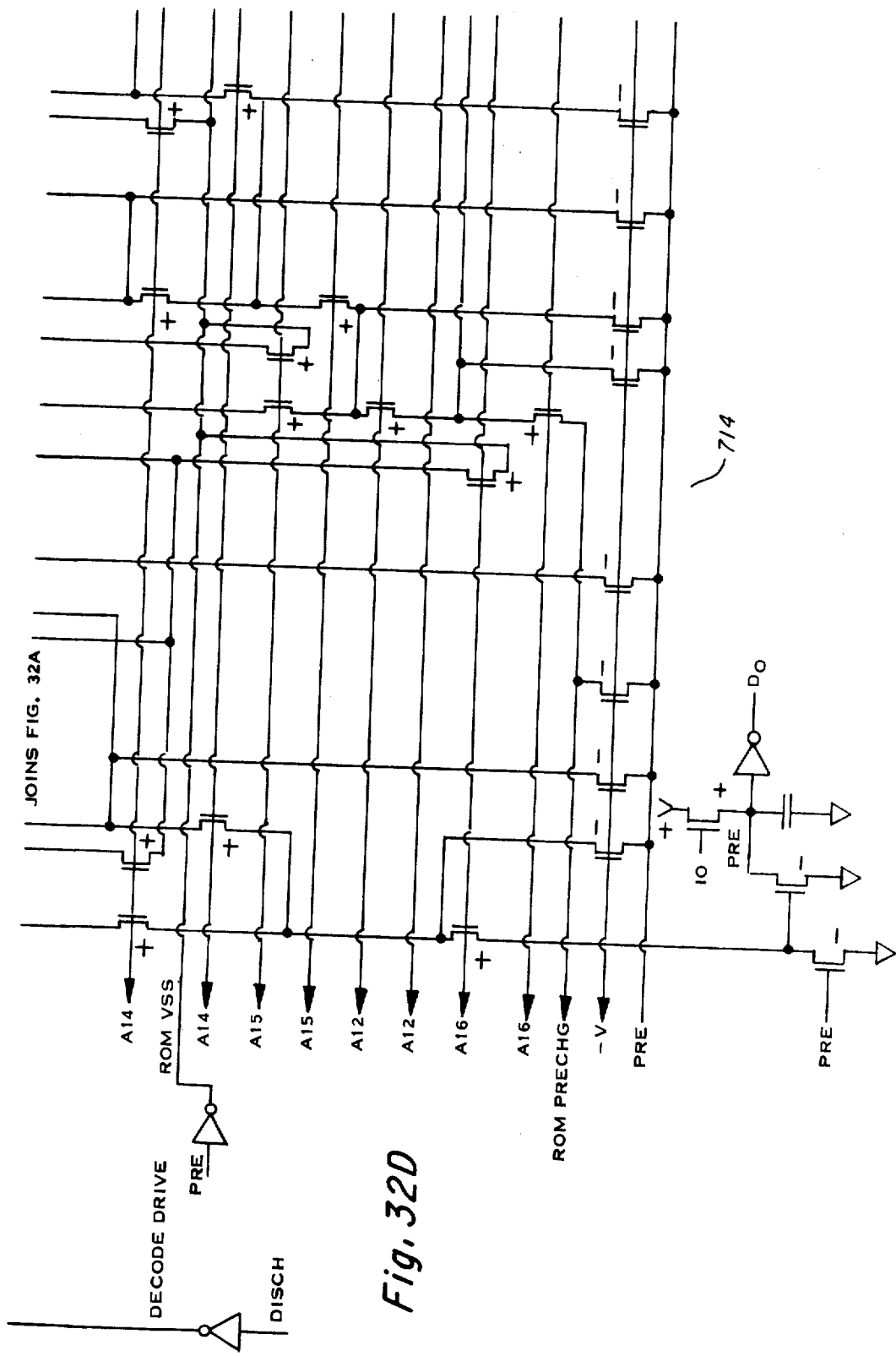
Figure 32E:
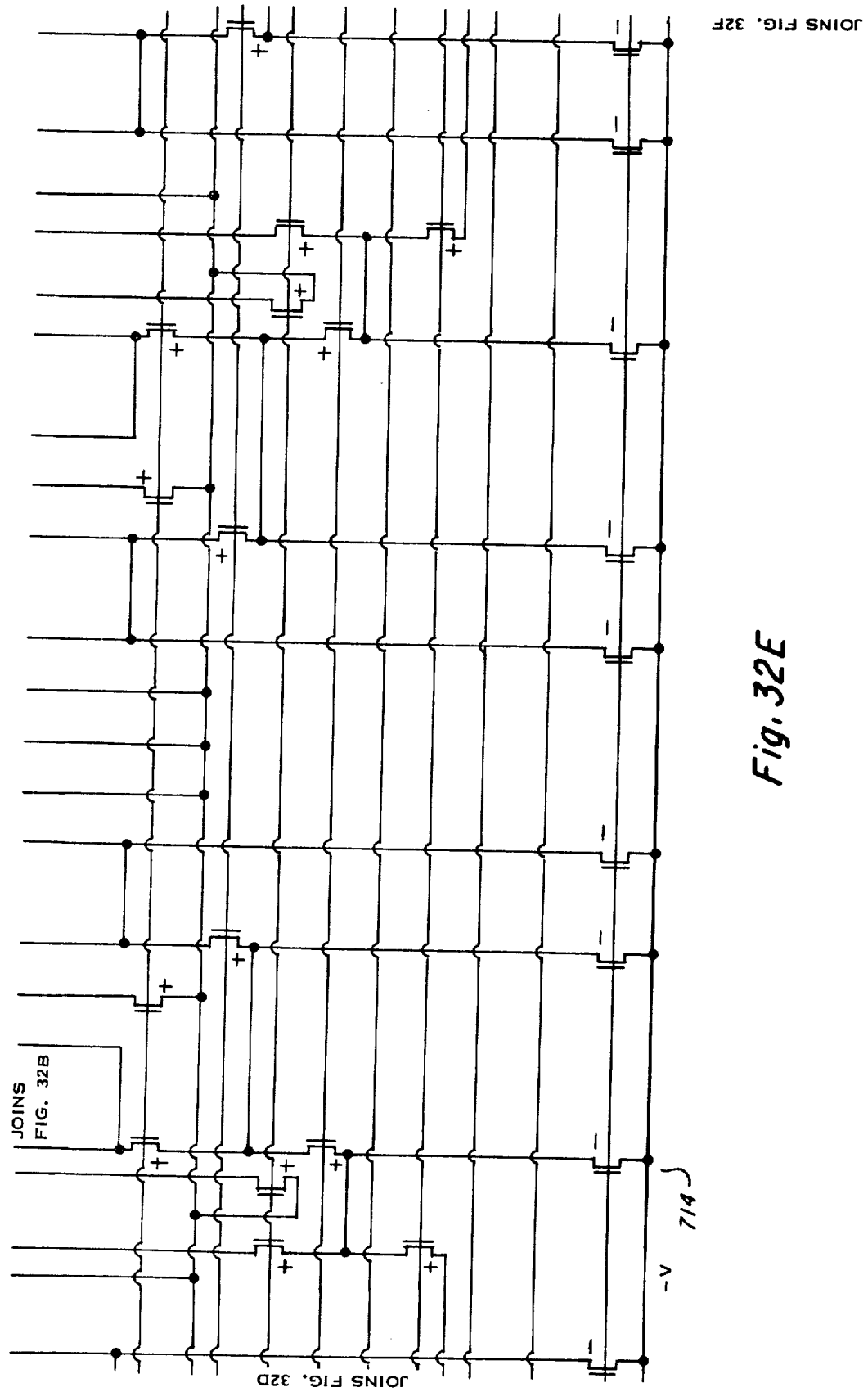
Figure 32F:
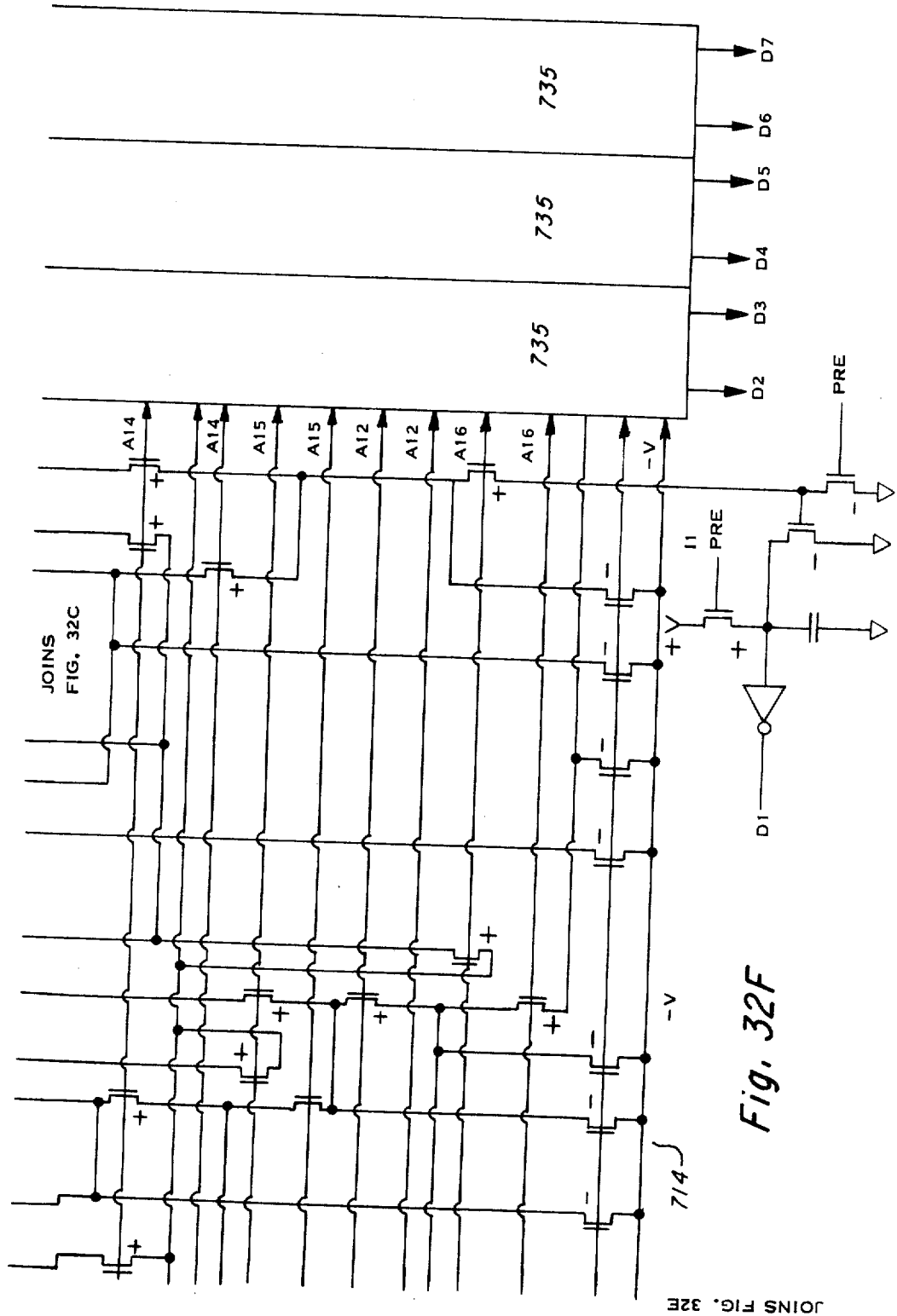

Referring to FIG. 30, the detail blocks of the state counter 706 and control logic 707 of FIG. 29b is shown. The state counter 706 and control logic 707 are is comprised of a state counter 706, as shown in greater detail in FIG. 34f, a divide by two timer circuit 713, as shown in greater detail in FIG. 34f, an end of instruction reset logic circuit 711, as shown in greater detail in FIGS. 34f and g, a load address logic circuit 727, as shown in greater detail in FIG. 34f, a read ROM enable circuit 712, as shown in greater detail in FIG. 34f, a ROM control circuit 710, as shown in greater detail in FIGS. 34f and g, a data latch control circuit 709, as shown in greater detail in FIG. 34g, and a read address control logic circuit 708, as shown in greater detail in FIGS. 34f and g.

Referring to FIG. 31, a drawing interrelationship layout is provided for FIGS. 32a–g, as described above, which provide a detailed schematic circuit representation of the read only memory array cells 735 and associated decode circuit 714 corresponding to the memory array 636 of FIG. 28b.

Referring to FIG. 33, a drawing interrelationship layout is provided for FIGS. 34a–g which follow, as described above, which provide a detailed schematic circuit representation of the clock generator 730, the no clock detector 740, the sync circuit 720, the I/O buffers 701, the I/O control 750, the enable circuit 703, the instruction decode PLA 700, the command latches 702, the state counter 706 and control logic 707, the data latches 705, and the BCD program counter 704, as described above with reference to FIGS. 29 and 30. Referring to FIG. 34g, a zero state latch circuit function (placing all zeroes or a no op state onto the common I/O bus) is included in the end of instruction reset logic 711.

Referring to FIG. 34a, the clock generator circuit 730, synchronization circuit 720, no-clock detect circuit 740 and I/O control 750 are shown in detailed schematic form. The synchronization circuit 720 is coupled to an interconnection node 722 which couples to the chip enable bus which is coupled to the controller circuit as shown in FIG. 29. The synchronization circuit provides a sync output 724 and DISABLE ($\overline{\text{DISABLE}}$) signal output 725 (726), these signals 724, 725 and 726 coupled to other block elements of the memory means 640. The oscillator circuit is coupled to an interconnection node 732 which provides for coupling to the clock signal bus which is coupled to the clock output from the controller circuit 620. The clock generator circuit 730 provides oscillator clock outputs OSC 733 and $\overline{\text{OSC}}$ 734, these signals coupled to other blocks of the memory 640. The clock generator 730 is coupled to the synchronization circuit 720 for receiving the sync signal 724, the DISABLE signal 725, and the $\overline{\text{DISABLE}}$ signal 726. Additionally, the clock generator 730 is coupled to the no-clock detect circuit 740 for receiving therefrom a NOCLK signal 735. The no-clock circuit 740 is coupled to the clock interconnection point 732, and provides a NOCLK signal 735 and a $\overline{\text{NOCLK}}$ signal 736, these signals 735 and 736 coupled to other blocks of the memory means 640. The signals 735 and 736 are indicative in the true state that no clock signal has been received via interconnection node 732. The clock generator means 730 provides OSC signal 733 and $\overline{\text{OSC}}$ signal 734 responsive to receipt of a clock signal from the interconnection node 732, and and in response to receiving a non-true NOCLK signal 735 from the no-clock detect circuit 740. The synchronization circuit 722 provides sync signal 724 at an active logic level when an active chip enable signal is received via the interconnection node 722, the OSC signal 733 and $\overline{\text{OSC}}$ signal 734 are active and cycling, and the $\overline{\text{NOCLK}}$ signal 736 is at an inactive level, indicating that active cycling clock signals are being received. Additionally, the synchronization circuit 720 provides said DISABLE signal 725 and said $\overline{\text{DISABLE}}$ signal 726 when either no clock signal has been received and a $\overline{\text{NOCLK}}$ signal 736 is received in an active state, or when the chip enable signal received via interconnection point 722 is at an inactive state. The clock generator circuitry 730 is further comprised of a multi-phase clock generator circuit for providing clock phase signals $\phi 1$, $\overline{\phi 1}$, $\phi 2$, $\overline{\phi 2}$, $\phi 3$, $\phi 4$, $\overline{\phi 4}$, $\phi 5$, $\phi 6$, $\phi a$, $\overline{\phi a}$, $\phi b$, $\overline{\phi b}$, $\phi c$, $\overline{\phi c}$, $\phi d$, and $\overline{\phi d}$. The multiphase clock generator portion of the clock generator 730 is coupled to the synchronization circuit 720 for receipt of the sync signal 724, the DISABLE signal 725, and the $\overline{\text{DISABLE}}$ signal 726. Additionally, the clock generator circuit 730 provides two output signals $\overline{\text{EN}}$ $\phi c$ and $\overline{\text{EN}}$ $\phi a$, providing synchronization linkage between the timing of $\phi_c$ and $\phi_b$, $\phi_a$ and $\phi_b$, respectively. The I/O buffers 701 are coupled to interconnection nodes 742, 743, 744 and 745, respectively coupling to the least significant bit ascending to the most significant bit of a received data word, respectively. The interconnection nodes 742-745 provide for coupling to the I/O bus 336 which is coupled for transferring data words with the controller 620. The data words present onto the bus 336 are structured so as to follow the command protocol as described above with reference to FIG. 26-28

Referring to FIG. 34B the I/O buffer 701 receives data from the interconnection nodes 742-745, selectively coupling the received data word to the instruction decode PLA 700 and to the command detect-enable circuit 703. I/O buffer 701 also provides additional output couplings for transferring I/O1, I/O2, I/O4, and I/O8, to other internal circuit nodes. The coupling of the data word from the interconnection nodes 742-745 to the remainder of the circuit blocks of the memory 640 is selectively enabled responsive to the receipt of an IN signal as received from the I/O control 750 of FIG. 34A. Alternatively, the I/O buffers 701 receives signals from other circuit block elements of memory 640 via nodes 746, 747, 748, and 749, selectively coupling these received signals to the interconnection nodes 742, 743, 744, and 745, respectively, in response to an active received OUT signal, as received from the I/O control 750. The data word received from control bus 336 by the I/O buffers 701 is selectively coupled to the instruction decode PLA responsive to a decode enable signal 698 received from the PLA command detect enable means 703. When an active decode signal 698 is received by the instruction decode PLA 700, the received data word is coupled to the PLA, and is therein decoded as a command from the command protocol sequence. Alternatively, the instruction decode may be accomplished by table lookup, or other techniques. The outputs of the instruction decode PLA 700 are synchronously gated to provide outputs coupled to the command latches. As shown in FIG. 34b, in the preferred embodiment of the read-only-memory means, decoded commands provided as separate active decode outputs from the instruction decode PLA are: load address (LA) into program counter, read address (RA) from program counter, read two data words from memory (R2), and read sixteen data words from memory (R16). Additional or different command decodes may be provided for depending on the application. For example, in a read/write memory embodiment, as shown in FIGS. 38a-f, the additional commands of write two received data words into memory (W2) and write sixteen received data words into memory (W16) are provided. The command latches 702 are coupled to the synchronization means 722 for receiving the DISABLE signal therefrom, and are additionally coupled to the reset logic 711 for receiving the RSTCL signal therefrom. The command latches 702 are comprised of individual command decode and synchronization latch circuits 770, 771, 772, and 773. Latch 770 is coupled to the disable signal, the RSTCL signal, the LA signal and the RA signal, and in response to these signals provides an ADD and $\overline{\text{ADD}}$ signal output for coupling to the enable means 703, the I/O control means 750 and other circuit elements. Latch 771 is coupled to receive the DISABLE signal, the RSTCL signal, the R2 signal and the R16 signal, and in response to these signals provides a READ and a $\overline{\text{READ}}$ signal for coupling to enable means 703 and I/O control 750, as well as to other circuit blocks. Latch 772 is coupled to receive the DISABLE signal, the RSTCL signal, and the R2 signal, and in response to these signals provides an output signal R2, and $\overline{\text{R2}}$, for coupling to other circuit blocks. Additionally, the command latches 702 includes a latch 773 which is coupled for receiving the DISABLE signal, and the LA signal, and in response to these signals provides a LOAD signal, signifying a load program counter condition. The LOAD signal is coupled to other circuit blocks, including said I/O control 750. Referring again to FIG. 34a, the I/O control 750 is coupled to the command latches 702 for receiving the $\overline{\text{ADD}}$, the $\overline{\text{LOAD}}$, and the $\overline{\text{READ}}$ signal. Additionally, the I/O control 750 is coupled to receive the DISABLE output signal from synchronization means 722. Furthermore, the I/O control 750 is coupled to receive clock signals $\phi b$ and $\phi d$ from the clock generator 730. Responsive to these received signals I/O control 750 provides output signals IN, $\overline{\text{IN}}$, OUT, and $\overline{\text{OUT}}$. These signals are coupled to other circuit blocks of the memory 640, and particularly to said I/O buffer 701. Referring again to FIG. 34B, the output buffer 791 is shown in detailed schematic form as utilized in the I/O buffer 701 in the preferred embodiment. The enable means 703 is coupled for receiving $\overline{\text{ADD}}$ signal from the command latches 702. Additionally, enable means 703 is coupled for receiving the DISABLE signal from the synchronization means 722. The enable means 703 selectively couples the most significant bit I/O8 of the received data word from I/O buffer 701 to an output which provides the command detect decode signal 698 to PLA 700. Signal I/O8 is selectively gated into the combinational logic of enable means 703 responsive to a clock signal (clock signal $\phi 4$ in the preferred embodiment) from the clock generator means 730. Responsive to received signals enable means 703 instruction decode PLA 700 provides command detect decode output 698 so as to enable the instruction decode PLA 700 to receive and decode the received data word from I/O buffer 701, and to provide active decode control word outputs responsive thereto.

The state counter 706 (as shown in FIG. 34f in detail) is coupled to the instruction decode PLA 700 for receiving the LA', RA', R2', and R16' outputs therefrom. (Note that in the read/write memory embodiment of the memory 640 that the state counter (879 of FIG. 38e) receives the additional decode signal outputs W2 and W16 from the read/write memory instruction command decode 810 as shown in FIG. 38b). When any of the instruction decode outputs coupled to the state counter 706 goes to an active state, the state counter 706 is activated to begin sequencing responsive to received clock generator 730 outputs $\phi_a$ and $\phi_c$. Operation of the state counter 706 is additionally responsive to the RSTSC output signal from the reset logic 711 (FIG. 38f) which is coupled to the state counter 706 at multiple points. When the RSTSC signal is at an inactive signal level, and one of the received command decode outputs, LA', RA', R2', or R16', is at an active signal level, then the state counter 706 will provide state counter outputs S0, to S7, and their complementary signals where required, responsive to received clock generator outputs $\phi_a$ and $\phi_c$. The state counter 706 in the preferred embodiment is a dual count state counter whose clock sequencing rate is determined by the received clock generator 730 outputs $\phi_a$ and $\phi_c$. The S0 output from the state counter 706 is coupled to the divide-by-two timer circuit 713 which provides outputs X and Y responsive to the received clock generator 730 outputs $\phi_a$ and $\phi_c$, and in response to the received $\overline{DIS\ ABLE}$ signal from the synchronization circuit 720 being at an inactive level. The divide-by-two timer circuit 713 is used for setting the timing of instructions. The reset logic 711 is comprised of three major parts, 711a, 711b, as shown in FIG. 39F and 711c, as shown in FIGS. 34F-G. The reset logic circuit 711a is coupled to receive the $\overline{ADD}$ and $\overline{R2}$ outputs from the command latches 702, and to receive the $\overline{S1}$ and $\overline{S5}$ outputs from the state counter 706. Responsive to a received $\overline{ADD}$ instruction, the reset logic 711A provides a RSTADD (reset on address command) synchronized to state 5 ($\overline{S5}$) of the state counter. Additionally, responsive to the receipt of an active $\overline{R2}$ output from the command latches 702, the reset logic 711A provides an output RSTR2, synchronized to the first state ($\overline{S1}$) of the state counter 706. The reset logic 711B is coupled to receive the output signals RSTADD and RSTR2 from the reset logic 711A. Additionally, the reset logic 711B is coupled to receive the state 7 (S7) output and the DC' (delayed count state 7) output from the state counter 706. Additionally, the reset logic 711B is coupled to receive the $\overline{DISABLE}$ output signal from the synchronization circuit 720, and clock phase outputs $\phi_a$ and $\phi_b$ from the clock generator 730. Responsive to these received signals, the reset logic 711B provides a RSTSC signal for coupling to the state counter 706, and for providing a RSTCL signal output for coupling to the command latches, and other blocks. The third subpart of the reset logic, 711C, is coupled to receive said RSTCL and the RSTSC outputs from the reset logic 711B. Furthermore, the reset logic 711C is coupled to receive $\overline{READ}$, $\overline{ADD}$ and $\overline{LOAD}$ outputs from the command latches 773, to receive the DISABLE output from synchronization circuit 720, and to receive clock phase output $\phi_a$ from clock generator 730. The reset logic 711C provides a send zero output ($\overline{SZ}$) in response to these received inputs coupled thereto. The send zero output ($\overline{SZ}$) is coupled to a zero latch 711d. Zero latch 711D provides outputs I/O1, I/O2, I/O4, and I/O8, these outputs being coupled to said I/O buffer means 701 at nodes 746–749. The zero latch 711D provides zero logic level signal outputs at I/O1, I/O2, I/O4, and I/O8 (no-op state) in response to receiving an active level set zero (SZ) signal output from the reset logic send zero decode circuit 711C. As described earlier with reference to FIGS. 25-28, the command protocol utilized in the preferred embodiment requires that a noop condition (zero logic level) state be forced onto the common bus 336 at the end of a command sequence in order to set up the bus protocol for the next command sequence.

Figure 34D:
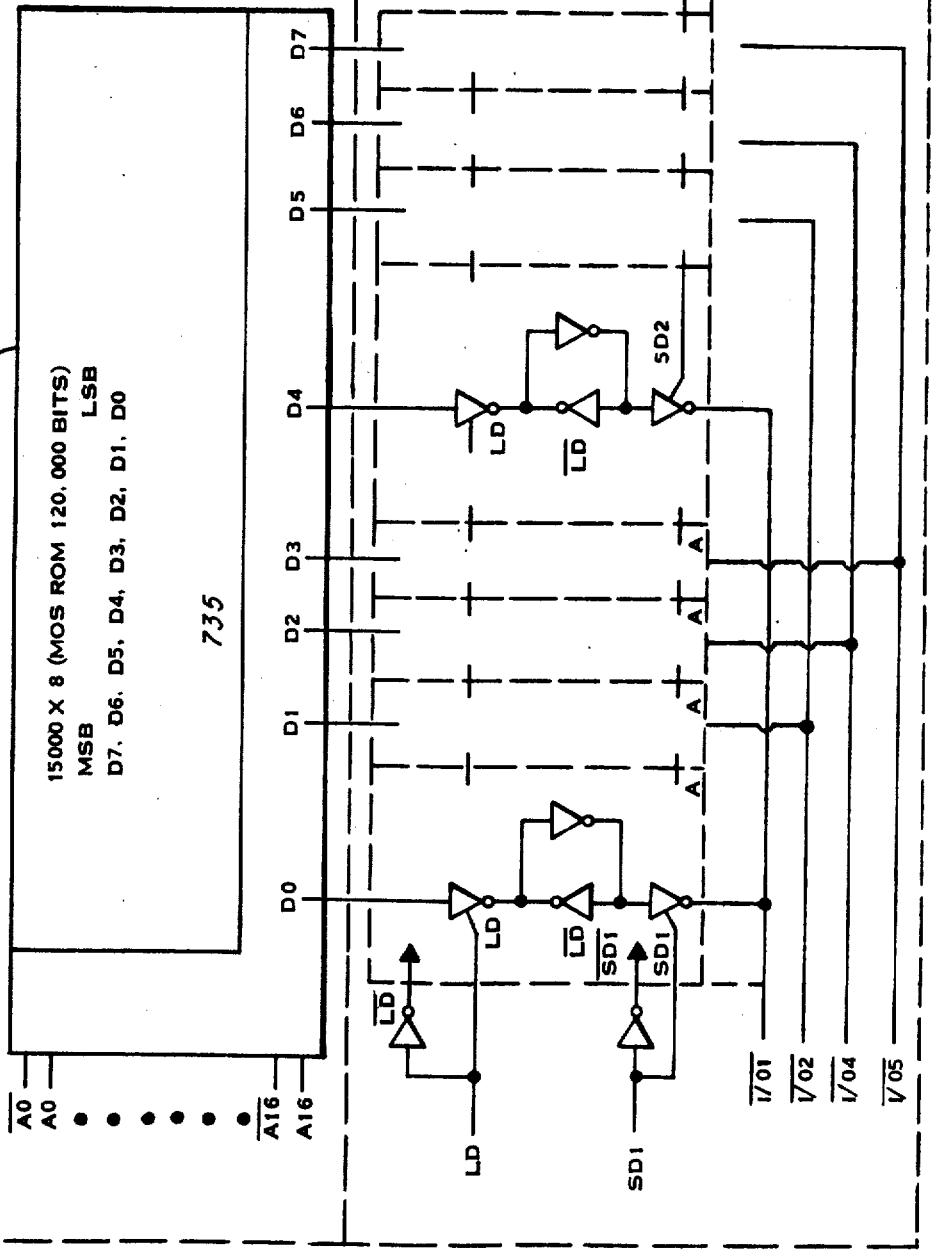
Figure 34D:
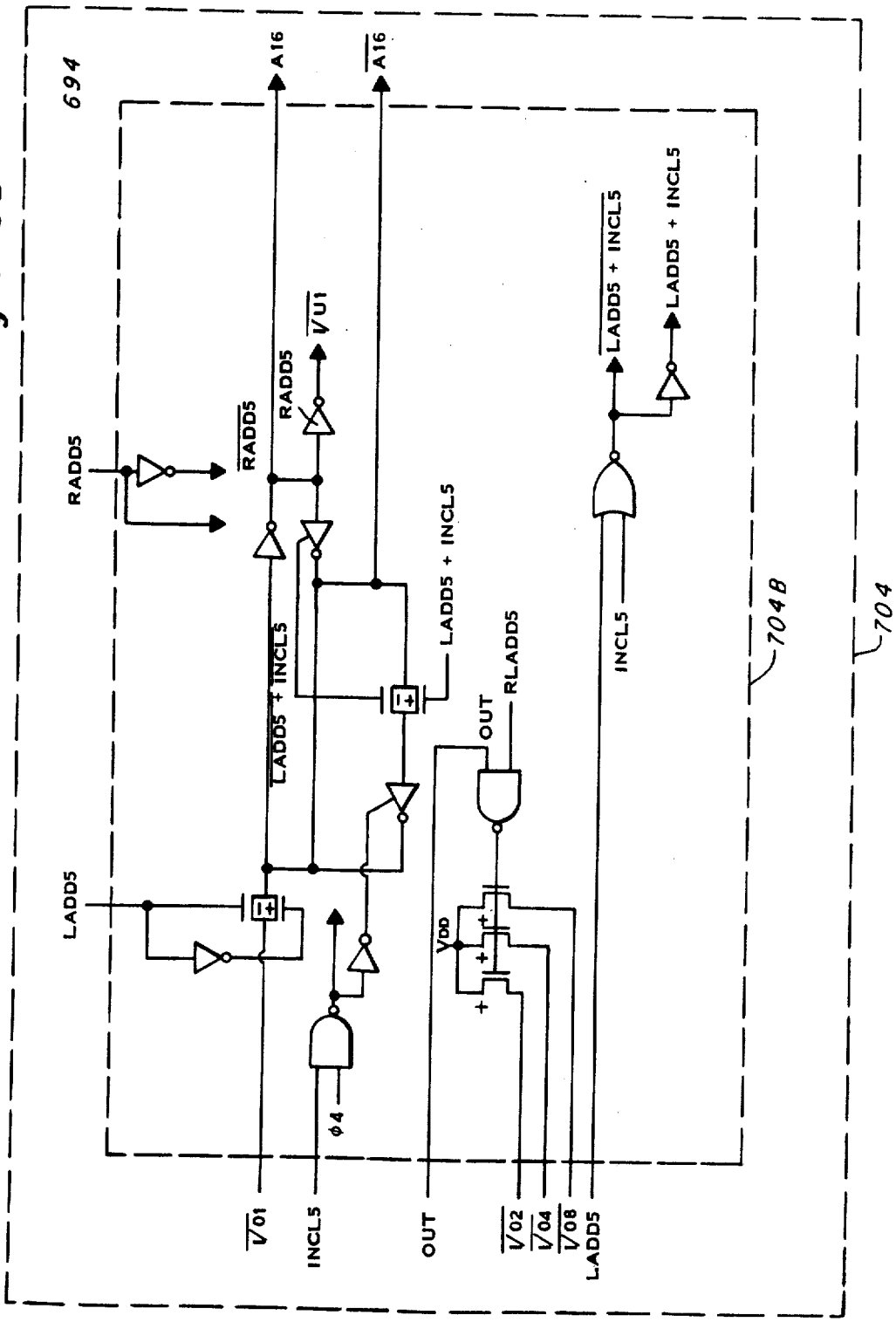
Figure 34E:
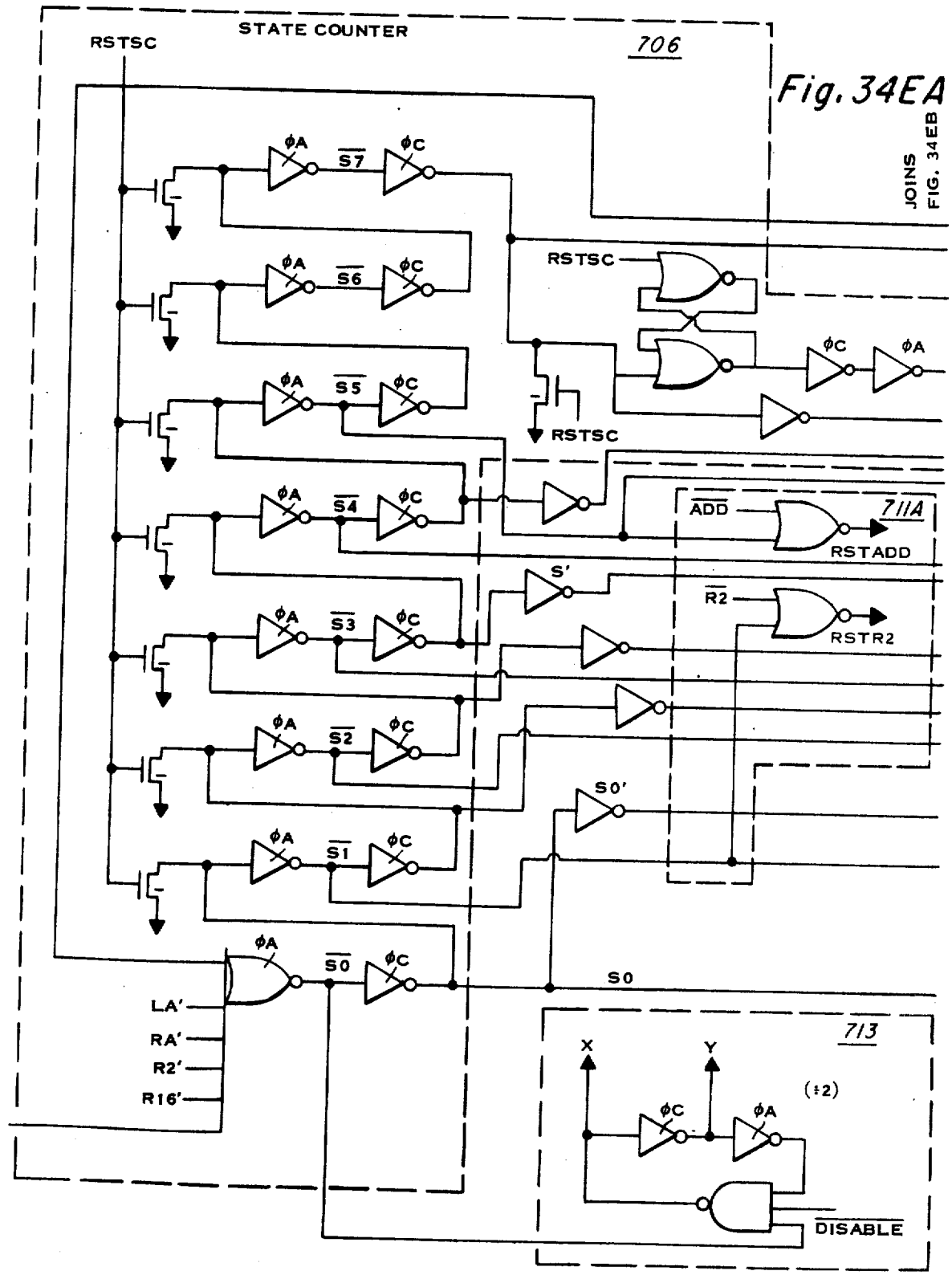

The load address logic circuit 727 is coupled to receive the $\overline{DISABLE}$ signal output from synchronization circuit 720, the $\phi$a output from clock generator 730, and the $\overline{LOAD}$ signal from command latches 702. In response to these received signals load address circuit 727 selectively gates received state counter ouputs S0', S1', S2', S3', and S4', coupling these selectively gated state counter outputs to the read address control logic circuit 708. Responsive to these selectively gated state counter outputs received from load address circuit 727, and responsive to received $\overline{ADD}$ and $\overline{LOAD}$ outputs from said command latches 702, said read address control logic 708 provides outputs read address one (RADD1), a load address one (LADD1), read address two (RADD2), load address two (LADD2), read address three (RADD3), load address three (LADD3), read address four (RADD4) load address four (LADD4), read address five (RADD5), and load address five (LADD5). These output signals RADD1-5, and LADD1-5 are coupled to control inputs of the program counter circuit 704, as shown in FIGS. 34c–d in detailed schematic form.

A read ROM enable circuit 712 is coupled to the state counter 706 for receiving the state zero (S0) output signal, and is coupled to the reset logic 711B for receiving said RSTSC signal. Unless an active RSTSC signal output is received, the S0 output signal sets an internal latch within the enable circuit 712. This latch output is synchronously coupled to other combinational circuits of the enable circuit 712. The enable circuit 712 is also coupled to receive the READ output signal from the command latches 702, and the X output from the divide by two circuit 713. Responsive to READ, X, and latch output signal, the enable circuit 712 provides an enable read output signal (SDL).

The data latch control circuit 709, as shown in FIG. 34G, is coupled to the read ROM enable circuit 712 for receiving the SDL output signal, and is additionally coupled to clock generator 730 for receiving $\phi$a and $\phi$c output signals therefrom. Responsive to the received SD1, $\phi$a and $\phi$c output signals, the data latch control circuit 709 provides an output SD2 coupled to data latches 705. Additionally, an output SD1 from ROM control 710 is also coupled to the data latches 705 (of FIG. 34D). The data latch control circuit 709 further includes a means for providing a load data latch output signal (LD) in response to a received $\phi$a signal from clock generator 730, and in response to receiving a first ROM control output R1 from ROM control means 710. The data latch control circuit 705 is coupled to the data latch control circuit 709 for receiving the LD and SD2 output signals therefrom.

The ROM control circuit 710, as shown in FIGS. 34f and 34g, coupled to reset logic 711b for receipt of the $\overline{RSTC}$ output signal and is coupled to the command latches 702 for receipt of the LOAD signal, and in response to these received signals provides an output signal LR for coupling to other parts of the ROM control circuit 710 and for coupling to the read address control logic 708. Additionally, the ROM control circuit 710 is coupled to the synchronization circuit 720 for receipt of the DISABLE signal therefrom, and is coupled to clock generator 730 for receipt of output signals $\phi_B$, $\overline{\phi_B}$, and $\phi D$. In response to these received signals ROM control means 710 provides a precharge output (PRE) and a discharge output (DISCH) for coupling to ROM array 735 and ROM decode 714. Additionally, ROM control circuit 710 provides a R1 output. The read address control logic 708 is coupled to the ROM control logic 710 for receiving the LR output therefrom and for receiving a precharge decode signal (PPRE) output. Read address control logic 708 provides an output signal INCL1 in response to received signals LR and PPRE. In the preferred embodiment, the INCL1 signal is at an active logic one level when both inputs thereto are at a logic zero level, signifying a precharge decode true, and a true load condition.

The program counter 704, as shown in detailed circuit schematic form in FIGS. 34c and d, is coupled to said read address control logic circuit 701 for receipt of LADD1-5 and RADD1-5. Additionally, the program counter 704 is coupled to the synchronization circuit 720 for receipt of the DISABLE signal therefrom. The program counter 704 is also coupled to the I/O control 750 for receipt of the IN and OUT signals therefrom. The program counter 704 is also coupled to the clock generator 730 for receipt of clock phase outputs therefrom. Finally, the program counter 704 is coupled to the I/O buffers 701, and particularly to nodes 746-749 of the I/O buffers 701, for transferring data to and from program counter 704. The program counter 704 provides address outputs A0-A16, and complementary address outputs $\overline{A0-A16}$, responsive to received inputs. In the preferred embodiment, the program counter 704 is comprised of four BCD digits, as shown in detail in FIG. 34c, each digit being individually readable or writable responsive to received RADD1-5 signals or LADD1-5 signals, respectively. A fifth BCD half digit position is provided for, as shown in FIG. 34d, stage 704b, which provides address outputs A0-A16 and $\overline{A0-A16}$. Additionally, each BCD digit 690, 691, 692, 693, and 694, includes BCD program counter circuitry including carry forward, inhibit 9, and other circuitry necessary to implement a five BCD digit stage counter. The address outputs A0-A16 and $\overline{A0-A16}$ from the program counter 704 are coupled to the decode circuit 714.

The data latches 705 are coupled to the read ROM enable circuit 712 for receipt of the SDL signal output therefrom, and are coupled to the data latch control circuit 709 for receipt of the SD2 and LD signal outputs therefrom. Additionally, the latch control circuit 709 is coupled to the I/O buffer 701, and particularly to connection nodes 746-749, for providing bi-directional data transfer with I/O buffers 701 and therefrom to the I/O control bus 336. In the preferred embodiment, the ROM array 735 is organized as an eight bit wide word, primarily for layout and bar size considerations. Since the I/O bus 336 is a four bit data bus (in the preferred embodiment), and since the internal data transfer path coupled to nodes 736-749 is also a four bit wide data path (in the preferred embodiment), outputs from the ROM 735 coupled to data latch 705 must be selectively stored and multiplexed onto the four bit wide data bus. The outputs D0-D7 from the ROM 735 are selectively stored in the data latch 705 responsive to the received LD signal, outputs D0-D3 being selectively coupled to the four bit data bus coupling to nodes 746-749 responsive to a received SD1 output signal, and data bits D4-D7 being selectively coupled to the four bit wide data bus and therefrom to output nodes 746-749 responsive to a received SD2 signal.

Referring to FIG. 34g, the clock timing waveforms for the received signals CLK coupled to clock generator 730, and external signal CE (chip enable) as shown coupled to synchronization circuit 722, both of FIG. 34a, as well as the internal clock and timing signals generated from the received clock and chip enable signals, together with sync signal output 724 from the synchronization circuit 720 as shown in FIG. 34a, clock generator 730 outputs $\phi1-\phi6$, and $\phi a-\phi d$, as shown in FIG. 34a, and $\overline{EN\phi}a$, and $\overline{EN\phi}c$ are shown. The timing waveforms show the interrelationship of external and internal clock signals to a single instruction cycle in the preferred embodiment of the memory in a system with the controller circuit.

Referring to FIG. 34h, the logic symbol conventions utilized in the FIGS. 34a-f are shown opposite the CMOS detailed circuit schematic embodiment as used in the preferred embodiment.

Referring to FIG. 35, a block diagram of the read/write embodiment of the memory module 650 and the memory 640 as shown in FIG. 28b is shown in detailed block form. The basic functional circuit blocks of FIG. 35 are for the most part equivalent to the basic functional circuit blocks of FIG. 29, except for the addition of the power switching circuit 900, which in the preferred embodiment forms an integral poart of integrated circuit 630, and a battery 909 which forms an integral part of the memory module 650 and is coupled to the integrated circuit power switching circuit 900. The clock generator 910 is identical to the clock generator 730 of FIG. 29. The synchronization circuit 920 of FIG. 35 is identical to the synchronization circuit 720 of FIG. 29. The I/O buffers 800 of FIG. 35 are identical to the I/O buffers 624 of FIG. 29. The I/O control circuit 820 of FIG. 35 is identical to the I/O control circuit 750 of FIG. 29. Finally, the state counter 879 of FIG. 35 is identical to the state counter 706 of FIG. 29. The remainder of the electrical circuitry of FIGS. 35-40, with the exception of the power circuit 900 and circuitry related thereto, are similar to the corresponding functional circuit blocks and circuitry of FIGS. 29-34, with addition and changes being made to accommodate a read/write memory as opposed to a read-only-memory. The basic functions performed by each of the circuit blocks of FIG. 35 are virtually identical to the function performed by the corresponding circuit functional block of FIG. 29.

Figure 38A:
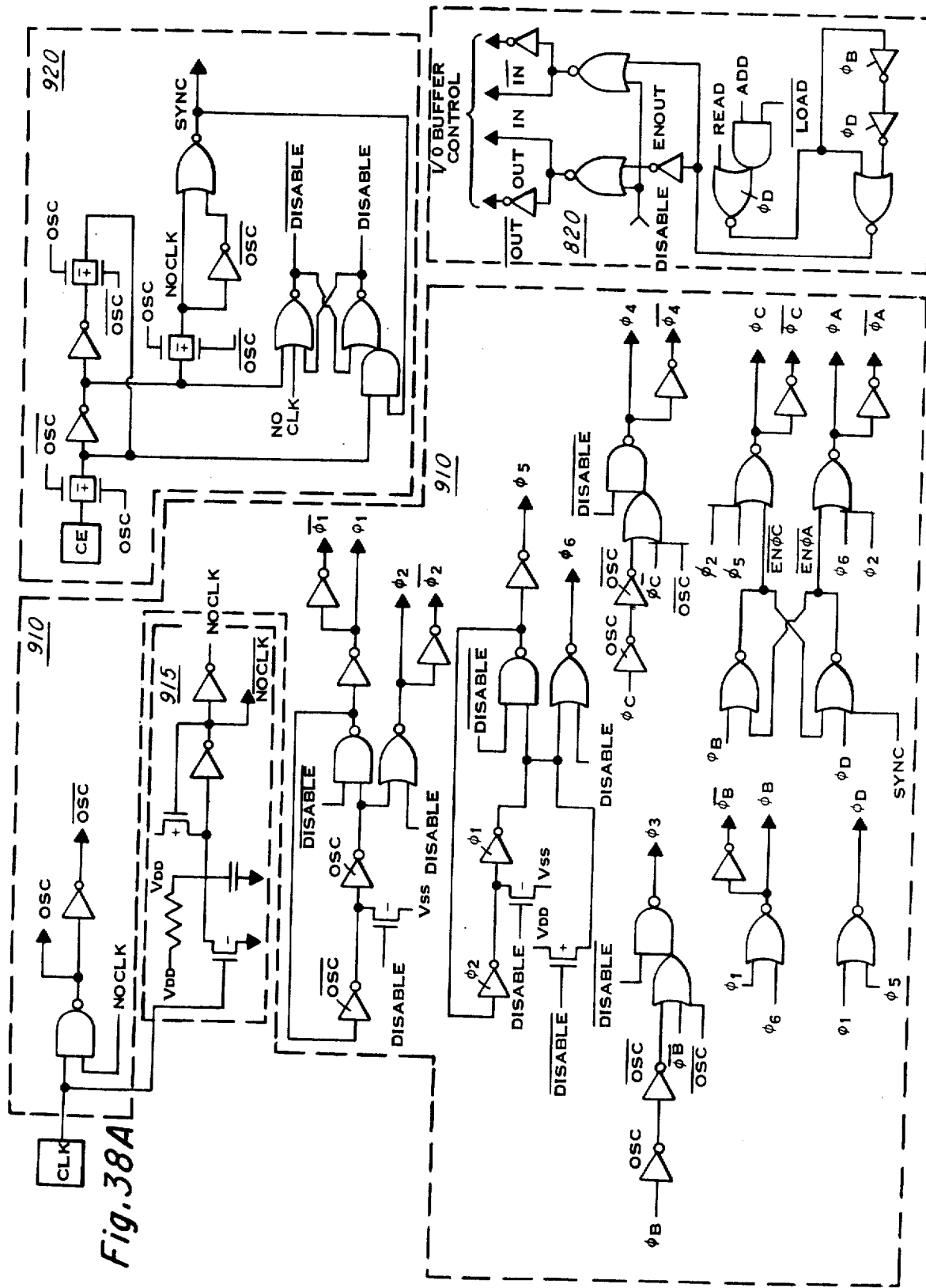

The clock generator means 910 and no clock detect means 915 of FIG. 35 are shown in greater detail in FIG. 38a, along with the I/O buffer control 820 and clock synchronization circuit 920. The I/O buffers 800, instruction command decode 810, command detect enable circuitry 830, and command latches 870 of FIG. 35 are shown in detailed schematic form in FIG. 38b. The BCD program counter 840 of FIG. 35 is shown in detailed schematic form in FIGS. 38c-d. Note that due to the lesser number of words of storage in the read/write memory means as compared with the read-only-memory means, the program counter 840 (of FIGS. 35 and 38c-d), provides three BCD digits of addressing as opposed to the program counter 704 of the read-only-memory means comprising five BCD digits. The data latches 845 of FIG. 35 are shown in detailed schematic form of FIG. 38d. The state counter 879, and other control logic are shown in detail schematic form in FIGS. 38e and f.

Figure 36:
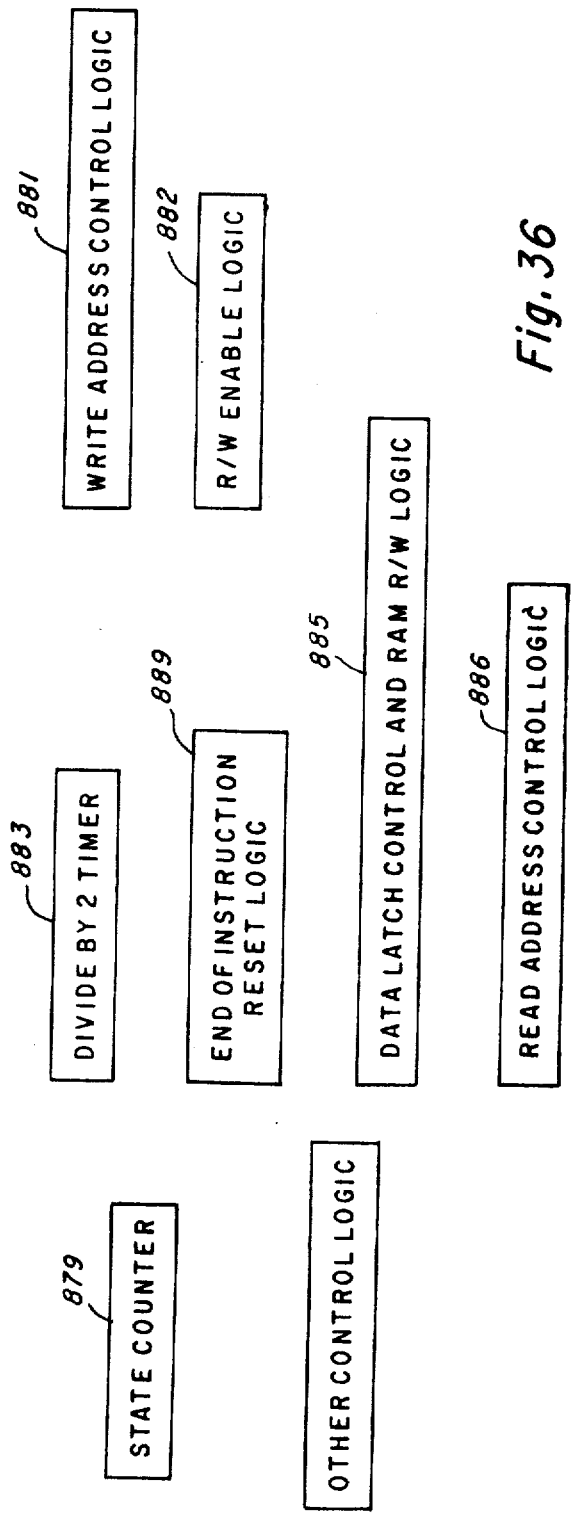
FIG. 36 is an expanded detailed block diagram of the state counter 879 and control logic 880 of FIG. 35.

Referring to FIG. 36, the state counter 879 and control logic 880 of FIG. 35 are shown in expanded detailed block diagram form. The state counter 879 remains an independent functional block. The control logic 880 is comprised of numerous functional control logic circuits which control the reading and writing of data to the program counter 840 and memory 892 responsive to a received set of signals as derived from the command code and data signals received from the common bus 336, and as synchronized by the chip enable signal input to the synchronizaton circuit 920, and in response to the received clock signal coupled to the clock generator 910. The control logic 880 is comprised of write address control logic 881, read/write enable logic 882, divide by two timer logic 883, end of instruction reset logic 884, data latch control and RAM read/-write logic 885, and read address control logic 886. The state counter 879 and control logic 880 sub blocks 881-886 are shown in detailed schematic form in FIGS. 38e-f.

Referring to FIG. 37, the layout interrelationship of FIGS. 38a-h is shown. Referring to FIG. 38a, the synchronization circuit 920, responsive to a received chip enable signal and to a received no clock output signal, selectively provides a sync output, a DISABLE output and a e,ovs/DISABLE/ output for coupling to other circuit blocks of the circuitry of FIGS. 38A-F. The clock generator 910 selectively provides outputs OSC and $\overline{OSC}$ responsive to a received CLK input from the controller and provides clock phase outputs $\phi 1$-$\phi 6$, and $\overline{\phi 1\text{-}\phi 6}$, and $\phi A$ and $\overline{EN}$ $\phi C$ clock signals, selectively providing these clock phase signal outputs responsive to the received oscillator clock input from the external controller and to the received SYNC and DISABLE signals from the synchronization circuit 920. Additionally, the no clock detect circuit 915 is coupled to receive the externally provided clock input, and responsive thereto provides a NOCLK and a $\overline{NOCLK}$ signal output for coupling to the other circuit blocks, including synchronization circuit 920. The I/O buffer control 820 provides buffer control signal outputs IN, $\overline{IN}$ OUT, $\overline{OUT}$ and ENOUT, in response to receiving the DISABLE output signal from the synchronization circuit 920, the $\phi B$ and $\phi D$ clock outputs from the clock generator circuit 910, and a READ, an ADD, and a LOAD signal output from command latches 870. The clock generator 910, no clock detect circuit 915, synchronization circuit 920, and I/O buffer control 820 are identical to the corresponding circuitry of FIG. 34a for the clock generator 730, no clock detect circuit 740, I/O control 750, and synchronization circuit 720, respectively.

Referring to FIG. 38b, connection nodes 811, 812, 813 and 814, provide for coupling to the external I/O communication bus 336 for coupling to the controller circuit. The I/O buffers 800 are coupled to the nodes 811-814 for coupling to the external bus 336. The output buffers 804 of the buffer means 800 are shown in greater detail in detail sectional 804 of FIG. 38b. The I/O buffers 800 provide interconnection nodes 805-808 which is coupled to an internal I/O bus 802 which is coupled to the command decode 810, as well as to other functional block elements. The I/O buffers 800 of FIG. 38b are in the preferred embodiment identical to the I/O buffers 701 of FIG. 34b. The command decode 810 is similar to the instruction decode PLA 700 of FIG. 34b except for the addition of decode circuit structure for decoding the additional instructions of write two words into memory (W2) and write 16 words into memory (W16). Thus, the command output 810 selectively provides an active decode on one of signal outputs LA, RA, R2 R16, W2, and W16 responsive to the decoded received command from the I/O buffers 800 as received from the command bus 336, when an active DECODE enable output is received from the enable means 830.

The command decode outputs LA, RA, R2, R16, W2, and W16, are coupled to the command latches 870 and are therein decoded to provide command latch outputs ADD, $\overline{ADD}$, READ, $\overline{READ}$, RW2, WRITE, and LOAD. One of the command latch outputs is selectively activated responsive to the decoded command outputs from the command decode 810, the DISABLE signal from synchronization means 820, and the RSTCL signal received from the reset logic 884. Note that the command latches 870 of FIG. 38b are substantially identical to the command latches 702 of FIG. 34b, with the addition of command latches and decode circuitry for providing a WRITE and a RW2 output. The enable circuit 830 of FIG. 38b is similar to the enable circuit 703 of FIG. 34b, except that in addition to receiving the READ, ADD, and DISABLE signals, the enable circuit 830 also receives as an input the WRITE signal as output from the command latches 870. The enable circuit 830 selectively provides an active output signal so as to enable the instruction decode circuitry 810 to receive and decode a data word from I/O buffers 800, responsive to the received READ, ADD, WRITE, and DISABLE signals. The enable circuit 830 provides means for inhibiting command decode once a command sequence has commenced until the command sequence is completed.

Referring to FIG. 38c, the program counter 840 of FIG. 35 is shown in detailed schematic form. Program counter 840 is comprised of three BCD digit stages 841, 842 and 843. The circuitry of counter stages 841 and 842 are identical to that of FIG. 34 C, counter stage 690, and the discussion of counter stage 690 with reference to FIG. 34c is equally applicable to counter stages 841 and 842. The last digit of the program counter stages, 843, is shown in an expanded detailed circuit schematic form in FIG. 38d. In the preferred embodiment, the program counter stage counter stage 843 is designed so as to count to 7 (111 in binary), and then reset to 0. This is because, in the preferred embodiment, the read/write memory program counter 840 is designed to count from 0 to 799 (decimal). The program counter 840, in a like manner to the program counter 704 of FIGS. 34c and d, may be designed so as to contain a plurality of counter stages, greater than or less than those shown in the preferred embodiments, and may be designed with other counter circuitry design types.

Figure 38D:
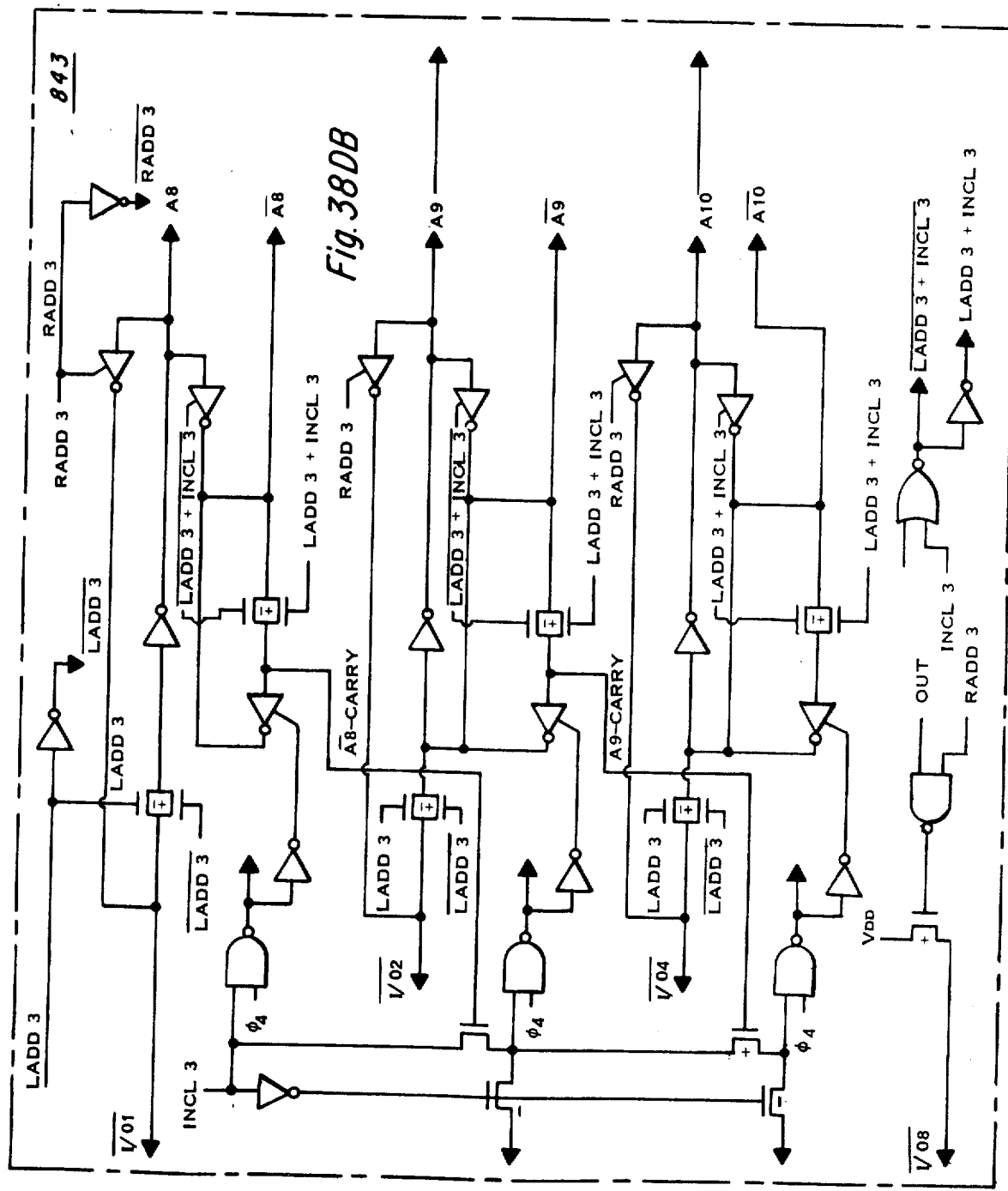
Figure 40A:
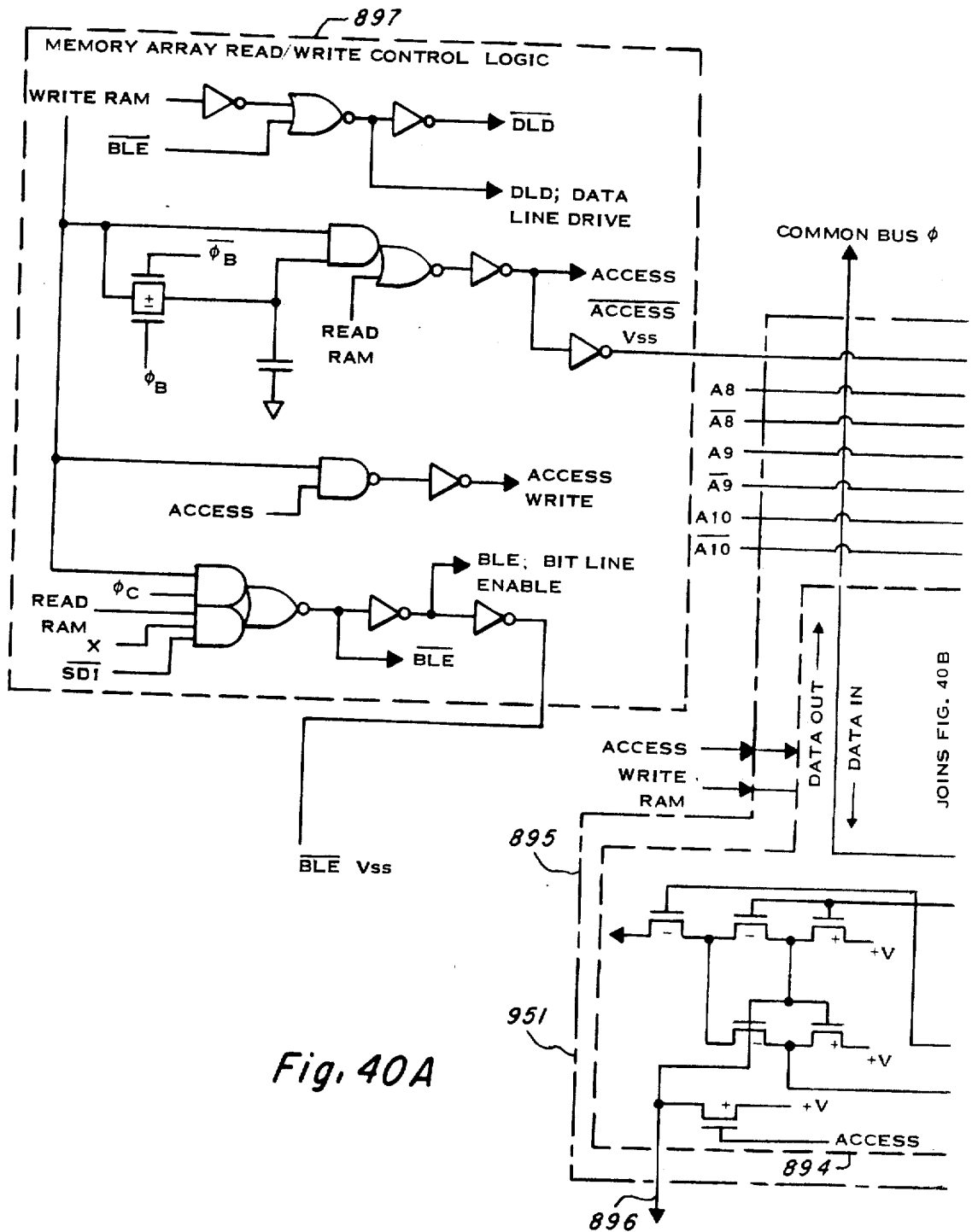
FIGS. 40A-B are a detailed schematic diagram of the memory array read-write control logic 897, memory array 890, address decode circuit 895, and other memory array related circuitry as discussed with reference to FIGS. 38A-G.

The data latches 845, as shown in detailed schematic form of FIG. 38d, are comprised of bidirectional data latches storing received data words from the internal bus 802 during sequential memory cycles in separate latch locations, and outputting this stored received data to the data interface 894 of the memory 892. In the preferred embodiment, since the data bus 802 is four bits wide while the memory word size is eight bits, two successive transfers of four bits of data from the bus 802 to the data latches 845 are required prior to transfer of one eight bit data word to the memory 892. Additionally, the data latches 845 store a received eight bit data word, in the preferred embodiment, as output from the memory 892, and selectively transfer four bits at a time from the eight bit data word onto the I/O bus 802 for coupling to the external bus 336. The data latches load data from the memory 892 responsive to a LRD signal received from data latch control and RAM rewrite logic 885 as shown in detail in FIGS. 38e and 38f, multiplexing the loaded data onto the bus 802 responsive to receiving an SD1 and an SD2 signal in a manner analogous with that described with reference to the data latches 705, as described with reference to FIG. 34d. Additionally, the data latches 845 store sequentially transferred and received data words from the bus 802 in separate latches responsive to receiving an LD1 and an LD2 signal as received from said data control and read write logic 885 as shown in detail in FIG. 38f. The memory circuit 892 of FIG. 38d is shown in greater detail in FIGS. 40a–d. Additionally, FIG. 40d provides a detailed schematic diagram of the power switching circuit 900. The decode circuit 895 of the memory 892 is coupled to the address outputs A0–A10 of the program counter means 840.

Figure 38E:
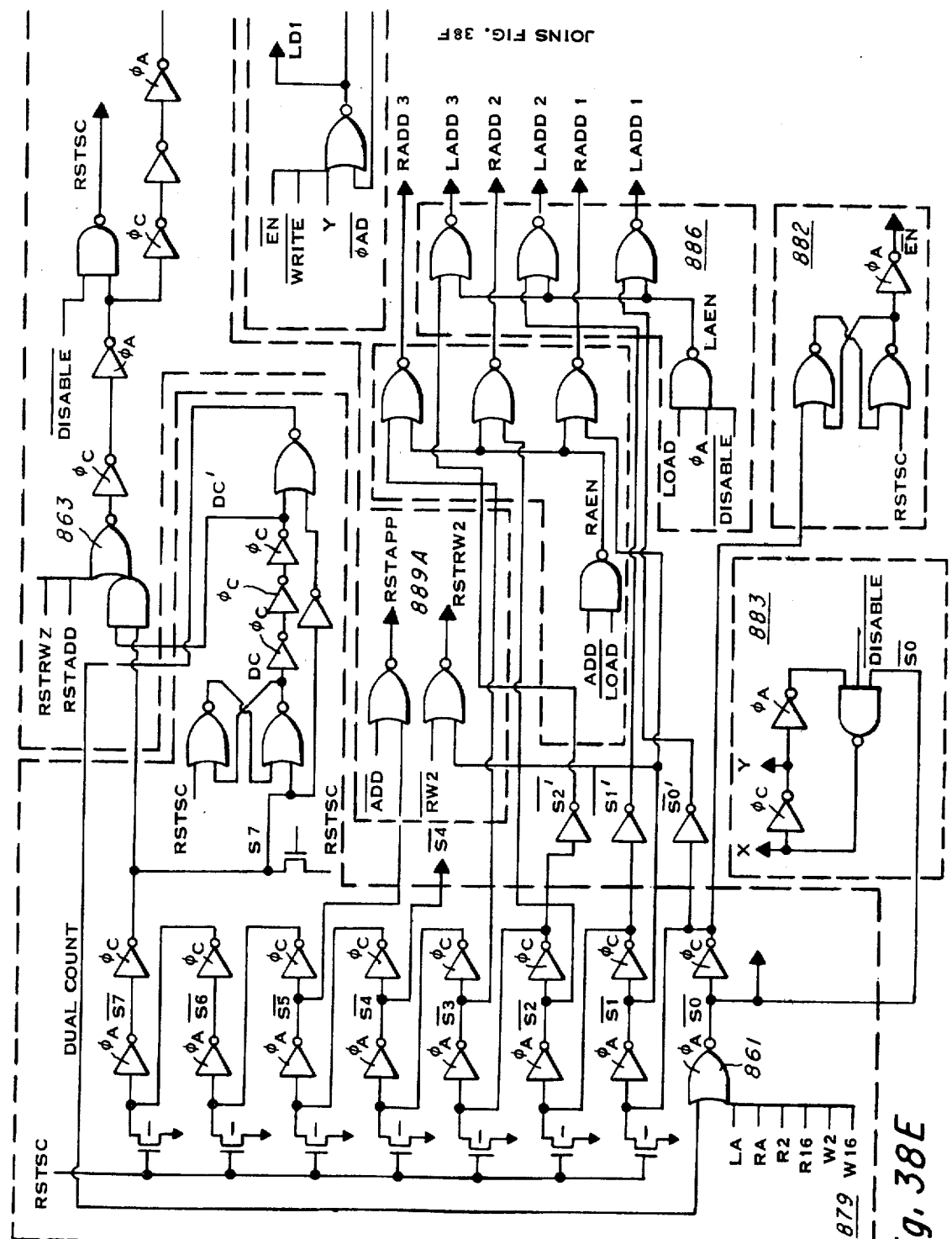
Figure 38F:
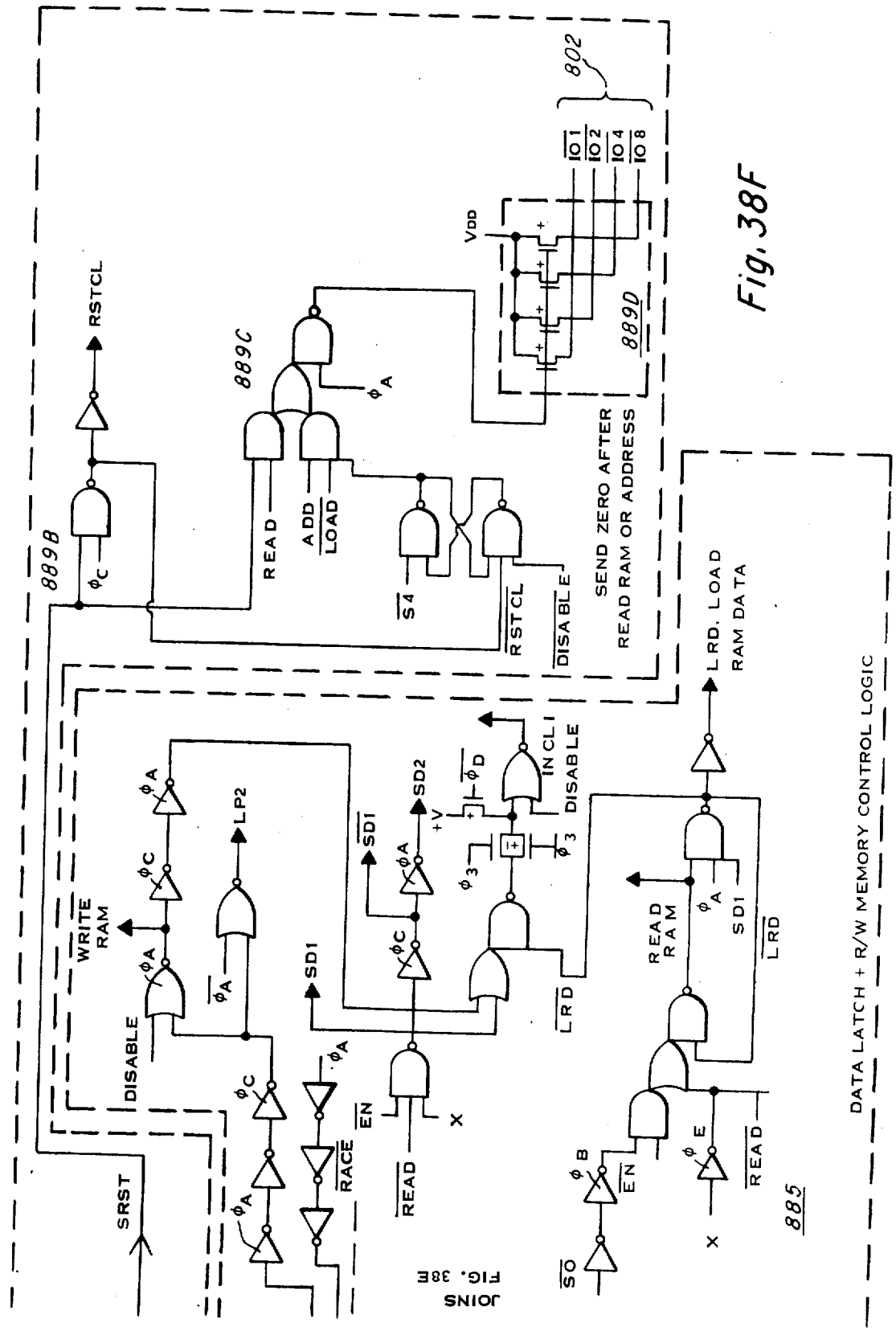
Figure 38G:
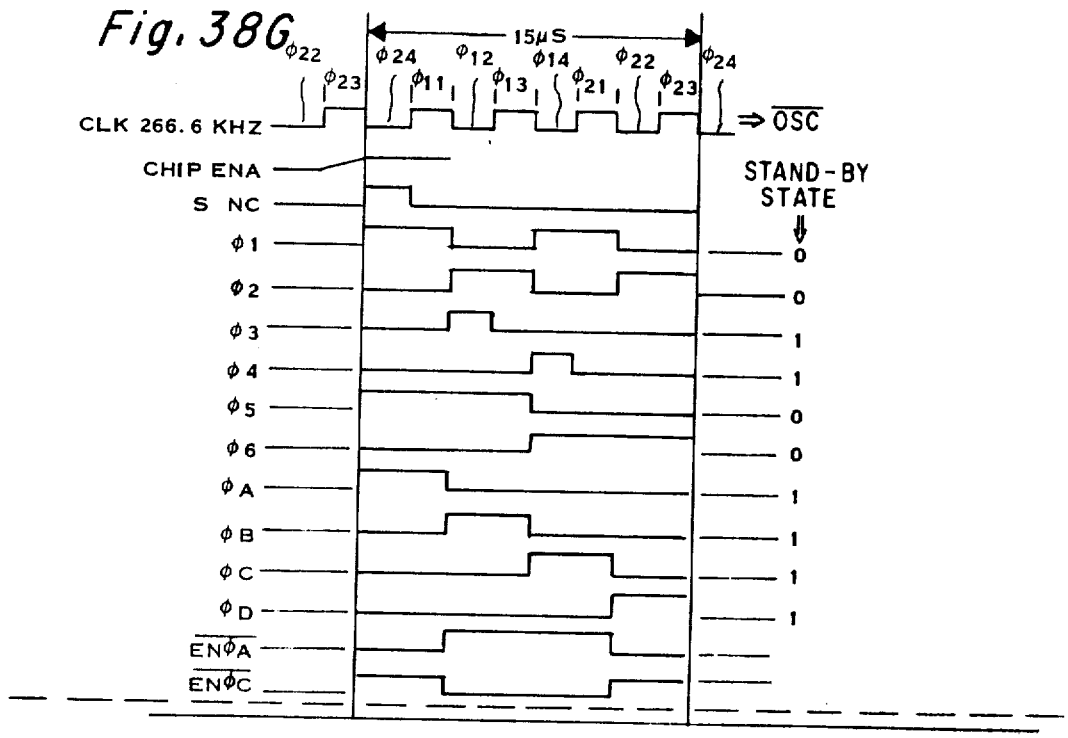
Figure 38H:
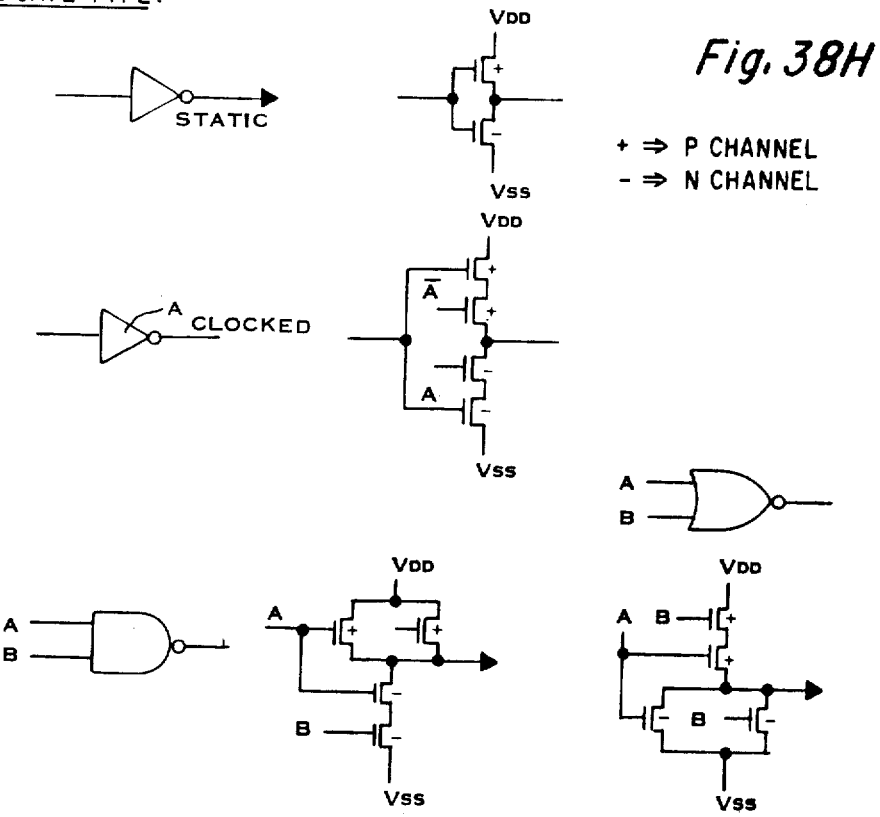

Referring to FIG. 38e, the detailed circuit schematic for the state counter 879, the read/write circuit 882, the divide-by-two timer 883, the write address control logic 881, the end of instruction reset logic 889, and the data latch control and read/write logic 885 are shown. The remainder of the end of instruction reset logic 899 and data latch control and read/write logic 885 is shown in FIG. 38f. The state counter 879 is identical to the state counter 706 of FIG. 34f except that output signals W2 and W16 received from the command decode circuit 810 are coupled to the state counter 879 in addition to output signals LA, RA, R2, and R16 (which are also present in the state counter 706). Specifically, the input signals W2 and W16 are coupled to the input of NOR gate 861 which also has coupled thereto the LA, RA, R2 and R16 inputs. The state counter 879 of FIG. 38e, like the counterpart state counter 706 of FIG. 34f, provides outputs S0–S7, and $\overline{S0}$–$\overline{S7}$ responsive to receiving the $\phi$A, $\phi$C, RSTSC, LA, RA, R2, R16, W2 and W16 input signals. Functionally, the end of instruction reset logic 889 of FIGS. 38e and f is substantially identical with the reset logic 711 of FIGS. 34f and g. The reset logic 889 is comprised of functional subgroups 889a, 889b, 889c and 889d, which correspond to the functional sub-blocks 711A–D of the reset logic 711 of FIGS. 34f–g. Each of the sub-blocks of the reset logic is substantially identical to the counterpart sub-blocks of FIGS. 34f and g. Reset logic sub-block 889a is coupled to the state counter 879 for receiving said S5 signal output and said S1 signal output therefrom. Additionally, the sub-group 889a of the reset logic is coupled to receive the ADD and the RW2 output signals from command latches 870. Responsive to ADD signal and said S5 signal, said reset logic 889A provides a RSTADD signal output, which is coupled to the reset logic subgroup 889B. Furthermore, responsive to the RW2 and S1 signals, said reset logic sub-group 889a provides a RSTRW2 output which is coupled to the reset logic subgroup 889B. The input signal RW2 from the command latches 870 is substituted for the input signal R2 of sub-block 711a of FIG. 34f, and a resultant output RSTRW2 is substituted for the responsive output signal RSTR2 of block 711A of FIG. 34f so as to result in the reset logic sub-block 889a of FIG. 38e. The reset logic sub-block 889b of FIG. 38e is identical to the reset logic sub-block 711B of FIG. 34f except that the input signal RSTR2 of reset logic 711B of FIG. 34f is replaced by the RSTRW2 signal output from reset logic sub-block 889a in FIG. 38e. In a manner similar to that described with reference to block 711B of reset logic of FIG. 34f, the reset logic sub-block 889b provides a RSTSC signal output for coupling to other circuit blocks in the memory, an output signal SRST for coupling to reset logic sub-block 889c, an output signal RSTCL for coupling to other circuit blocks of the memory, responsive to receiving as inputs the RSTRW2 signal, the RSTADD signal (from sub-block 889a of the reset logic) in response to: clock generator outputs $\phi$A and $\phi$C, the DISABLE signal from synchronization circuit 920, the S7 signal output from state counter 879 and the $\phi$c' signal output from state counter 879. The outputs of the reset logic 889b are coupled to other circuit blocks within the memory to provide for synchronization and control of reset procedures within the memory. Reset logic sub-block 889c is coupled to said sub-block 889b for receiving the SRST output signal and the RSTCL signal therefrom; to synchronization circuit 920 for receiving the DISABLE signal therefrom; to the clock generator circuit for receiving the $\phi$A signal therefrom, and to the command latches 870 for receiving therefrom the READ, ADD, and LOAD signals. Responsive to these input signals reset zero logic sub-block 889c provides a send zero signal $\overline{SZ}$ which is coupled to reset logic sub-block 889d.

After completion of a command cycle for reading the address from the program counter or reading data from the memory array, the send zero signal output $\overline{SZ}$ is activated so as to enable a zero latch within the reset logic sub-group 889d so as to couple zero logic level output signals (NO-OP condition) to the internal I/O bus 802 for coupling to the external communications I/O bus 336. The send zero signal VOS/(SZ)/ is activated after a read command memory cycle from the memory array or from the program counter, since as the last device utilizing the command bus, it is the duty of the sending circuit to send a NO-OP condition signal pattern on the command bus 336 to allow for commencement of the next command cycle in accordance with the command protocol.

The read/write enable circuit 882 provides an enable output ($\overline{EN}$) which is coupled to the data latch control circuit 885, responsive to receiving the $\phi$A signal and the S0 signal outputs from state counter 879, and in response to receiving the RSTSC signal from reset logic sub-group 889b. The divide-by-two circuit 883 of FIG. 38e is identical to the divide-by-two circuit 713 of FIG. 34f, and the description with reference to FIG. 34f circuit 713 is equally applicable to the circuit 883 of FIG. 38e. The address control logic 886 of FIG. 38e is substantially identical to the address control logic 708 of FIG. 34f except that the address control logic 886 controls three BCD digits of the address program counter while the address control logic 708 of FIG. 34f controls five BCD digits of the address program counter. Responsive to receiving the ADD signal and the LOAD signal from command latches 870, the DISABLE signal from synchronization circuit 920, the $\overline{S0}'$, $\overline{S1}'$, $\overline{S2}'$, $\overline{S3}$, and $\phi$A output signals from state counter 879, the address control logic 886 provides signal outputs LADD1, LADD2, LADD3, RADD1, RADD2, RADD3, corresponding to load address digit 1, 2 or 3, or read address digit 1, 2 or 3, respectively. The outputs LADD1–3 and RADD1–3 are coupled to program counter means 840 for control of communication between the program counter 840 with the internal I/O bus 802.

Figure 40B:
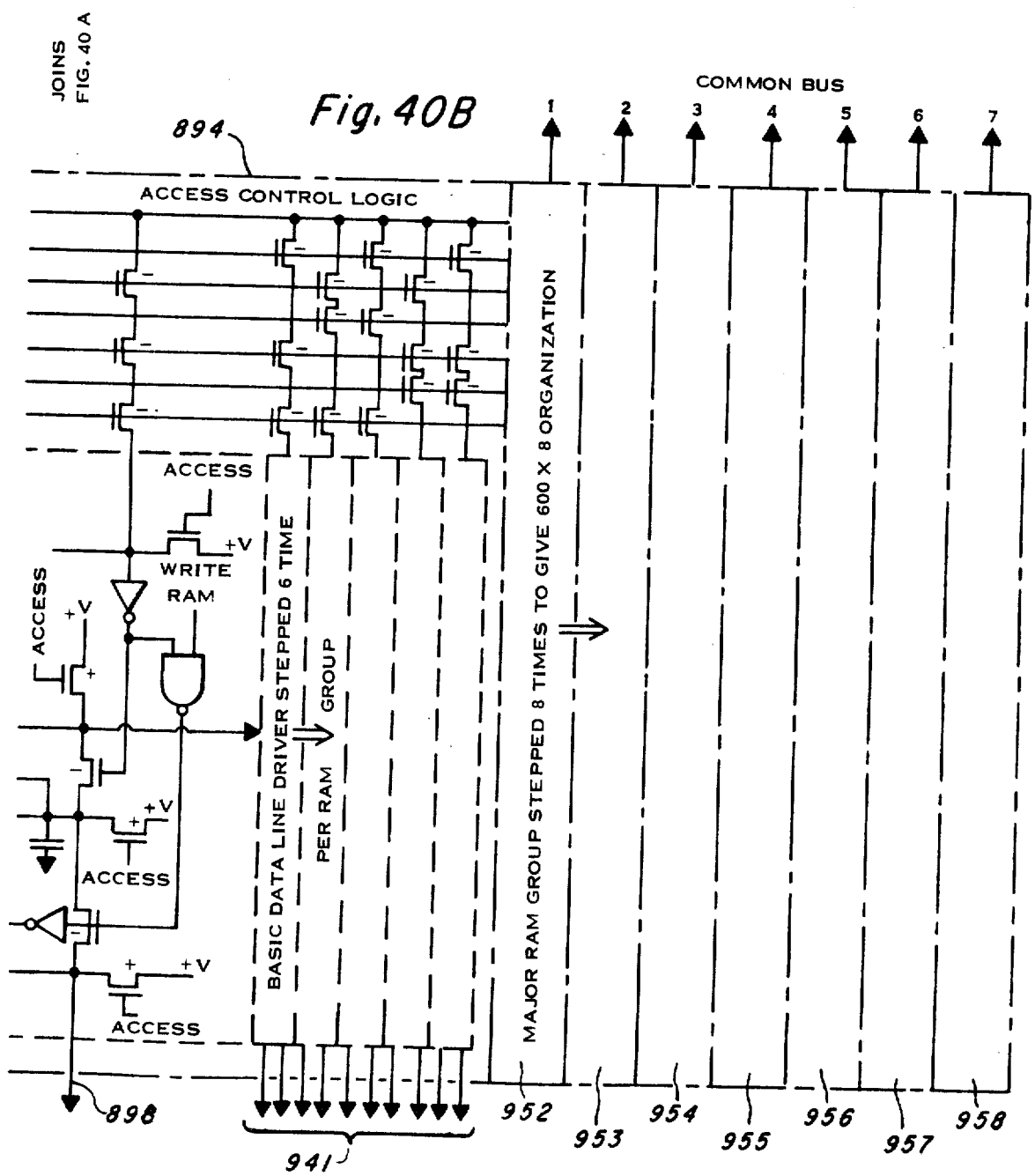
Figure 40C:
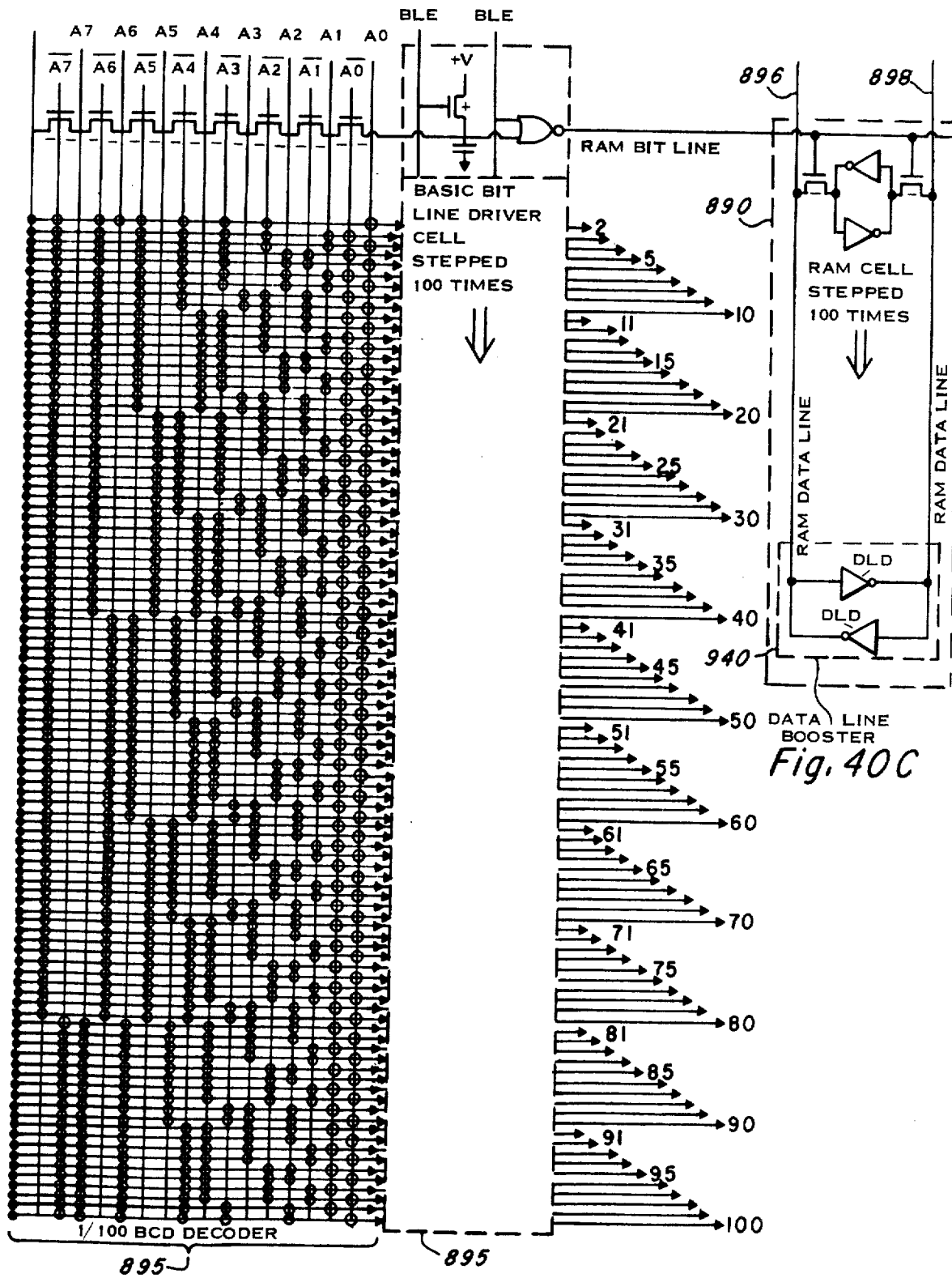

The data latch control logic and read/write logic 885 provides outputs LD1, LD2, SD1, SD2, LRD, INCL1, READRAM, and WRITERAM, for coupling to other circuit block elements of FIGS. 38e–f and FIGS. 40a–c. The LD1, LD2, SD1, SD2, and LRD outputs from the logic 885 are coupled to the bidirectional data latches 845 of FIG. 38d. The data latch and read/write logic 885 are coupled: to the divide-by-two timer 884, receiving the X and Y signal outputs therefrom; to the read/write enable logic 882 for receiving the $\overline{EN}$ signal therefrom; to the clock synchronization circuit 920 for receiving the DISABLE signal therefrom, to the state counter 879 for receiving the $\phi A$, $\overline{\phi A}$, $\phi C$, $\overline{\phi D}$, $\phi B$, $\phi 3$ and $\overline{\phi 3}$ and S0; and is coupled to the command latches 870 for receiving the READ, and WRITE output signals therefrom. The data latch and read/write memory logic 885 provides the outputs LD1, LD2, SD1, SD2 INCL1, LRD (load RAM data), READRAM, and WRITERAM, responsive to receiving the $\overline{EN}$, WRITE, READ, X, Y, S0, $\phi A$, $\phi B$, $\phi C$, $\overline{\phi A}$, $\overline{\phi D}$, $\phi 3$, $\overline{\phi 3}$, and DISABLE signals. The LD1, LS2, SD1, SD2, and LRD output signals provide control for the bidirectional data latches 845, selecting latch functions and multiplex functions for read and write cycles in response to the received signals coupled to the data latch and read/write memory control logic 885. The READRAM, WRITERAM, and SD1 output signals from the data latch and read/write memory control logic 885 are coupled to the memory array read/write control logic 897 as shown in FIGS. 40a-c.

Referring to FIG. 39, the drawing interrelationship of FIGS. 40a-b is shown. Referring to FIG. 40a, the memory array read/write control logic circuit 897 selectively provides data line drive output signals DLD and $\overline{DLD}$; memory array access control signal outputs ACCESS, $\overline{ACCESS}$, VSS, and ACCESS WRITE; and bit line enable output signals BLE, $\overline{BLE}$, and $\overline{BLE}$ VSS. These output signals are selectively provided responsive to: the signals WRITE RAM, READ RAM, and SD1, as received from the data latch and read/write memory control logic 885, the X output signal from divide by two circuits 883, and the $\phi B$, $\overline{\phi B}$, and $\phi C$ signals as received from state counter means 879. The BLE and $\overline{BLE}$ output signals and $\overline{BLE}$ VSS output signal are coupled to the bit line drivers of the decode means 895 as shown in FIG. 40c, to control selection of a particular set of bit line drivers. The DLD and $\overline{DLD}$ output signals from the memory array read/write control logic 897 are coupled to the array 890 so as to control the direction of data line transfer provided by data line booster 940 of the memory array 890. Address inputs from the program counter 840 are coupled to the address decode circuit 895 as shown in FIGS. 40a-c, providing bit selection within the major RAM groups 951-958, as shown in FIG. 40b, and for selectively enabling one out of 100 RAM bit lines as shown in FIG. 40c. An access control logic circuit 894 provides RAM data line outputs 896, 898, and 941 from RAM group 951 for selectively coupling to the memory array 890, responsive: to the received address inputs A8-A10 and $\overline{A8}$-$\overline{A10}$; to ACCESS signals received from the memory array read/write control logic 897: and to the WRITE RAM signal output received from data latch and read/write memory control logic 885. Furthermore, the circuit 894 selectively couples input data from common bus 0 to RAM data lines 896 and 898 or to the RAM data lines 941, when an active WRITE RAM and an active ACCESS signal are present, storing the received data signal from common bus 0 at a location within the memory array 890 responsive to the received address inputs from the program counter 840. The access control logic 894 is stepped six times per major RAM group, each RAM group coupling to a separate common bus bit position, common bus 0-common bus 7 coupling to major RAM groups 951-958, respectively.

Referring to FIG. 41, the power switching circuit 900 of the memory means 640 is shown in detailed schematic form. In the preferred embodiment, input node 960 provides a coupling for connection of the external system supplied VDD power souce to the switched VDD power supply circuit 900 of the RAM module. Input node 962 provides for coupling to an external power source, such as a standby (or auxiliary) battery supply, which provides a power source at a sufficient voltage level to maintain valid data in the memory array 890. The power switching circuit 900 provides an output 964 which is coupled to the internal power bus of the read/write memory means, coupling to all circuits except the I/O buffers 800. Finally, an input node 961 is coupled to receive the externally supplied clock input signal which is also coupled to the clock generator 910. The output 964 provides a constant power source to the internal power bus of the read/write memory means, continuously providing power from either the external system supply via input 960 or the standby battery supply via input 962. The power switching circuit 900 provides power at the output 964 from the system power source as received at node 960 when a proper voltage level is received at the input node 960 and after a predetermined number of clock signals have been received at the clock input node 961. When an inadequate voltage level is received at the system power source input 960, or when an adequate power signal level is received at the input node 960 but the predetermined number of clock signals has not been received at clock input node 961, then the power switching circuit 900 provides power from the standby battery supply via input node 962 as output at node 964. Diode 966 of the power switching circuit 900 provides isolation of the standby battery supply from the system power supply when the system power supply is properly coupled to the output node 964. When a proper power source input is received at node 960, and a predetermined number of clock pulses have been received at node 961, enable output 969 switches transistor 970 to a conductive state, thereby coupling the system power supply as received at node 960 to the output node 964 for coupling to the internal power bus of the read/write memory means circuitry. When this occurs, diode 966 performs a blocking function, being reversed biased since the system power supply coupled to input node 960 is at a sufficiently greater positive voltage level than the standby batter supply coupled to the input node 962. This is so because the standby battery supply coupled to the input node 962 needs only supply a voltage level sufficient to sustain the memory array 890 within the read/write memory means. However, the system power supply as coupled to input node 960 must additionally power the logic circuitry within the read/write memory means, and must therefore be at a more positive voltage level than that required for the standby battery supply. Diode 967 shunts transistor 970, coupling the power source as received at node 960 less the voltage drop across the diode 967 to the output node 964, coupling said voltage to output node 964 prior to and concurrently with the coupling of said input voltage to said output node 964 by said transistor 970. Diode 967 prevents input voltages less than the voltage level of the standby battery supply from coupling to the output node 964, but allows voltages greater than the standby battery supply to be coupled to the output node 964 pending enablement of transistor 970 by the clock detection circuitry 972.

Figure 42:
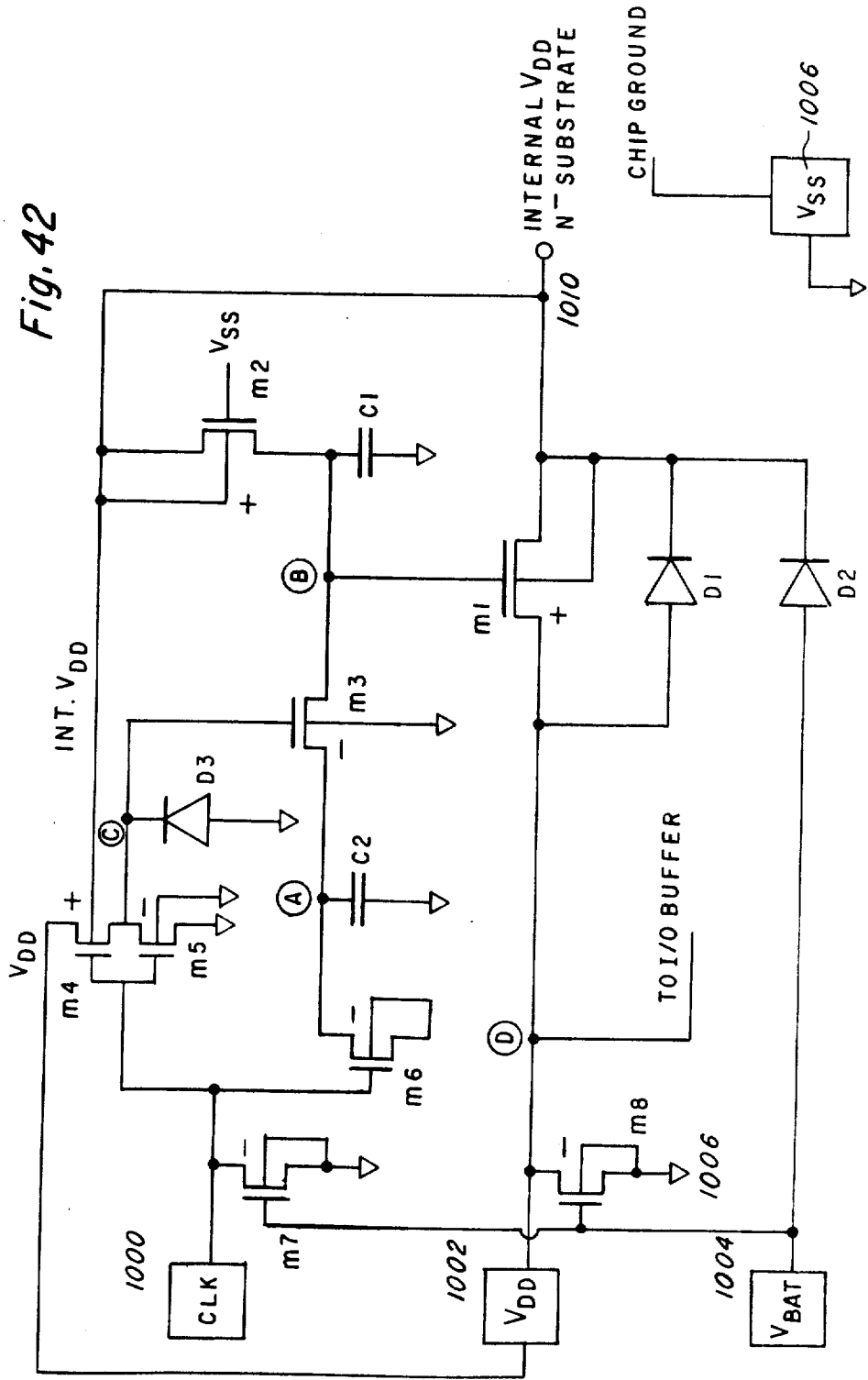

In a preferred embodiment, the power supply switching circuit 900 is designed in metal gate CMOS technology. Additionally, in the preferred embodiment, the process utilized has P channel transistors built on an N-substrate and has N channel transistors built in a P- tank, the N- substrate of the chip coupling to the +V or internal VDD power supply. To solve the problems associated with providing a non-volatile read/write memory in a removeable module, the following features are provided by the present power supply circuit (900) invention. First, the blocking diode (966 of FIG. 41, D2 of FIG. 42) for the auxiliary battery supply is built into the integrated circuit, thereby eliminating one external component from the system. Secondly, a timing feature is incorporated in the integrated circuit switching circuit 900 to allow said switching circuit to disregard noise on the input lines to the integrated circuit when the module is unplugged from a powered system, or when the module is plugged into a system but power is not provided by the main power supply. This feature protects the memory array and auxiliary battery supply both. Thirdly, a pull down resistor (M8 of FIG. 42) is coupled to the input coupling to the main power supply bus (VDD) line. When the main power supply is turned off, the main power supply bus line will float, unless otherwise controlled. The internal resistive element transistor M8 is coupled so that the main bus power supply input is pulled to ground (VSS in the preferred embodiment) when the main power supply is switched off. This feature eliminates the need for provding external resistors in the module or in the system which would otherwise be required to perform this function of logic level (state) pull down. Additionally, there is an internal resistor (M6 of FIG. 42) pull down coupled to the clock input (1000 of FIG. 42) so as to insure that the clock input is coupled to ground when the system is powered down or the module is unplugged from the controller housing. This assures that the read/write memory in the non volatile memory module is maintained in a deselected state so that no false data may be written into or read from the circuit. This feature eliminates the need for an external pull down resistor from the module or from the main system which would otherwise be required to fulfill this function. Furthermore, the internal resistors coupled to the main power supply bus line (VDD) input and the external clock input may be disabled by coupling the auxiliary battery power supply input to ground. In the preferred embodiment, the pull down resistors are comprised of MOS resistors M7 and M8 of FIG. 42, the gates of transistors M7 and M8 coupled to the auxiliary battery input 1004 VBAT. This feature allows the read/write memory circuit within the non-volatile memory module to be powered directly from the main power supply VDD in a standby low power mode with slightly lower current drain than is required by the non-volatile memory in its normal standby mode with an auxiliary battery coupled to node 1004. Additionally, the switching circuit 900 provides means for coupling the main power supply (VDD) to the internal buffers within the integrated circuit, bypassing the switched supply transistor M1. This feature allows for an increased current capacity for the buffers in the memory integrated circuit, and reduces the current spikes in the internal circuits of the memory integrated circuit when the buffer circuits of the memory integrated circuit switch states. This feature is shown in FIG. 42 as node D which couples to the I/O buffers in the memory integrated circuit. Finally, no power is drawn from the auxiliary battery power supply as long as the main power supply VDD is at a voltage level greater than that of the auxiliary battery power supply.

In the preferred embodiment, the switching circuit is designed to operate in one of five modes of power supply operation. These modes are responsive to the detection of the presence or absence of the clock input signal 1,000 coupled to the clock input node and to the voltage levels present on the external power supply (VDD) node 1002 and auxiliary battery standby power supply (VBAT) node 1004. In the preferred embodiment, the internal clocks on the read/write memory circuit are only activated when an externally supplied chip enable signal coupled to the memory means 640 is at a high logic level (1). When the chip enable signal is at a low logic level (0), the internal clock phases are set to predetermined states and all circuit nodes are forced to a static logic state, as disclosed in greater detail in co-pending application Ser. No. 106,429, filed Dec. 26, 1979, by Kenneth A. Lies, for Clocked CMOS Low Power Standby Mode, assigned to the assignee of the present invention. When the clock input signal at node 1,000 is at a non-cycling (stopped) state, the clock input node 1,000 is forced to a default low logic level state as a result of a node pull down transistor M7. The five modes of operation for the power supply switching circuit in the preferred embodiment are comprised of: (1) normal operation with the switching circuit receiving active clocks and with the voltage level of VDD greater than the voltage level of VBAT; (2) standby mode with the system powered from the external VDD supply, that is, with VDD greater than VBAT, but with no active clock input signal at node 1,000; (3) power down mode where the system is not powered from the external power supply, that is, VDD is floating, with the clock inputs 1,000 being at an inactive level and therefore no clock is cycling, and with VBAT greater than VDD, such that VBAT provides total power to the memory circuit; (4) normal operation mode two, where the circuit receives clock signals at node 1,000 in an active state, where VDD is at the system power voltage level, and where no battery power supply is provided at node 1004, that is, VBAT=VSS; and (5) standby mode two where there are no active clock inputs to the system (the clock signal at 1,000 is non-cycling), where there is no auxiliary battery supply provided, that is, VBAT=VSS, and where the external power supply VDD provides total power to the memory circuit.

In the normal operation mode No. 1, the switching circuit receives an active clock signal at 1,000 and the VDD power supply and VBAT auxiliary supply are present, with VDD being greater than VBAT so as to effectively switch VBAT off from supplying power to the system. When the non-volatile read/write memory is coupled in a system (that is, the module is plugged in), and this mode is entered, command instructions are accepted and executed by the memory means 640. In the preferred embodiment, at least 20 clock input signal cycles must be cycled through before a command is accepted as issued to the memory system 640.

Referring to FIG. 42, as the input clock signal at node 1,000 is switched high, transistor M6 is enabled so as to couple node A to ground. Node C is at a low logic level, turning off transistor M3. When the clock signal at node 1,000 is switched low, node C is caused to switch to a high logic level, thereby turning on transistor M3 and allowing capacitors C1 and C2 to charge together. In the preferred embodiment, capacitor C2 is approximately ⅓ the size of capacitor C1 to aid in maintaining a stable low logic level on node B, even when the clock input signal at node 1,000 is cycling at a low frequency, 100 KHz in the preferred embodiment. As the clock input at node 1,000 is switched to a high voltage (logic) level, transistor M3 is turned off and transistor M2 is enabled so as to switch to couple node B to a high logic level. Transistor M2 and capacitor C1 are sized to provide a long RC time constant to provide an initial time out period. After approximately 20 clock input signals at node 1000 have been received, node B will have discharged very close to ground, and transistor M1 will thereby be turned on (enabled) and driven hard. Transistor M1 thereby couples a full VDD voltage level from the VDD input 1002 to which transistor M1 is coupled, to said memory circuit internal VDD node 1010. If the voltage level of the VDD signal at node 1,002 is greater than the voltage level of the VBAT auxiliary power supply signal at node 1,004, and the internal VDD node 1,010 is approximately equal to the external VDD supply at node 1,002, then diode D2 will be reversed biased and no power is drawn from the auxiliary battery power supply VBAT from node 1004. In the preferred embodiment, the clock input signal 1,000 and the VDD input signal at node 1,002 are coupled to 30 Megaohm resistors (M7 and M8, respectively) which couple to ground (VSS). Other resistor values may also be used. These 30 provide pull down of the input nodes 1,000 and 1,002 to a low logic level when the input signals coupled to node 1,000 and 1,002 are at a floating (non-fixed) voltage level. This prevents spurious signals from propogating through the power switching circuit and therefrom to the memory circuit in the non-volatile memory system. In the preferred embodiment, transistors M7 and M8 provide the pull down functions for nodes 1,000 and 1,002, respectively.

In mode number 2, the standby mode of operation, the external power supply is active and coupled to the VDD input node 1002, with the input voltage level at a VDD input node 1002 being greater than the voltage level present at VBAT input node 1004, and the clock input signal coupled to clock input node 1000 is at an inactive non-cycling level. In between instruction execution cycles, the data processing system switches into a standby state and the non-volatile memory system as well as other circuits coupled into the data processing system, are powered from the main power supply VDD. However, since there are no system clocks cycling in this mode, that is the clock signals are inactive and steady state, each circuit coupled into the data processing system is forced into a static standby mode state, including said non-volatile memory module including the power switching circuit therein. In making the transition from normal operation, mode one, to standby mode operation, the clock input signal 1000 ceases to cycle and settles at a low logic level. Transistor M6 is turned off, and transistor M3 is turned on. Transistor M2 slowly pulls node B up to an internal VDD level (as present at node 1010) turning off transistor M1 and causing the internal VDD node 1010 to discharge towards ground (VSS). When the internal VDD node 1010 reaches a voltage level one diode drop down (less than) the voltage level present at VDD input node 1002, the diode D1 becomes forward biased and couples power to the internal VDD node 1010. As long as the external power supply provides a voltage level at the VDD input node 1002 such that VDD (the voltage present at node 1002) is greater than VBAT (the voltage present at node 1004), then the diode D2 is held in a reversed biased condition, and no power is drawn from the VBAT supply via VBAT input node 1004.

In the third mode, the power down mode, the external power supply is inactive and couples an indefinite (floating) voltage level signal coupled to input node 1002. Furthermore, a system clock coupled to input node 1000 is at an inactive non-cycling mode so that no input clocks are presented to the power switching circuit. In this mode the auxiliary battery power supply coupled to the VBAT input node 1004 provides total power to the system. This mode is of particular importance when the non-volatile read-write memory module is used as a plug in memory module for coupling to a data processing system, such as in a calculator. In this embodiment, there is packaged with the non-volatile memory integrated circuit (including the power switching circuit in the preferred embodiment) an auxiliary battery power supply coupled to the VBAT input node 1004. When the data processing system is switched off, the external power supply VDD coupled to the input node 1002 is disconnected, and the voltage level of the signal coupling to the VDD input 1002 is floating, however the voltage level present at the VDD input node 1002 is pulled to ground to pull down resistive load transistor M8. The non-volatile memory system, and more particularly the power switching circuit, automatically switches to the stand-by power down mode. When the externally suppplied system power coupled to node 1002 is turned off, transistor M8 acts as a resistive pull down to pull the input node 1002 to the ground level (VSS). The internal VDD voltage level at node 1010 will drop (decrease in magnitude) in concert with the voltage level at the external VDD input 1002 because transistor M1 remains temporarily enabled upon initial switching to the number three mode, power down mode. The voltage at input node 1002 and at internal VDD input node 1010 decrease until diode D2 is turned on (forward biased) so as to couple the auxiliary battery power supply via input node 1004 to the internal VDD input node 1010 so as to provide power to the memory array in the non-volatile memory system. As long as transistor M1 remains turned on, transistor M8 is unable to pull the system VDD input node 1002 to the ground level (VSS). However, after a period of time, transistor M2 charges capacitor C1 to the internal VDD input voltage level at node 1010, thereby turning off transistor M1, thereby allowing transistor M8 to pull the external system VDD input node 1002 to the ground voltage level (VSS). Diode D3 provides a leakage path so as to discharge the remaining charge trapped on node C when transistor M4 is turned off upon loss of a positive voltage level at the VDD input node 1002 as coupled to transistor M4. With transistors M1 and M3 turned off, the internal VDD voltage level at node 1010 is isolated from the VDD input node 1002 (from the external system), with the auxiliary battery power supply VBAT supplying necessary current (leakage) to the remainder of the memory circuit through diode D2. If the non-volatile memory module is now unplugged from the data processing system, transistor M7 and M8 maintain input nodes 1000 and 1002, respectively, at a ground level, thereby isolating the auxiliary battery power supply coupled to node 1004 and the internal VDD supply present at node 1010 from the outside environment, preventing spurious clock input and VDD inputs at nodes 1000 and 1002, respectively.

In the fourth mode of operation, normal operation mode two, and in the fifth mode of operation, standby mode second, there is no auxiliary battery power supply coupled to VBAT input node 1004, the VBAT input node 1004 being coupled to the integrated circuit ground node VSS 1006. The voltage level at the VBAT input node 1004 is at the VSS level, thereby disabling resistive load element transistors M7 and M8. Additionally, the external power supply coupled to VDD input node 1002 is active and coupled to node 1002. In mode 4, normal operation mode two, the non-volatile memory system is utilized in a data processing system where the externally provided power supply VDD is presumed always active. By tying the VBAT input node 1004 to ground, transistors M7 and M8 are disabled, reducing the power consumption of the integrated circuit while allowing the non-volatile memory system to function as it would in mode 1, normal operation. In mode 5, standby mode second, no clock inputs are present, the clock signals coupling to input node 1000 being at an inactive non-cycling mode. Transistor M1 is disabled after a short delay by the clock detect circuitry, thereby eliminating the coupling via M1 of the internal VDD node 1010 to the VDD input node 1002. Since the VBAT input node 1004 is coupled to ground, diode D2 will remain reverse biased in this mode. As the voltage at node 1010 drops one diode voltage drop below the voltage level at the VDD input node 1002, diode D1 becomes forward biased, thereby coupling the voltage present in input node 1002 to the internal VDD node 1010. Since node 5 is utilized only in a system where the main VDD supply coupled to node 1002 is presumed always present, no auxiliary battery power supply is required. Under these conditions, mode 5 parallels standby mode, mode 2, and power down mode, mode 3, combined for use as an on-board in system non-volatile memory. When the clock signal coupled to input node 1000 switches inactive and stops cycling, transistor M1 is turned off, and power is supplied to the internal VDD node 1010 via diode D1, just as in mode 2 standby mode, except that transistors M7 and M8 are turned off, thereby reducing power is consumption in mode 5 as compared to mode 2.

Figure 43:
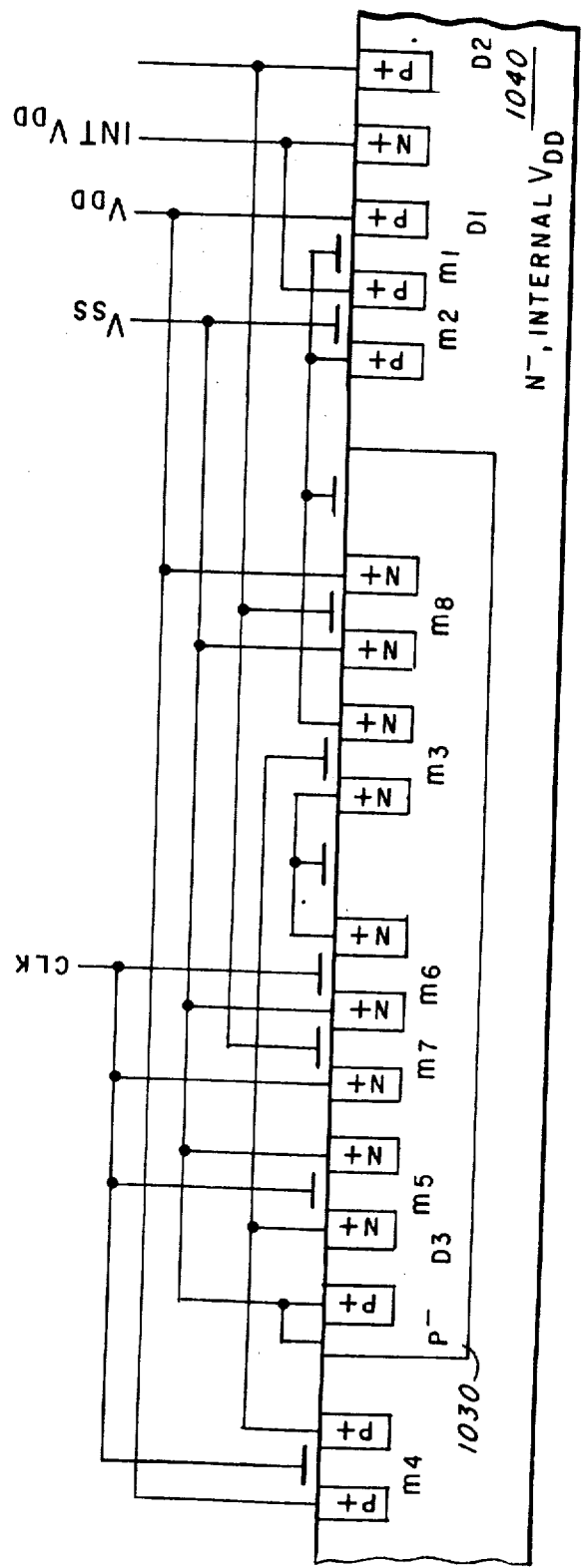
FIG. 43 is a cross-section of the circuit of FIGS. 41 and 42, shown in the preferred CMOS embodiment.

Referring to FIG. 43, a cross section of the circuit of FIG. 42 is shown. In the preferred embodiment as shown in FIG. 43, the power switching circuit is designed in metal gate CMOS technologies, although other MOS and bipolar technologies may be utilized with the present invention. In the preferred embodiment, N-channel devices (diodes D3, transistors M3, M5, M6, and M8) are built in a P tank 1030, and has P-channel devices (diodes D1 and D2, and transistors M1, M2 and M4) are built in an Nsubstrate 1040. The Nsubstrate 1040 forms the internal VDD power supply node 1010 for the power switching circuit.

While the present invention has been disclosed with respect to particular embodiments, it is understood by those skilled in the art that the present invention may be utilized in other embodiments, systems, circuits, and technologies, within the spirit of the present invention as set forth in the appended claims.

What is claimed is:

1. A multichip date processing system comprising:
    processor means on a first chip for sequentially producing or receiving address, command and data signals,
    memory means on a second chip coupled to said processor means, said memory means including a program counter means coupled to a read-only or read-write memory for selectively outputting data to said processor and a plurality of conductors electrically interconnecting said processor on said first chip with said memory means on said second chip, at least some of said conductors being common for transmitting or receiving said address, command and data signals sequentially.

2. A multichip data processing system according to claim 1 wherein each of said read-only and read write memories are in separate modules which may be inserted into said data processing system.

3. A multichip data processing system according to claim 2 wherein the read-write memory module includes a separate power source for retaining the information in said read-write memory when said read-write memory module is removed from said data processing system.

4. A plug-in memory module for use in a data processing system having a keyboard for providing input signals, a processor coupled to said input signals for sequentially producing or receiving address, command and data signals, and receptacle means including contacts for temporarily receiving the memory module and for coupling the memory module to the processor, said memory module comprising:
    a memory module housing having module contacts connectable to the contacts of said receptable means;
    a read-write memory disposed within said memory module for storing information at predetermined locations and selectively outputting said information;
    program counter means coupled to said read-write memory and said processor for addressing predetermined locations in said read-write memory, and
    a plurality of conductors in said module coupled to said module contact, at least some of said conductors being common for transmitting or receiving said address, command and data signals sequentially.

5. A plug-in module according to claim 4 further including a power source in said module coupled to said read-write memory.

6. A plug-in module according to claim 5 wherein said power source is a battery such that the information in said read-write memory is retained when said module is removed from said receptacle means.

* * * * *